United States Patent
Ryu et al.

(10) Patent No.: US 9,543,528 B2
(45) Date of Patent: Jan. 10, 2017

(54) COMPOUND FOR AN ORGANIC OPTOELECTRIC DEVICE, ORGANIC OPTOELECTRIC DEVICE INCLUDING THE SAME, AND DISPLAY DEVICE INCLUDING THE OPTOELECTRIC DEVICE

(71) Applicants: Dong-Kyu Ryu, Uiwang-si (KR); Jin-Seok Hong, Uiwang-si (KR); Eun-Sun Yu, Uiwang-si (KR); Dong-Min Kang, Uiwang-si (KR); Sang-Shin Lee, Uiwang-si (KR); Han-Ill Lee, Uiwang-si (KR); Yu-Na Jang, Uiwang-si (KR); Soo-Young Jeong, Uiwang-si (KR); Su-Jin Han, Uiwang-si (KR)

(72) Inventors: Dong-Kyu Ryu, Uiwang-si (KR); Jin-Seok Hong, Uiwang-si (KR); Eun-Sun Yu, Uiwang-si (KR); Dong-Min Kang, Uiwang-si (KR); Sang-Shin Lee, Uiwang-si (KR); Han-Ill Lee, Uiwang-si (KR); Yu-Na Jang, Uiwang-si (KR); Soo-Young Jeong, Uiwang-si (KR); Su-Jin Han, Uiwang-si (KR)

(73) Assignee: CHEIL INDUSTRIES, INC., Gumi-si, Gyeongsangbuk-do (KR)

( * ) Notice: Subject to any disclaimer, the term of this patent is extended or adjusted under 35 U.S.C. 154(b) by 398 days.

(21) Appl. No.: 14/283,935

(22) Filed: May 21, 2014

(65) Prior Publication Data
US 2015/0060788 A1    Mar. 5, 2015

(30) Foreign Application Priority Data

Sep. 5, 2013    (KR) .................. 10-2013-0106803

(51) Int. Cl.
H01L 51/50    (2006.01)
H01L 27/32    (2006.01)
(Continued)

(52) U.S. Cl.
CPC ........... *H01L 51/0067* (2013.01); *C09K 11/06* (2013.01); *H01L 51/0071* (2013.01);
(Continued)

(58) Field of Classification Search
None
See application file for complete search history.

(56) References Cited

FOREIGN PATENT DOCUMENTS

JP    2009-542868 A    12/2009
JP    2010-126535 A    6/2010
(Continued)

OTHER PUBLICATIONS

Machine translation for WO 2012/067415 A2, which has a publication date of May 2012.*

*Primary Examiner* — Dawn Garrett
(74) *Attorney, Agent, or Firm* — Lee & Morse, P.C.

(57) ABSTRACT

A compound for an organic optoelectric device, an organic optoelectric device including the same, and a display device including the organic optoelectric device, the compound including a combination of a moiety represented by the
(Continued)

following Chemical Formula I and a moiety represented by the following Chemical Formula II:

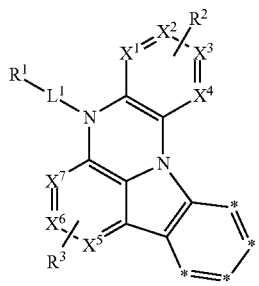

[Chemical Formula I]

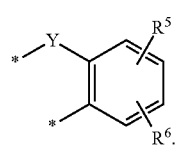

[Chemical Formula II]

(51) Int. Cl.
*H01L 51/00* (2006.01)
*C09K 11/06* (2006.01)

(52) U.S. Cl.
CPC ...... *H01L 51/0072* (2013.01); *H01L 51/5016* (2013.01); *H01L 51/5056* (2013.01); *H01L 51/5072* (2013.01)

(56) References Cited

FOREIGN PATENT DOCUMENTS

| | | |
|---|---|---|
| JP | 2012-234873 A | 11/2012 |
| JP | 2012-248663 A | 12/2012 |
| KR | 10-2012-0054154 A | 5/2012 |
| KR | 10-2012-0079411 A | 7/2012 |
| WO | WO-2008/006454 A1 | 1/2008 |
| WO | WO-2009/148015 A1 | 12/2009 |
| WO | WO-2010-113761 A1 | 10/2010 |
| WO | WO-2011/088877 A1 | 7/2011 |
| WO | WO-2011/107186 A2 | 9/2011 |
| WO | WO-2011/125020 A1 | 10/2011 |
| WO | WO-2011/128017 A1 | 10/2011 |
| WO | WO 2012/067415 A2 * | 5/2012 |

* cited by examiner

16 Claims, 1 Drawing Sheet

COMPOUND FOR AN ORGANIC OPTOELECTRIC DEVICE, ORGANIC OPTOELECTRIC DEVICE INCLUDING THE SAME, AND DISPLAY DEVICE INCLUDING THE OPTOELECTRIC DEVICE

CROSS-REFERENCE TO RELATED APPLICATION

Korean Patent Application No. 10-2013-0106803, filed on Sep. 5, 2013, in the Korean Intellectual Property Office, and entitled: "Compound, Organic Optoelectric Device Including the Same and Display Device Including the Optoelectric Device," is incorporated by reference herein in its entirety.

BACKGROUND

1. Field

Embodiments relate to a compound for an organic optoelectric device, an organic optoelectric device including the same, and a display device including the organic optoelectric device.

2. Description of the Related Art

An organic optoelectric device is a device that converts electrical energy into photoenergy, and vice versa.

An organic optoelectric device may be classified as follows in accordance with its driving principles. One type may include a photoelectric device in which excitons generated by photoenergy are separated into electrons and holes, the electrons and holes are transferred to different electrodes respectively, and electrical energy is generated. Another type may include a light emitting device to generate photoenergy from electrical energy by supplying a voltage or a current to electrodes.

Examples of the organic optoelectric device may include an organic photoelectric device, an organic light emitting diode, an organic solar cell, and an organic photo-conductor drum, and the like.

The organic light emitting diode (OLED) has been considered due to an increase in demand for flat panel displays. The organic light emitting diode converts electrical energy into light by applying current to an organic light emitting material, and may have a structure in which an organic layer is interposed between an anode and a cathode. The organic layer may include, e.g., an emission layer and optionally an auxiliary layer. The auxiliary layer may include at least one layer selected from, e.g., a hole injection layer, a hole transport layer, an electron blocking layer, an electron transport layer, an electron injection layer, and a hole blocking layer, in order to help improve efficiency and stability of an organic light emitting diode.

SUMMARY

Embodiments are directed to a compound for an organic optoelectric device, an organic optoelectric device including the same, and a display device including the organic optoelectric device.

The embodiments may be realized by providing a compound for an organic optoelectric device, the compound including a combination of a moiety represented by the following Chemical Formula I and a moiety represented by the following Chemical Formula II:

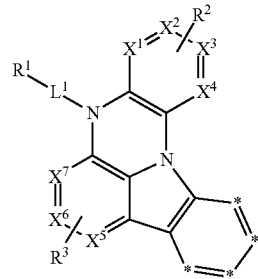

[Chemical Formula I]

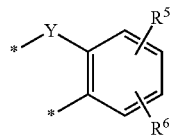

[Chemical Formula II]

wherein, in the above Chemical Formula I and Chemical Formula II, $X^1$ to $X^7$ are each independently $CR^a$ or N, provided that all $X^1$ to $X^7$ are $CR^a$ or one of $X^1$ to $X^7$ is N, Y is O, S, $SO_2$, PO, or $N-L^2-R^4$, two *s of the above Chemical Formula II are bonded with two adjacent *s of the above Chemical Formula I, *s in the above Chemical Formula I that are not bonded with the two *s of the above Chemical Formula II are each independently $CR^b$ or N, $L^1$ and $L^2$ are each independently a single bond, a substituted or unsubstituted C1 to C30 alkylene group, a substituted or unsubstituted C3 to C30 cycloalkylene group, a substituted or unsubstituted C3 to C30 heterocycloalkylene group, a substituted or unsubstituted C6 to C30 arylene group, a substituted or unsubstituted C3 to C30 heteroarylene group, a substituted or unsubstituted C6 to C30 aryleneamine group, a substituted or unsubstituted C6 to C30 heteroaryleneamine group, a substituted or unsubstituted C1 to C30 alkoxylene group, a substituted or unsubstituted C6 to C30 aryloxylene group, a substituted or unsubstituted C2 to C30 alkenylene group, a substituted or unsubstituted C2 to C30 alkynylene group, or a combination thereof, and $R^1$ to $R^6$, $R^a$, and $R^b$ are each independently hydrogen, deuterium, a halogen, a cyano group, a hydroxyl group, an amino group, a substituted or unsubstituted C1 to C20 amine group, a nitro group, a carboxyl group, a ferrocenyl group, a substituted or unsubstituted C1 to C20 alkyl group, a substituted or unsubstituted C6 to C30 aryl group, a substituted or unsubstituted C2 to C30 heteroaryl group, a substituted or unsubstituted C1 to C20 alkoxy group, a substituted or unsubstituted C6 to C20 aryloxy group, a substituted or unsubstituted C3 to C40 silyloxy group, a substituted or unsubstituted C1 to C20 acyl group, a substituted or unsubstituted C2 to C20 alkoxycarbonyl group, a substituted or unsubstituted C2 to C20 acyloxy group, a substituted or unsubstituted C2 to C20 acylamino group, a substituted or unsubstituted C2 to C20 alkoxycarbonylamino group, a substituted or unsubstituted C7 to C20 aryloxycarbonylamino group, a substituted or unsubstituted C1 to C20 sulfamoylamino group, a substituted or unsubstituted C1 to C20 sulfonyl group, a substituted or unsubstituted C1 to C20 alkylthiol group, a substituted or unsubstituted C6 to C20 arylthiol group, a substituted or unsubstituted C1 to C20 heterocyclothiol group, a substituted or unsubstituted C1 to C20 ureide group, a substituted or unsubstituted C3 to C40 silyl group, a substituted or unsubstituted C3 to C40 fused ring-containing group, or a combination thereof.

The embodiments may be realized by providing an organic optoelectric device including an anode and a cathode facing each other, and at least one organic layer between the anode and the cathode, wherein the organic layer includes the compound according to an embodiment.

The embodiments may be realized by providing a display device comprising the organic optoelectric device according to an embodiment.

BRIEF DESCRIPTION OF THE DRAWINGS

Features will be apparent to those of skill in the art by describing in detail exemplary embodiments with reference to the attached drawings in which.

DETAILED DESCRIPTION

Figure 1:
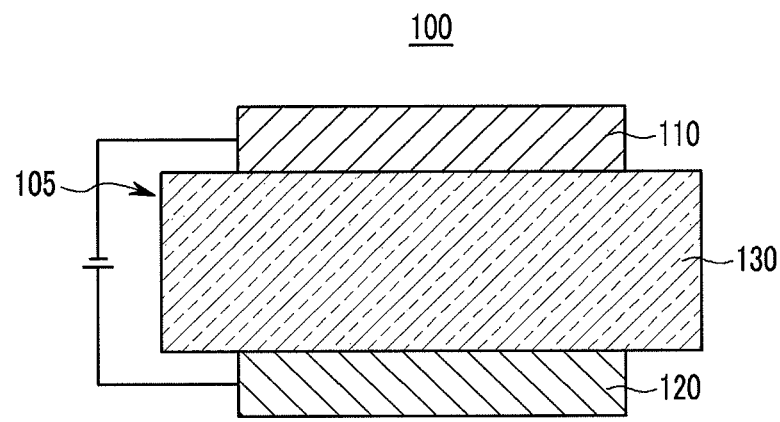
FIGS. 1 and 2 illustrate cross-sectional views showing organic light emitting diodes according to various embodiments.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. Like reference numerals refer to like elements throughout.

In the present specification, a "single bond" indicates a directly-linked bond through no carbon or no hetero atom other than the carbon considering definition of an intermediate linking group, and specifically, when $L^1$ is regarded as the single bond, the $L^1$ does not indicate a methylene bond.

As used herein, when a definition is not otherwise provided, the term "substituted" refers to one substituted with deuterium, a halogen, a hydroxy group, an amino group, a substituted or unsubstituted C1 to C30 amine group, a nitro group, a substituted or unsubstituted C1 to C40 silyl group, a C1 to C30 alkyl group, a C1 to C10 alkylsilyl group, a C3 to C30 cycloalkyl group, a C6 to C30 aryl group, a C1 to C20 alkoxy group, a fluoro group, a C1 to C10 trifluoroalkyl group such as a trifluoromethyl group and the like, or a cyano group, instead of at least one hydrogen of a substituent or a compound.

In the present specification, when specific definition is not otherwise provided, the term "hetero" refers to one including 1 to 3 hetero atoms selected from N, O, S, and P, and remaining carbons in one compound or substituent.

In the present specification, when a definition is not otherwise provided, the term "alkyl group" may refer to an aliphatic hydrocarbon group. The alkyl group may refer to "a saturated alkyl" without any double bond or triple bond.

The alkyl group may be a C1 to C20 alkyl group. More specifically, the alkyl group may be a C1 to C10 alkyl group or a C1 to C6 alkyl group. For example, a C1 to C4 alkyl group includes 1 to 4 carbons in alkyl chain, and may be selected from methyl, ethyl, propyl, iso-propyl, n-butyl, iso-butyl, sec-butyl, and t-butyl.

Specific examples of the alkyl group may be a methyl group, an ethyl group, a propyl group, an isopropyl group, a butyl group, an isobutyl group, a t-butyl group, a pentyl group, a hexyl group, a cyclopropyl group, a cyclobutyl group, a cyclopentyl group, a cyclohexyl group, and the like.

In the present specification, the term "aryl group" refers to a substituent including all element of the cycle having p-orbitals which form conjugation, and may be monocyclic or fused ring polycyclic (i.e., rings sharing adjacent pairs of carbon atoms) functional group.

As used herein, the term "heteroaryl group" may refer to aryl group including 1 to 3 hetero atoms selected from N, O, S, and P, and remaining carbons in an aryl group. The heteroaryl group may be a fused ring where each ring may include the 1 to 3 heteroatoms.

More specifically, the substituted or unsubstituted C6 to C30 aryl group and/or the substituted or unsubstituted C2 to C30 heteroaryl group may be a substituted or unsubstituted phenyl group, a substituted or unsubstituted naphthyl group, a substituted or unsubstituted anthracenyl group, a substituted or unsubstituted phenanthryl group, a substituted or unsubstituted naphthacenyl group, a substituted or unsubstituted pyrenyl group, a substituted or unsubstituted biphenylyl group, a substituted or unsubstituted p-terphenyl group, a substituted or unsubstituted m-terphenyl group, a substituted or unsubstituted chrysenyl group, a substituted or unsubstituted triphenylenyl group, a substituted or unsubstituted perylenyl group, a substituted or unsubstituted fluorenyl group, a substituted or unsubstituted indenyl group, a substituted or unsubstituted furanyl group, a substituted or unsubstituted thiophenyl group, a substituted or unsubstituted pyrrolyl group, a substituted or unsubstituted pyrazolyl group, a substituted or unsubstituted imidazolyl group, a substituted or unsubstituted triazolyl group, a substituted or unsubstituted oxazolyl group, a substituted or unsubstituted thiazolyl group, a substituted or unsubstituted oxadiazolyl group, a substituted or unsubstituted thiadiazolyl group, a substituted or unsubstituted pyridyl group, a substituted or unsubstituted pyrimidinyl group, a substituted or unsubstituted pyrazinyl group, a substituted or unsubstituted triazinyl group, a substituted or unsubstituted benzofuranyl group, a substituted or unsubstituted benzothiophenyl group, a substituted or unsubstituted benzimidazolyl group, a substituted or unsubstituted indolyl group, a substituted or unsubstituted quinolinyl group, a substituted or unsubstituted isoquinolinyl group, a substituted or unsubstituted quinazolinyl group, a substituted or unsubstituted quinoxalinyl group, a substituted or unsubstituted naphthyridinyl group, a substituted or unsubstituted benzoxazinyl group, a substituted or unsubstituted benzothiazinyl group, a substituted or unsubstituted acridinyl group, a substituted or unsubstituted phenazinyl group, a substituted or unsubstituted phenothiazinyl group, a substituted or unsubstituted phenoxazinyl group, a substituted or unsubstituted dibenzofuranyl group, a substituted or unsubstituted dibenzothiophenyl group, a substituted or unsubstituted carbazolyl group, or a combination thereof, but are limited thereto.

In the specification, hole characteristics refer to characteristics that holes formed in the anode are easily injected into the emission layer and transported in the emission layer due to conductive characteristics according to HOMO level. Specifically, it is similar to electron-repelling characteristics.

In addition, electron characteristics refer to characteristics that electrons formed in the cathode are easily injected into the emission layer and transported in the emission layer due to conductive characteristics according to LUMO level. Specifically, it is similar to electron-withdrawing characteristics.

A compound for an organic optoelectric device according to an embodiment may include a combination of a moiety represented by the following Chemical Formula I and a moiety represented by the following Chemical Formula II.

[Chemical Formula I]

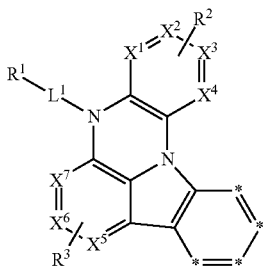

[Chemical Formula II]

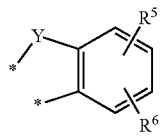

In the above Chemical Formula I and Chemical Formula II, $X^1$ to $X^7$ may be each independently $CR^a$ or N. In an implementation, all $X^1$ to $X^7$ may be $CR^a$ or one of $X^1$ to $X^7$ may be N.

Y may be O, S, $SO_2$ (O=S=O), PO (P=O), or $N-L^2-R^4$.

Two *s of the above Chemical Formula II may be bonded with two adjacent *s of the above Chemical Formula I. The *s in the above Chemical Formula I that are not bonded with the two *s of the above Chemical Formula II may be each independently $CR^b$ or N.

$L^1$ and $L^2$ may be each independently a single bond, a substituted or unsubstituted C1 to C30 alkylene group, a substituted or unsubstituted C3 to C30 cycloalkylene group, a substituted or unsubstituted C3 to C30 heterocycloalkylene group, a substituted or unsubstituted C6 to C30 arylene group, or a substituted or unsubstituted C3 to C30 heteroarylene group, a substituted or unsubstituted C6 to C30 aryleneamine group, a substituted or unsubstituted C6 to C30 heteroaryleneamine group, a substituted or unsubstituted C1 to C30 alkoxylene group, a substituted or unsubstituted C1 to C30 aryloxylene group, a substituted or unsubstituted C2 to C30 alkenylene group, a substituted or unsubstituted C2 to C30 alkynylene group, or a combination thereof.

$R^1$ to $R^6$, $R^a$, and $R^b$ may be each independently hydrogen, deuterium, a halogen, a cyano group, a hydroxyl group, an amino group, a substituted or unsubstituted C1 to C20 amine group, a nitro group, a carboxyl group, a ferrocenyl group, a substituted or unsubstituted C1 to C20 alkyl group, a substituted or unsubstituted C6 to C30 aryl group, a substituted or unsubstituted C2 to C30 heteroaryl group, a substituted or unsubstituted C1 to C20 alkoxy group, a substituted or unsubstituted C6 to C20 aryloxy group, a substituted or unsubstituted C3 to C40 silyloxy group, a substituted or unsubstituted C1 to C20 acyl group, a substituted or unsubstituted C2 to C20 alkoxycarbonyl group, a substituted or unsubstituted C2 to C20 acyloxy group, a substituted or unsubstituted C2 to C20 acylamino group, a substituted or unsubstituted C2 to C20 alkoxycarbonylamino group, a substituted or unsubstituted C7 to C20 aryloxycarbonylamino group, a substituted or unsubstituted C1 to C20 sulfamoylamino group, a substituted or unsubstituted C1 to C20 sulfonyl group, a substituted or unsubstituted C1 to C20 alkylthiol group, a substituted or unsubstituted C6 to C20 arylthiol group, a substituted or unsubstituted C1 to C20 heterocyclothiol group, a substituted or unsubstituted C1 to C20 ureide group, a substituted or unsubstituted C3 to C40 silyl group, a substituted or unsubstituted C3 to C40 fused ring-containing group, or a combination thereof.

In an implementation, the compound for an organic optoelectric device may have a basic structure where dibenzofuran, dibenzothiophene, and/or carbazole are fused with phenazine and thus, may have hole transport capability. For example, the structure may exhibit excellent hole transport capability characteristics and may easily transport holes of a hole transport layer (HTL) and an emission layer. In an implementation, at least of $R^1$ to $R^3$ may be a substituent having electron transport capability, and the compound may have a bipolar structure. Thus, an emission layer formed of or including the compound may have both hole transport capability and electron transport capability and may maximize luminous efficiency.

In an implementation, the compound may be represented by one of the following Chemical Formula I to Chemical Formula 6.

[Chemical Formula 1]

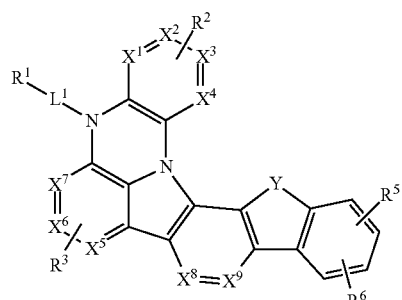

[Chemical Formula 2]

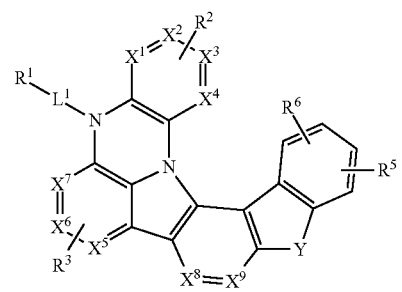

[Chemical Formula 3]

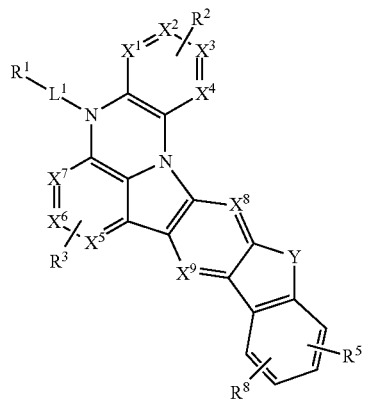

[Chemical Formula 4]

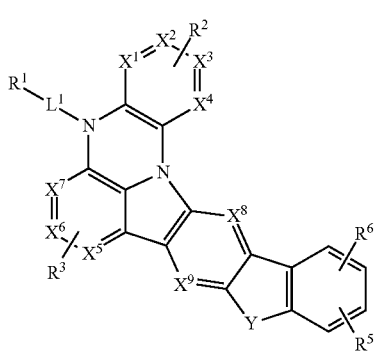

[Chemical Formula 5]

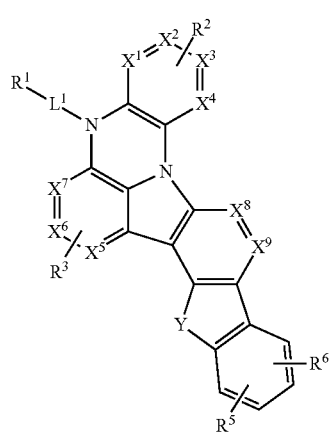

[Chemical Formula 6]

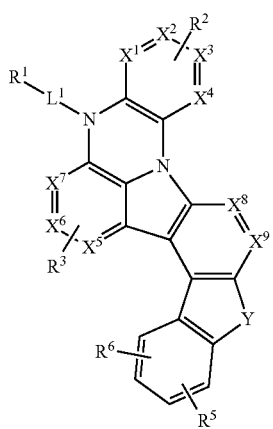

In the above Chemical Formula I to Chemical Formula 6, $X^1$ to $X^9$ may be each independently $CR^a$ or N. In an implementation, all $X^1$ to $X^9$ may be $CR^a$ or one of $X^1$ to $X^9$ may be N. Y may be O, S, $SO_2$ (O=S=O), PO (P=O), or $N-L^2-R^4$.

$L^1$ and $L^2$ may be each independently a single bond, a substituted or unsubstituted C1 to C30 alkylene group, a substituted or unsubstituted C3 to C30 cycloalkylene group, a substituted or unsubstituted C3 to C30 heterocycloalkylene group, a substituted or unsubstituted C6 to C30 arylene group, or a substituted or unsubstituted C3 to C30 heteroarylene group, a substituted or unsubstituted C6 to C30 aryleneamine group, a substituted or unsubstituted C6 to C30 heteroaryleneamine group, a substituted or unsubstituted C1 to C30 alkoxylene group, a substituted or unsubstituted C1 to C30 aryloxylene group, a substituted or unsubstituted C2 to C30 alkenylene group, or a substituted or unsubstituted C2 to C30 alkynylene group, or a combination thereof.

$R^1$ to $R^6$ and $R^a$ may be each independently hydrogen, deuterium, a halogen, a cyano group, a hydroxyl group, an amino group, a substituted or unsubstituted C1 to C20 amine group, a nitro group, a carboxyl group, a ferrocenyl group, a substituted or unsubstituted C1 to C20 alkyl group, a substituted or unsubstituted C6 to C30 aryl group, a substituted or unsubstituted C2 to C30 heteroaryl group, a substituted or unsubstituted C1 to C20 alkoxy group, a substituted or unsubstituted C6 to C20 aryloxy group, a substituted or unsubstituted C3 to C40 silyloxy group, a substituted or unsubstituted C1 to C20 acyl group, a substituted or unsubstituted C2 to C20 alkoxycarbonyl group, a substituted or unsubstituted C2 to C20 acyloxy group, a substituted or unsubstituted C2 to C20 acylamino group, a substituted or unsubstituted C2 to C20 alkoxycarbonylamino group, a substituted or unsubstituted C7 to C20 aryloxycarbonylamino group, a substituted or unsubstituted C1 to C20 sulfamoylamino group, a substituted or unsubstituted C1 to C20 sulfonyl group, a substituted or unsubstituted C1 to C20 alkylthiol group, a substituted or unsubstituted C6 to C20 arylthiol group, a substituted or unsubstituted C1 to C20 heterocyclothiol group, a substituted or unsubstituted C1 to C20 ureide group, a substituted or unsubstituted C3 to C40 silyl group, a substituted or unsubstituted C3 to C40 fused ring-containing group, or a combination thereof.

When the compound (having an appropriate energy level depending on a is used to manufacture an organic optoelectric device, the compound may reinforce hole transport capability or electron transport capability. Thus, excellent effects in terms of efficiency and a driving voltage may be achieved, and excellent electrochemical and thermal stability may be achieved. Thus, life-span characteristics of the organic optoelectric device may be improved.

In an implementation, Y may be O, S, or $N-L^2-R^4$, and $R^1$ and/or $R^4$ may be each independently a functional group of the following Group I.

[Group 1]

-continued

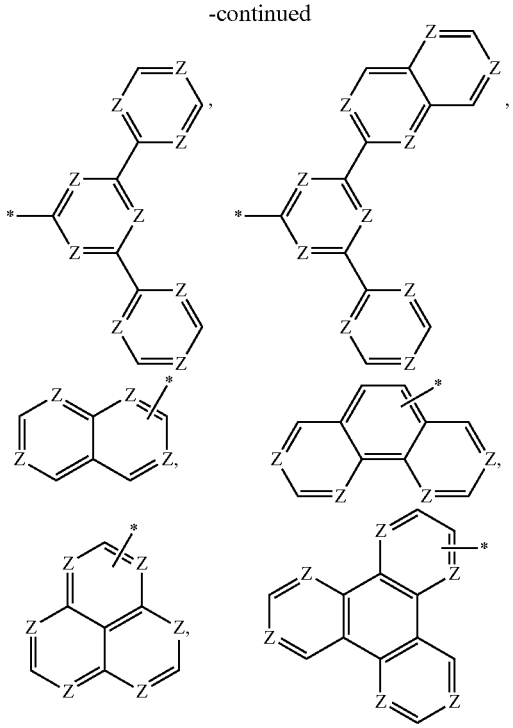

In Group I, each Z may be independently N or CR$^c$.
W may be O, S, SO, SO$_2$, NR', CR'R", or SiR'R".

R$^c$, R', and R" may be each independently hydrogen, deuterium, a substituted or unsubstituted C1 to C30 alkyl group, a substituted or unsubstituted C3 to C30 cycloalkyl group, a substituted or unsubstituted C3 to C30 heterocycloalkyl group, a substituted or unsubstituted C6 to C30 aryl group, a substituted or unsubstituted C3 to C30 heteroaryl group, a substituted or unsubstituted amine group, a substituted or unsubstituted C6 to C30 arylamine group, a substituted or unsubstituted C6 to C30 heteroarylamine group, a substituted or unsubstituted C1 to C30 alkoxy group, a substituted or unsubstituted C2 to C30 alkoxycarbonyl group, a substituted or unsubstituted C2 to C30 alkoxycarbonylamino group, a substituted or unsubstituted C7 to C30 aryloxycarbonylamino group, a substituted or unsubstituted C1 to C30 sulfamoylamino group, a substituted or unsubstituted C2 to C30 alkenyl group, a substituted or unsubstituted C2 to C30 alkynyl group, a substituted or unsubstituted silyl group, a substituted or unsubstituted silyloxy group, a substituted or unsubstituted C1 to C30 acyl group, a substituted or unsubstituted C1 to C20 acyloxy group, a substituted or unsubstituted C1 to C20 acylamino group, a substituted or unsubstituted C1 to C30 sulfonyl group, a substituted or unsubstituted C1 to C30 alkylthiol group, a substituted or unsubstituted C1 to C30 heterocyclothiol group, a substituted or unsubstituted C6 to C30 arylthiol group, a substituted or unsubstituted C1 to C30 heteroarylthiol group, a substituted or unsubstituted C1 to C30 ureide group, a halogen, a halogen-containing group, a cyano group, a hydroxyl group, an amino group, a nitro group, a carboxyl group, a ferrocenyl group, or a combination thereof.

* may be a linking point and may be positioned at one position of an element consisting of the functional group. For example, * may be a binding site. In an implementation, * may be a binding site between the group of Group I and a nitrogen atom, L$^1$, or L$^2$.

In an implementation, R$^1$ and/or R$^4$ may be each independently a substituted or unsubstituted functional group of the following Group II.

[Group II]

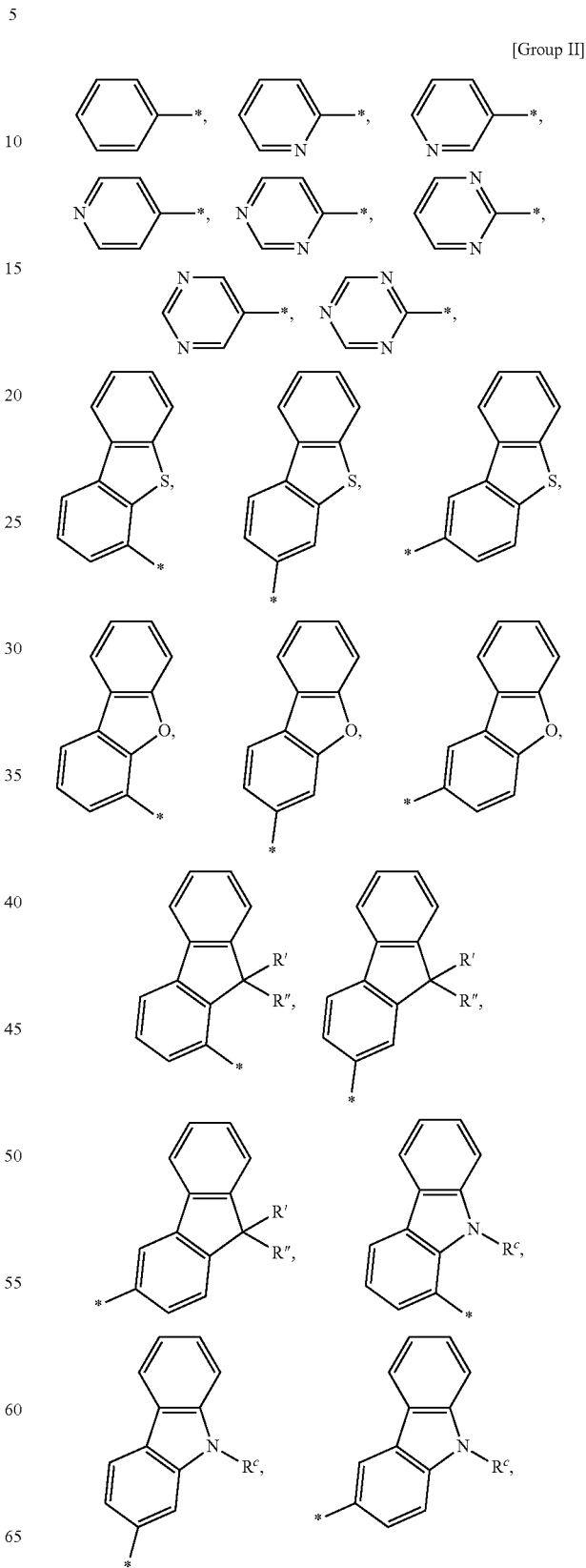

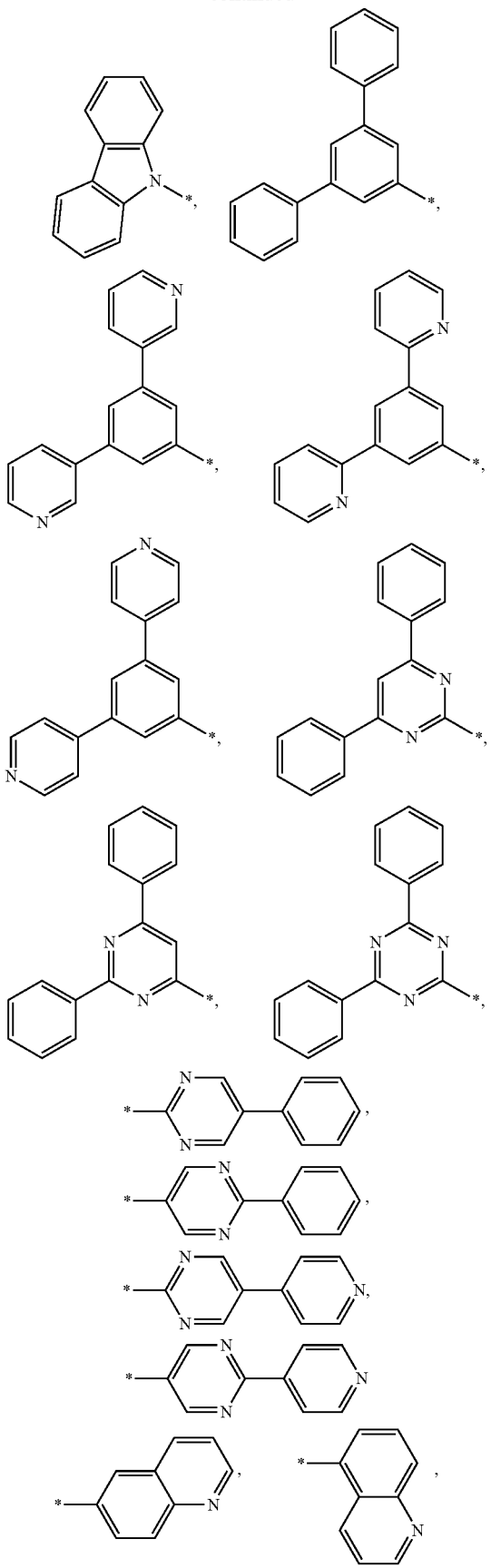
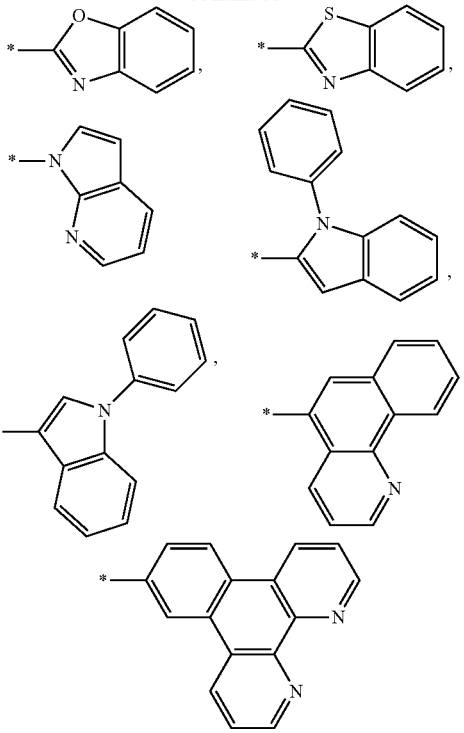

In Group II, $R^C$, R' and R" may be each independently hydrogen, deuterium, a substituted or unsubstituted C1 to C30 alkyl group, a substituted or unsubstituted C3 to C30 cycloalkyl group, a substituted or unsubstituted C3 to C30 heterocycloalkyl group, a substituted or unsubstituted C6 to C30 aryl group, a substituted or unsubstituted C3 to C30 heteroaryl group, a substituted or unsubstituted C2 to C30 alkenyl group, a substituted or unsubstituted C2 to C30 alkynyl group, a substituted or unsubstituted silyl group, a substituted or unsubstituted silyloxy group, a halogen, a halogen-containing group, a cyano group, a hydroxyl group, an amino group, a nitro group, a carboxyl group, a ferrocenyl group, or a combination thereof.

* may be a linking point. For example, * may be a binding site. In an implementation, * may be a binding site between the group of Group II and a nitrogen atom, $L^1$, or $L^2$.

In an implementation, $L^1$ and $L^2$ may be each independently a single bond, a substituted or unsubstituted phenylene group, a substituted or unsubstituted naphthylene group, a substituted or unsubstituted anthracenylene group, or a substituted or unsubstituted biphenylene group.

In an implementation, $X^1$ to $X^7$ of the Chemical Formula I may be each independently $CR^a$ or N (e.g., provided that all $X^1$ to $X^7$ are $CR^a$ or one of $X^1$ to $X^7$ is N), Y may be O, S or N-$L^2$-$R^4$, two *s of the above Chemical Formula II may be bonded with two adjacent *s of the above Chemical Formula I, the *s in the above Chemical Formula I that are not bonded with the two *s of the above Chemical Formula II may be each independently $CR^b$ or N, $L^1$ and $L^2$ may be each independently a single bond, a substituted or unsubstituted C6 to C30 arylene group, or a substituted or unsubstituted C3 to C30 heteroarylene group, and $R^1$ to $R^6$, $R^a$, and $R^b$ may be each independently hydrogen, deuterium, a substituted or unsubstituted C1 to C20 alkyl group, a substituted or unsubstituted C6 to C30 aryl group, or a substituted or unsubstituted C2 to C30 heteroaryl group.

The compound for an organic optoelectric device including a combination of a moiety represented by the Chemical Formula I and a moiety represented by the Chemical Formula II may be represented by one of the following Chemical Formula 7 to Chemical Formula 24.

[Chemical Formula 7]

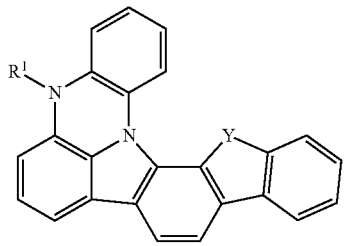

[Chemical Formula 8]

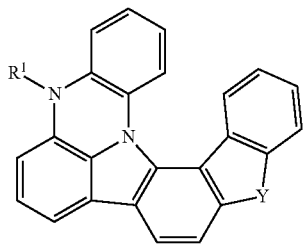

[Chemical Formula 9]

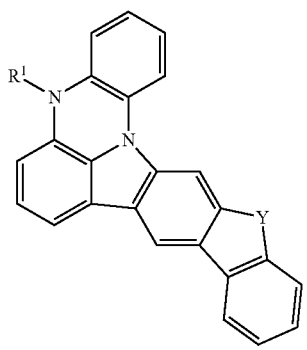

[Chemical Formula 10]

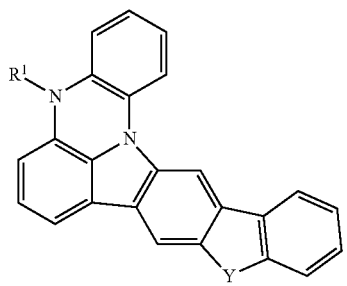

[Chemical Formula 11]

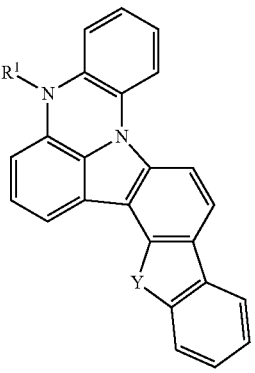

[Chemical Formula 12]

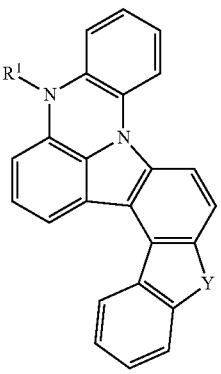

[Chemical Formula 13]

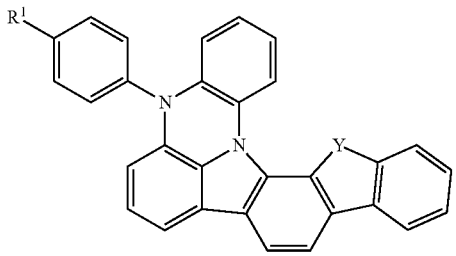

[Chemical Formula 14]

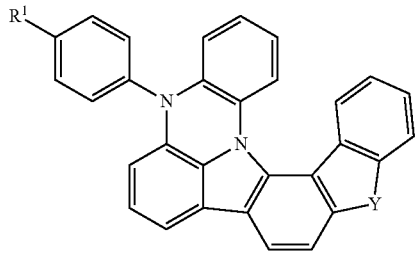

[Chemical Formula 15]

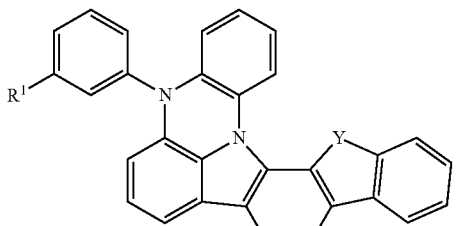

[Chemical Formula 16]
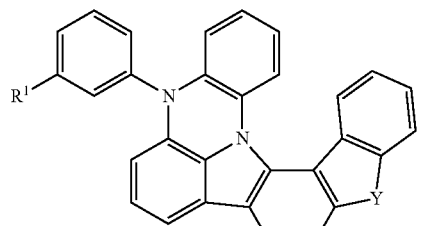
[Chemical Formula 17]
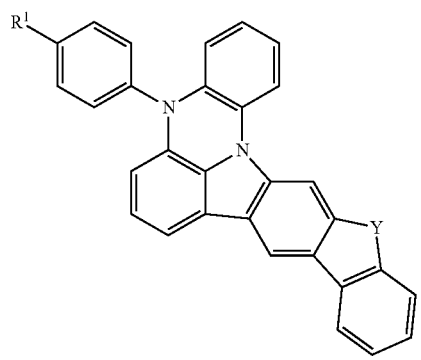
[Chemical Formula 18]
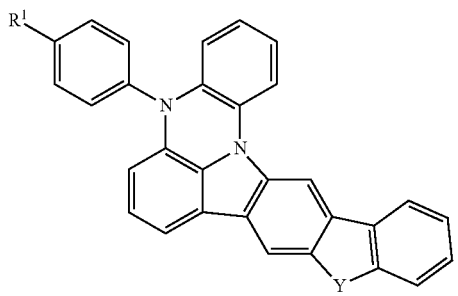
[Chemical Formula 19]
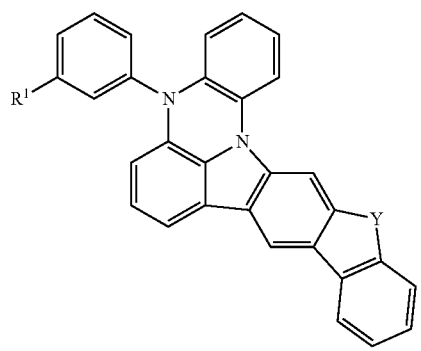
[Chemical Formula 20]
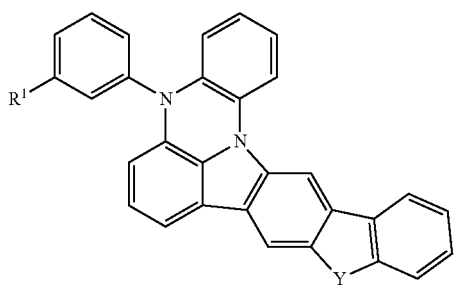
[Chemical Formula 21]
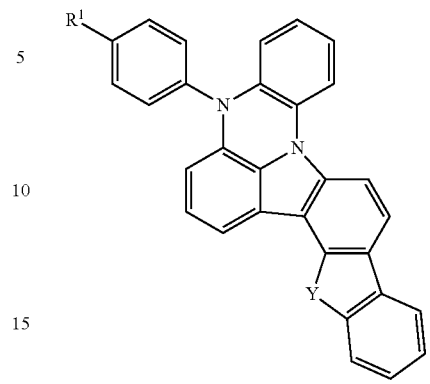
[Chemical Formula 22]
[Chemical Formula 23]
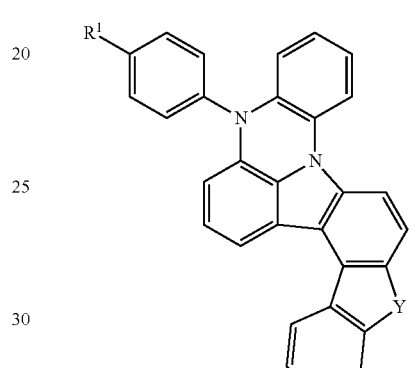
[Chemical Formula 24]
In the above Chemical Formula 7 to Chemical Formula 24, Y may be O, S, or N-$L^2$-$R^4$.

L² may be a single bond, a substituted or unsubstituted C1 to C30 alkylene group, a substituted or unsubstituted C3 to C30 cycloalkylene group, a substituted or unsubstituted C3 to C30 heterocycloalkylene group, a substituted or unsubstituted C6 to C30 arylene group, or a substituted or unsubstituted C3 to C30 heteroarylene group, a substituted or unsubstituted C6 to C30 aryleneamine group, a substituted or unsubstituted C6 to C30 heteroaryleneamine group, a substituted or unsubstituted C1 to C30 alkoxylene group, a substituted or unsubstituted C6 to C30 aryloxylene group, a substituted or unsubstituted C2 to C30 alkenylene group, a substituted or unsubstituted C2 to C30 alkynylene group, or a combination thereof.

$R^1$ and/or $R^4$ may be each independently hydrogen, deuterium, a halogen, a cyano group, a hydroxyl group, an amino group, a substituted or unsubstituted C1 to C20 amine group, a nitro group, a carboxyl group, a ferrocenyl group, a substituted or unsubstituted C1 to C20 alkyl group, a substituted or unsubstituted C6 to C30 aryl group, a substituted or unsubstituted C2 to C30 heteroaryl group, a substituted or unsubstituted C1 to C20 alkoxy group, a substituted or unsubstituted C6 to C20 aryloxy group, a substituted or unsubstituted C3 to C40 silyloxy group, a substituted or unsubstituted C1 to C20 acyl group, a substituted or unsubstituted C2 to C20 alkoxycarbonyl group, a substituted or unsubstituted C2 to C20 acyloxy group, a substituted or unsubstituted C2 to C20 acylamino group, a substituted or unsubstituted C2 to C20 alkoxycarbonylamino group, a substituted or unsubstituted C7 to C20 aryloxycarbonylamino group, a substituted or unsubstituted C1 to C20 sulfamoylamino group, a substituted or unsubstituted C1 to C20 sulfonyl group, a substituted or unsubstituted C1 to C20 alkylthiol group, a substituted or unsubstituted C6 to C20 arylthiol group, a substituted or unsubstituted C1 to C20 heterocyclothiol group, a substituted or unsubstituted C1 to C20 ureide group, a substituted or unsubstituted C3 to C40 silyl group, a substituted or unsubstituted C3 to C40 fused ring-containing group, or a combination thereof.

In an implementation, the compound may be represented by one of the following Chemical Formula 25 to Chemical Formula 54.

[Chemical Formula 25]

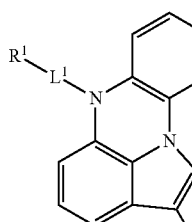

[Chemical Formula 26]

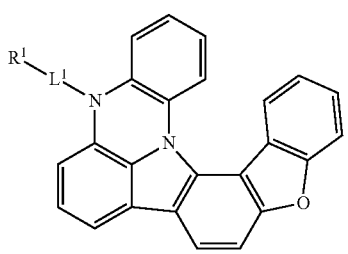

[Chemical Formula 27]

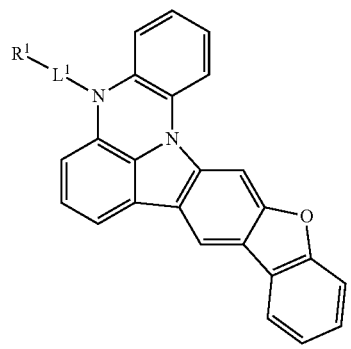

[Chemical Formula 28]

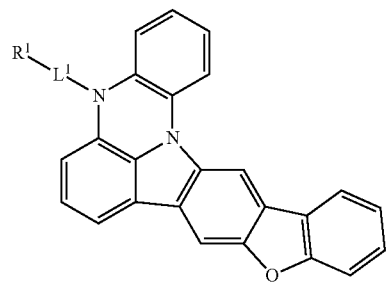

[Chemical Formula 29]

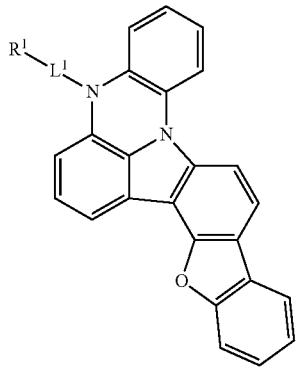

[Chemical Formula 30]

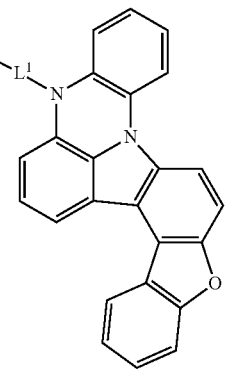

[Chemical Formula 31]
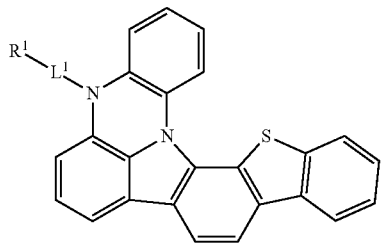
[Chemical Formula 32]
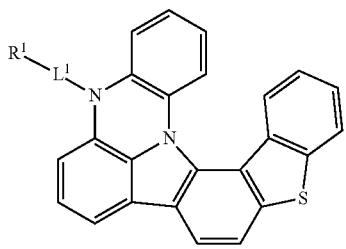
[Chemical Formula 33]
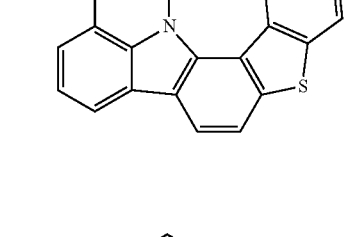
[Chemical Formula 34]
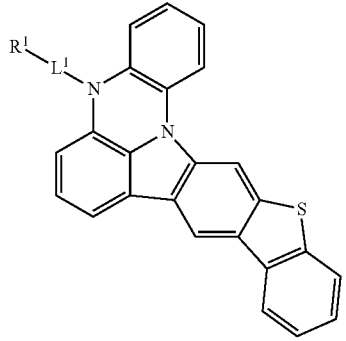
[Chemical Formula 35]
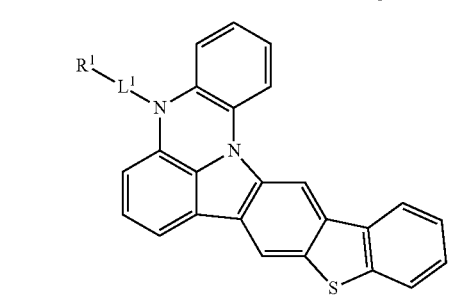
[Chemical Formula 36]
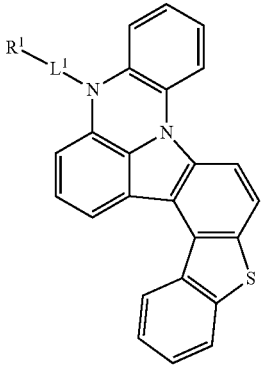
[Chemical Formula 37]
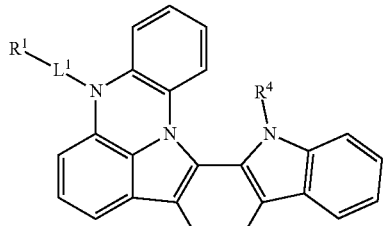
[Chemical Formula 38]
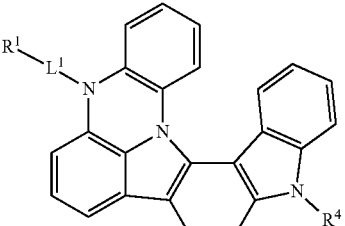
[Chemical Formula 39]
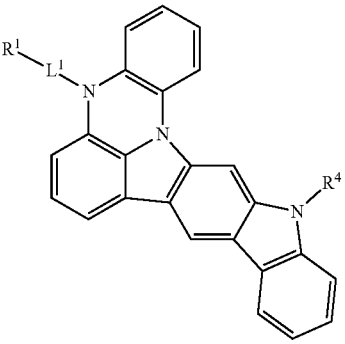
[Chemical Formula 40]
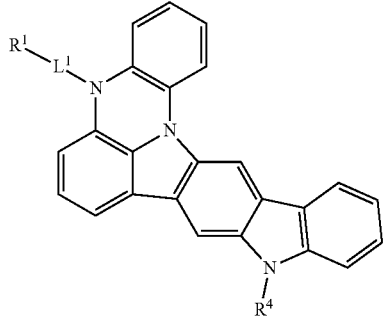

[Chemical Formula 41]
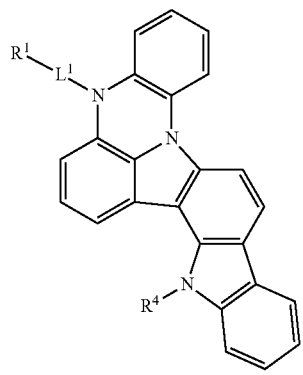
[Chemical Formula 42]
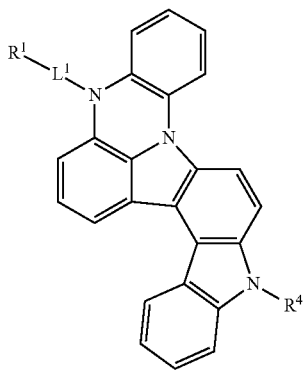
[Chemical Formula 43]
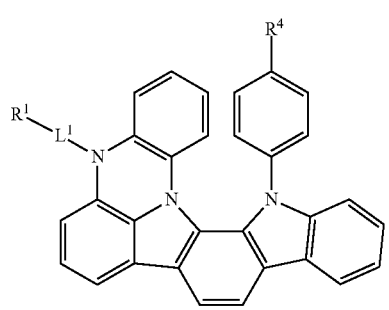
[Chemical Formula 44]
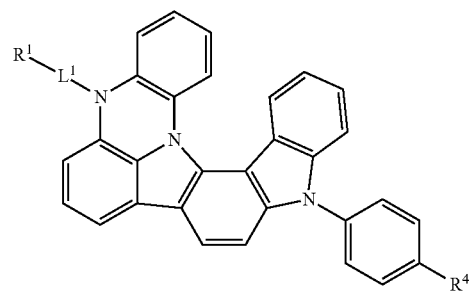
[Chemical Formula 45]
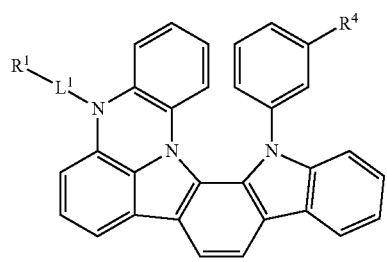
[Chemical Formula 46]
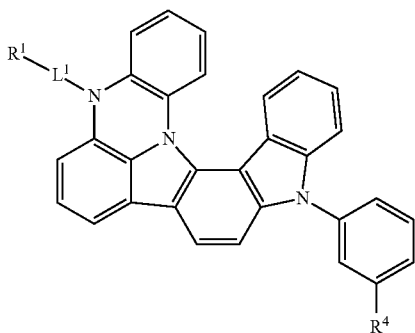
[Chemical Formula 47]
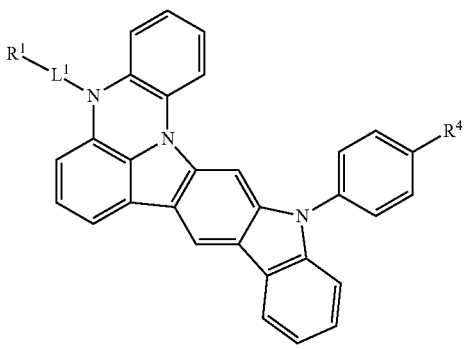
[Chemical Formula 48]
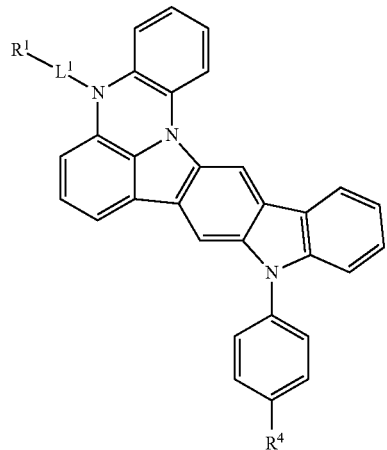

[Chemical Formula 49]

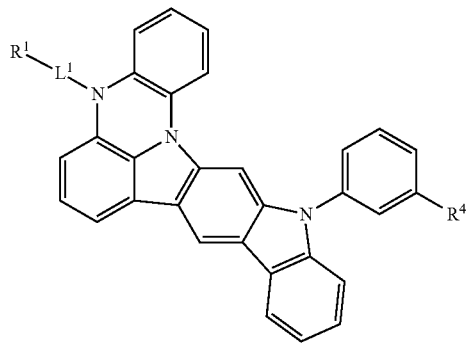

[Chemical Formula 50]

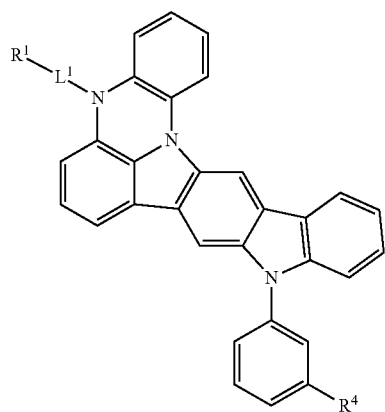

[Chemical Formula 51]

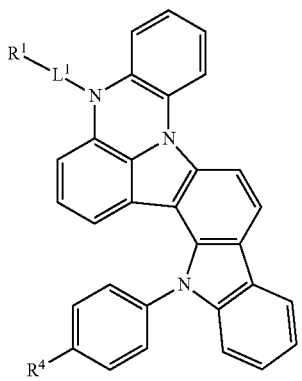

[Chemical Formula 52]

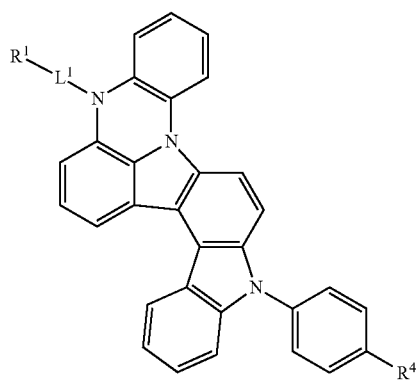

[Chemical Formula 53]

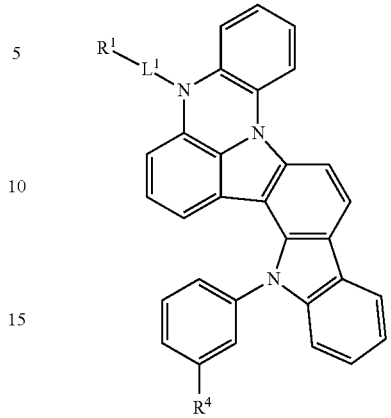

[Chemical Formula 54]

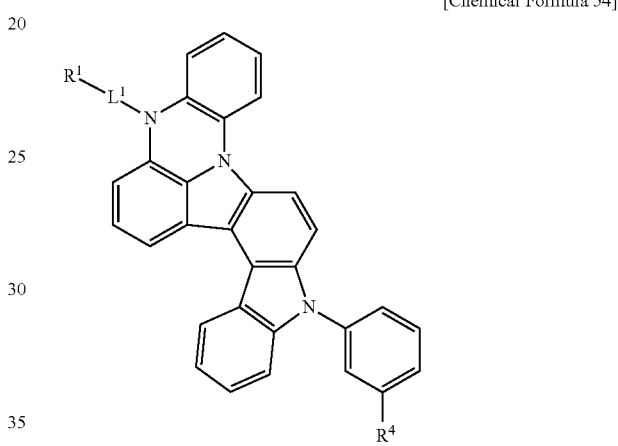

In the above Chemical Formula 25 to Chemical Formula 54, $L^1$ may be a single bond, a substituted or unsubstituted C6 to C30 arylene group, or a substituted or unsubstituted C3 to C30 heteroarylene group.

$R^1$ and/or $R^4$ may be each independently hydrogen, deuterium, a substituted or unsubstituted C1 to C20 alkyl group, a substituted or unsubstituted C6 to C30 aryl group, or a substituted or unsubstituted C2 to C30 heteroaryl group.

In an implementation, Y may be O, S or N-$L^2$-$R^4$, $L^1$ and $L^2$ may be each independently a single bond, a substituted or unsubstituted C6 to C30 arylene group, or a substituted or unsubstituted C3 to C30 heteroarylene group, and $R^1$ to $R^6$, $R^a$, and $R^b$ may be each independently hydrogen, deuterium, a substituted or unsubstituted C1 to C20 alkyl group, a substituted or unsubstituted C6 to C30 aryl group, or a substituted or unsubstituted C2 to C30 heteroaryl group.

In an implementation, $R^1$ and/or $R^4$ may be each independently a substituted or unsubstituted phenyl group, a substituted or unsubstituted biphenyl group, a substituted or unsubstituted fluorene group, a substituted or unsubstituted pyridyl group, a substituted or unsubstituted pyrimidinyl group, a substituted or unsubstituted triazinyl group, a substituted or unsubstituted dibenzofuranyl group, a substituted or unsubstituted dibenzothiophenyl group, or a substituted or unsubstituted carbazolyl group.

In an implementation, the $L^1$ and $L^2$ may be each independently a single bond, a substituted or unsubstituted phenylene group, a substituted or unsubstituted biphenylene group, a substituted or unsubstituted fluorenylene group, a substituted or unsubstituted pyridylene group, a substituted or unsubstituted pyrimidinylene group, a substituted or unsubstituted triazinylene group, a substituted or unsubstituted dibenzofuranylene group, a substituted or unsubstituted dibenzothiophenylene group, a substituted or unsubstituted carbazolylene group, $R^1$ to $R^6$, $R^a$, and $R^b$ may be each independently hydrogen, deuterium, a substituted or unsubstituted phenyl group, a substituted or unsubstituted biphenyl group, a substituted or unsubstituted fluorenyl group, a substituted or unsubstituted pyridyl group, a substituted or unsubstituted pyrimidinyl group, a substituted or unsubstituted triazinyl group, a substituted or unsubstituted dibenzofuranyl group, a substituted or unsubstituted dibenzothiophenyl group, or a substituted or unsubstituted carbazolyl group.

Examples of the compound according to an embodiment may include any of the following Compounds 1-719.

1

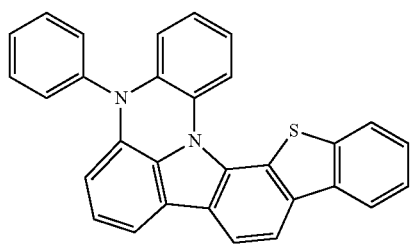

2

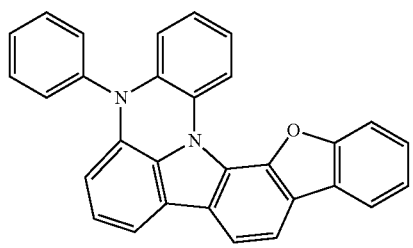

3

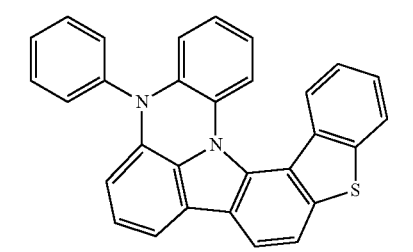

4

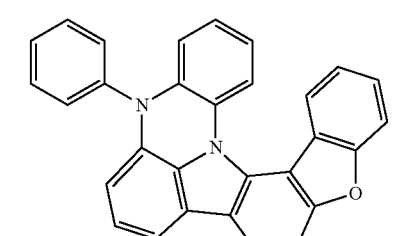

5

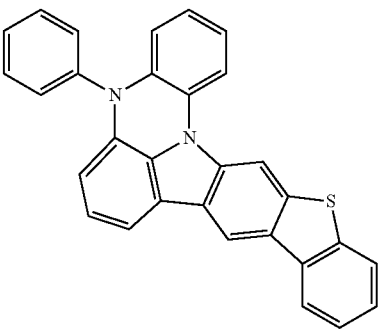

6

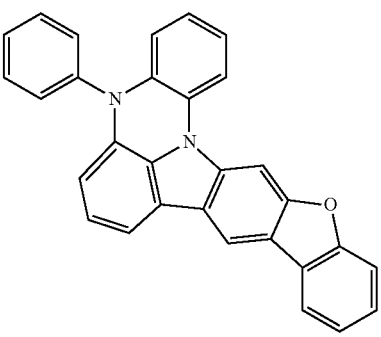

7

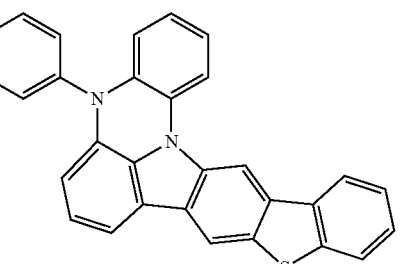

8

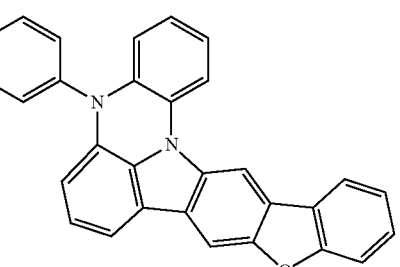

9

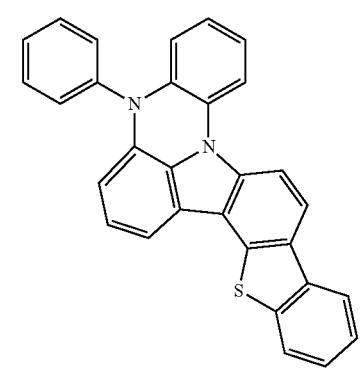

-continued
10
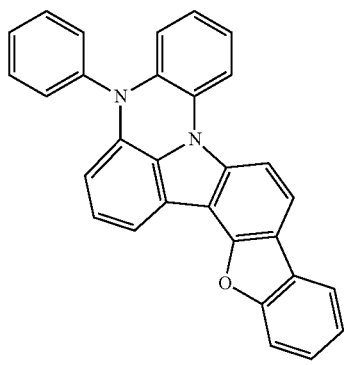
11
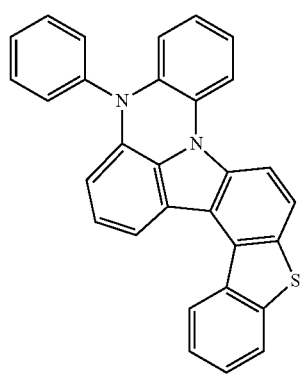
12
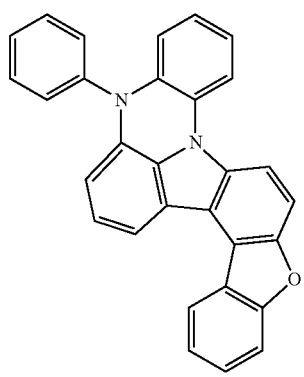
13
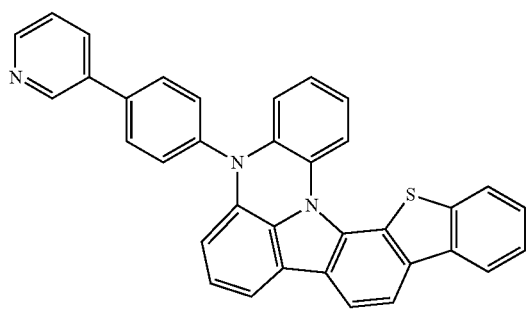
-continued
14
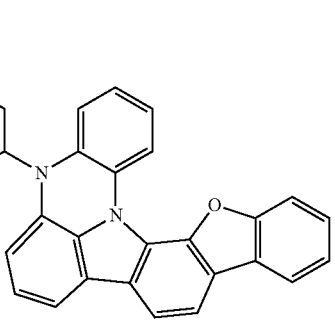
15
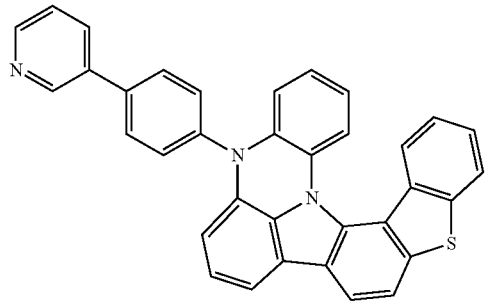
16
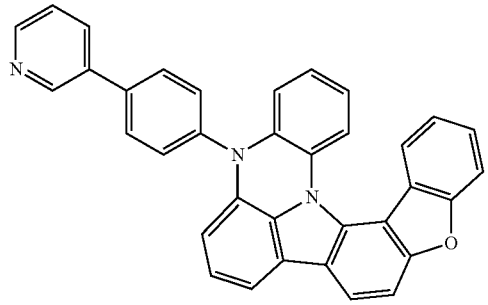
17
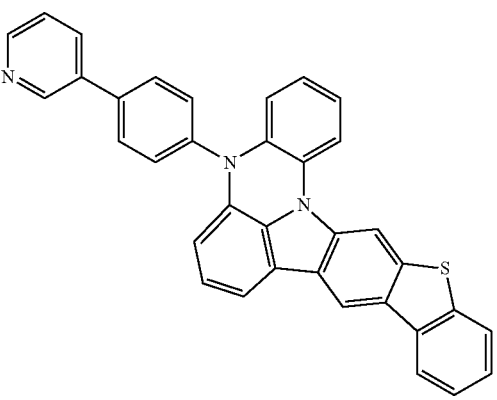

-continued
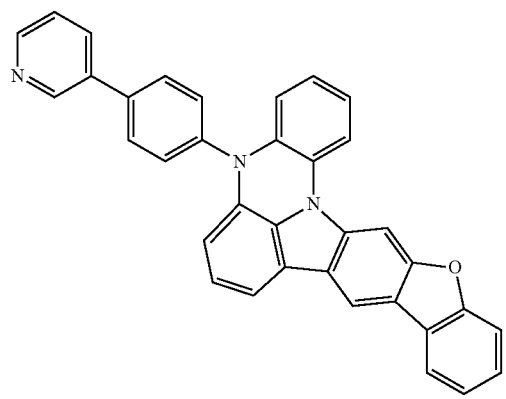
18
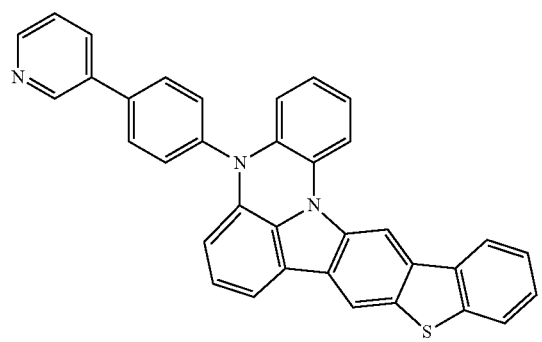
19
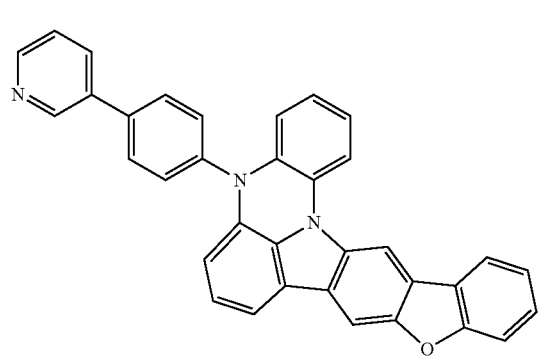
20
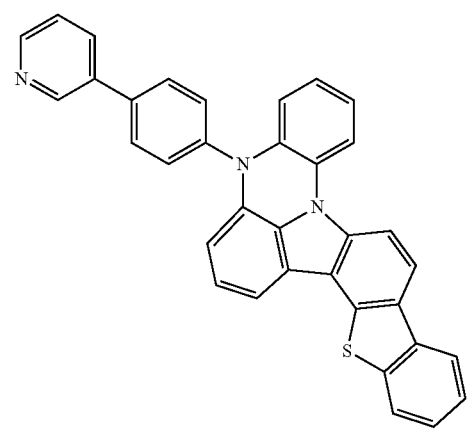
21
-continued
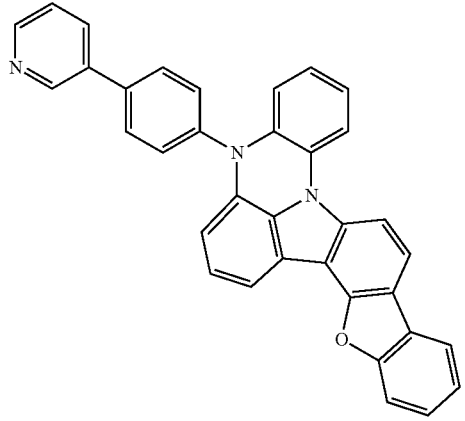
22
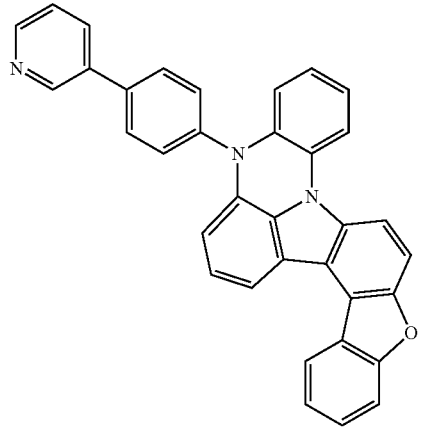
23
24

-continued
25
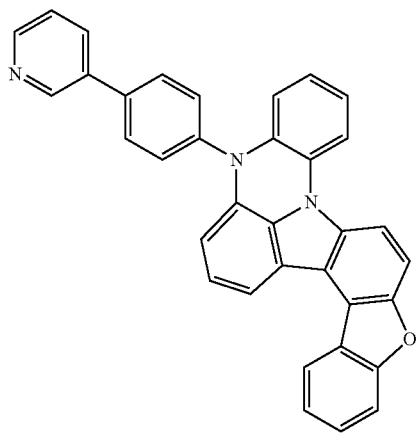
26
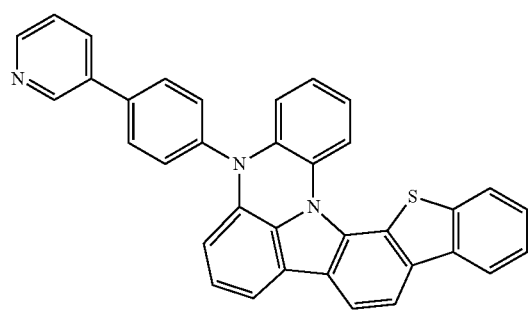
27
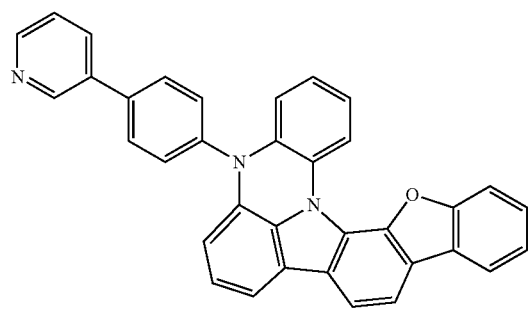
28
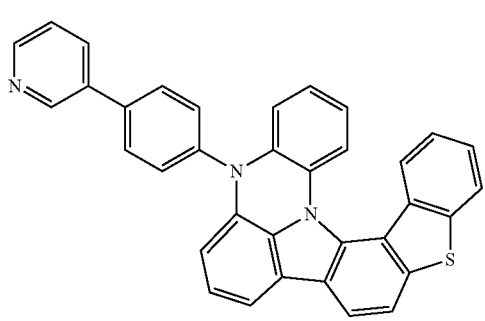
-continued
29
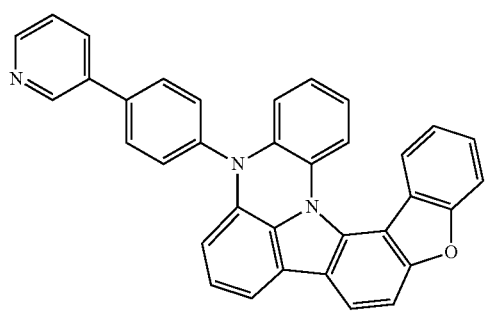
30
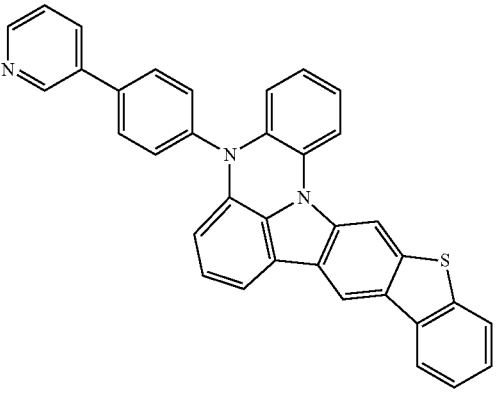
31
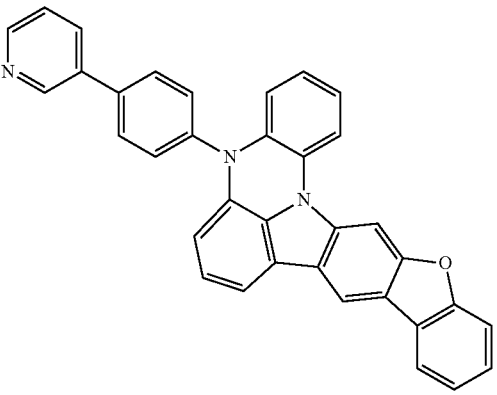
32
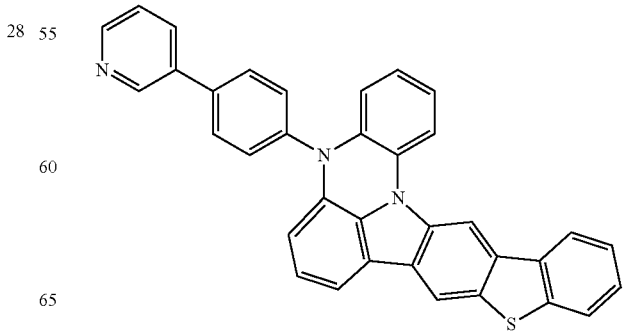

33
-continued
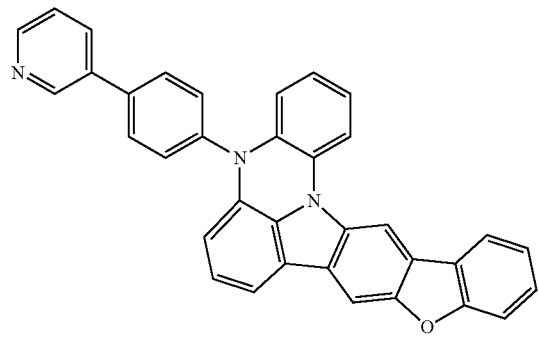
33
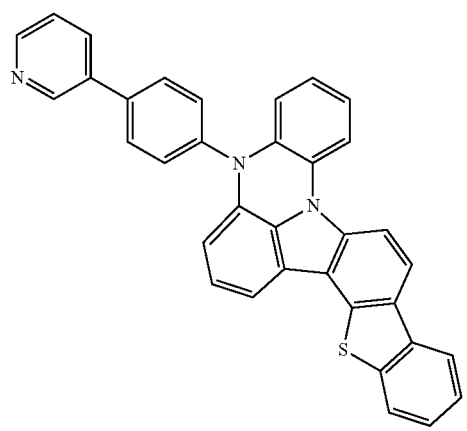
34
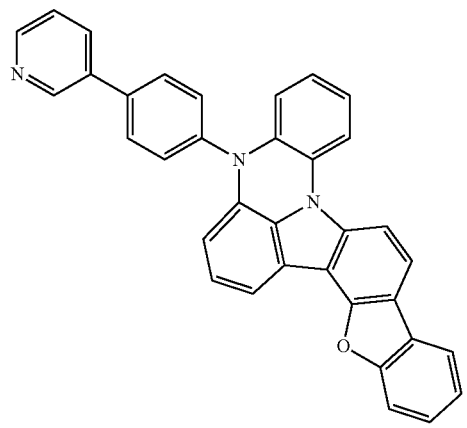
35
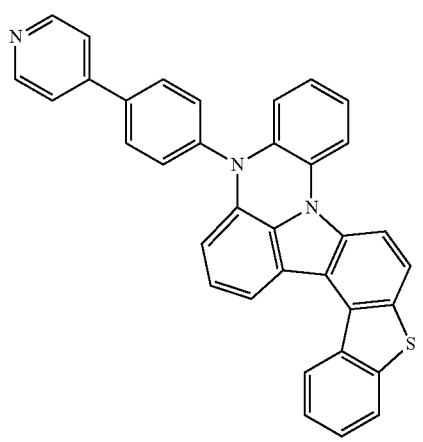
36
34
-continued
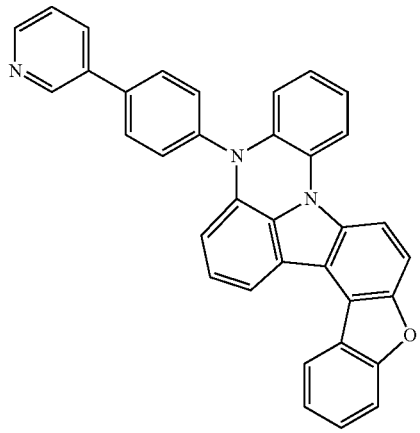
37
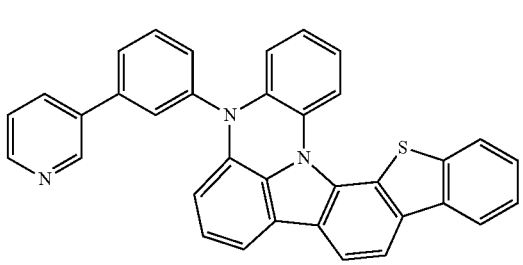
38
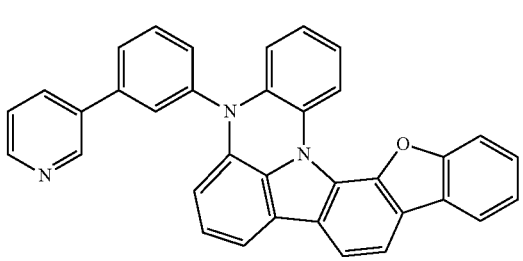
39
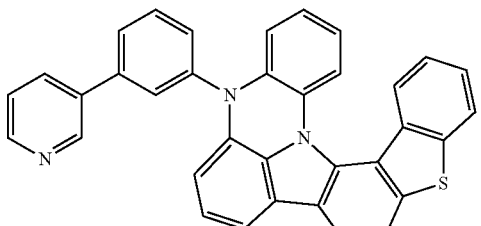
40
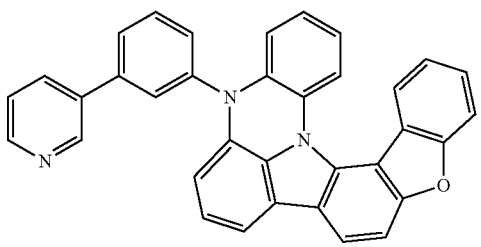
41

42
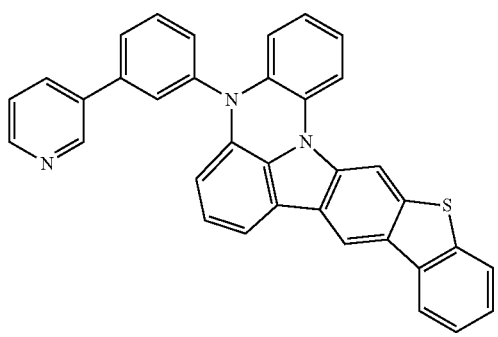
43
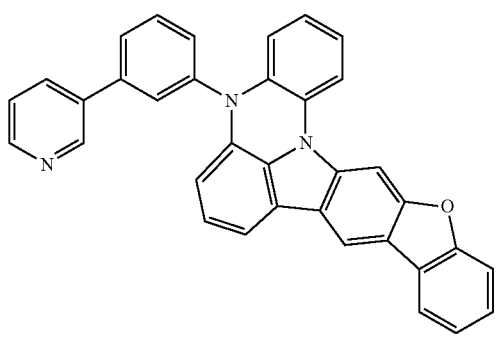
44
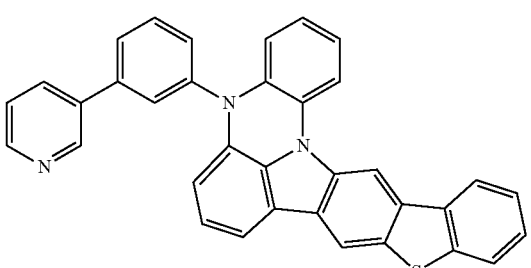
45
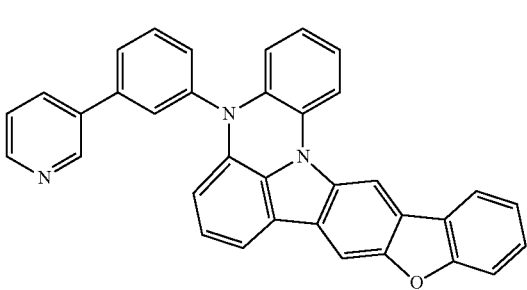
46
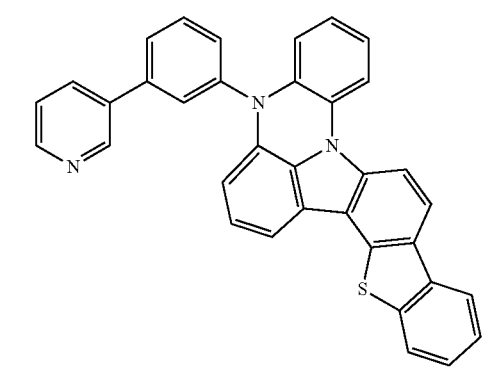
47
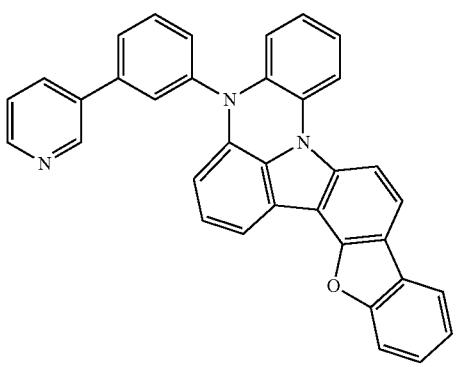
48
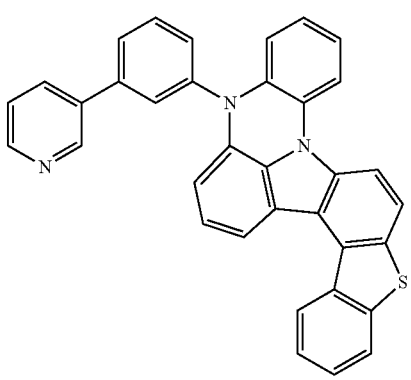
49
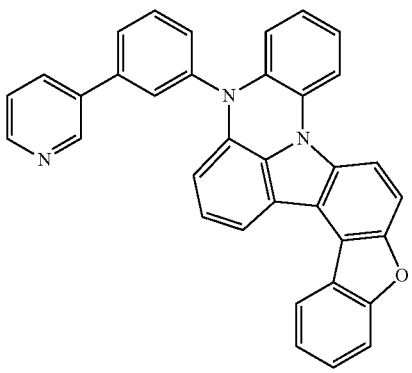
50
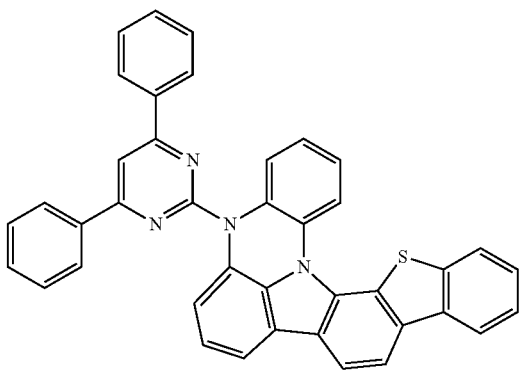

-continued
51
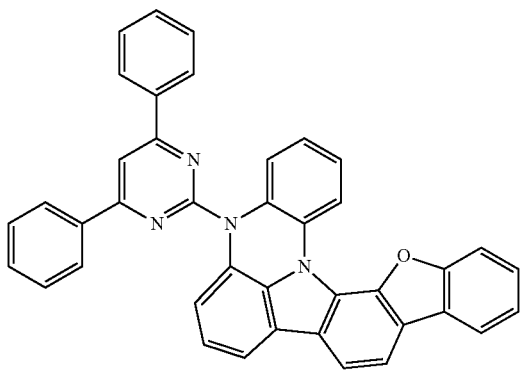
52
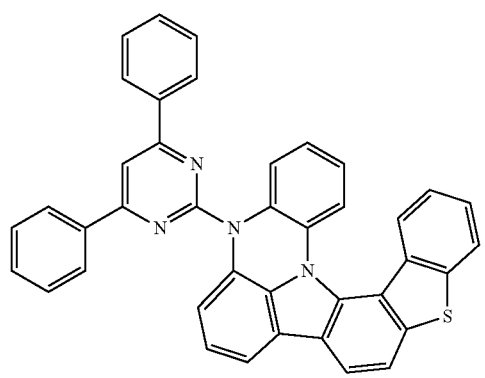
53
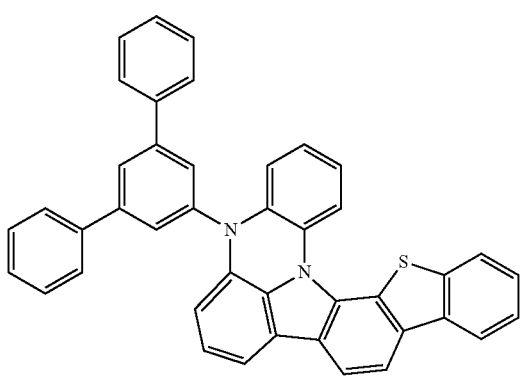
54
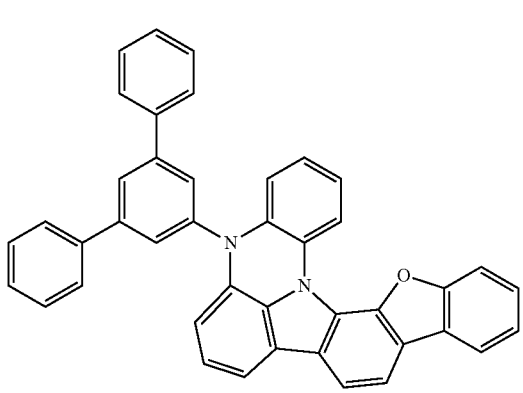
-continued
55
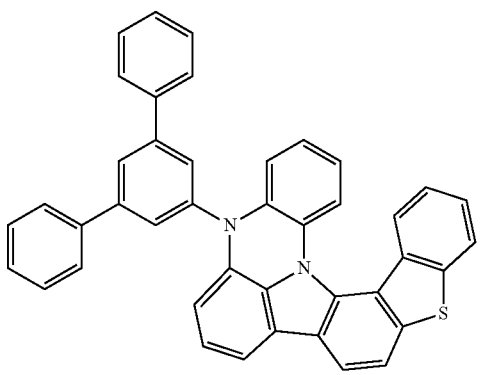
56
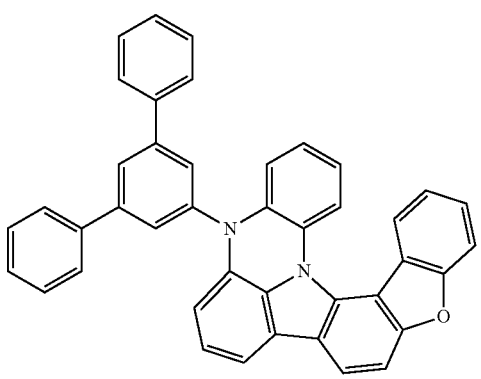
57
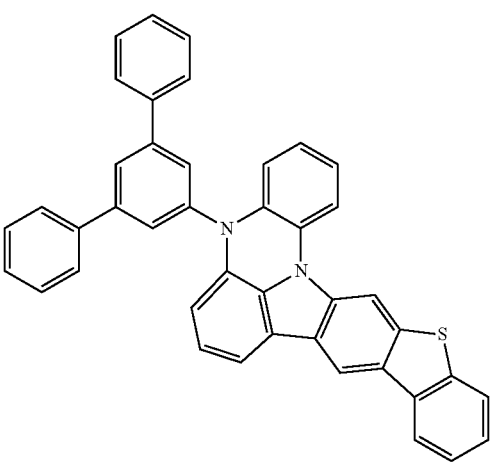

58
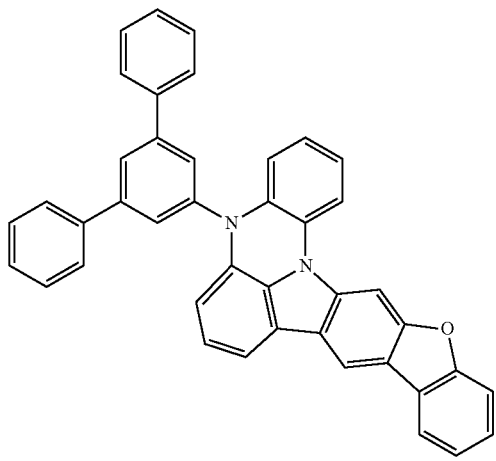
59
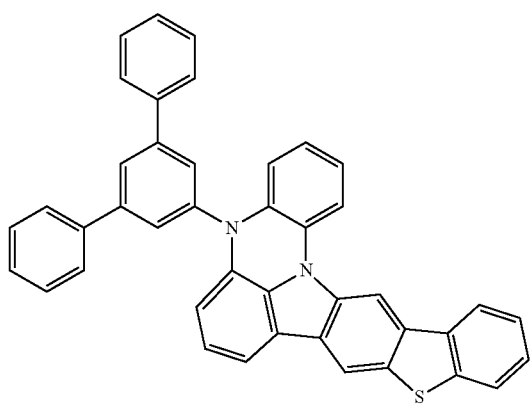
60
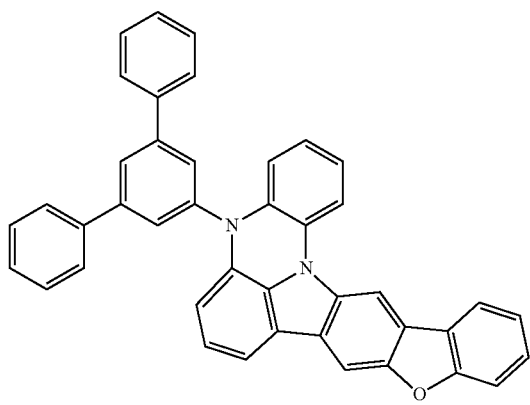
61
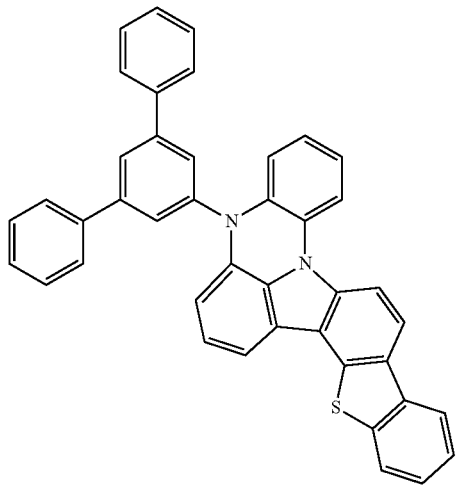
62
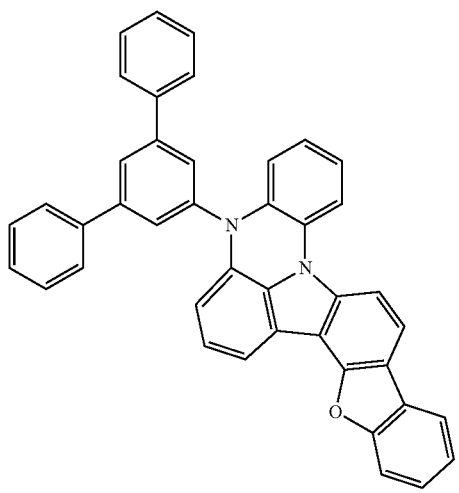
63
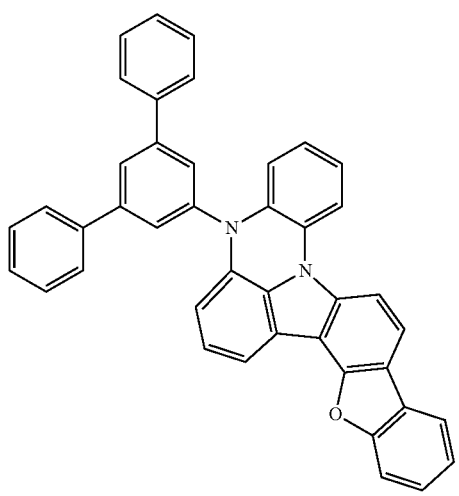

64
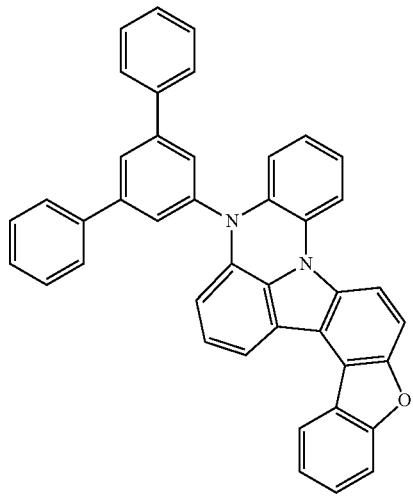
65
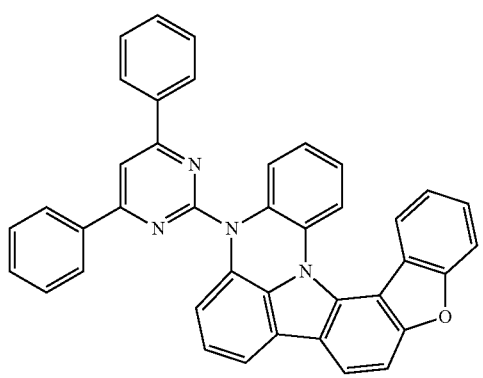
66
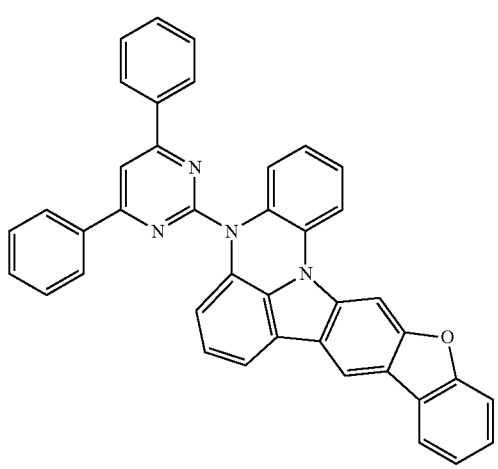
67
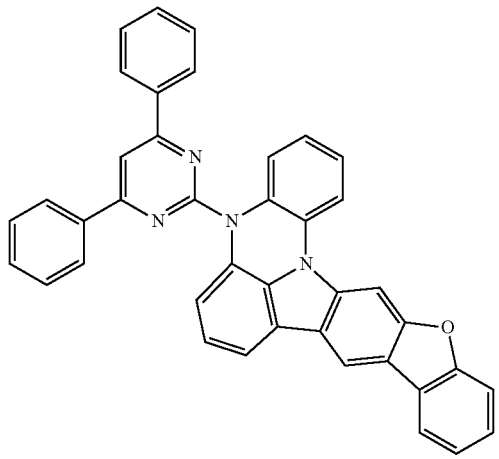
68
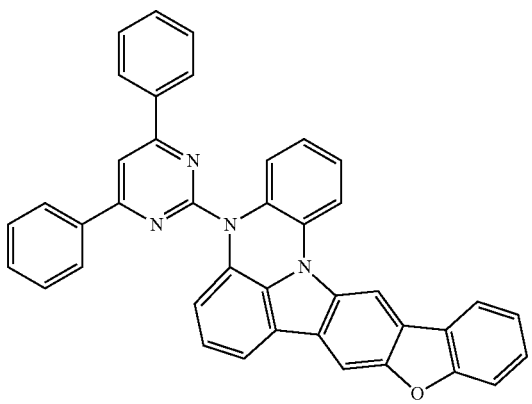
69
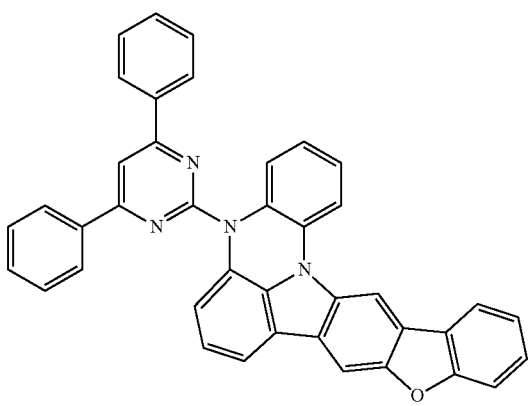

43
-continued
70
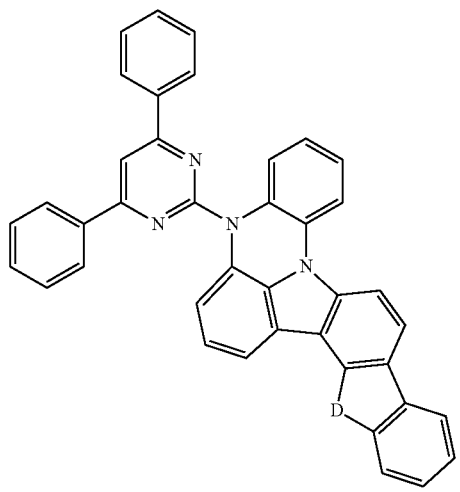
71
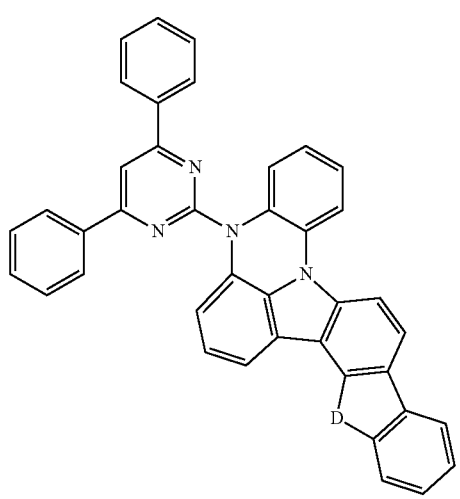
72
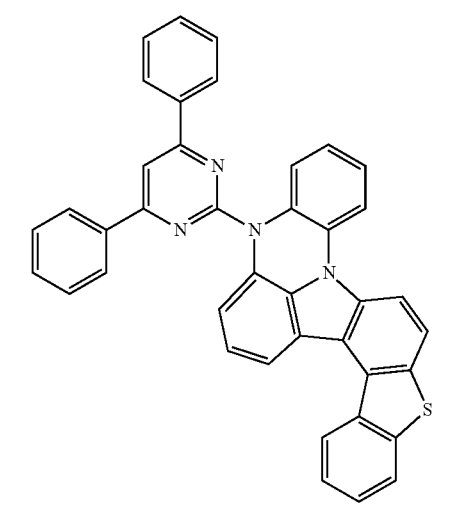
44
-continued
73
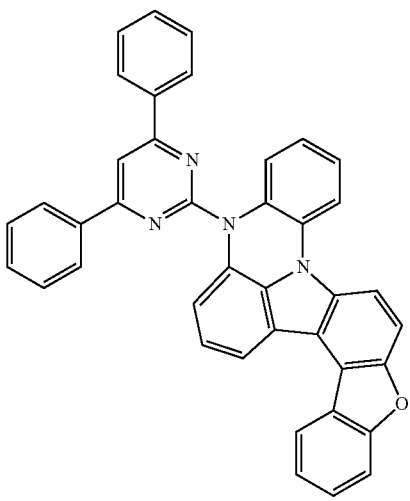
74
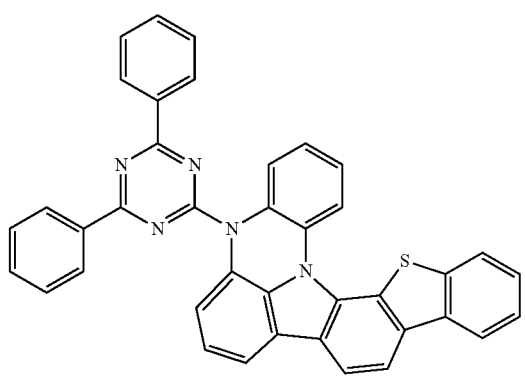
75
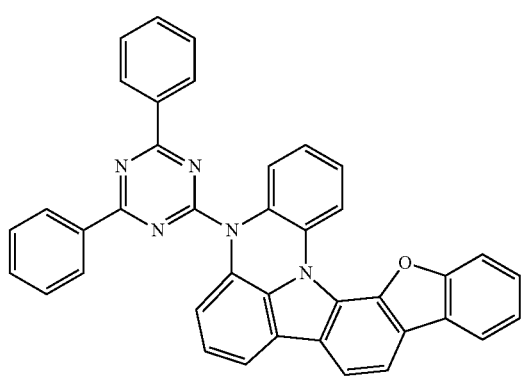
76
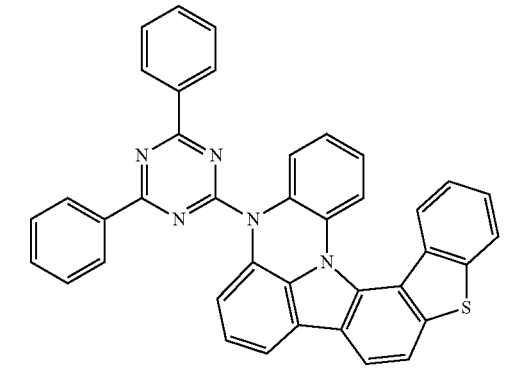

77
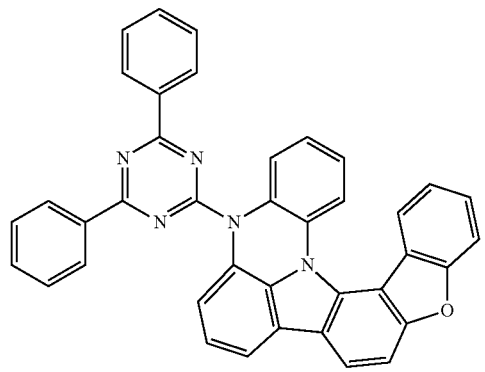
78
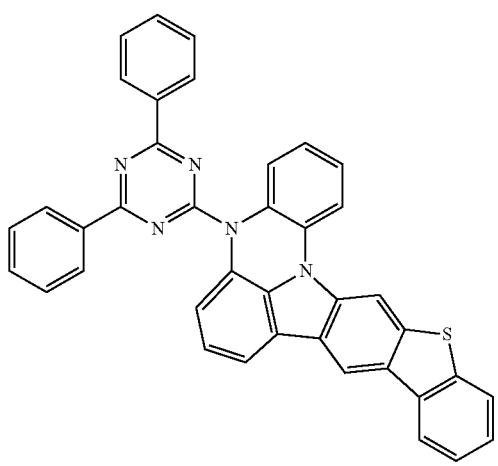
79
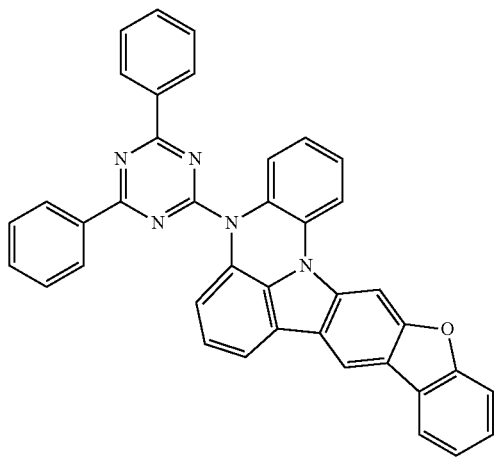
80
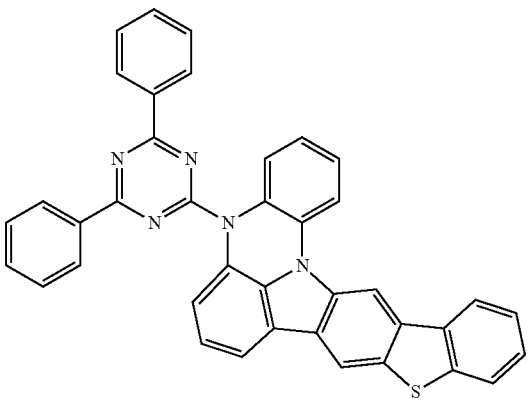
81
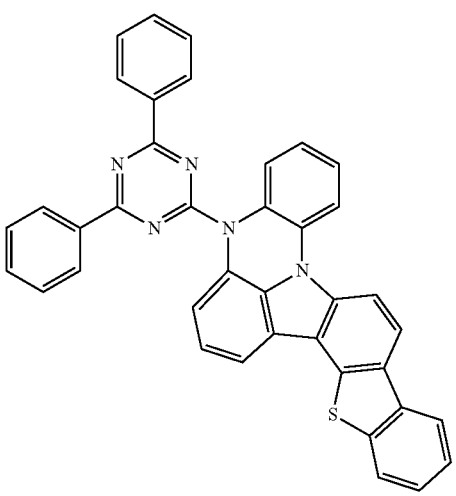
82

83
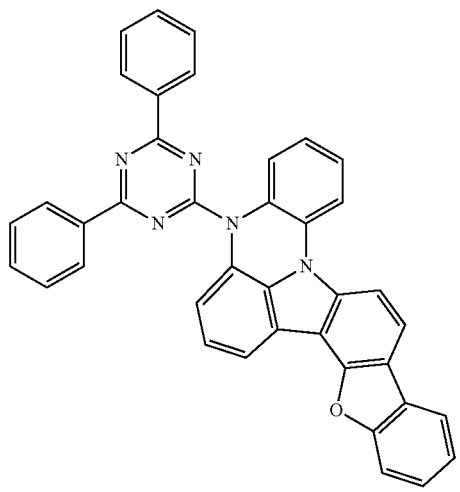
84
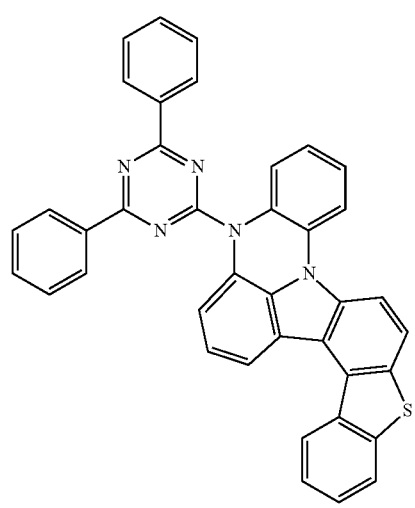
85
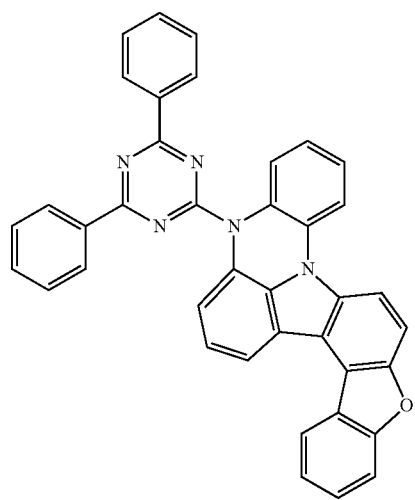
86
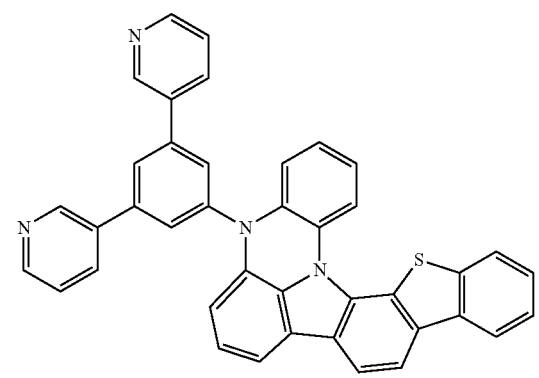
87
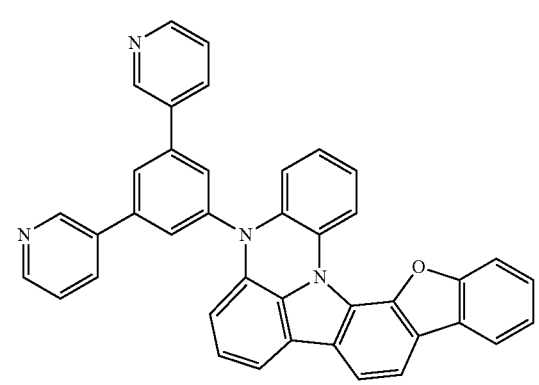
88
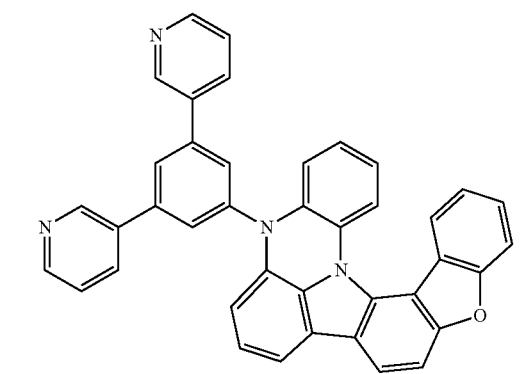
89
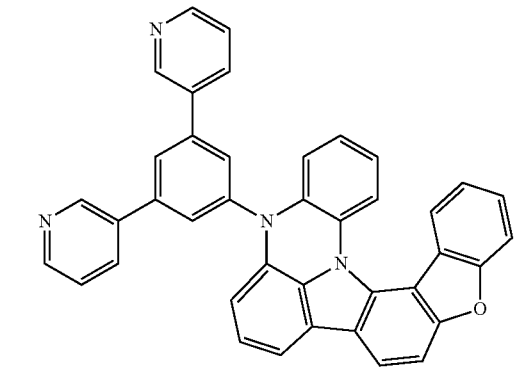

-continued
90
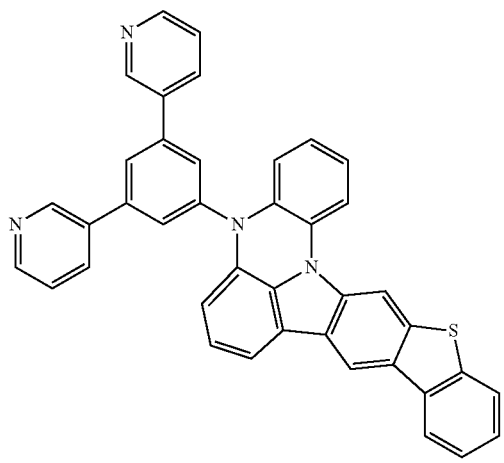
91
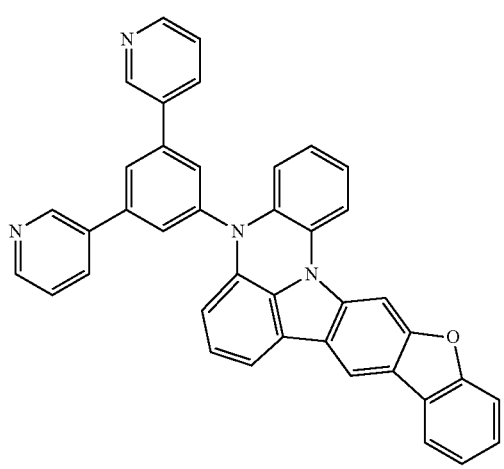
92
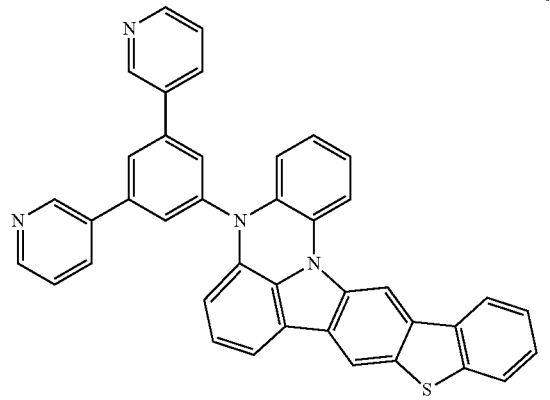
93
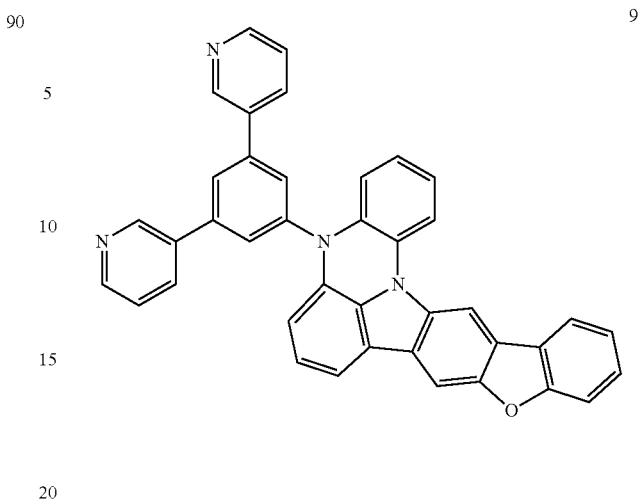
94
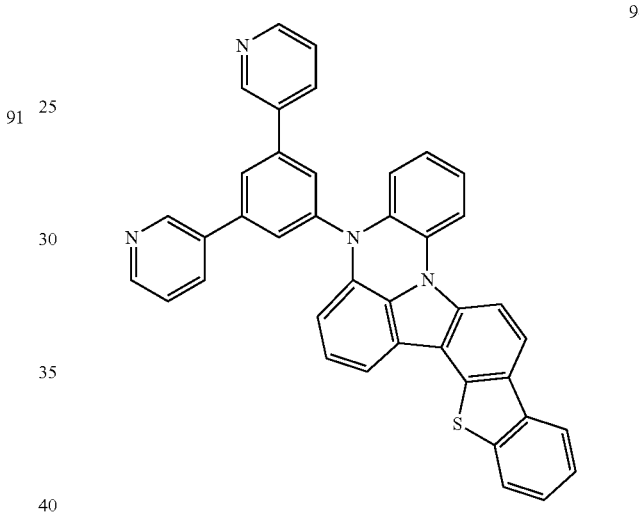
95
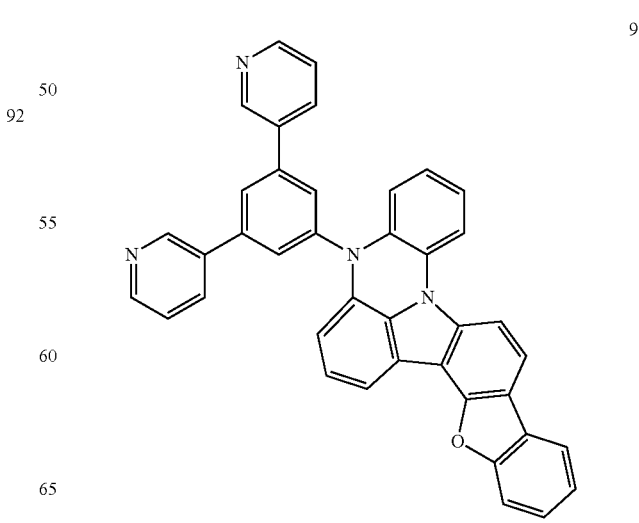

US 9,543,528 B2
51
-continued
96
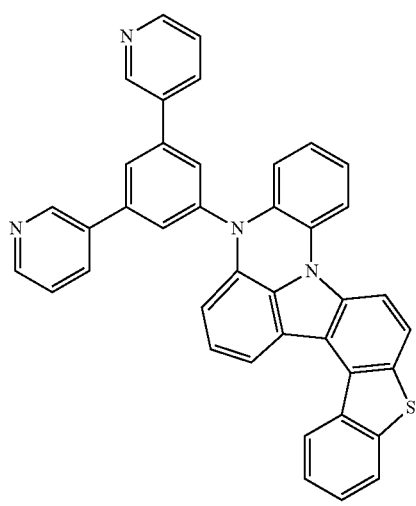
97
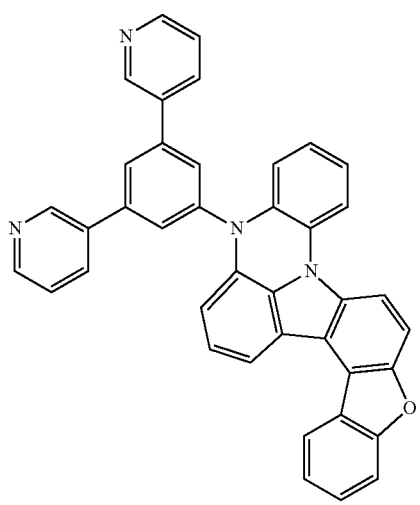
98
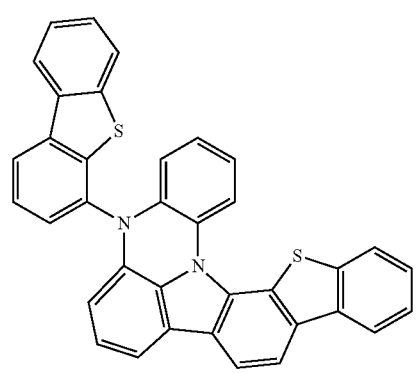
52
-continued
99
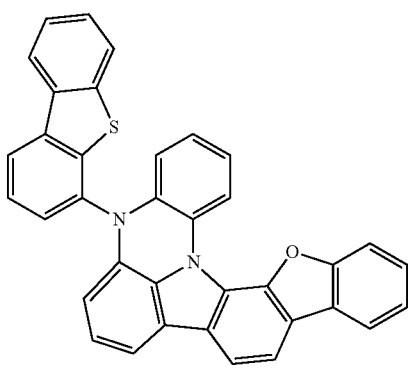
100
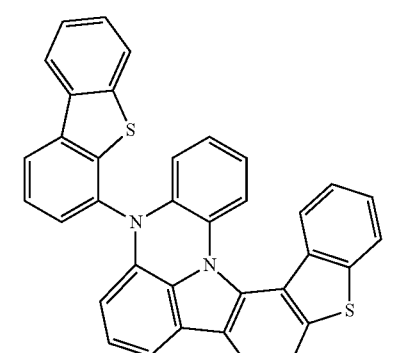
101
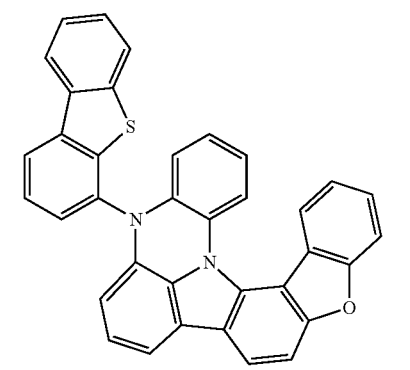
102
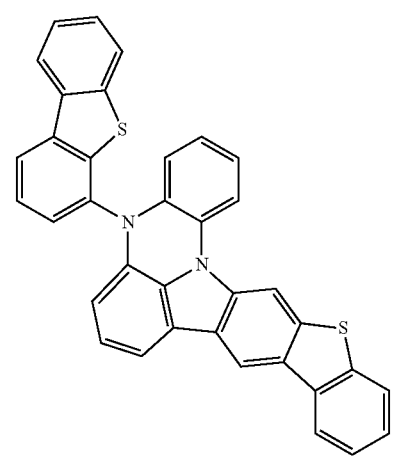

-continued
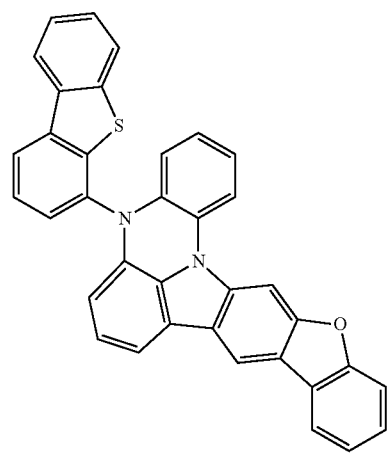
103
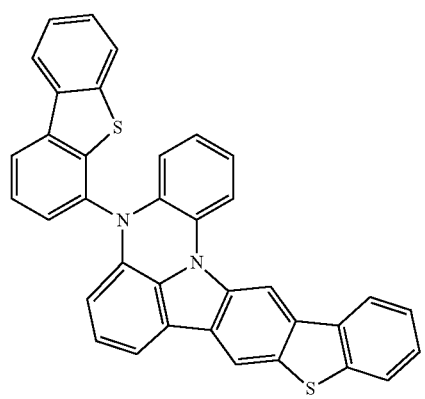
104
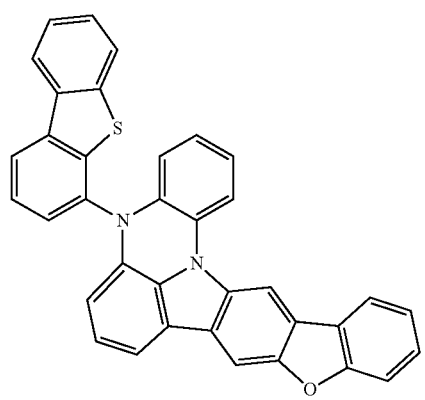
105
-continued
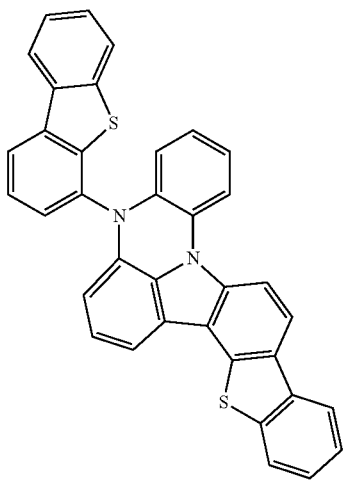
106
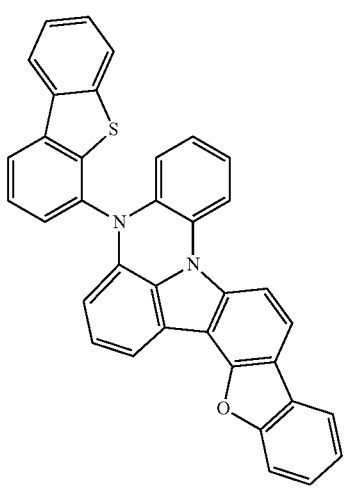
107
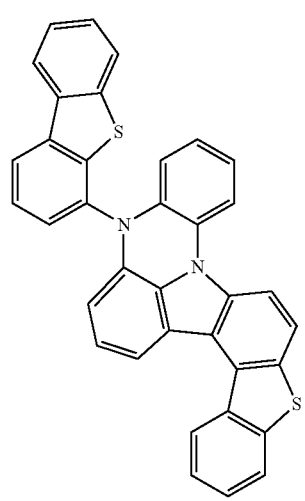
108

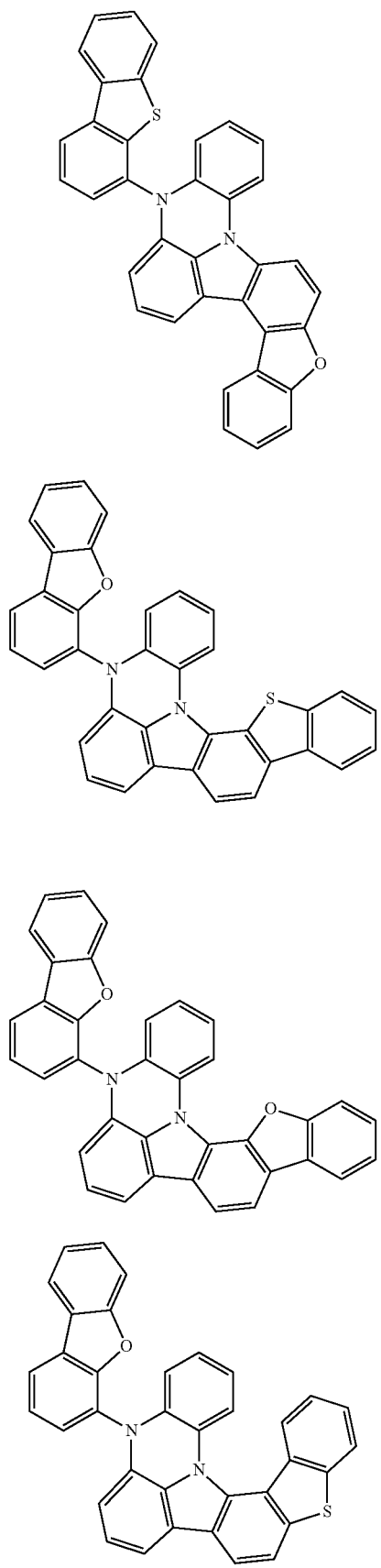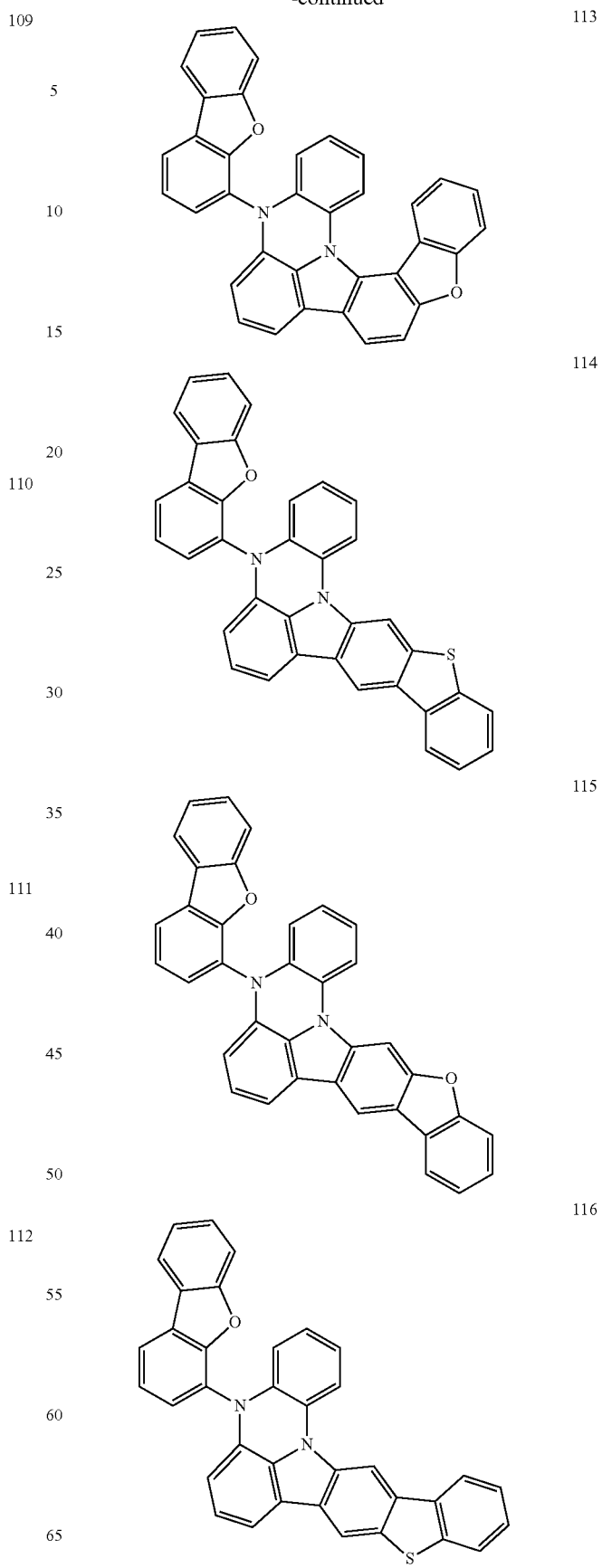

117
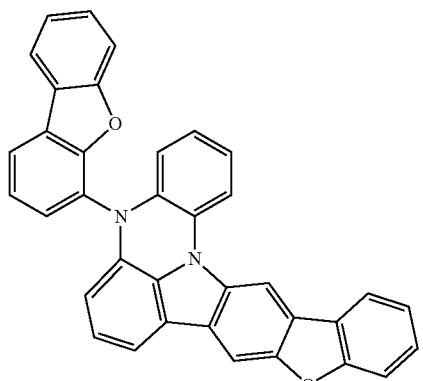
118
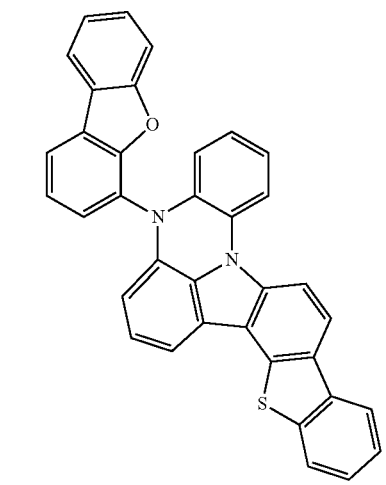
119
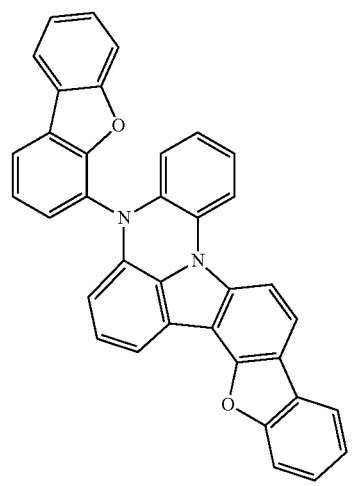
120
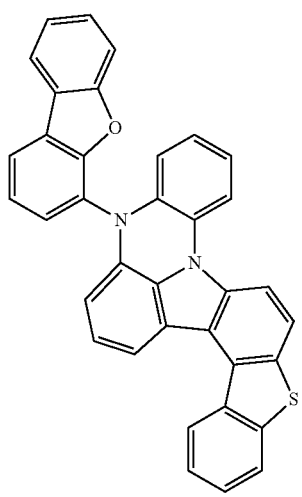
121
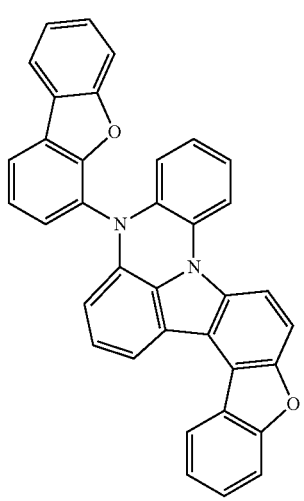
122
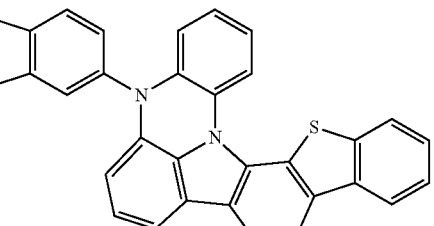
123
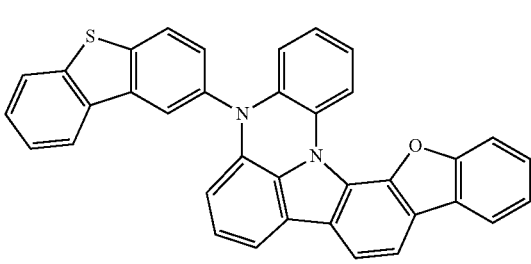

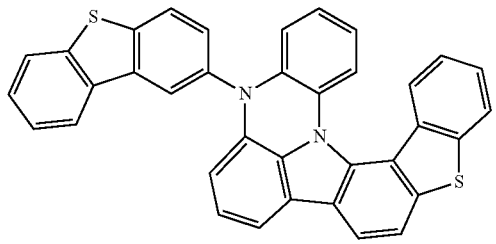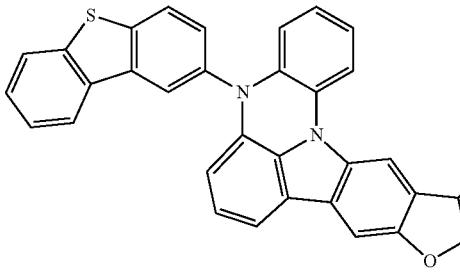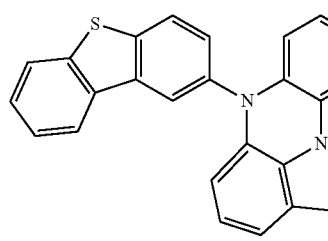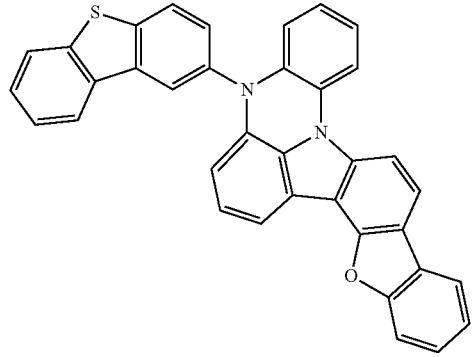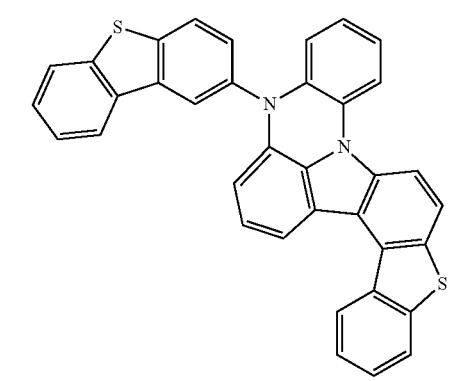

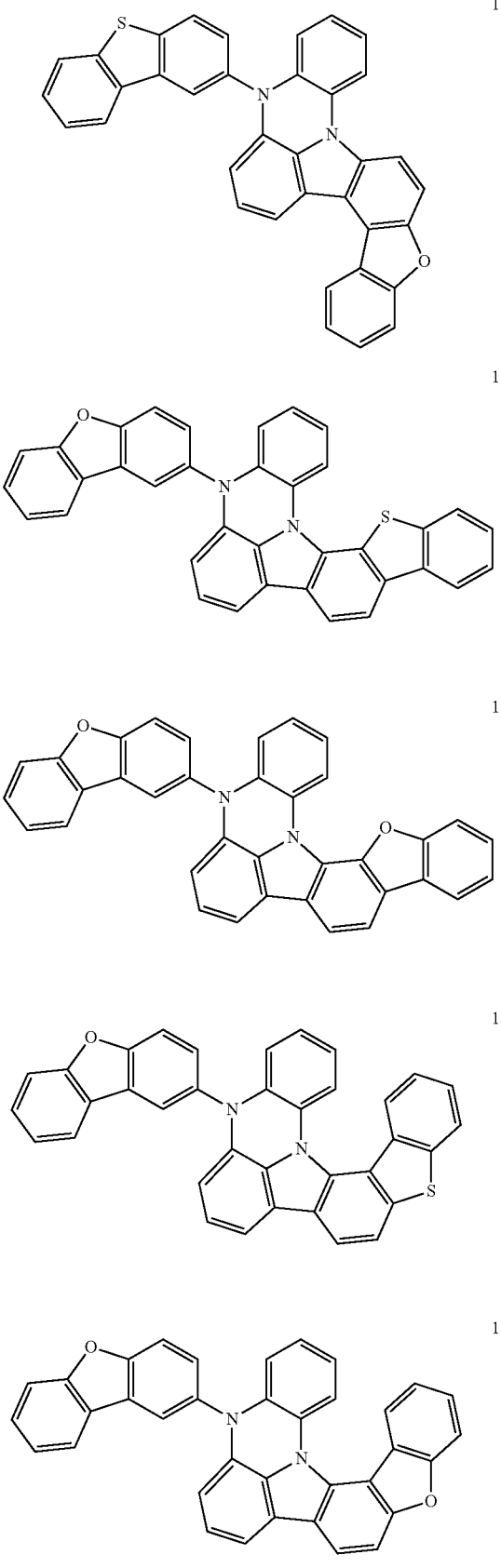
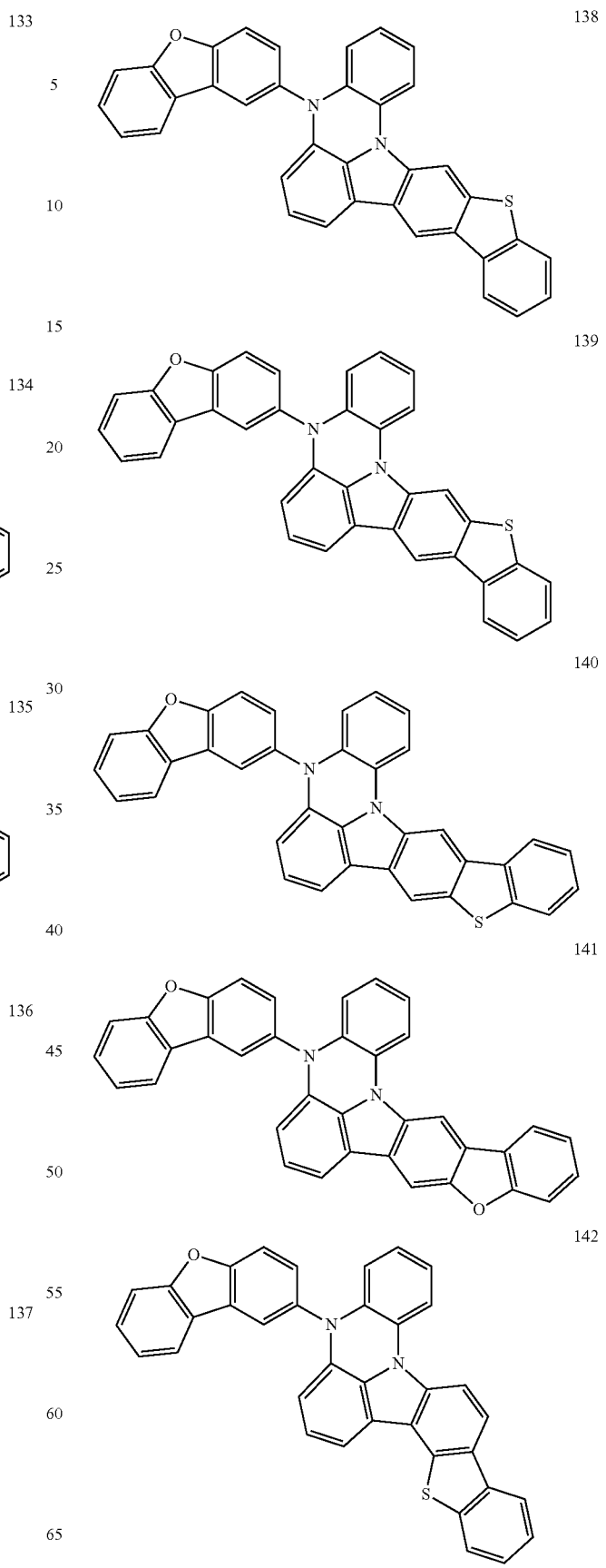

US 9,543,528 B2
63
-continued
143
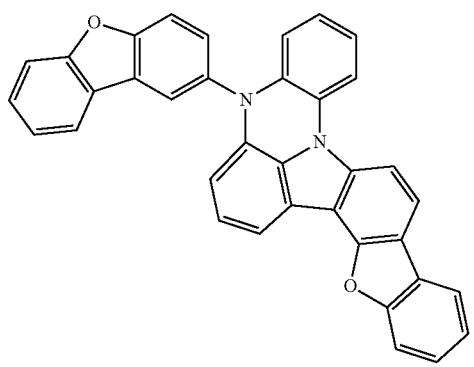
144
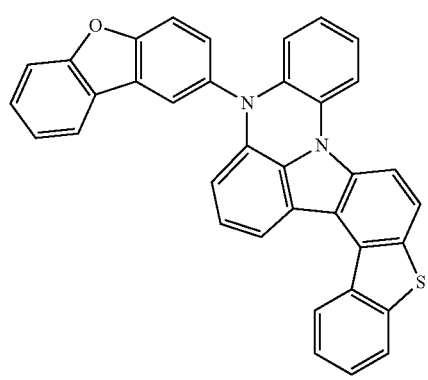
145
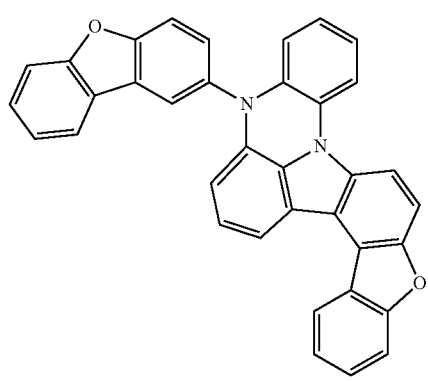
146
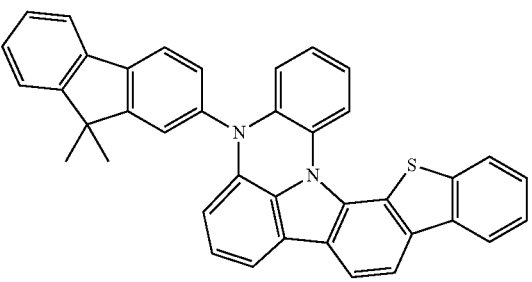
64
-continued
147
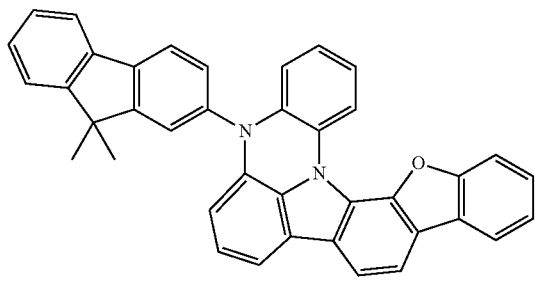
148
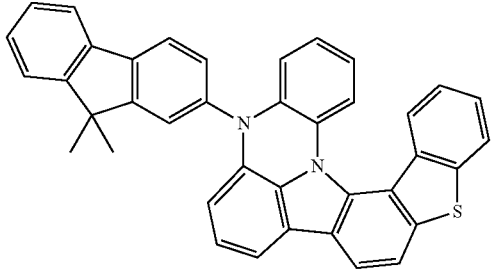
149
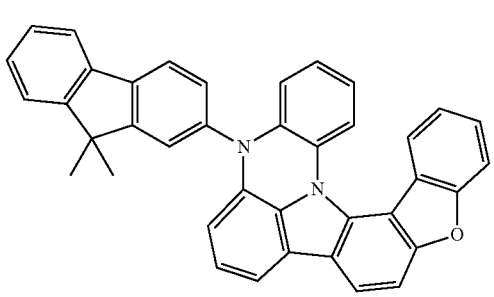
150
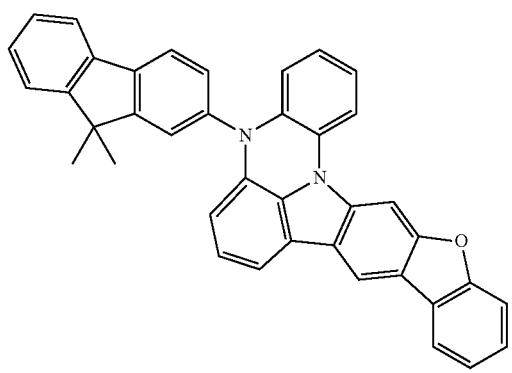
151

152
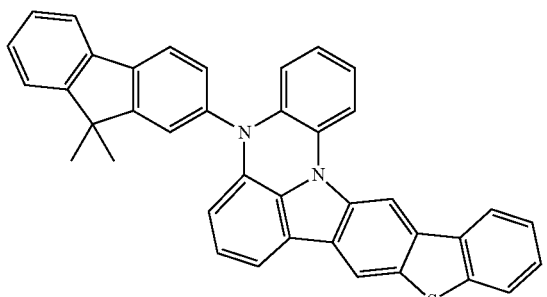
153
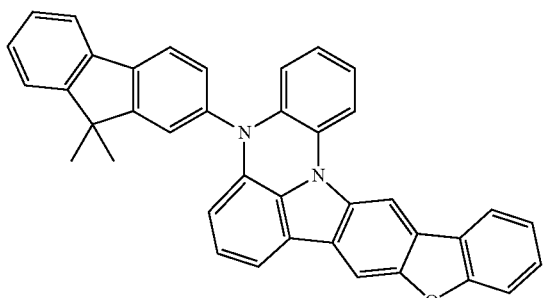
154
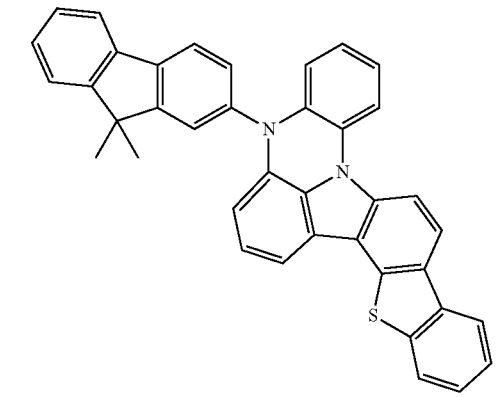
155
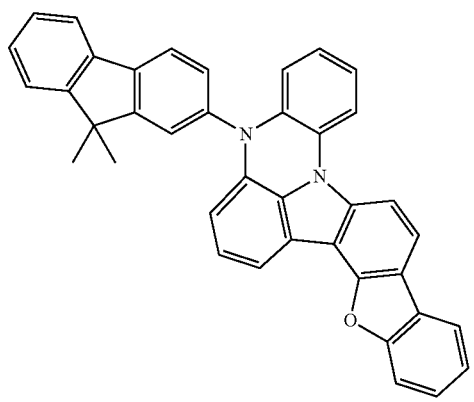
156
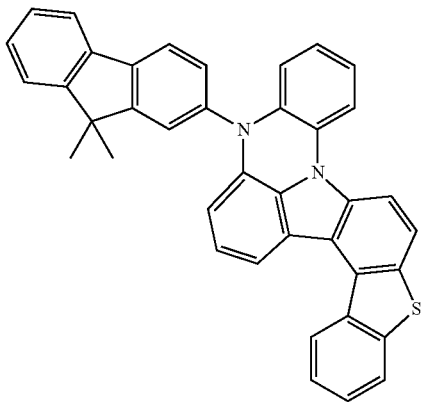
157
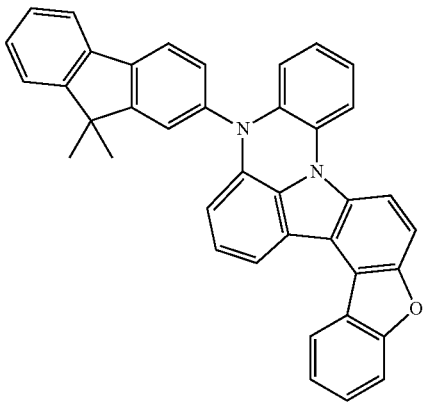
158
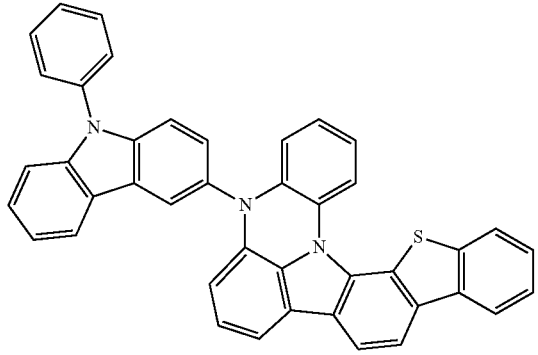
159
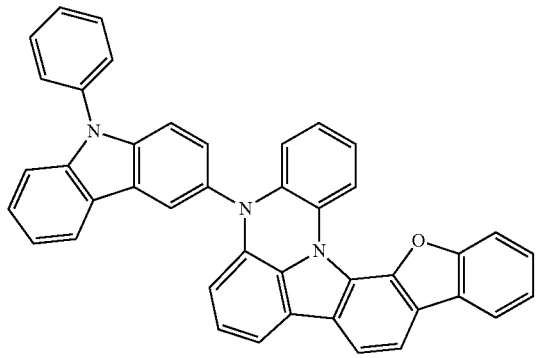

160
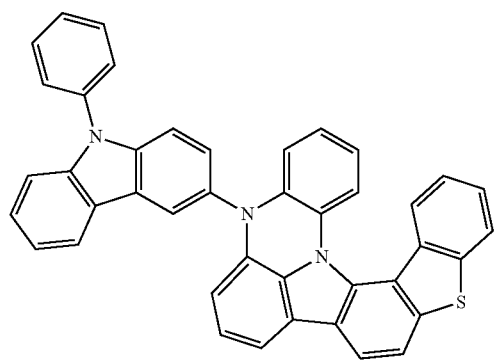
161
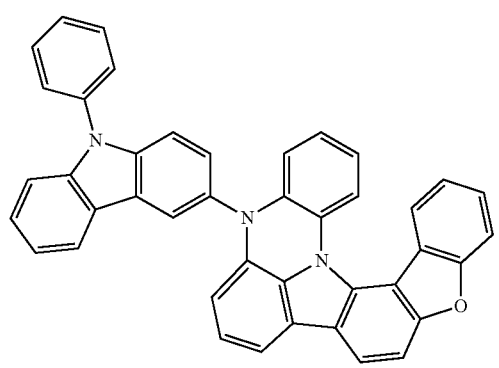
162
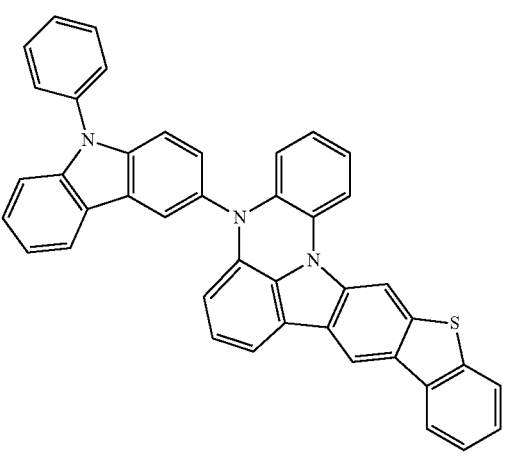
163
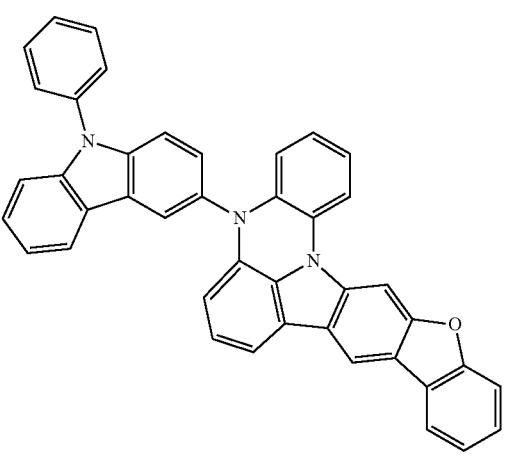
164
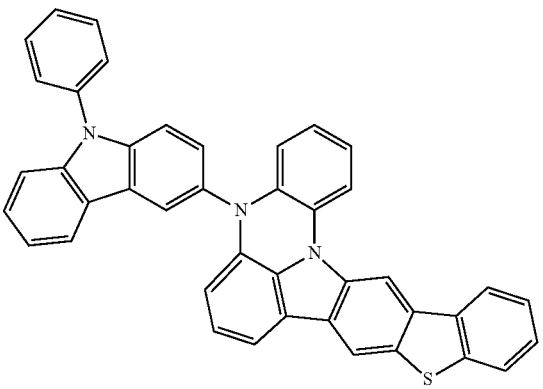
165
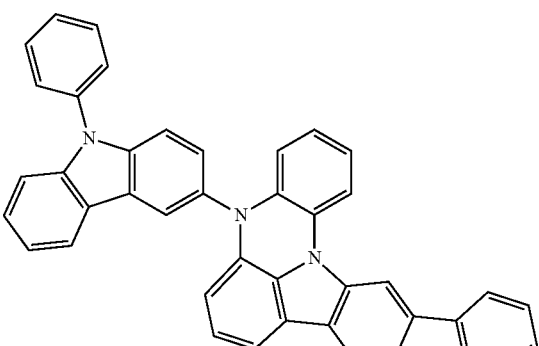
166
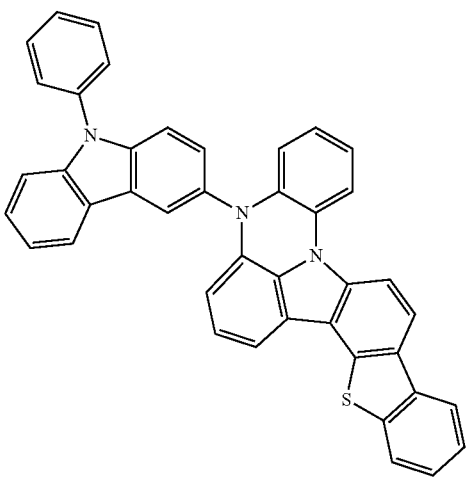

167
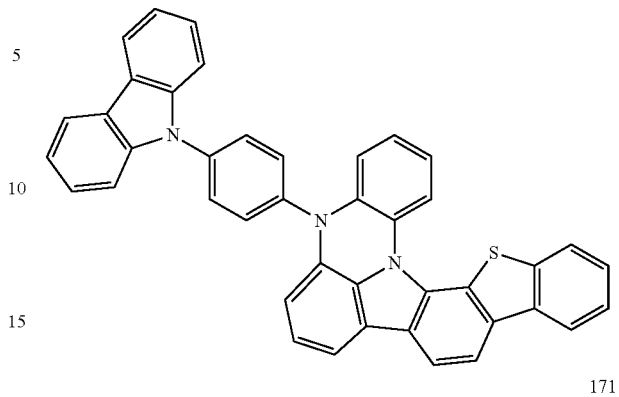
168
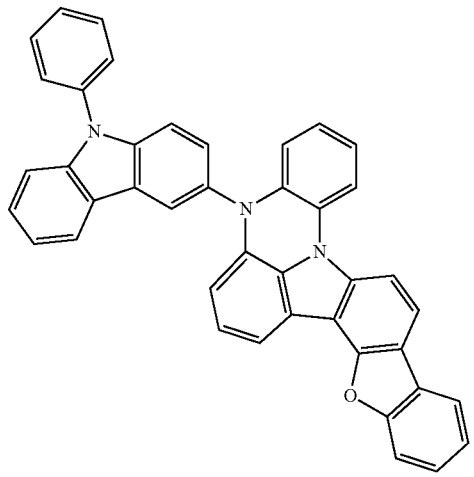
171
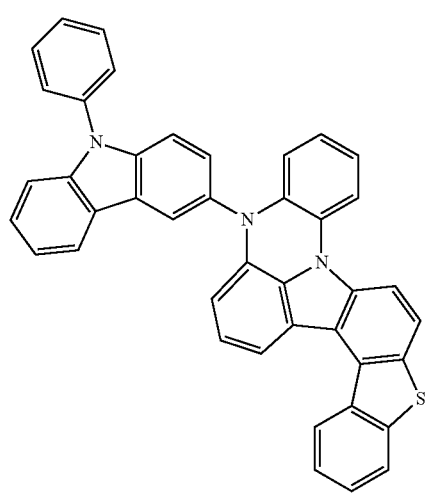
172
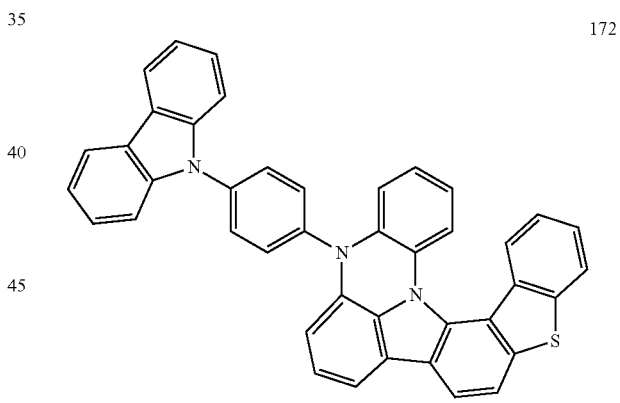
169
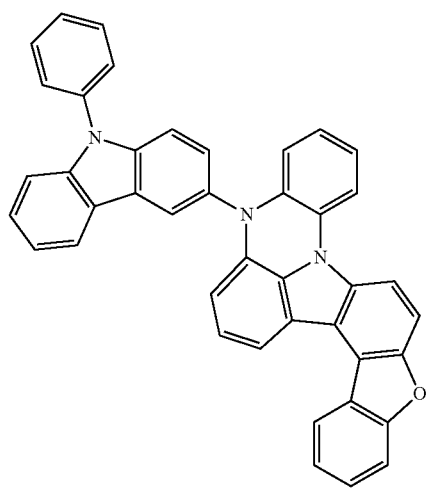
173
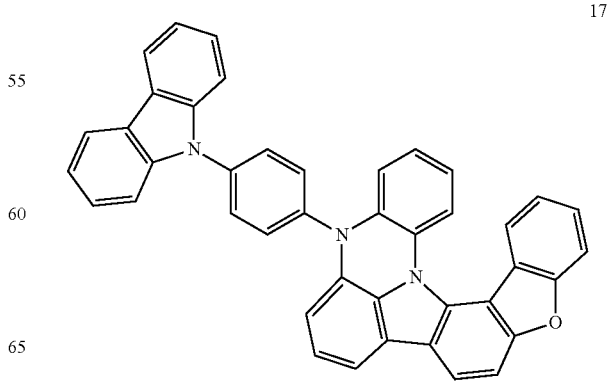

174
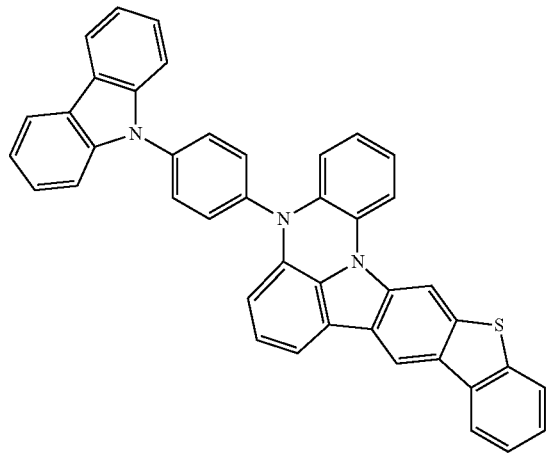
175
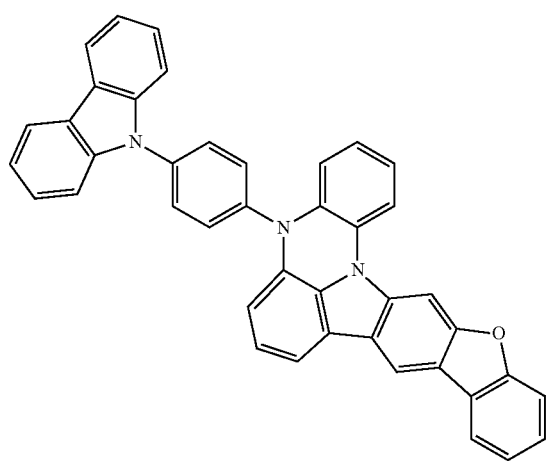
176
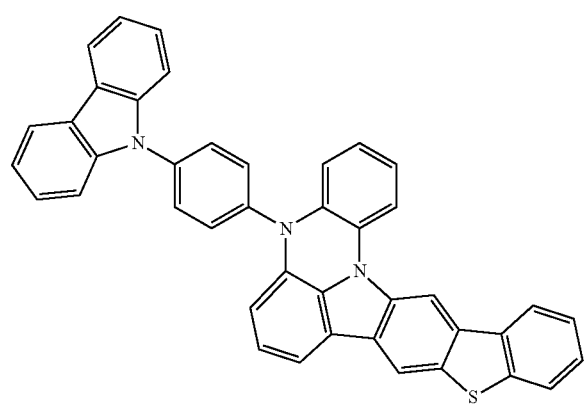
177
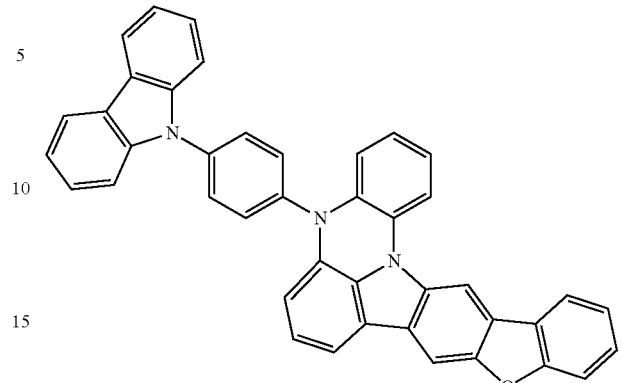
178
179
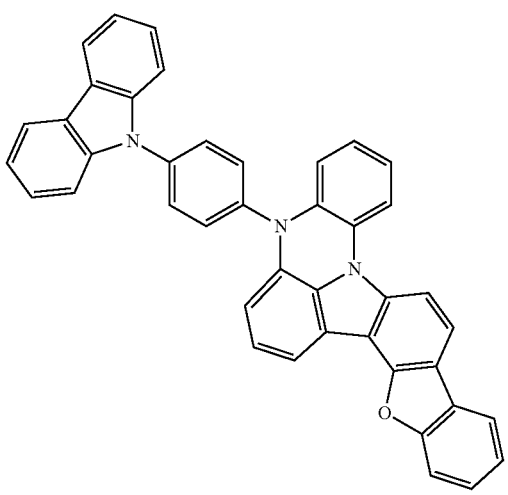

-continued
180
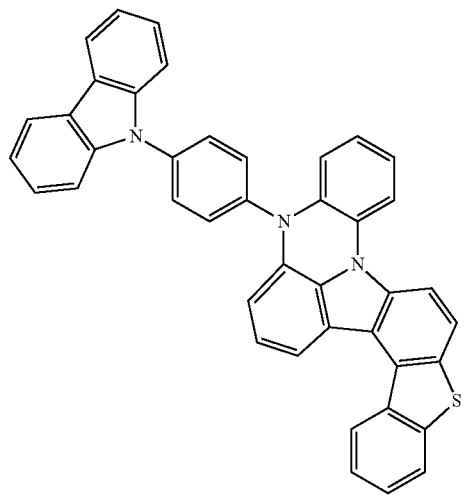
181
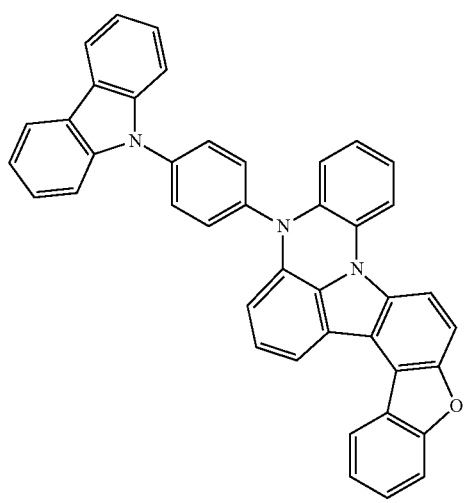
182
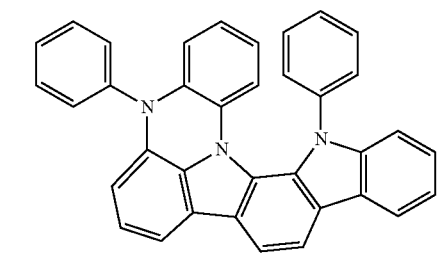
183
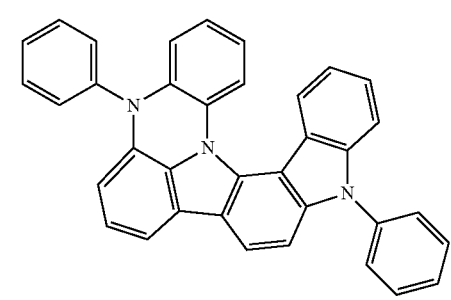
-continued
184
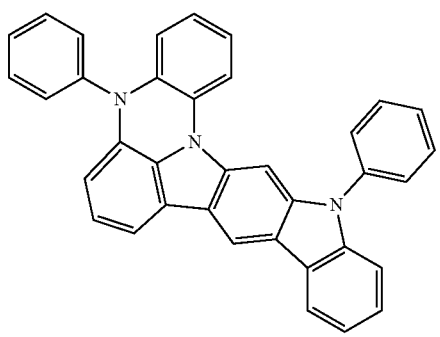
185
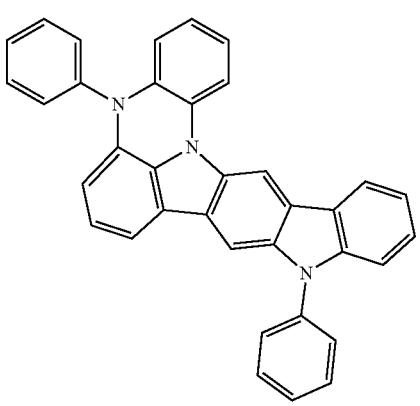
186
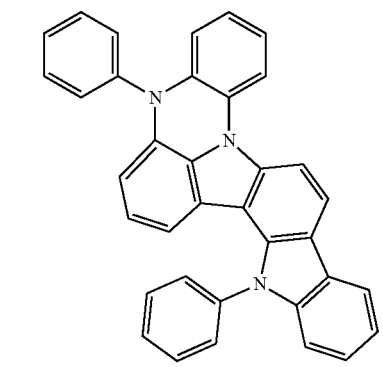
187
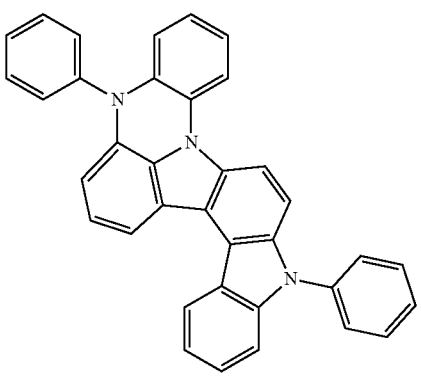

-continued
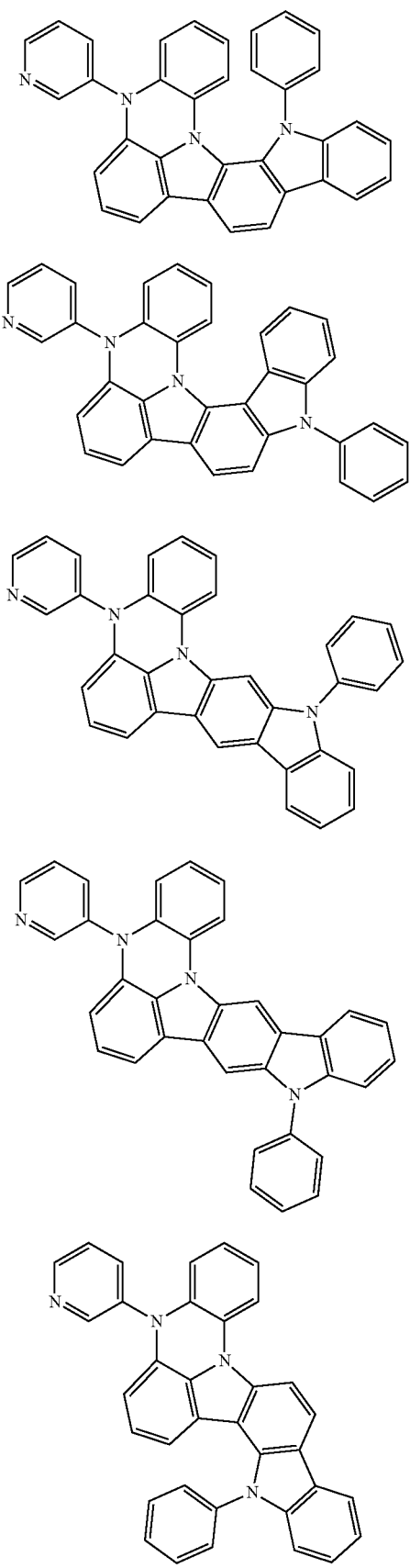
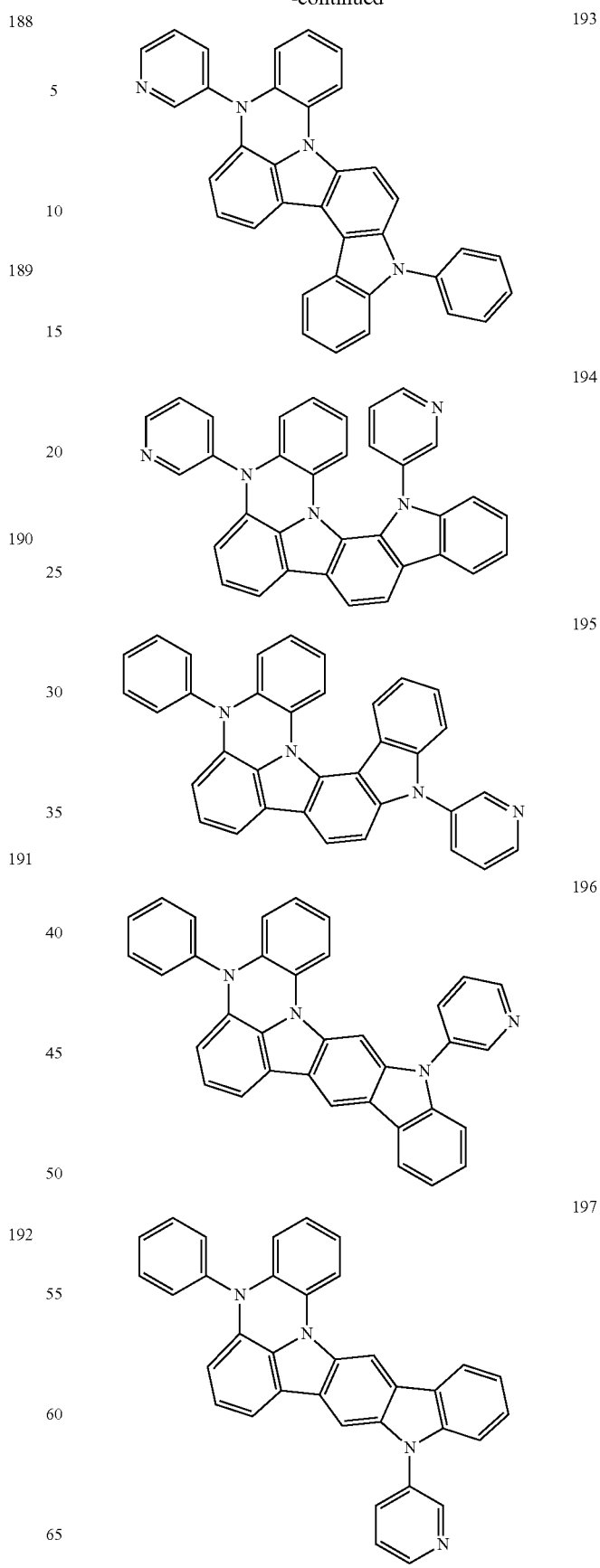

77
-continued
198
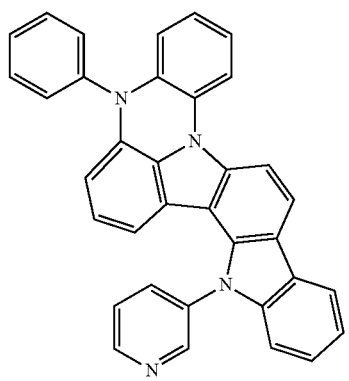
199
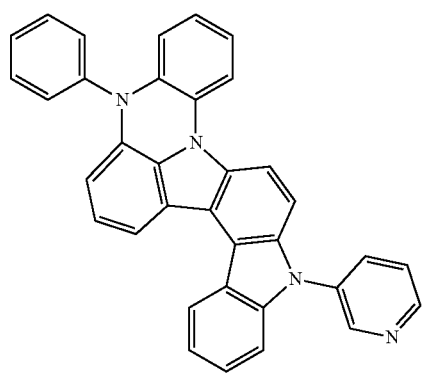
200
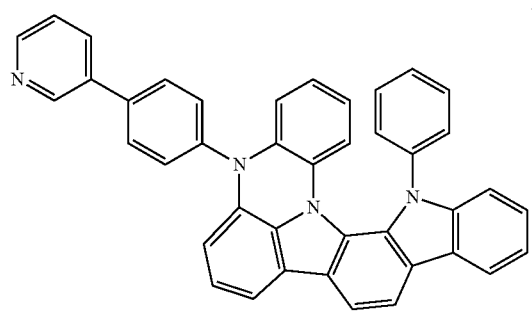
201
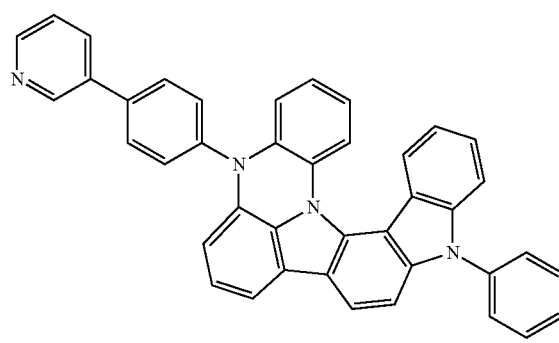
78
-continued
202
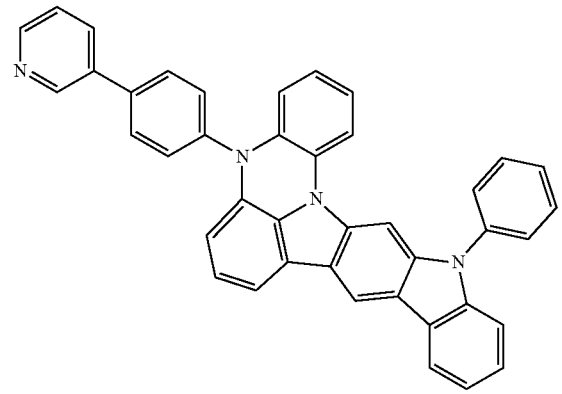
203
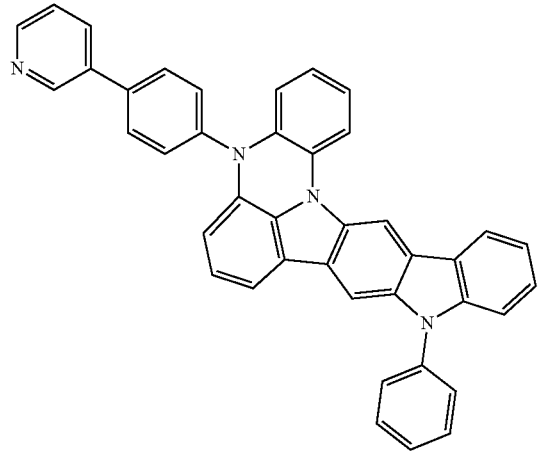
204
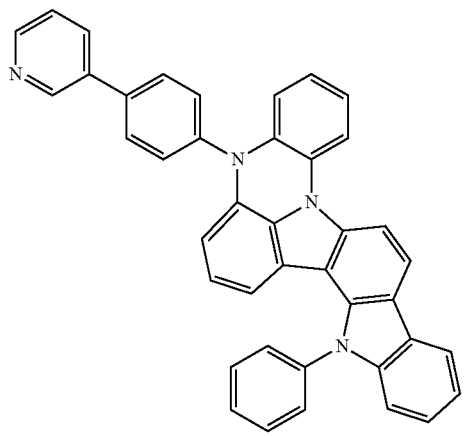

-continued
205
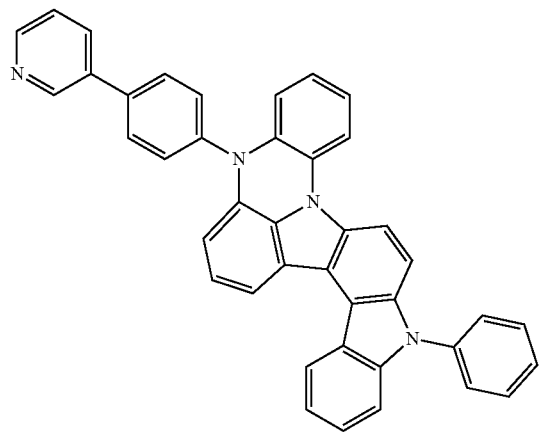
206
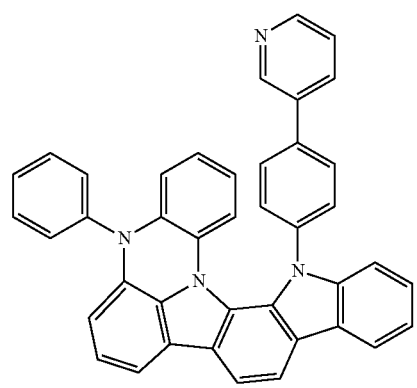
207
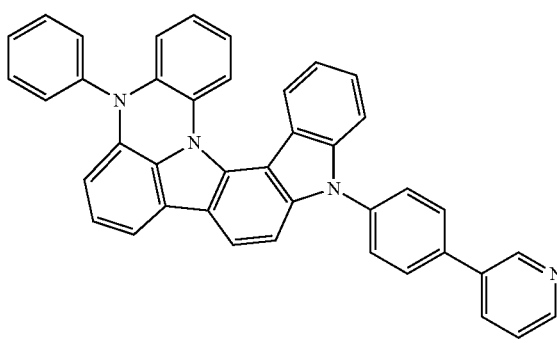
208
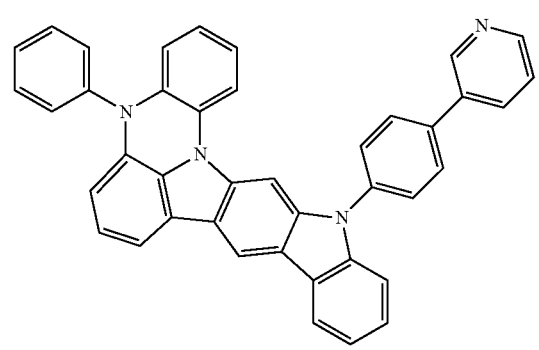
-continued
209
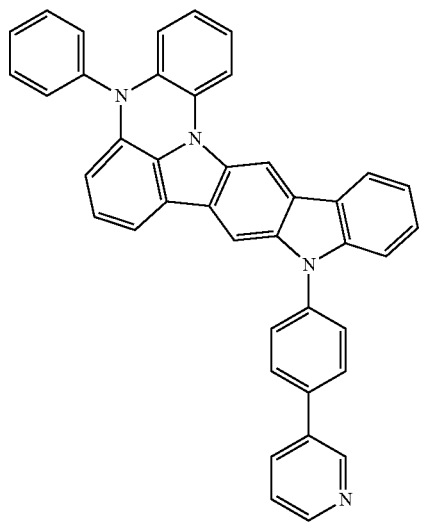
210
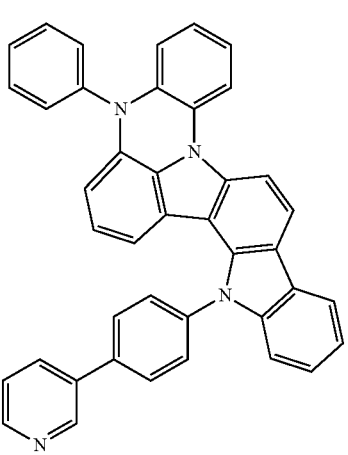
211
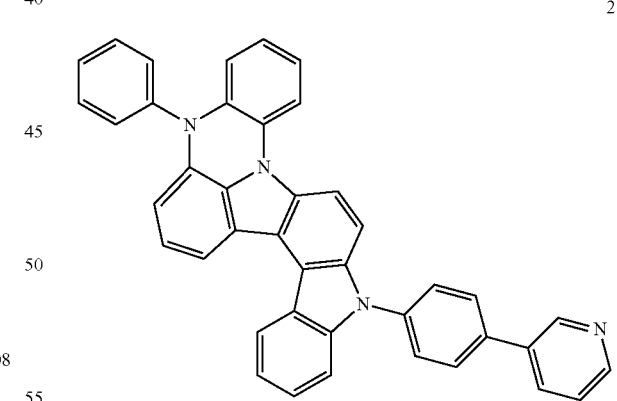
212
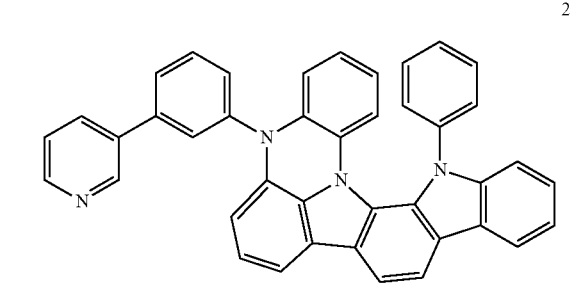

213
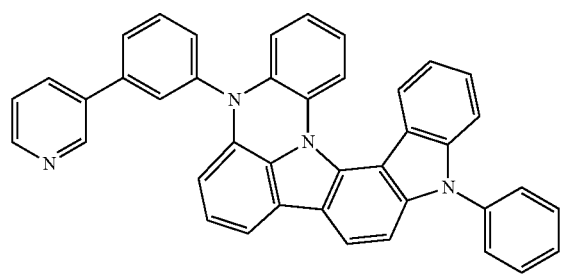
214
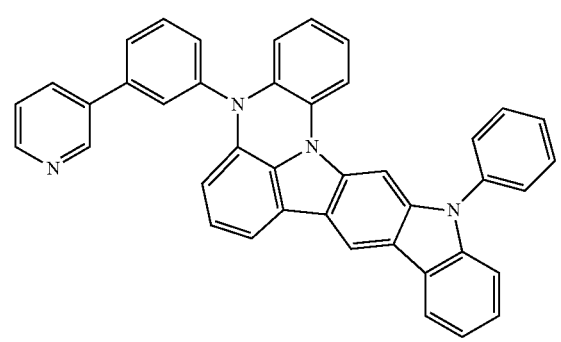
215
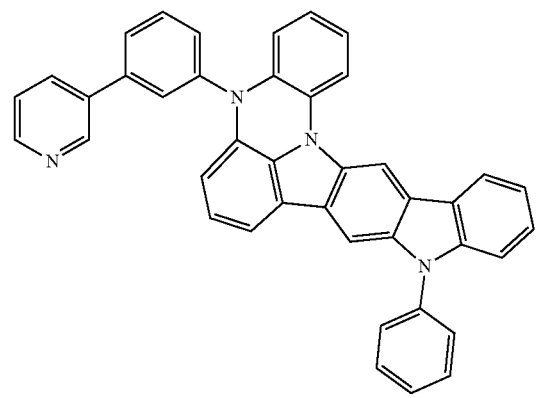
216
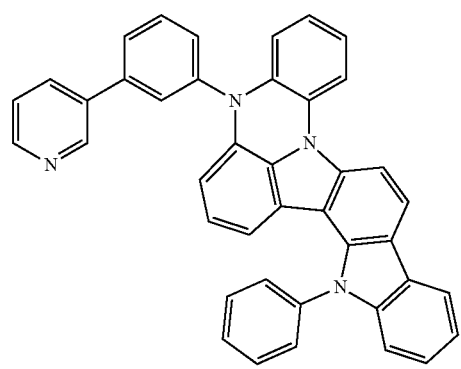
217
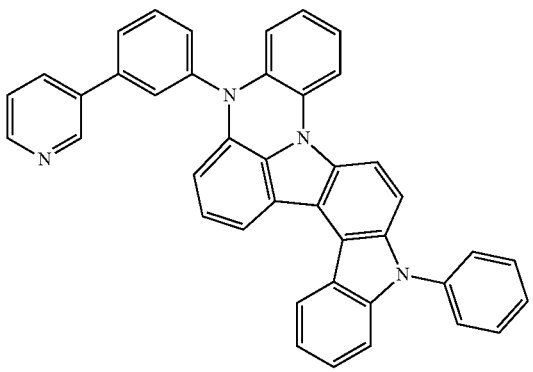
218
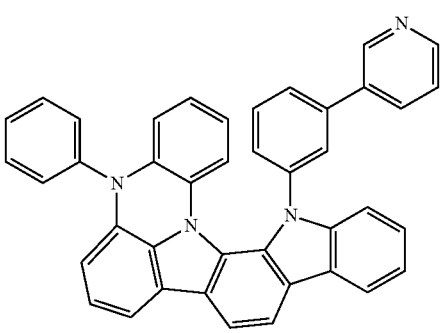
219
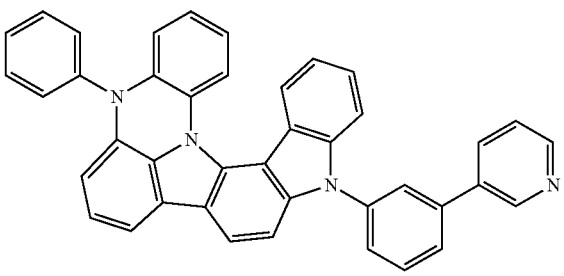
220
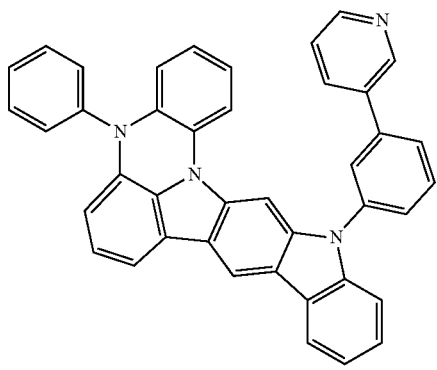

221
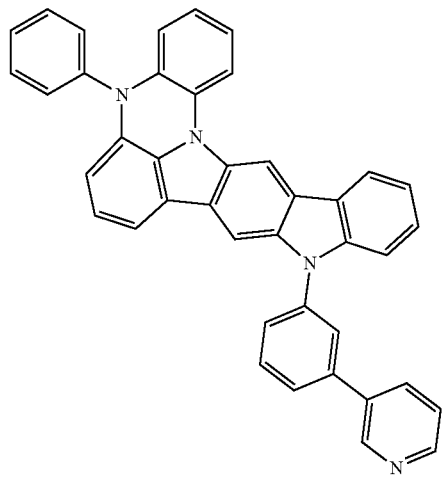
222
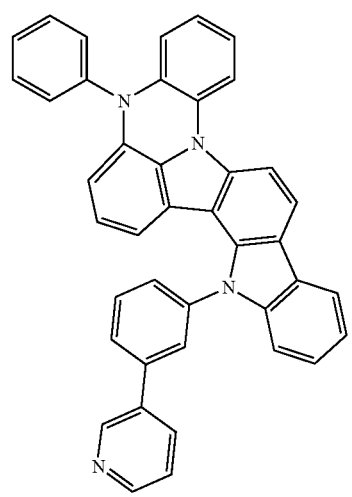
223
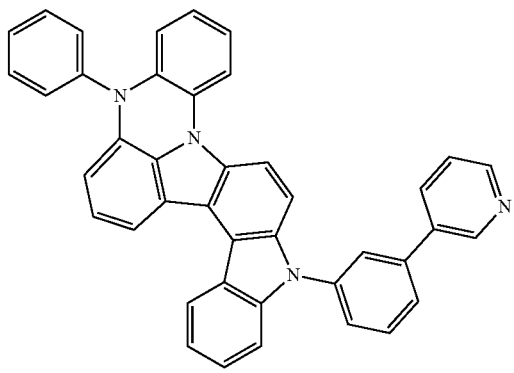
224
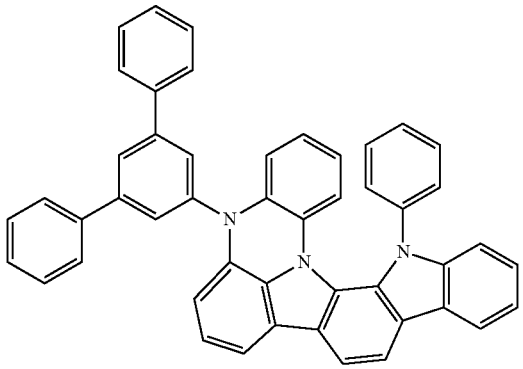
225
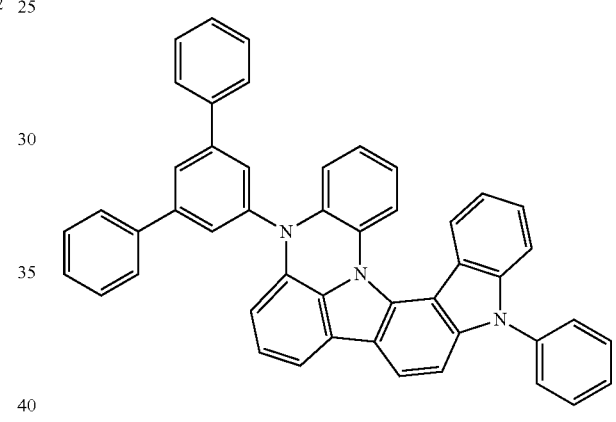
226
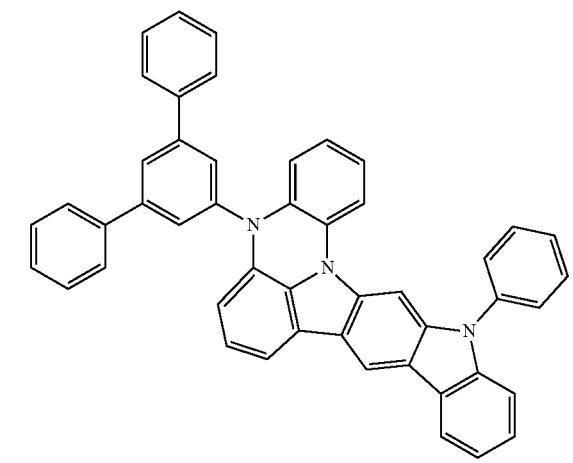

-continued
227
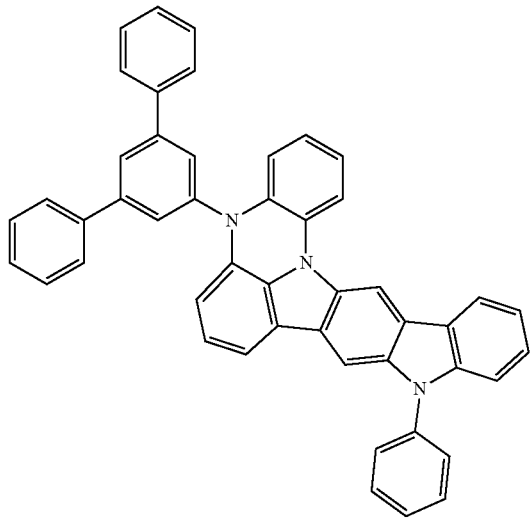
228
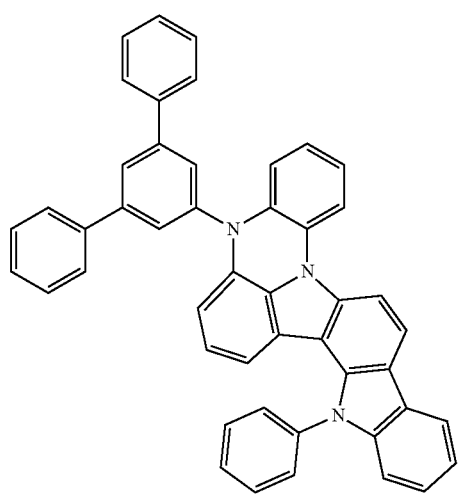
229
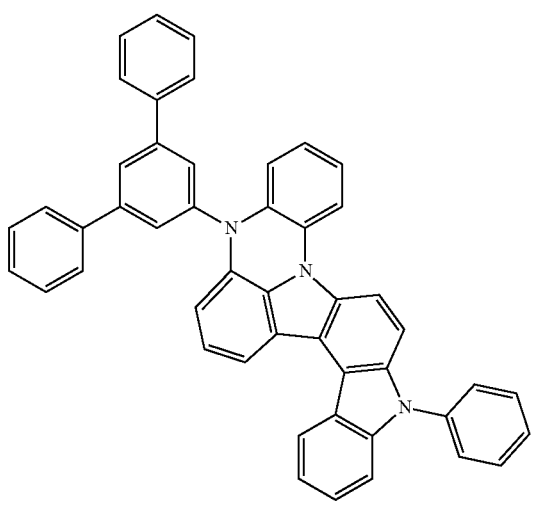
-continued
230
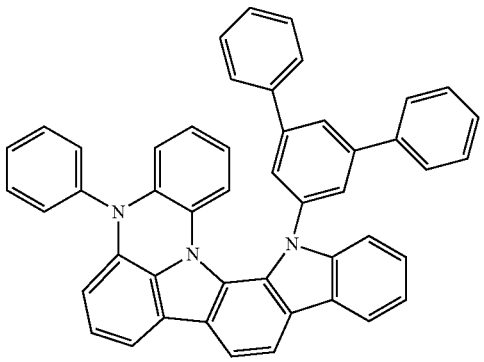
231
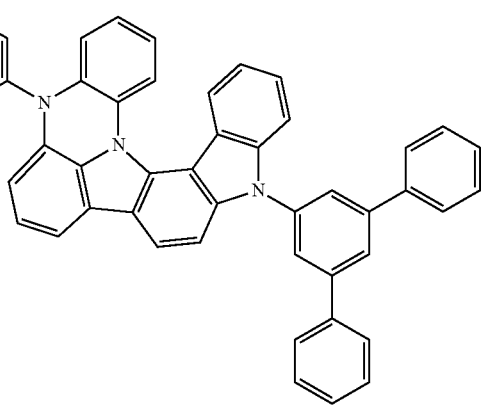
232
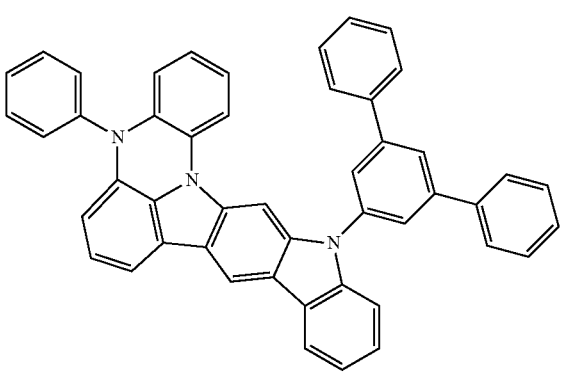
233
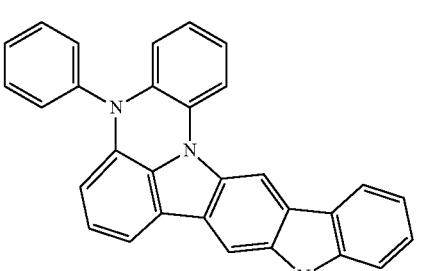
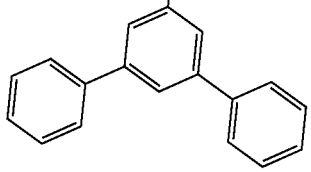

234
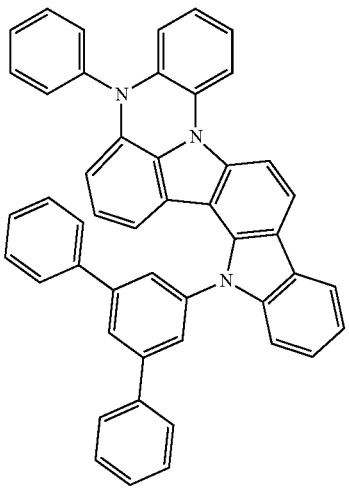
235
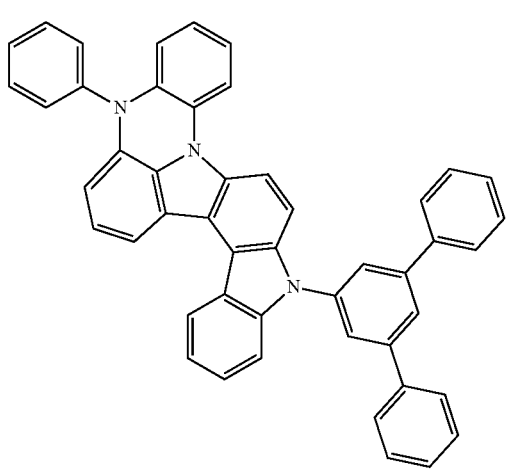
236
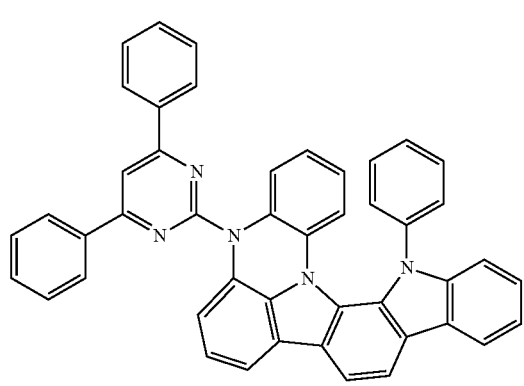
237
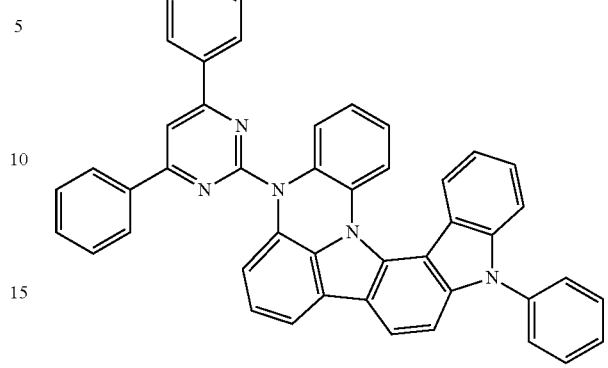
238
239
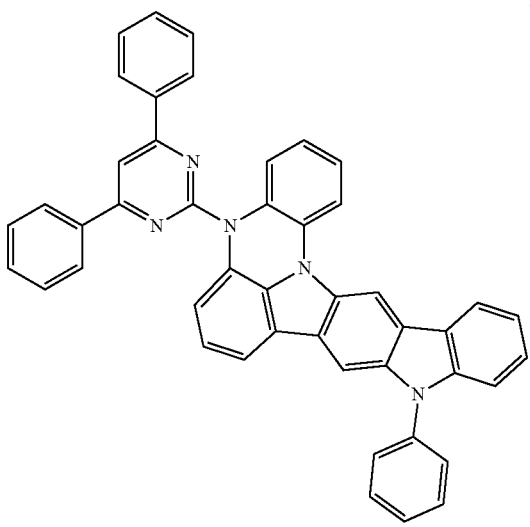

240
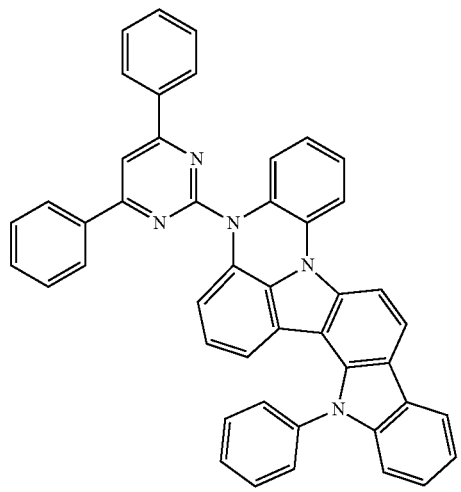
241
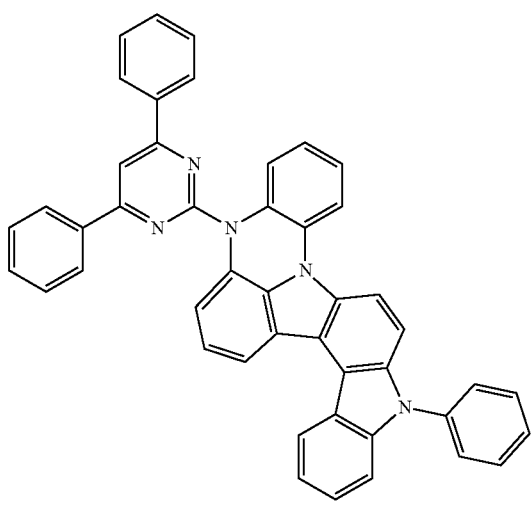
242
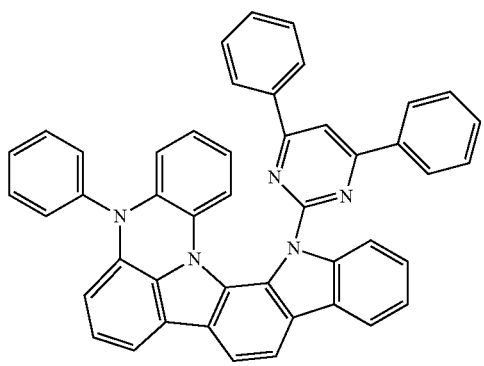
243
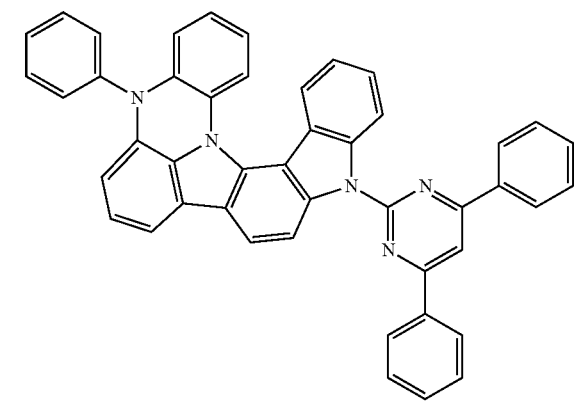
244
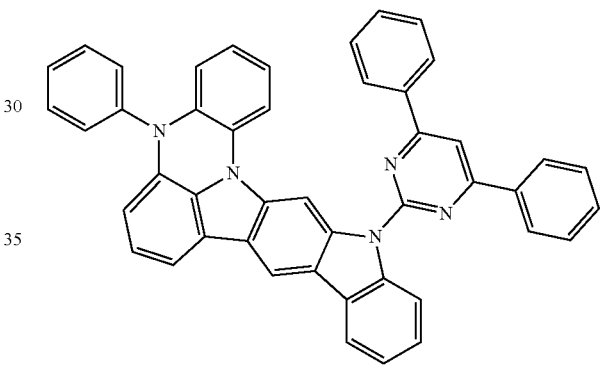
245
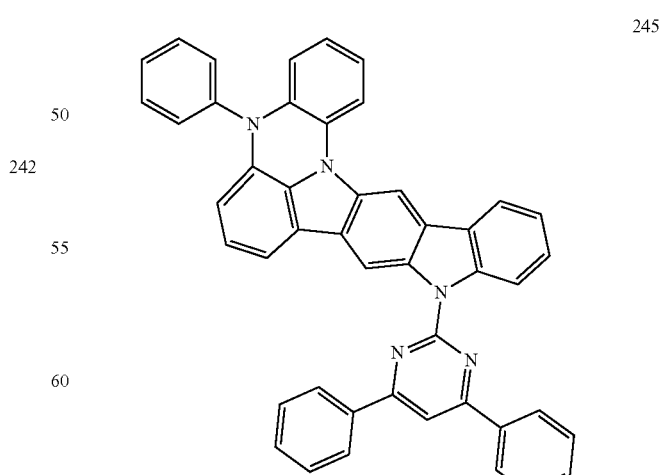

246
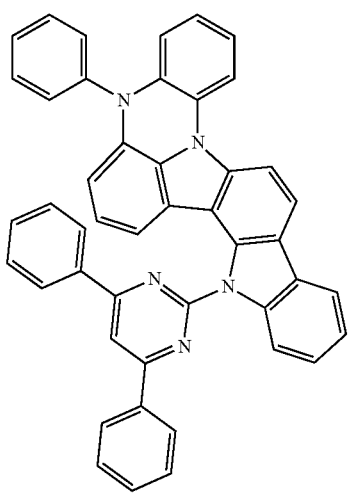
247
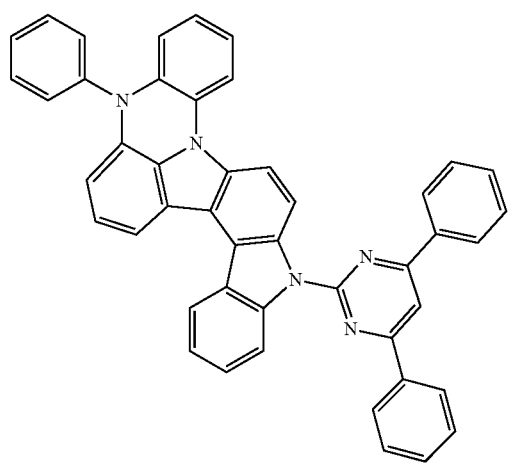
248
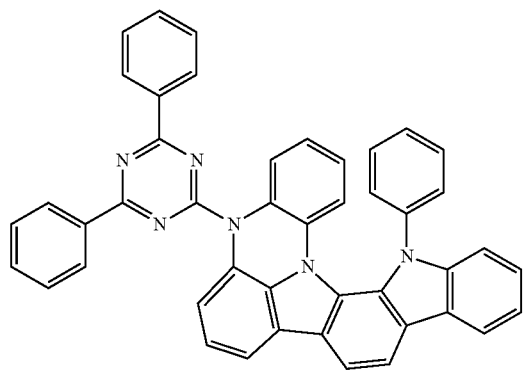
249
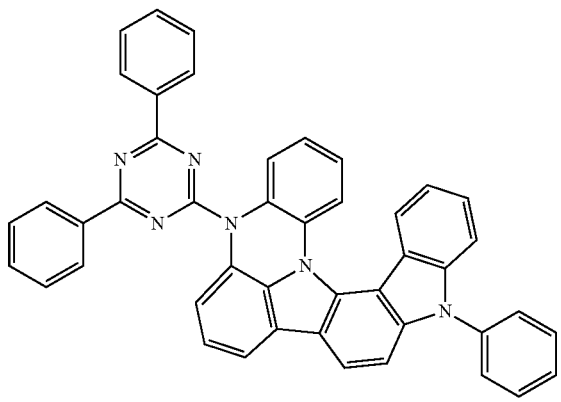
250
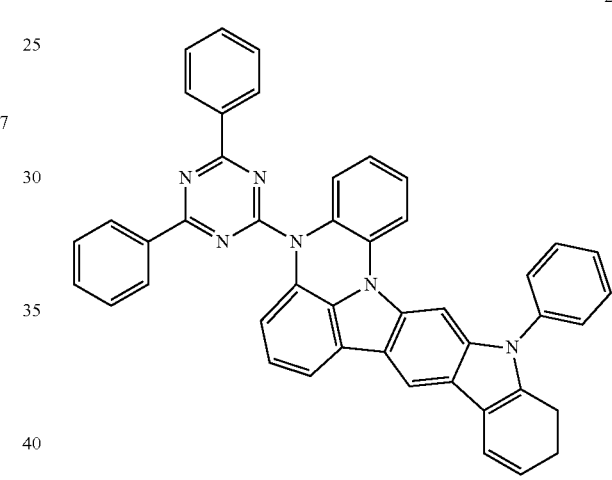
251
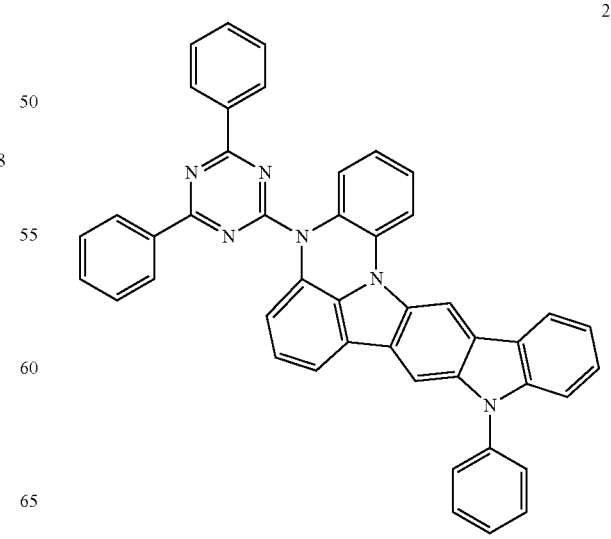

252
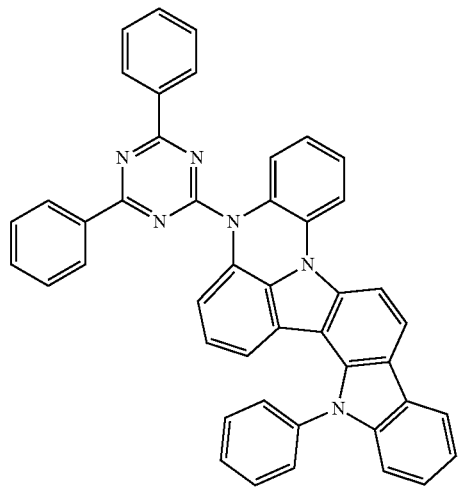
255
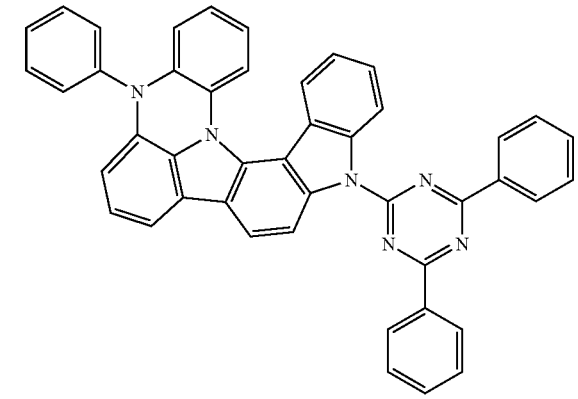
253
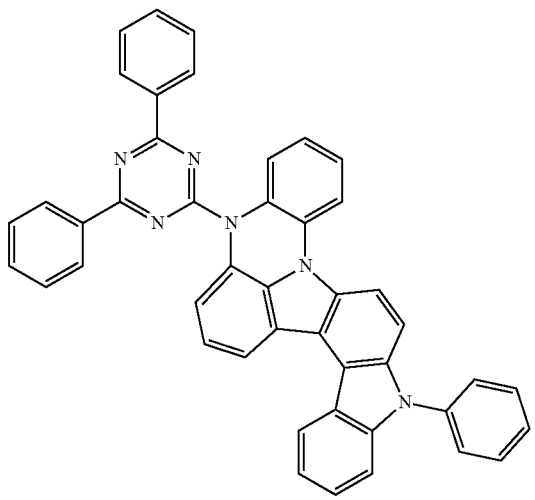
256
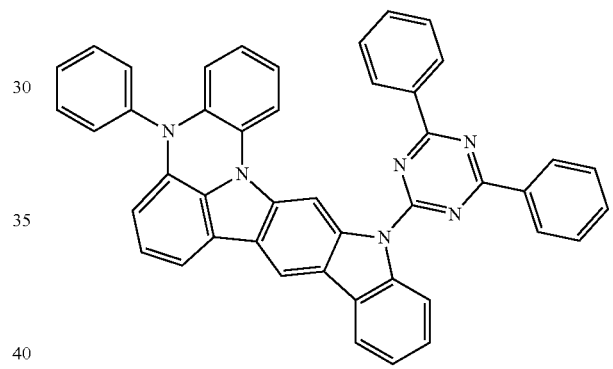
254
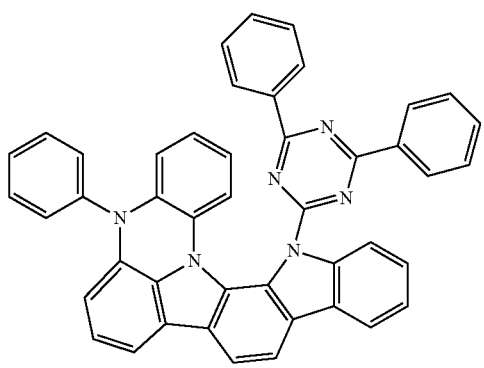
257
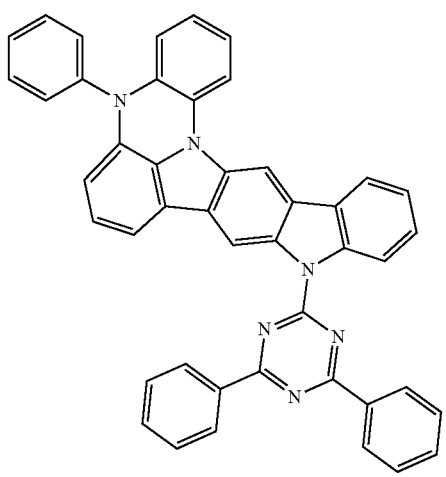

258
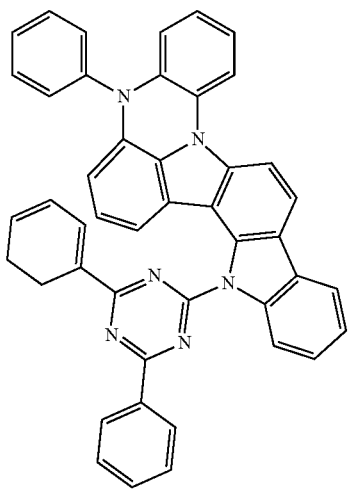
259
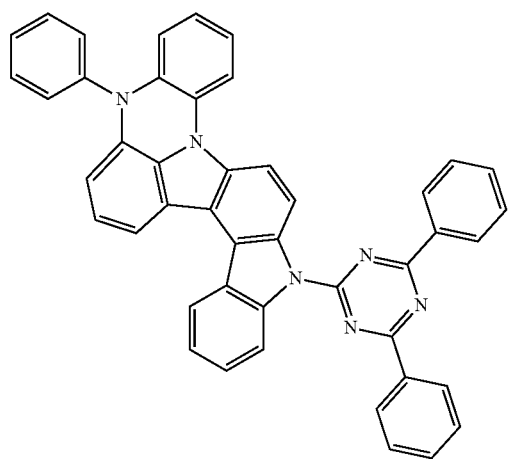
260
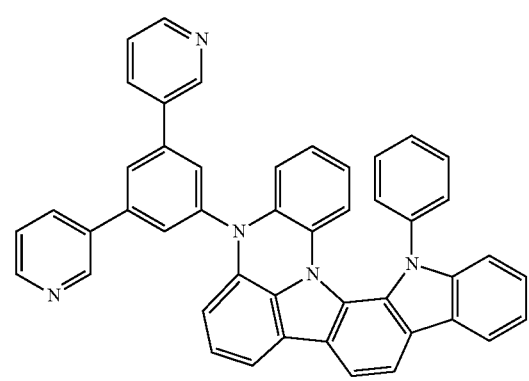
261
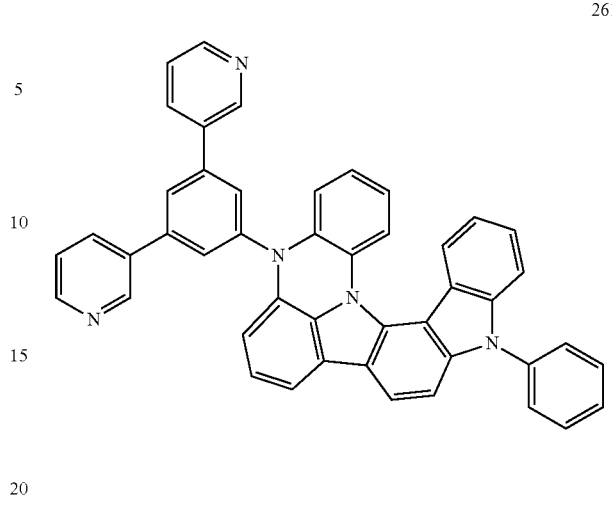
262
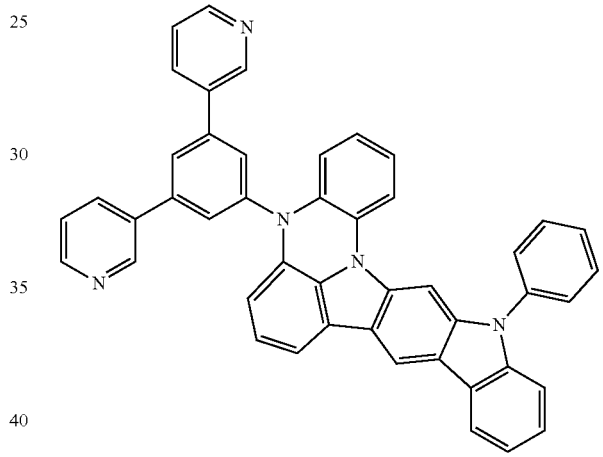
263
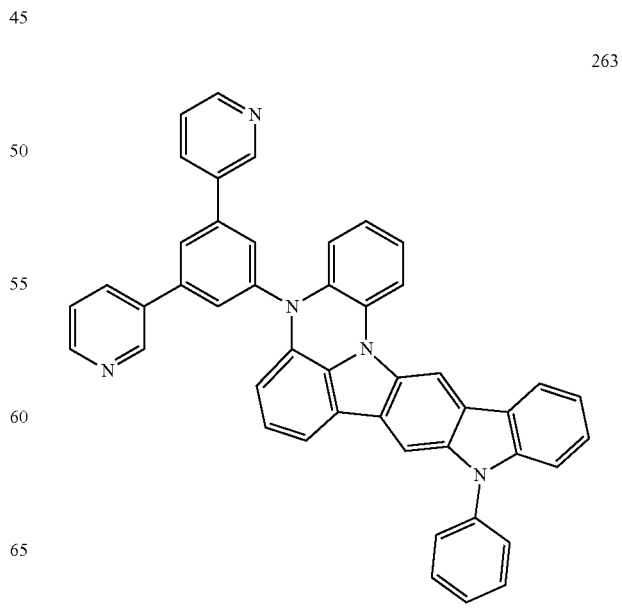

264
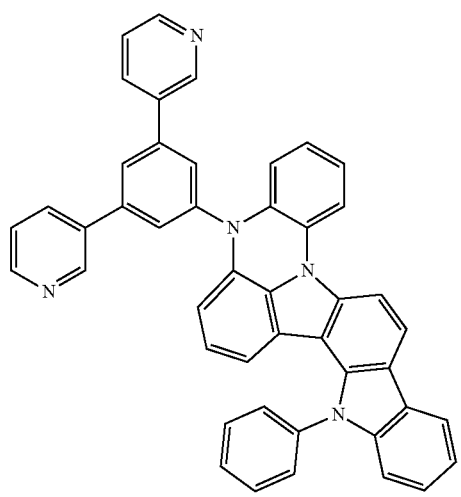
265
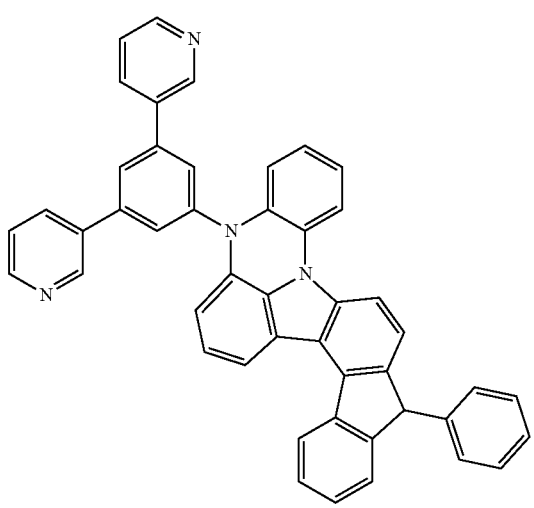
266
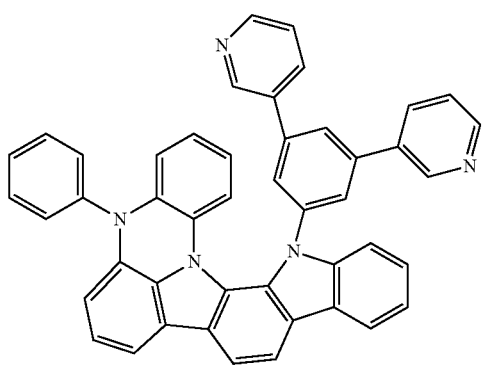
267
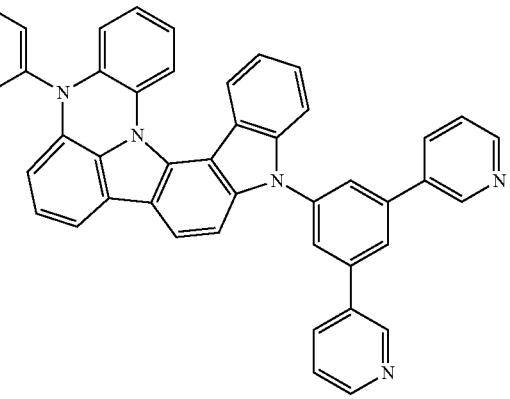
268
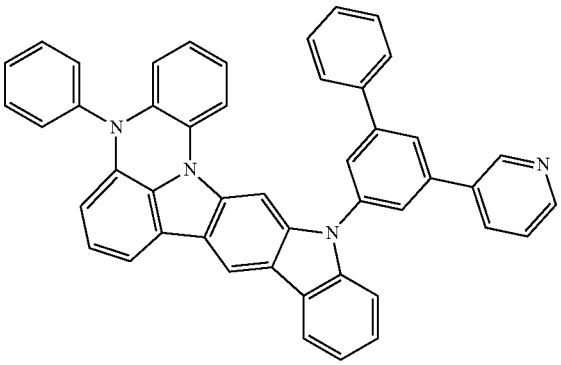
269
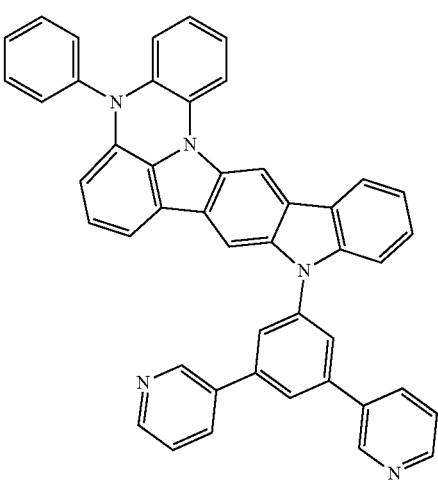

270
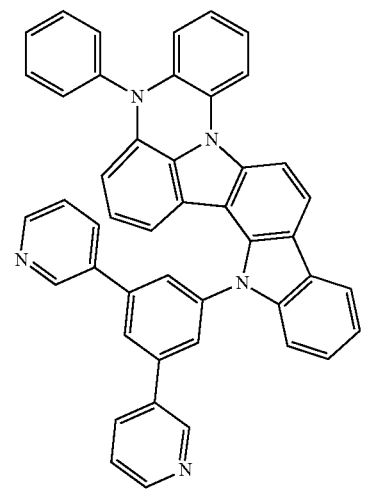
271
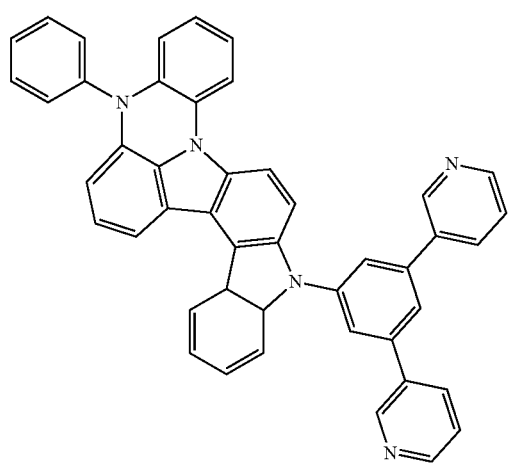
272
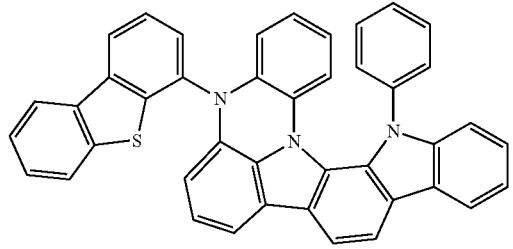
273
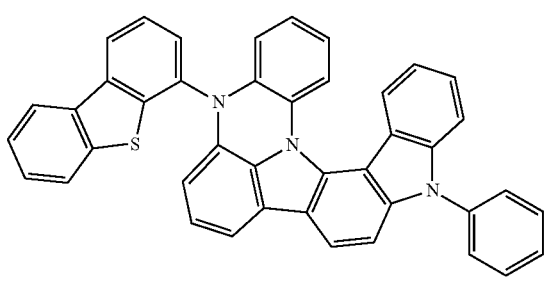
274
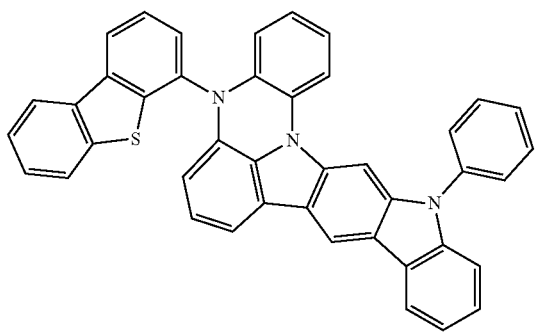
275
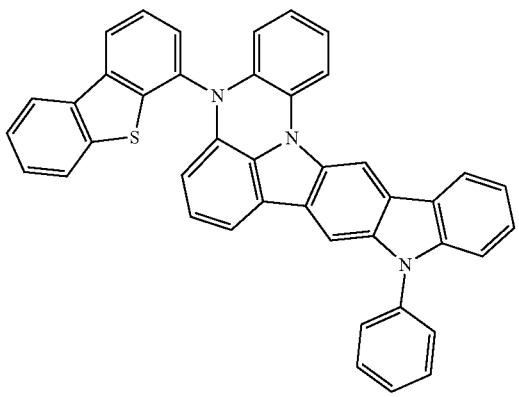
276
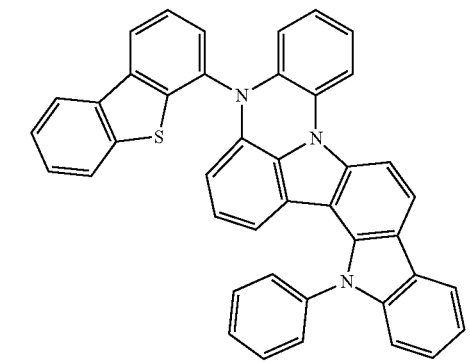
277
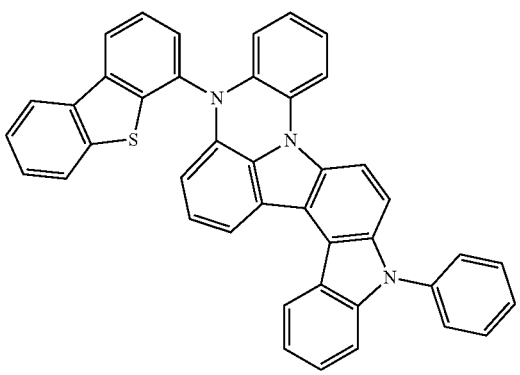

278
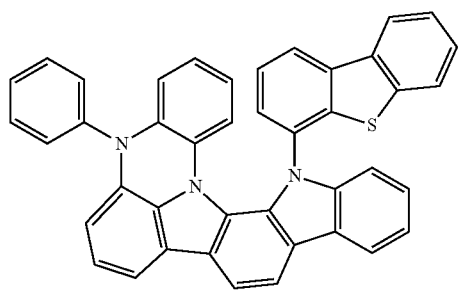
279
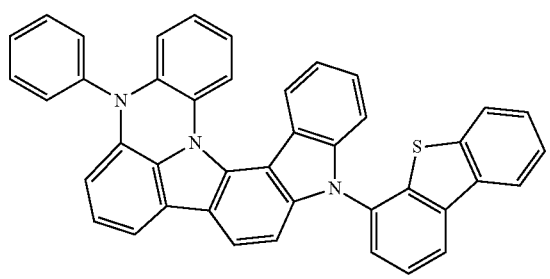
280
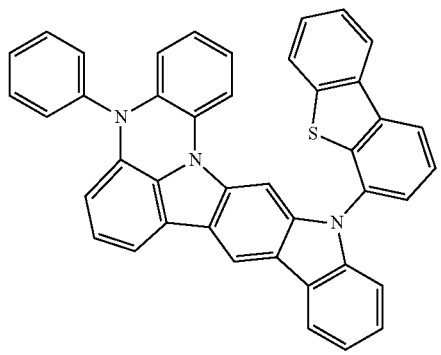
281
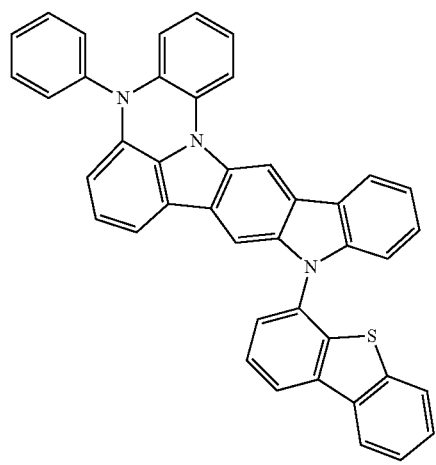
282
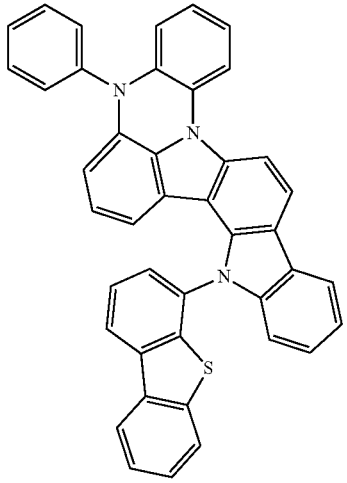
283
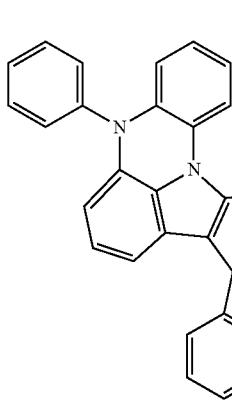
284
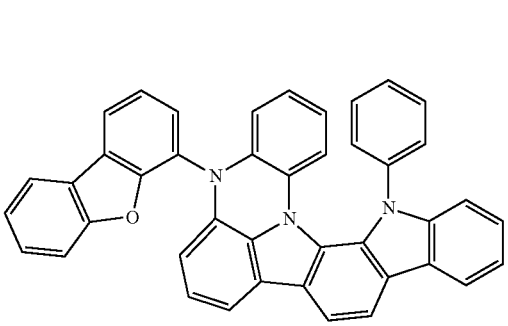
285
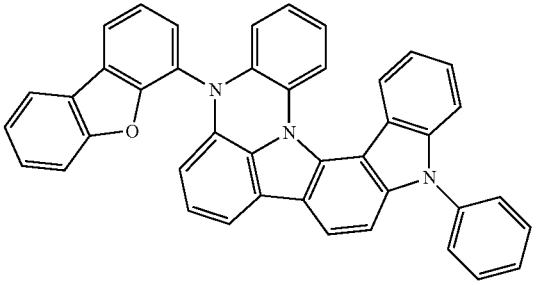

286
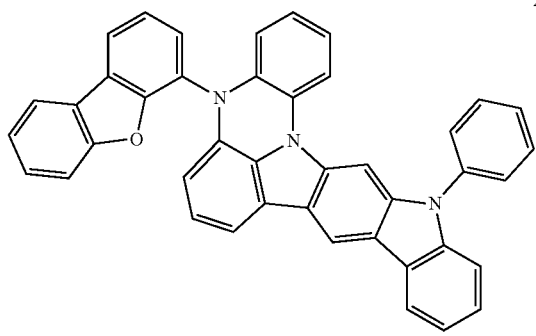
287
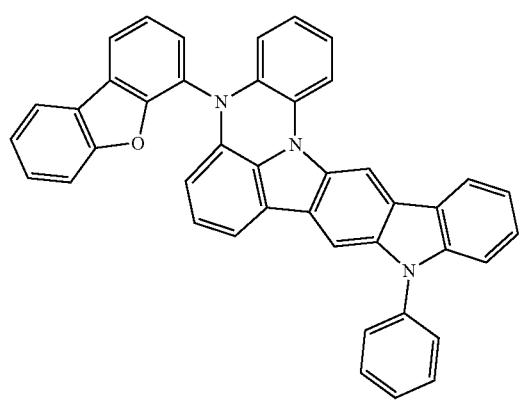
288
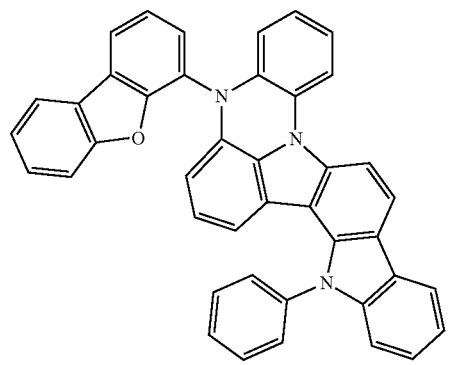
289
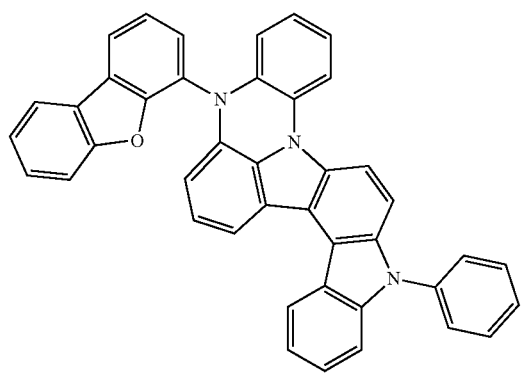
290
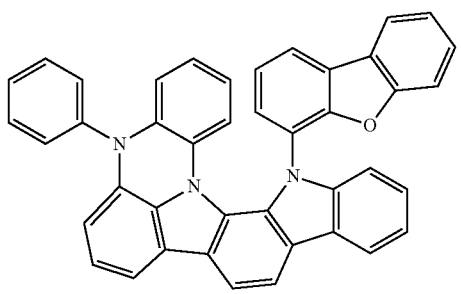
291
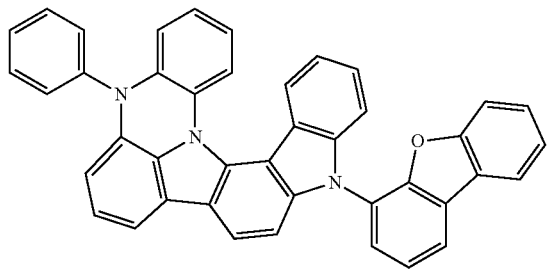
292
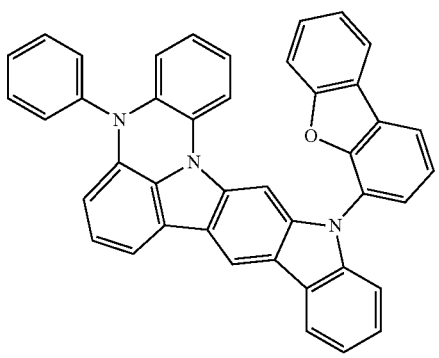
293
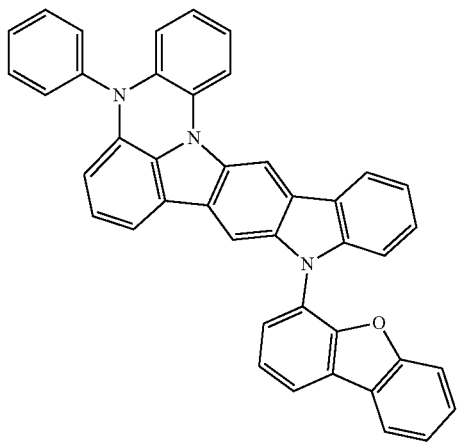

294
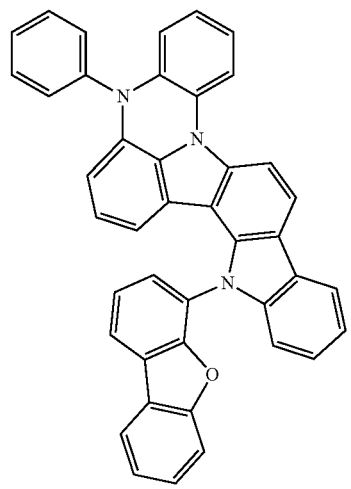
295
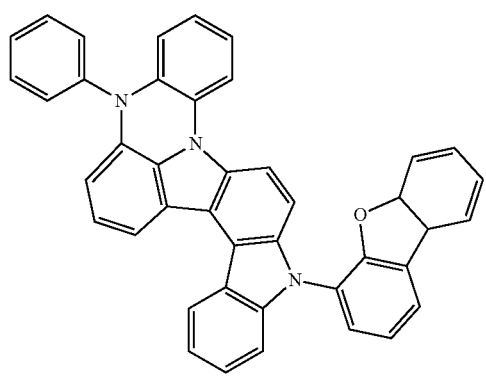
296
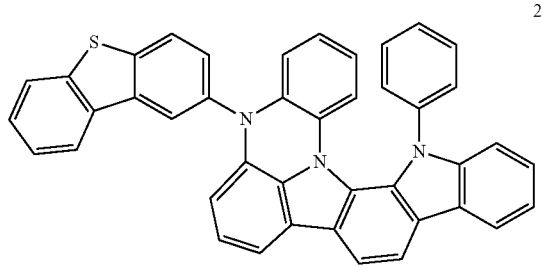
297
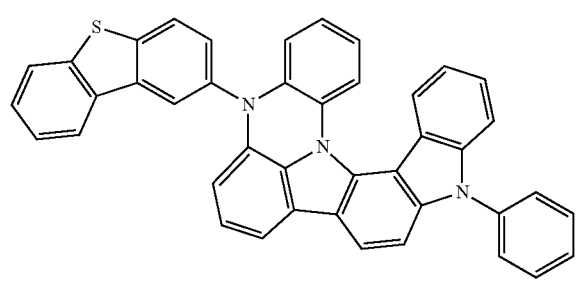
298
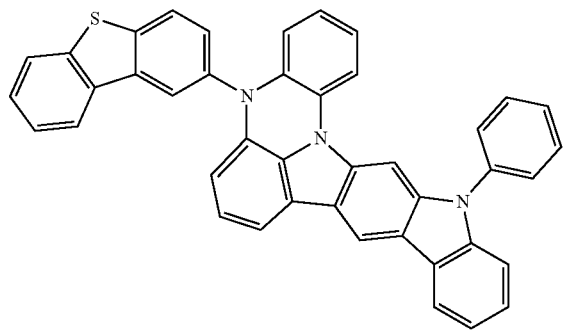
299
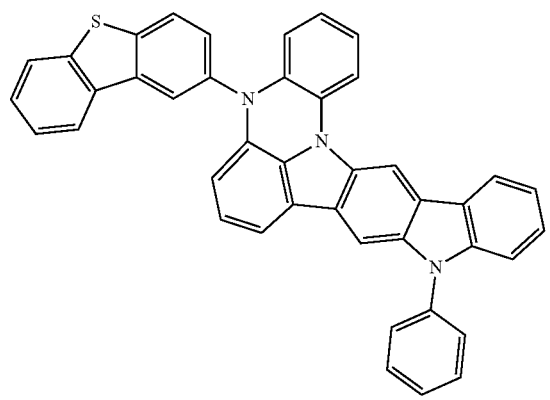
300
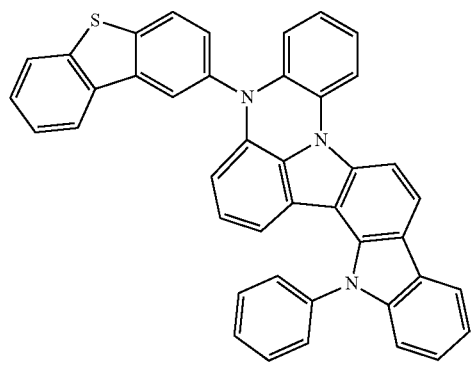
301
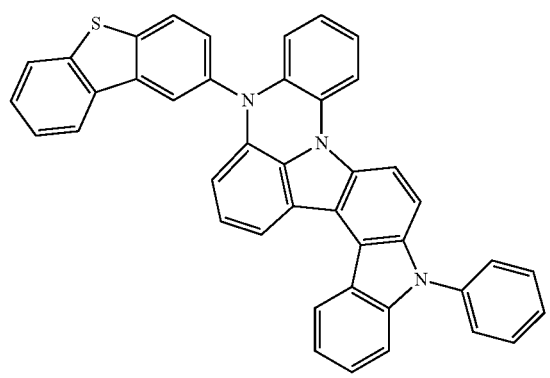

107
-continued
302
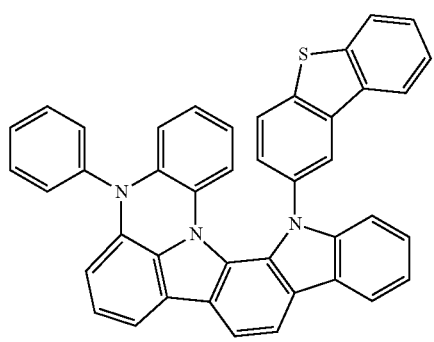
303
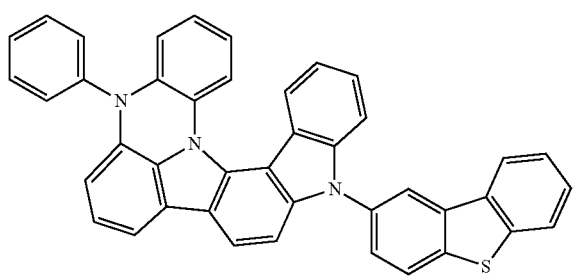
304
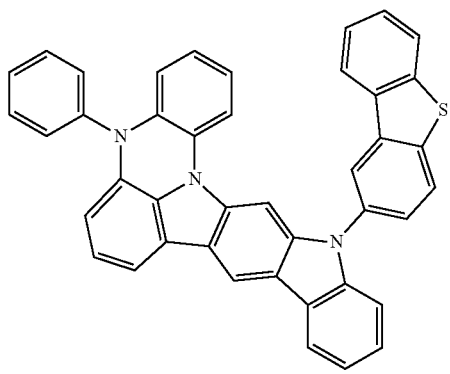
305
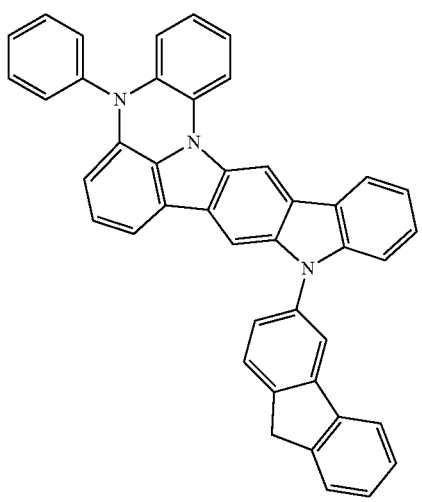
108
-continued
306
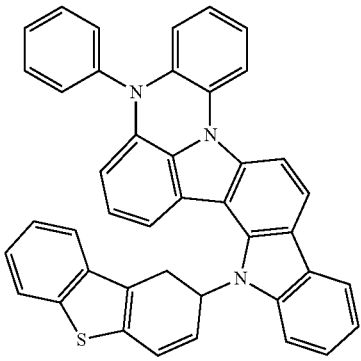
307
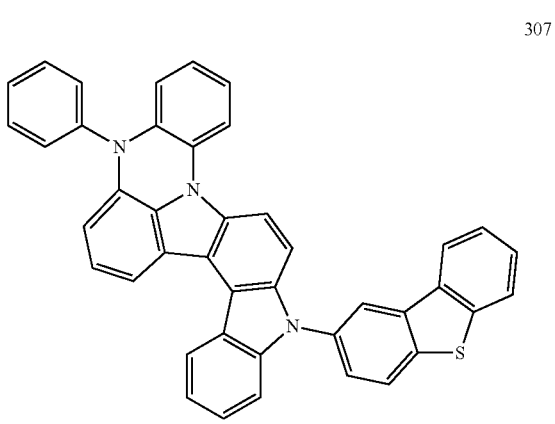
308
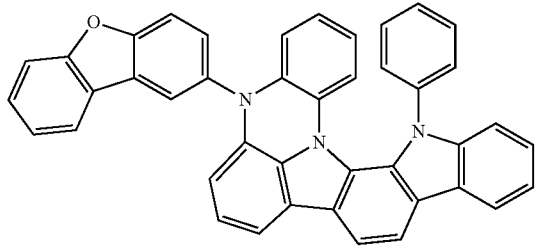
309
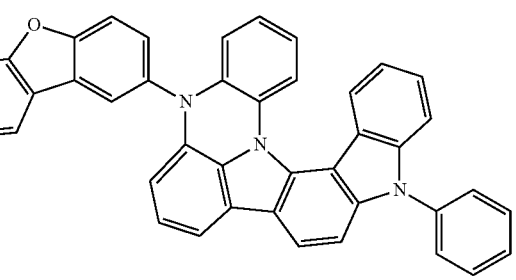

-continued
310
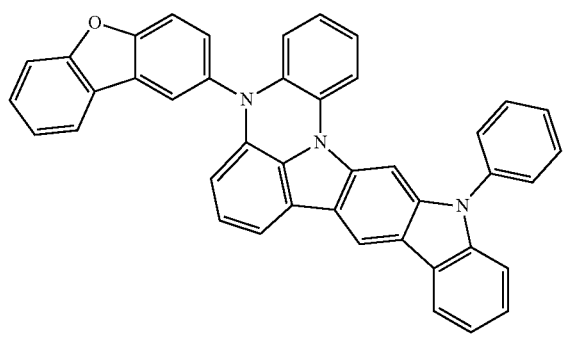
311
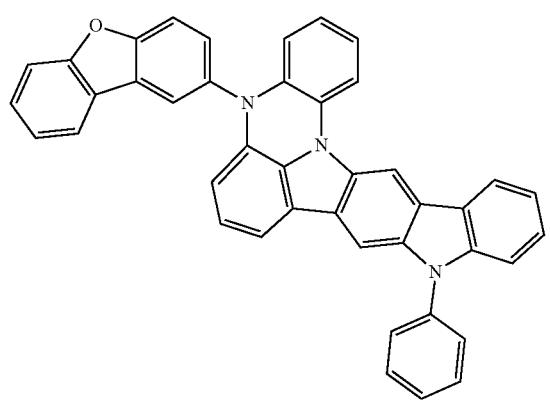
312
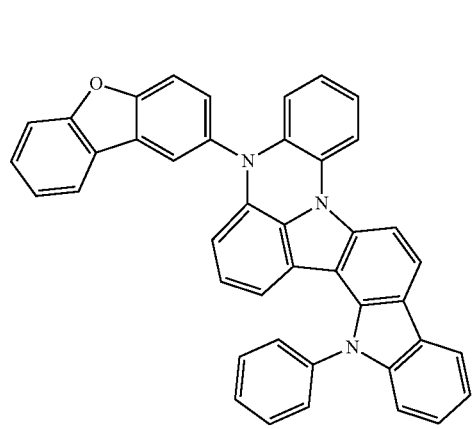
313
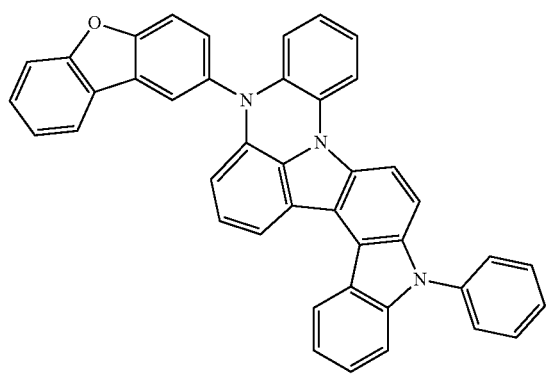
-continued
314
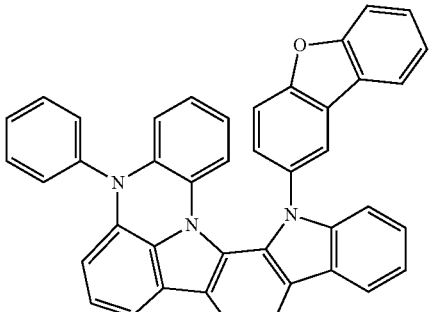
315
316
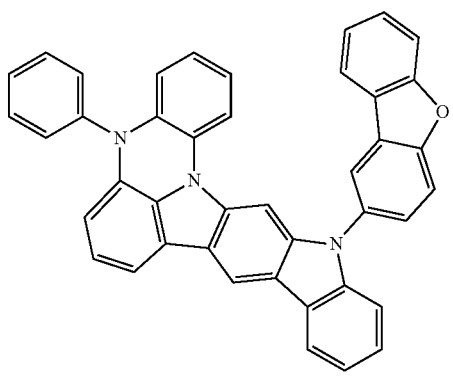
317
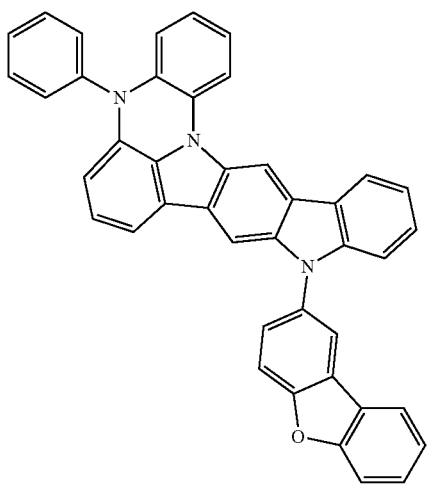

318
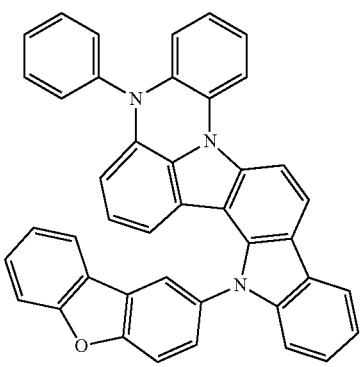
322
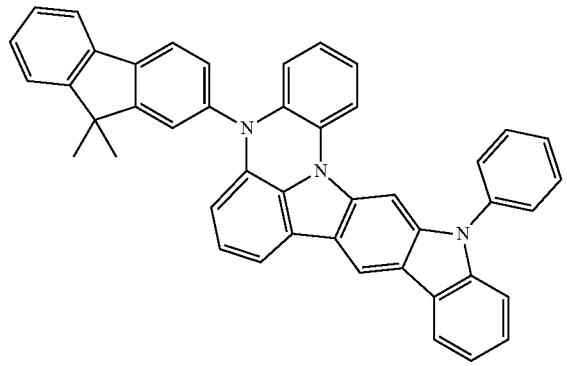
319
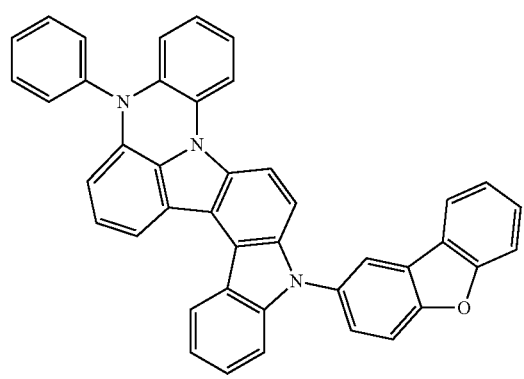
323
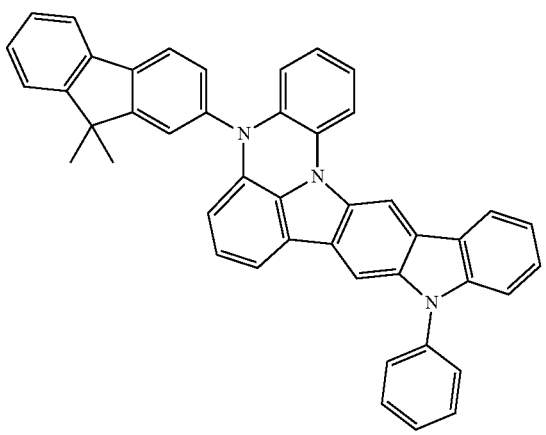
320
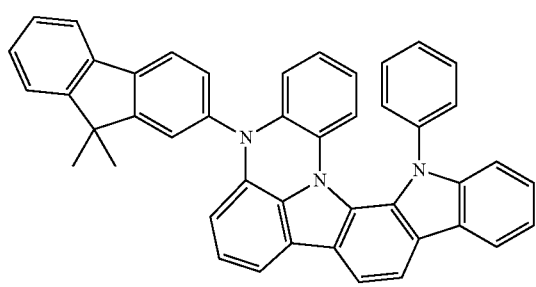
324
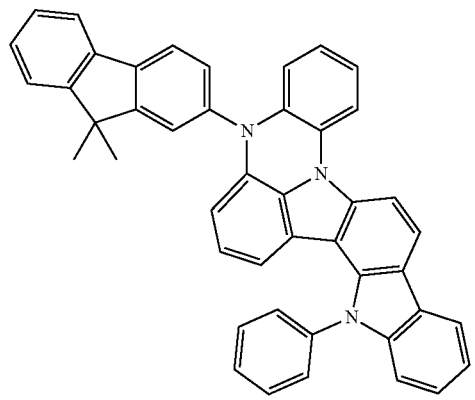
321
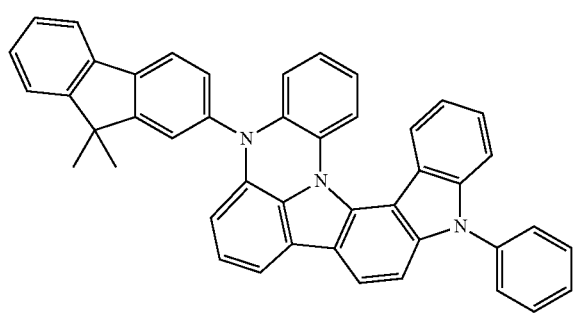
325
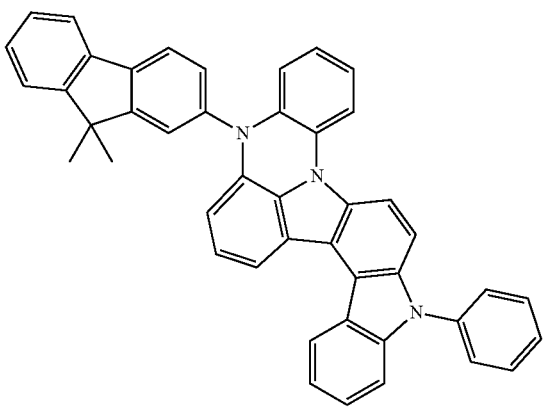

326
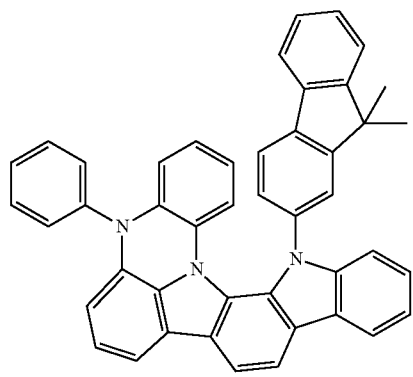
327
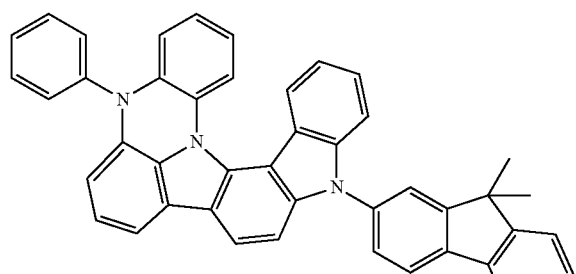
328
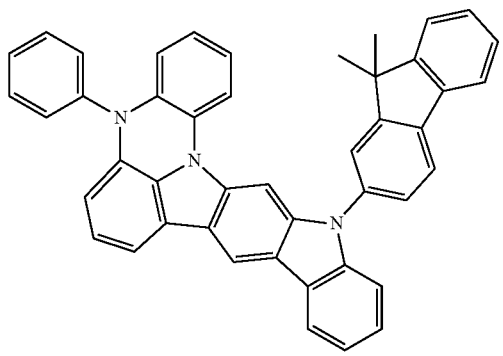
329
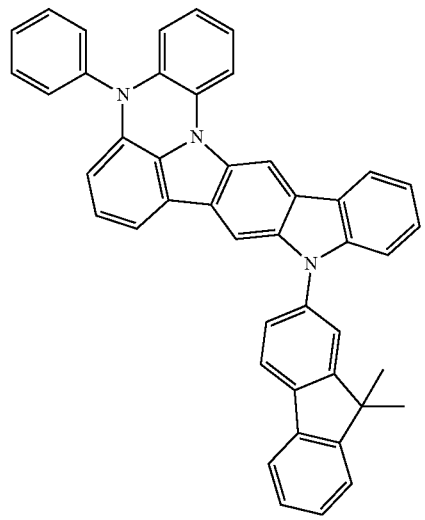
330
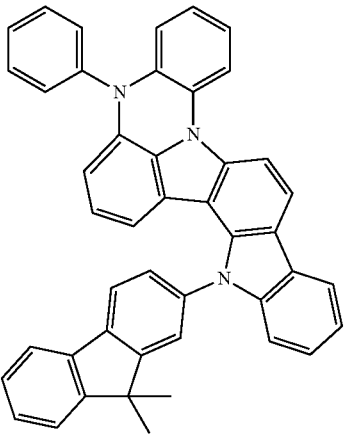
331
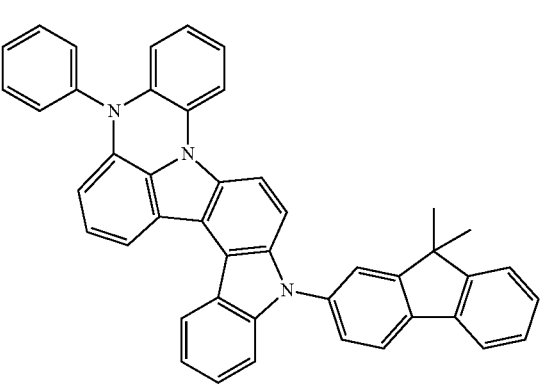
332
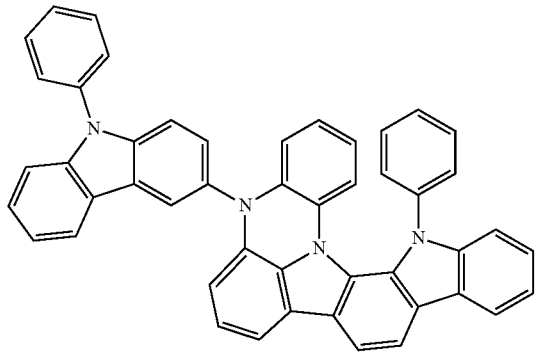
333
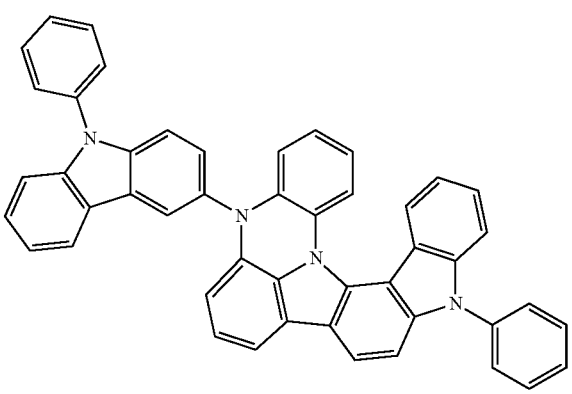

334
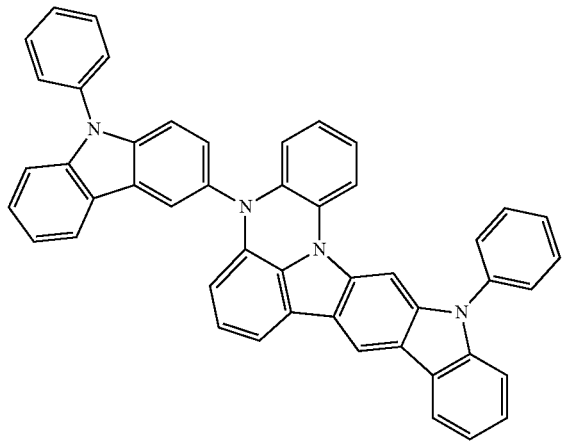
335
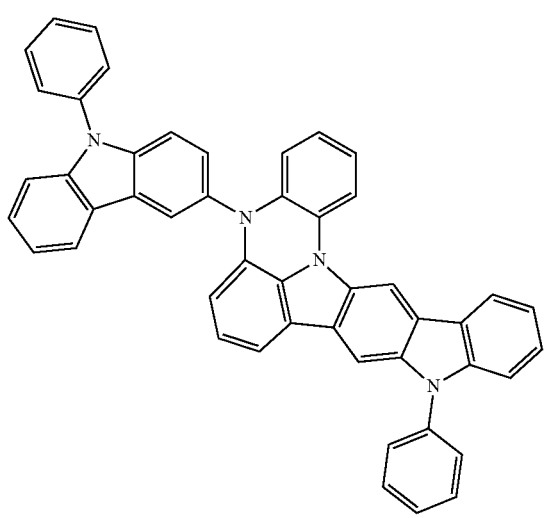
336
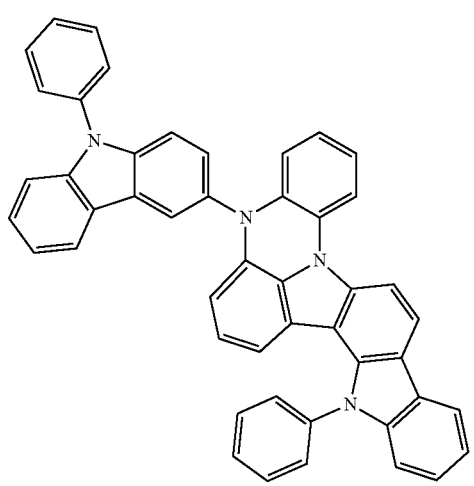
337
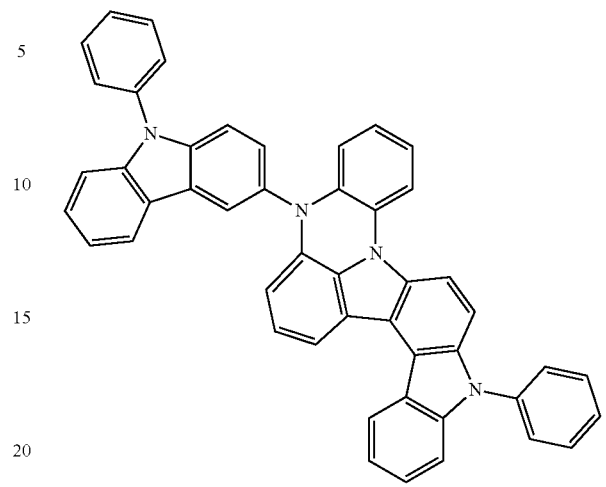
338
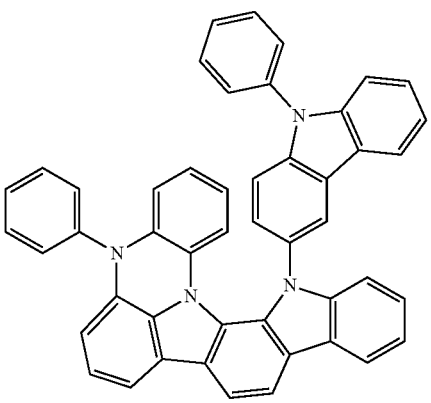
339
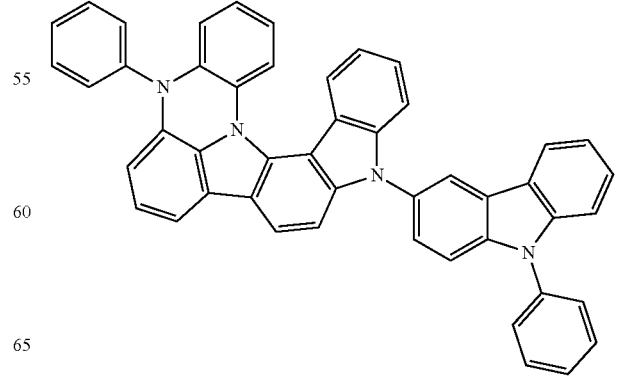

117
-continued
340
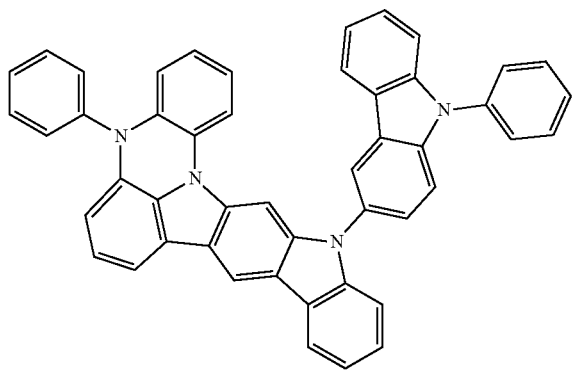
341
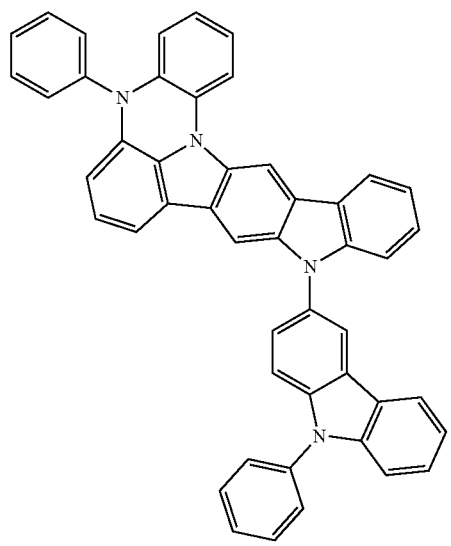
342
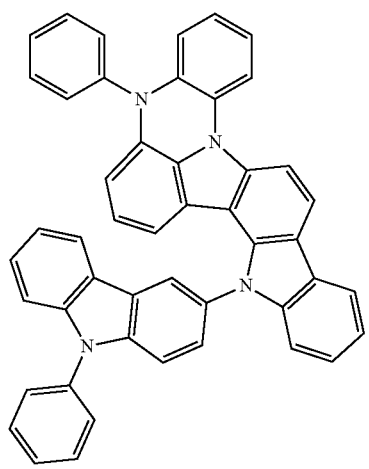
118
-continued
343
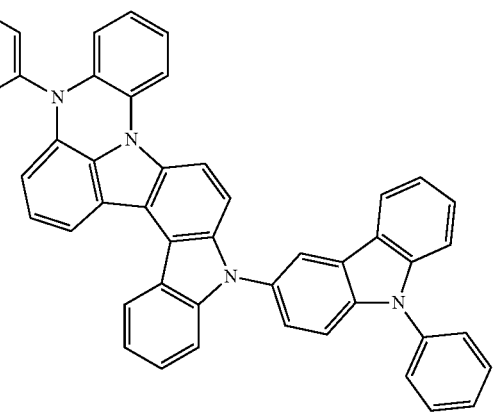
344
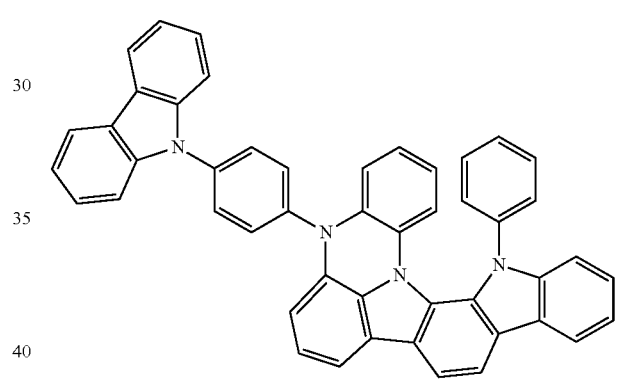
345
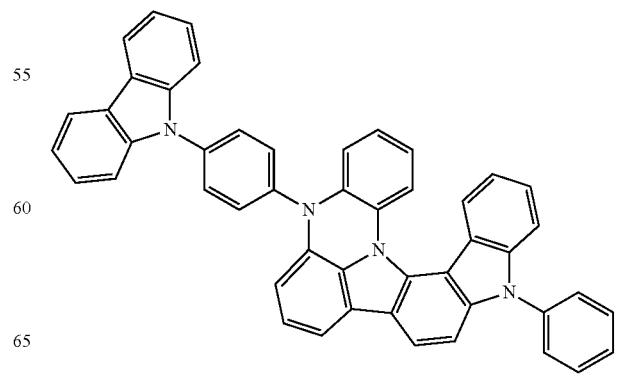

-continued
346
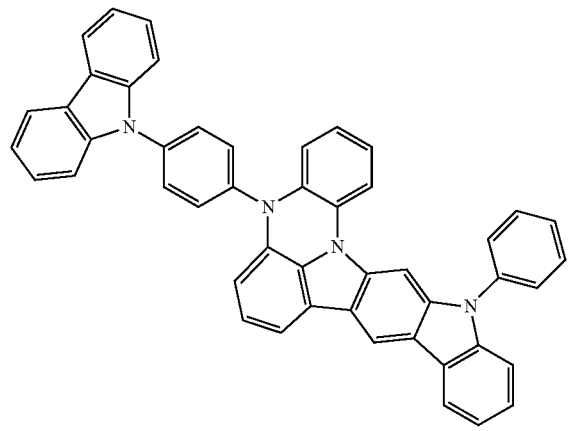
347
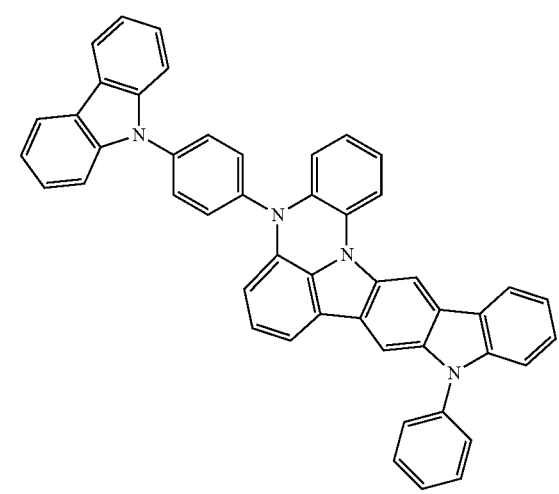
348
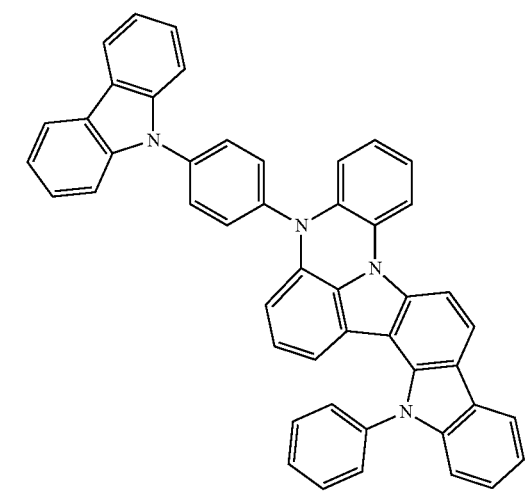
-continued
349
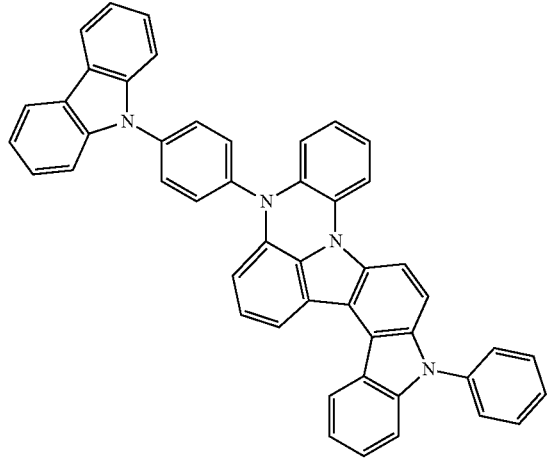
350
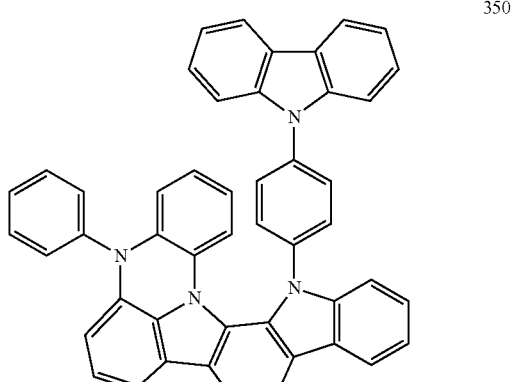
351
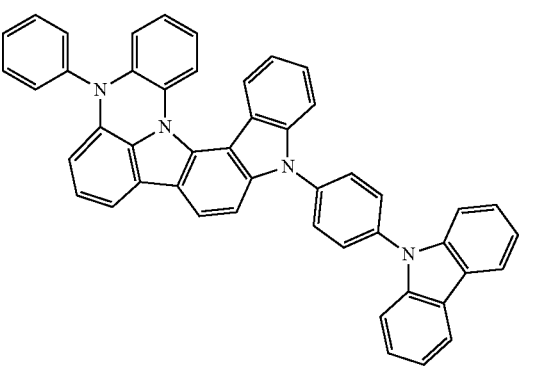
352
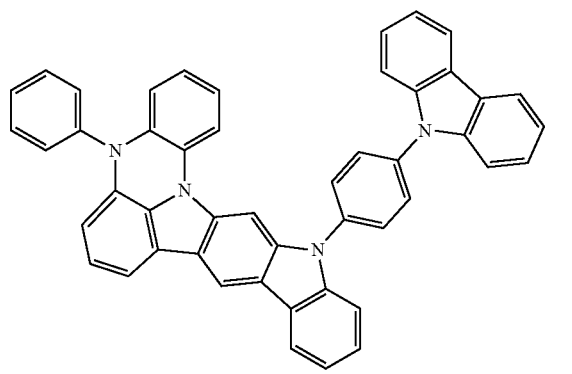

121
-continued
353
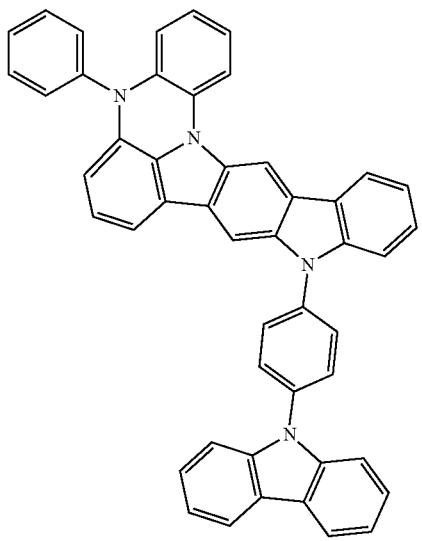
354
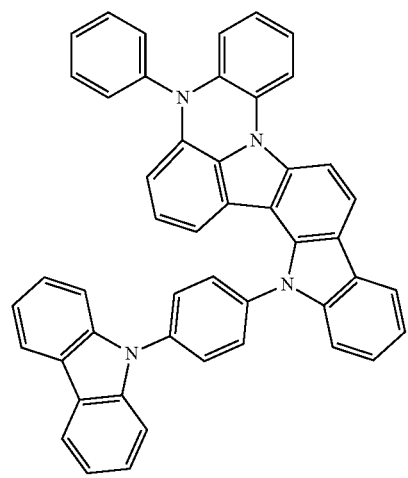
355
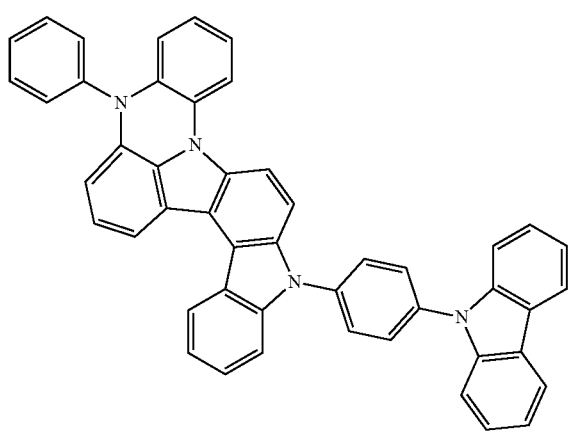
122
-continued
356
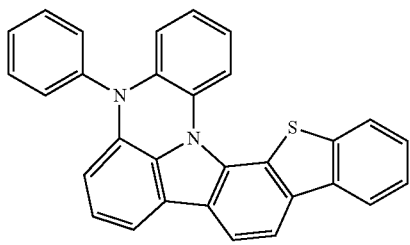
357
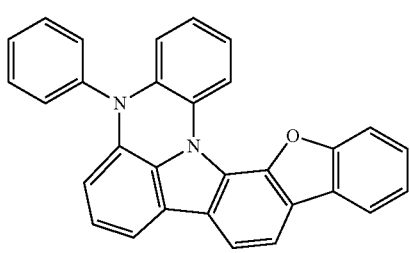
358
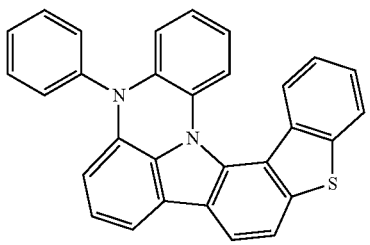
359
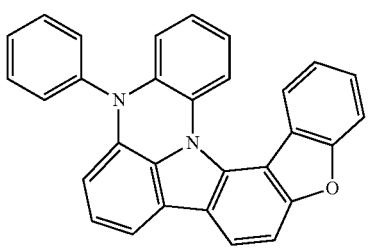
360
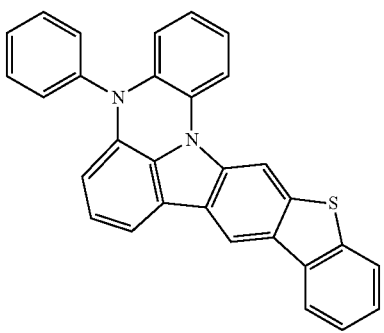

123
-continued
361
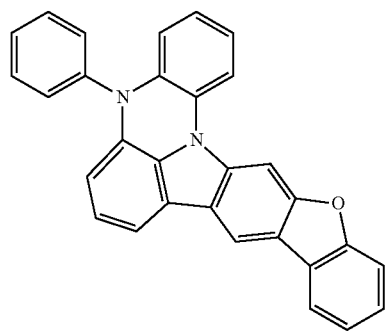
362
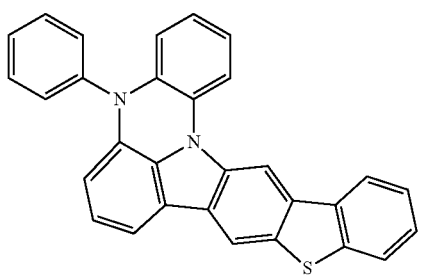
363
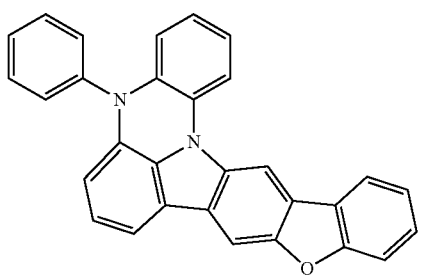
364
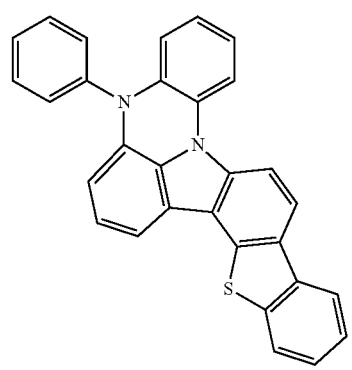
365
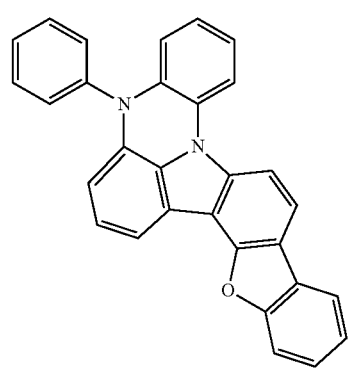
124
-continued
366
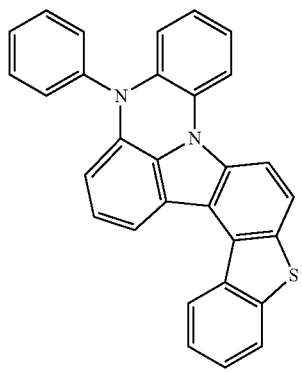
367
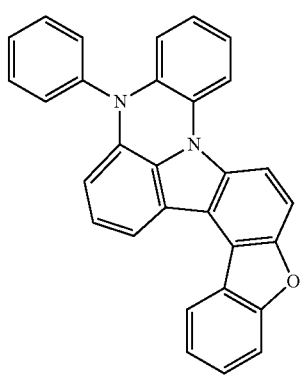
368
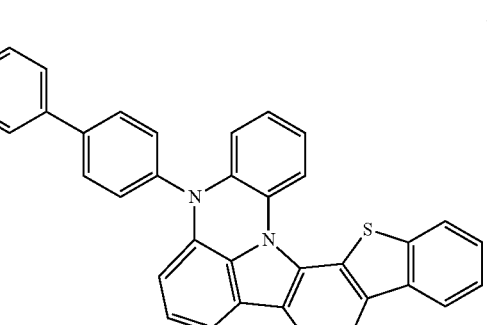
369
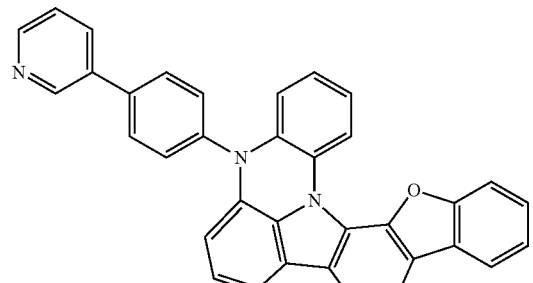

370
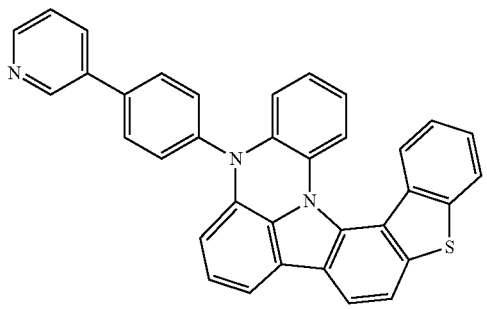
374
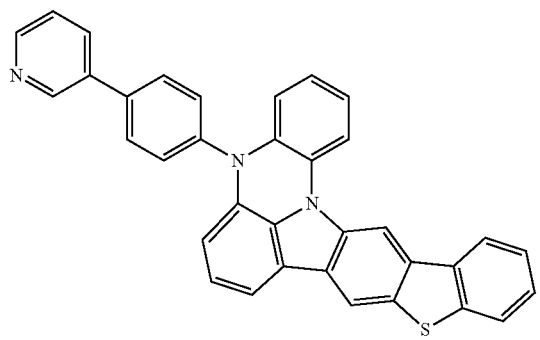
371
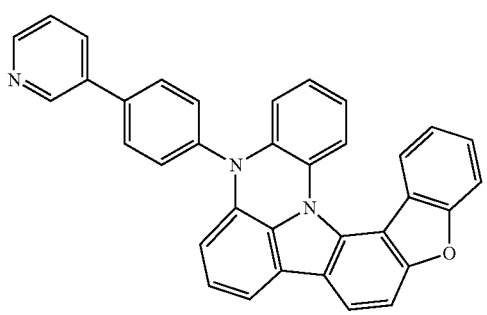
375
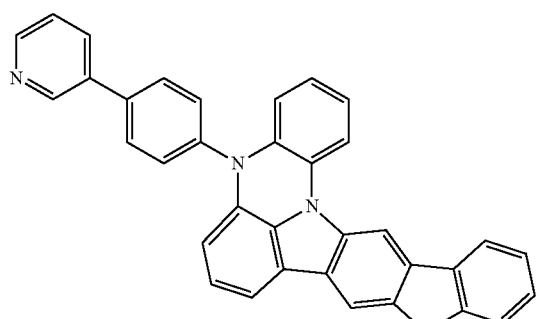
372
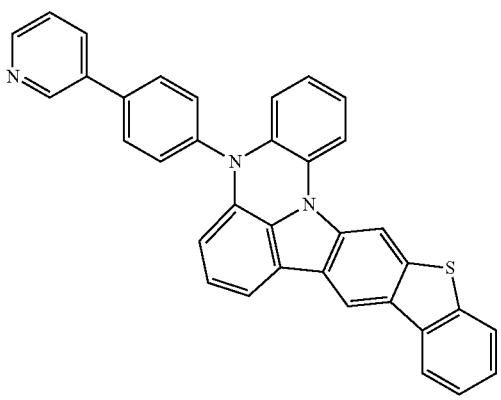
376
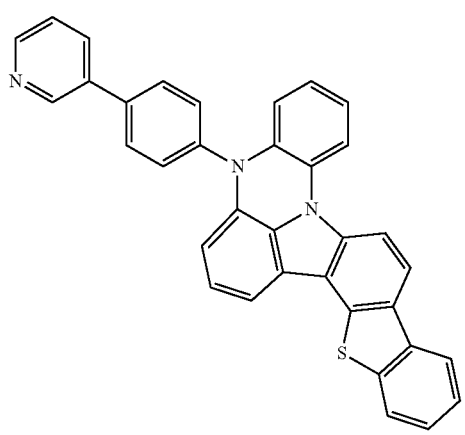
373
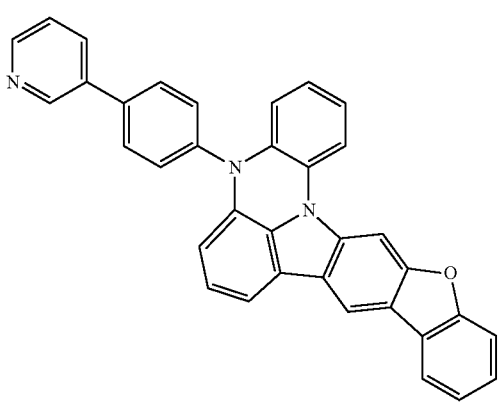
377
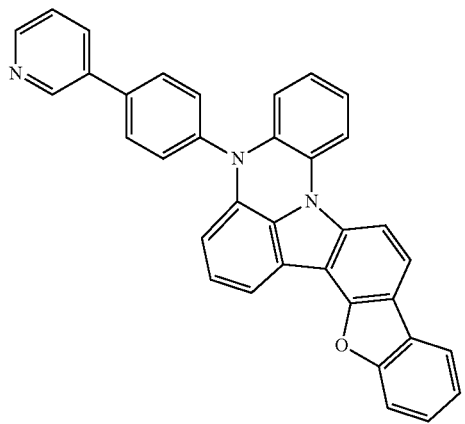

US 9,543,528 B2
127
-continued
378
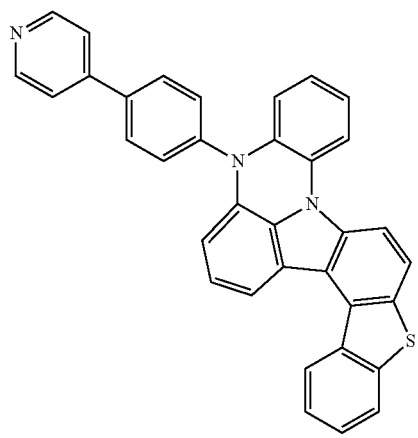
379
380
381
128
-continued
382
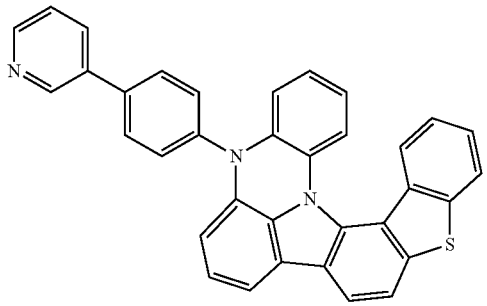
383
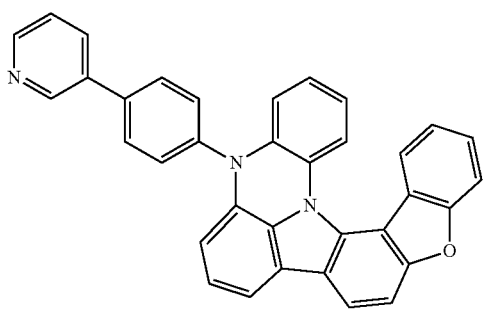
384
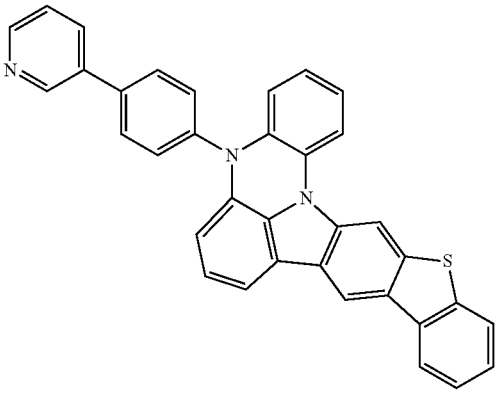
385
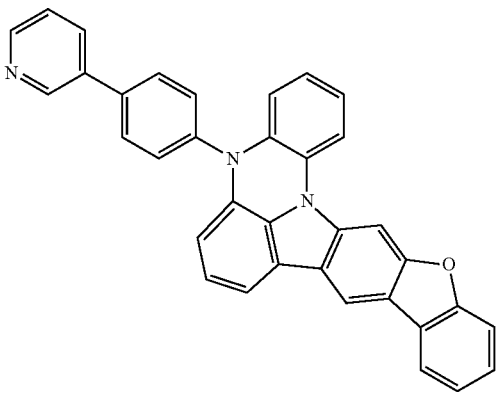

-continued
386
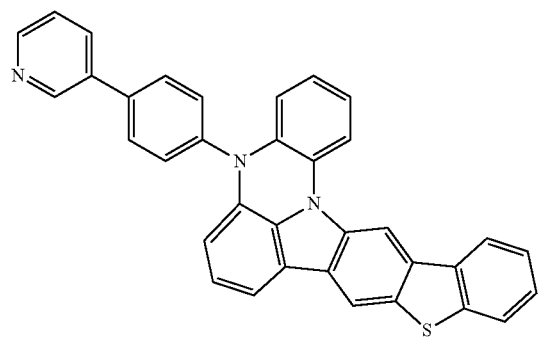
387
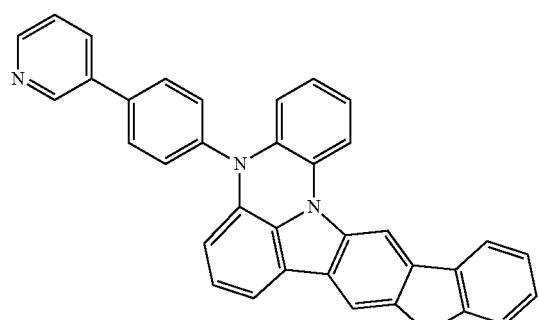
388
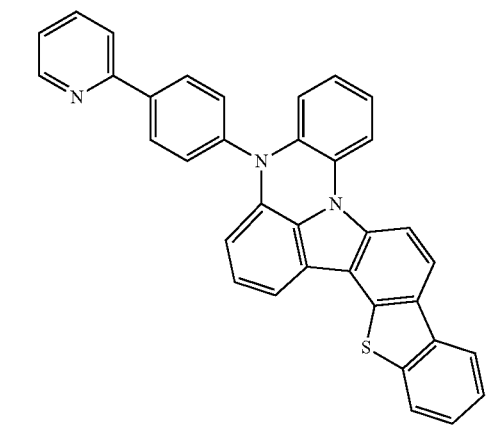
389
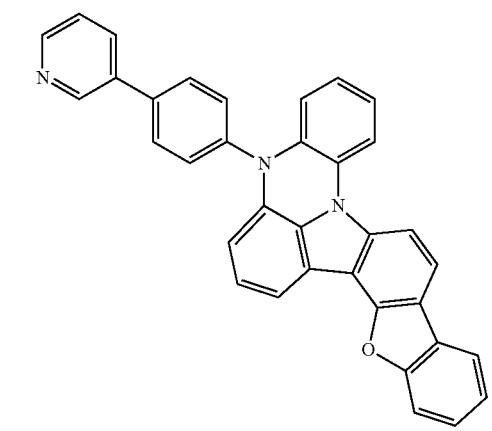
-continued
390
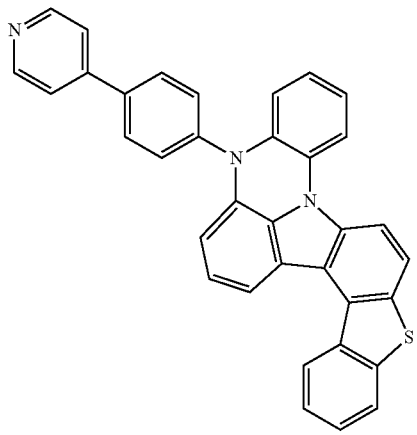
391
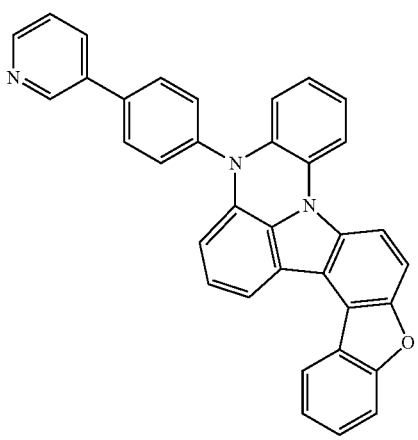
392
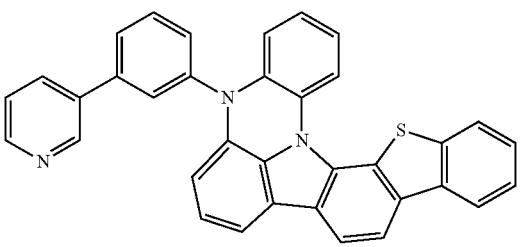
393
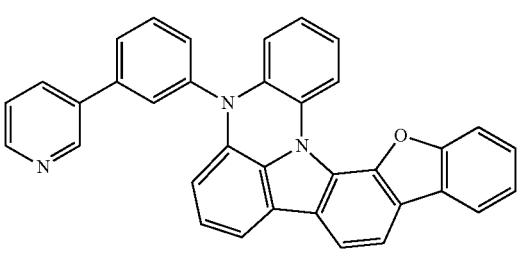
394
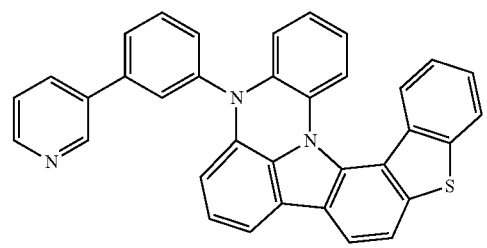

395
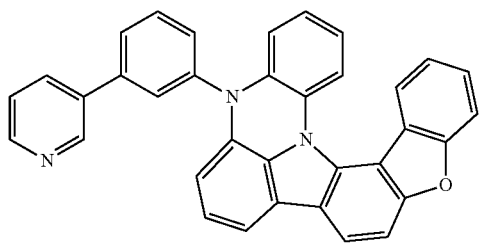
396
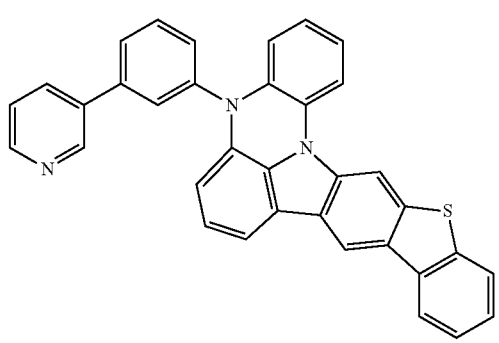
397
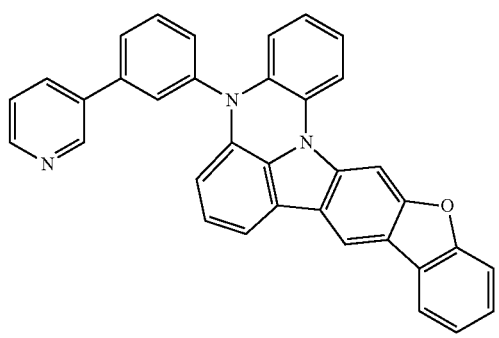
398
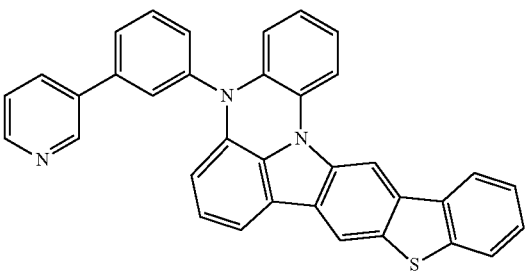
399
400
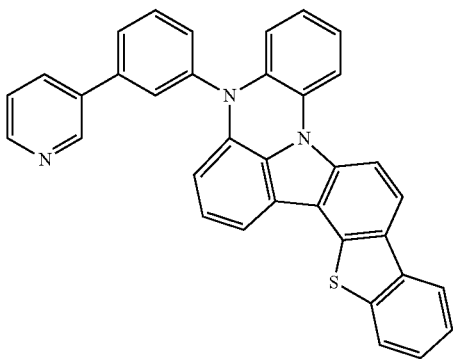
401
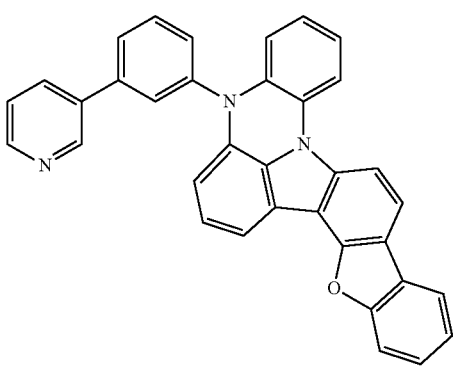
402
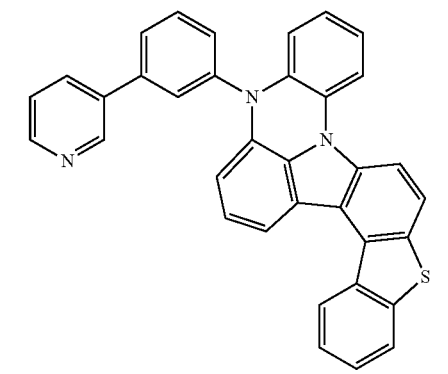
403
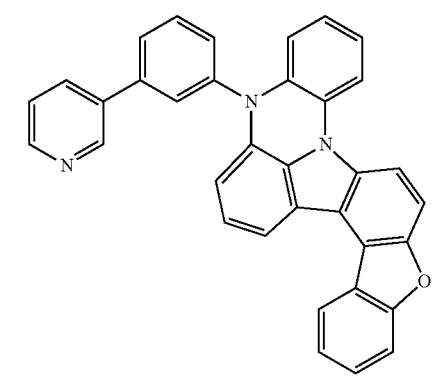

133
-continued
404
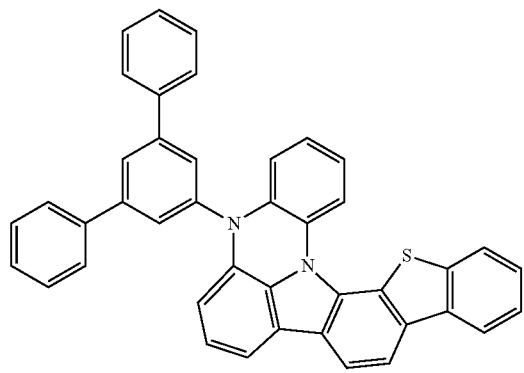
405
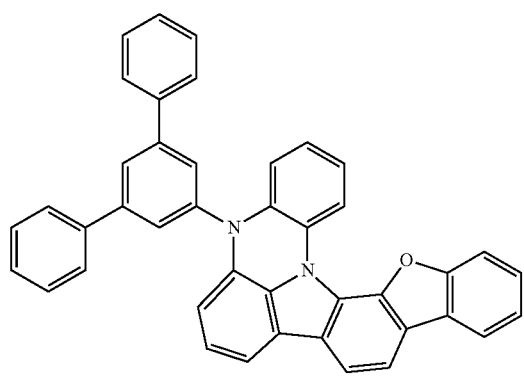
406
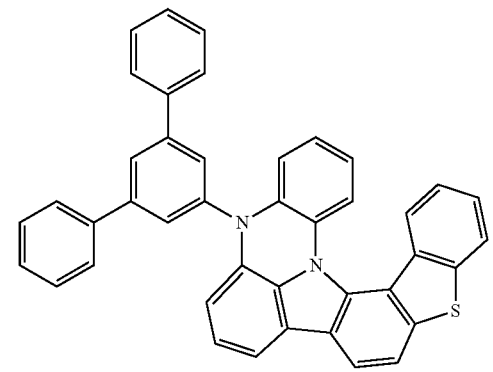
407
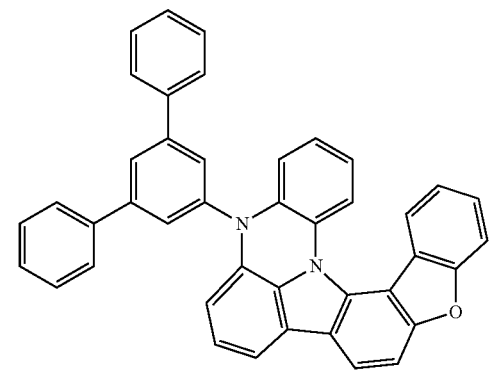
134
-continued
408
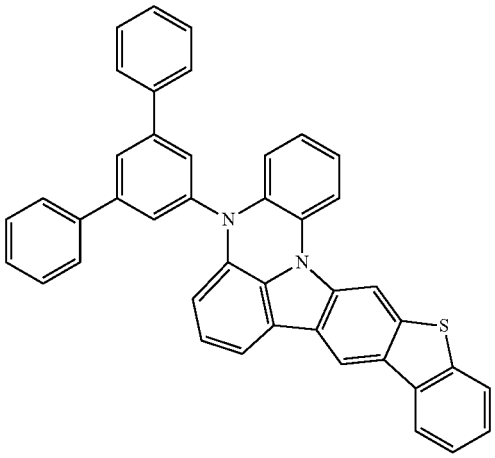
409
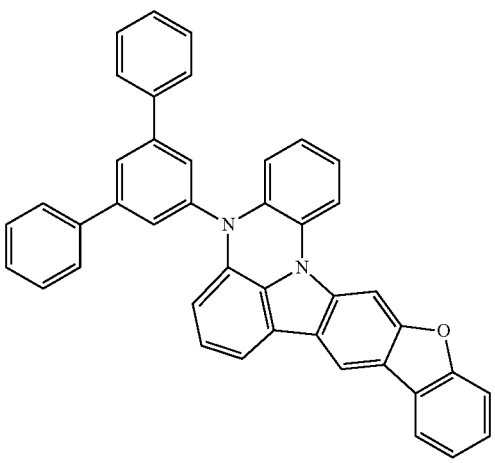
410
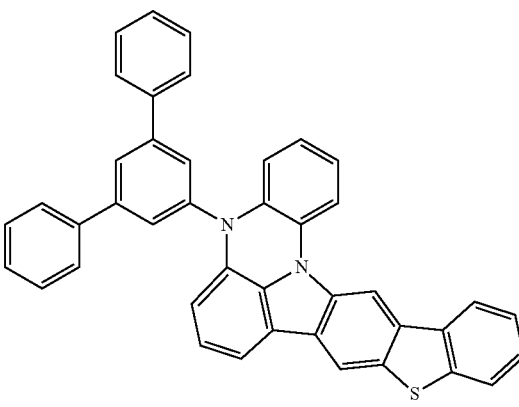

411
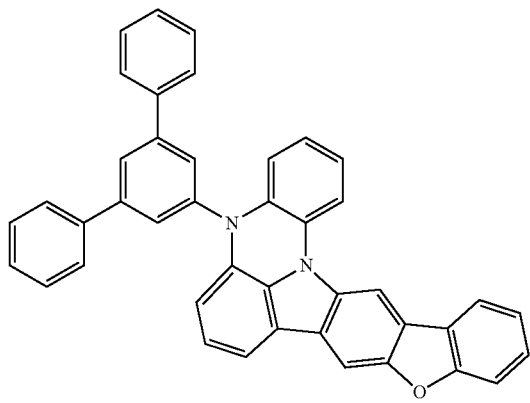
412
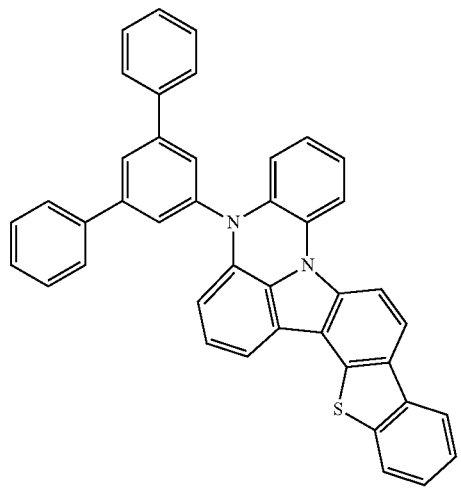
413
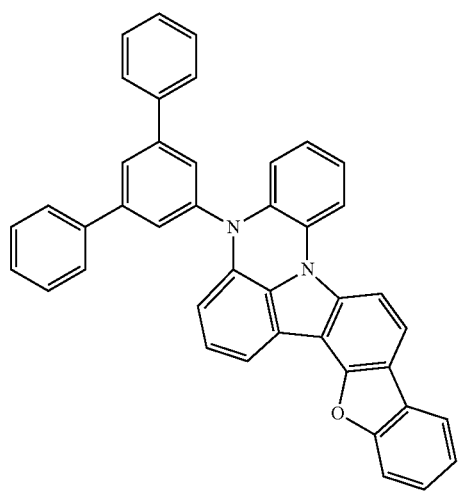
414
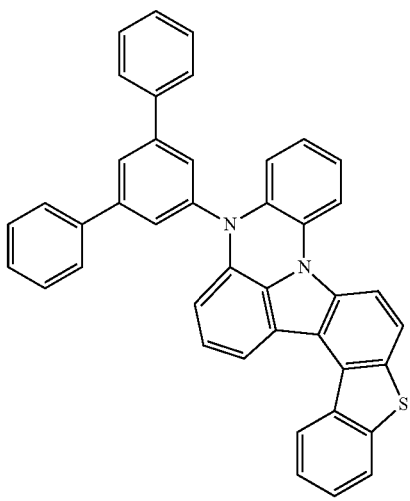
415
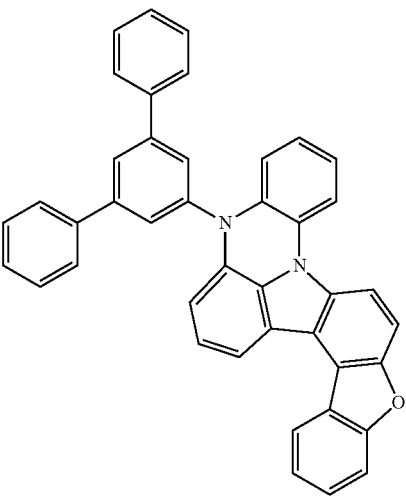
416
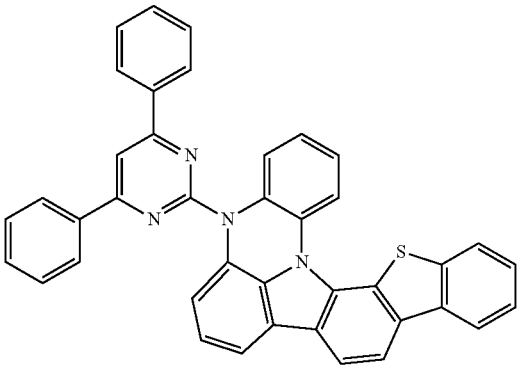

417
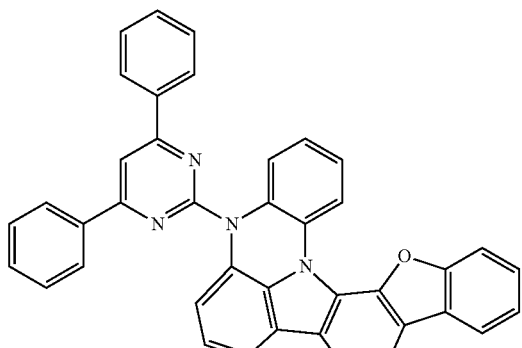
418
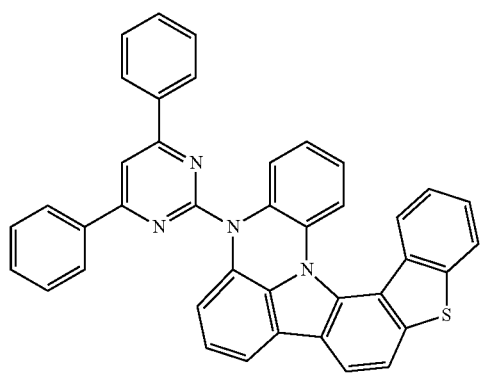
419
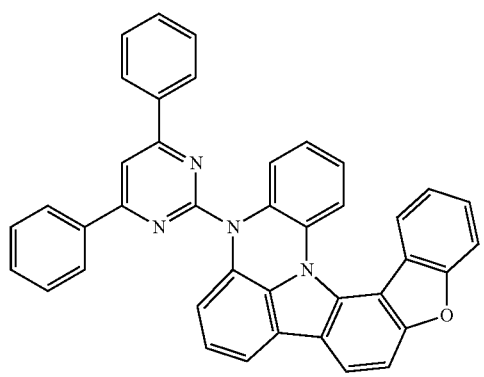
420
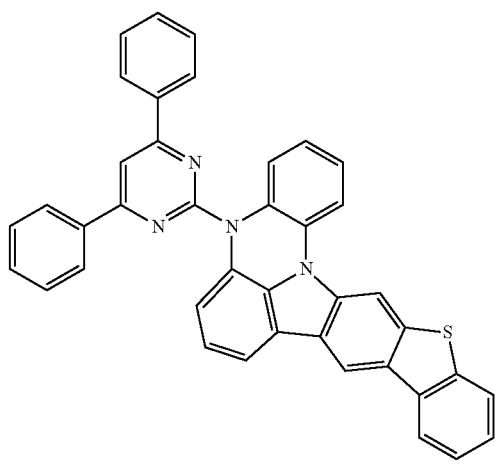
421
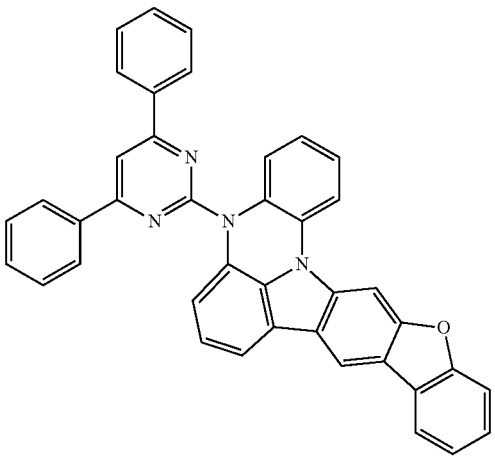
422
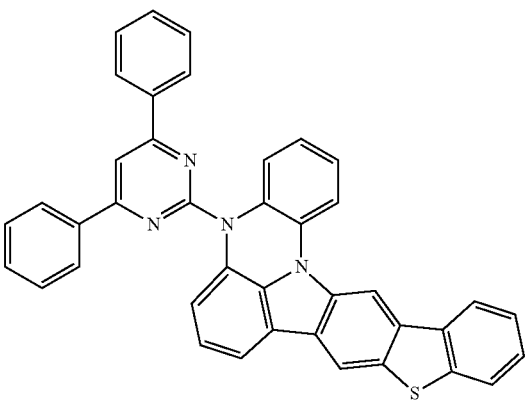
423
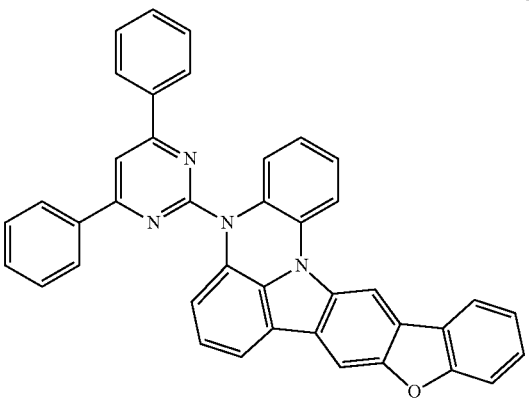

424
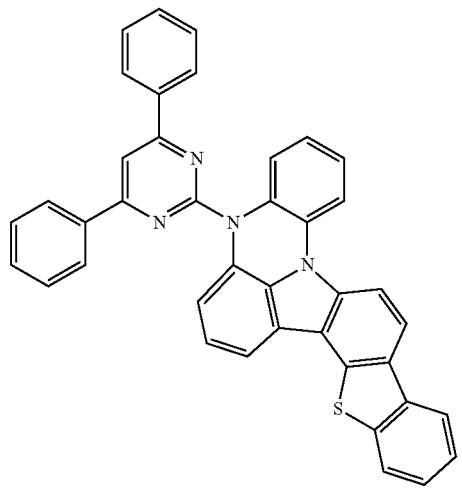
425
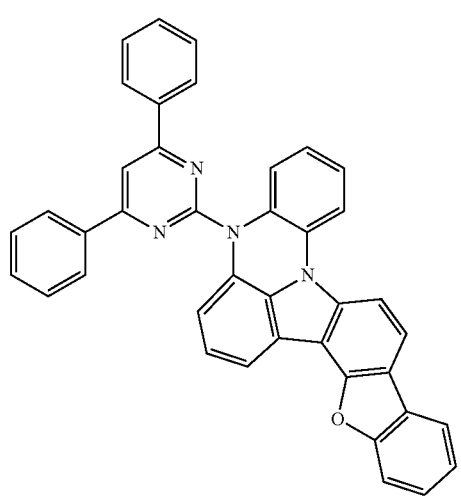
426
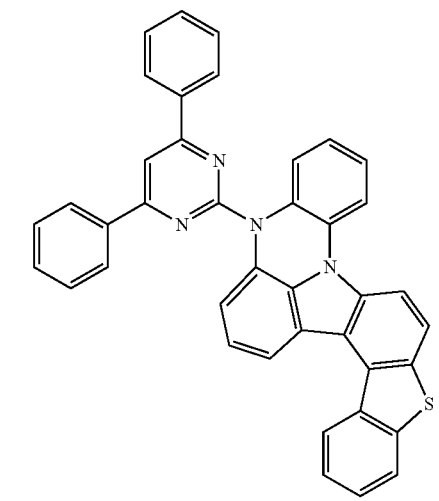
427
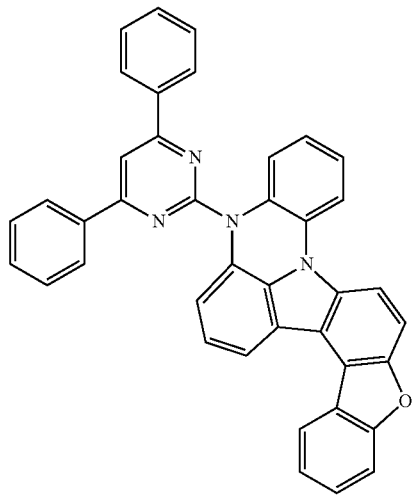
428
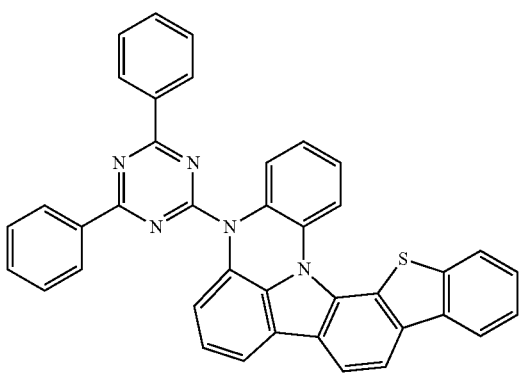
429
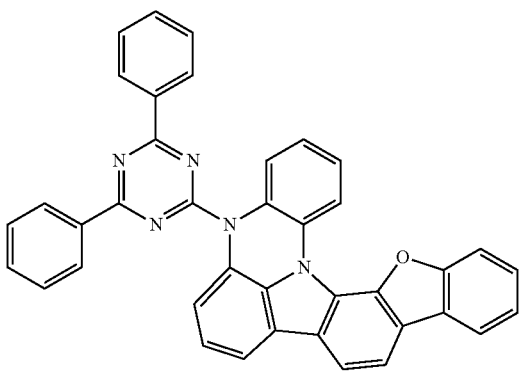
430
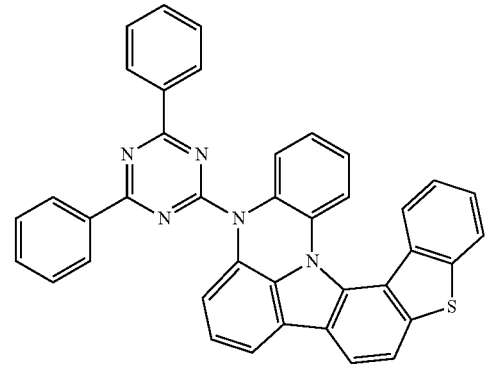

141
-continued
431
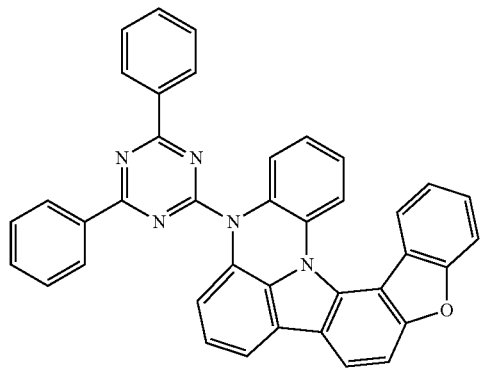
432
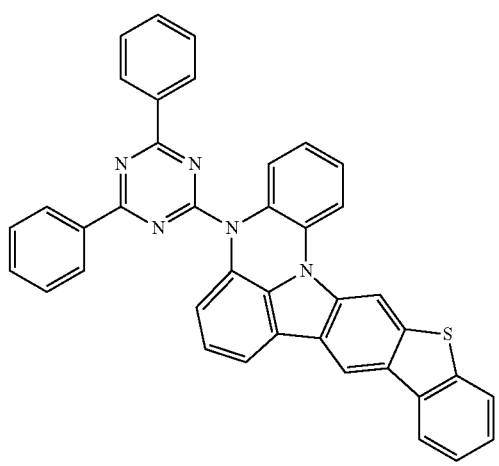
433
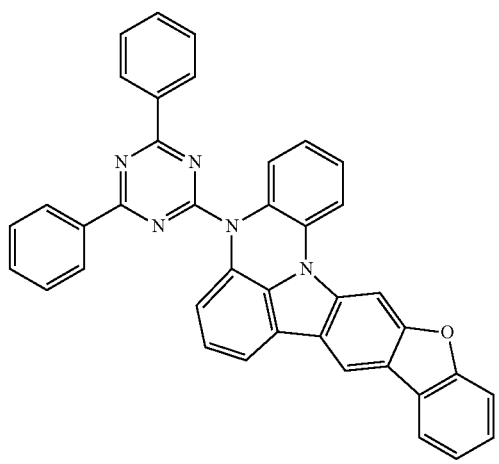
142
-continued
434
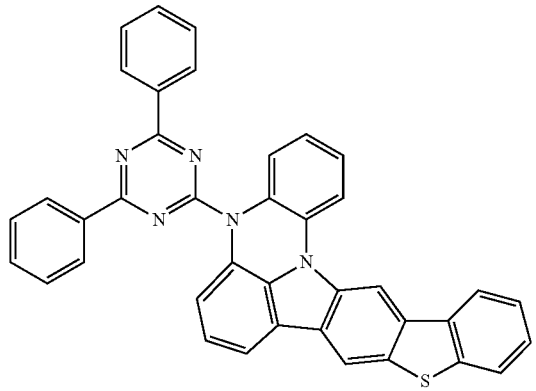
435
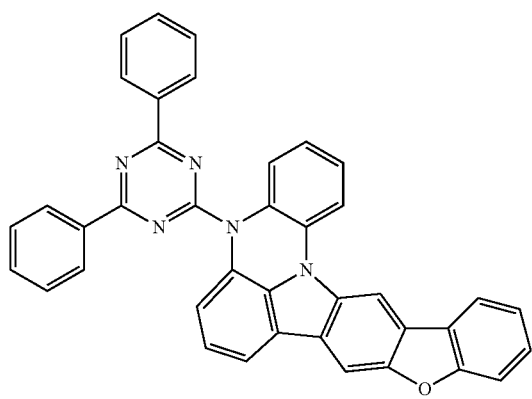
436
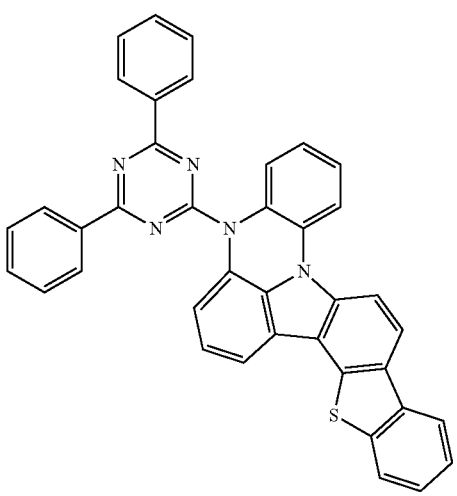

437
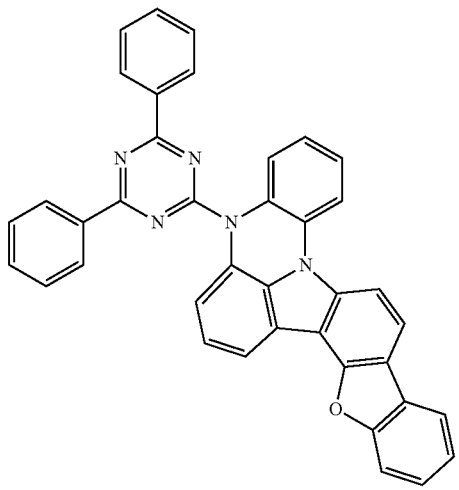
438
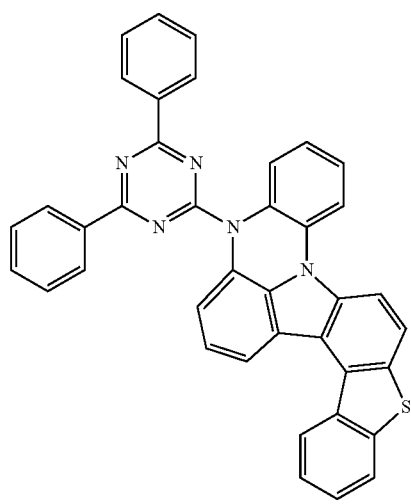
439
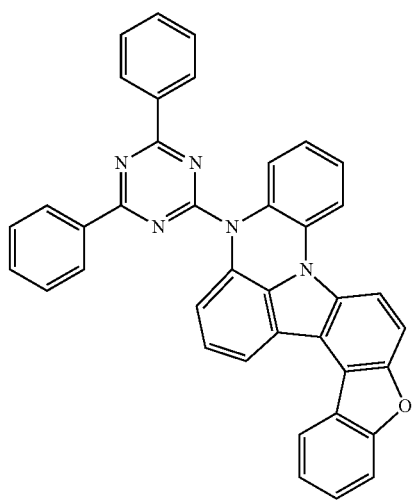
440
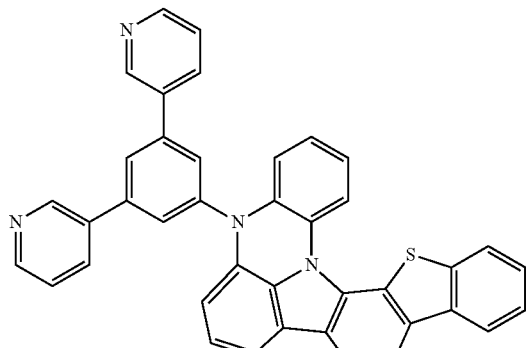
441
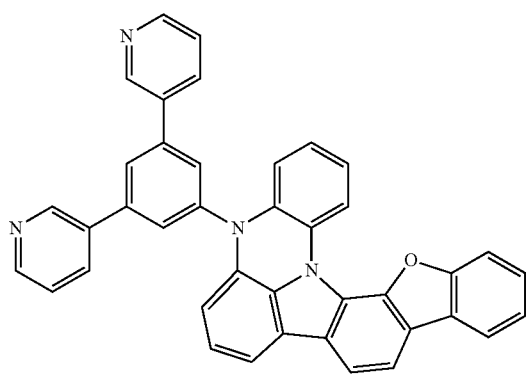
442
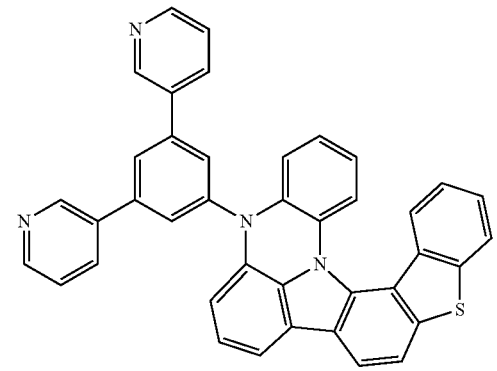
443
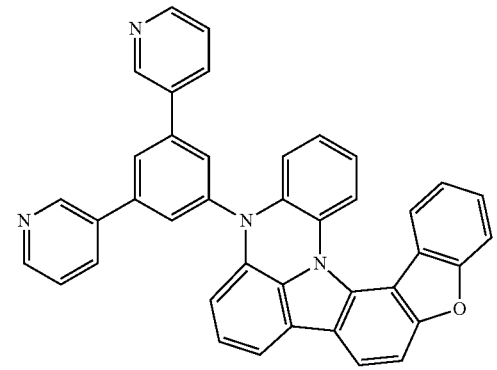

145
-continued
444
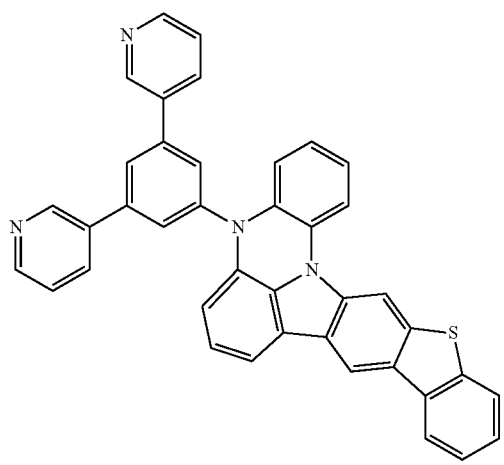
445
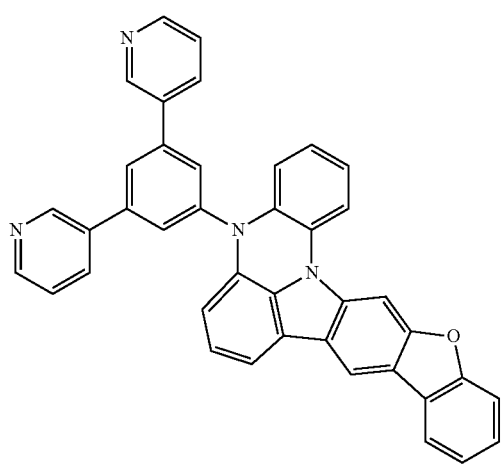
446
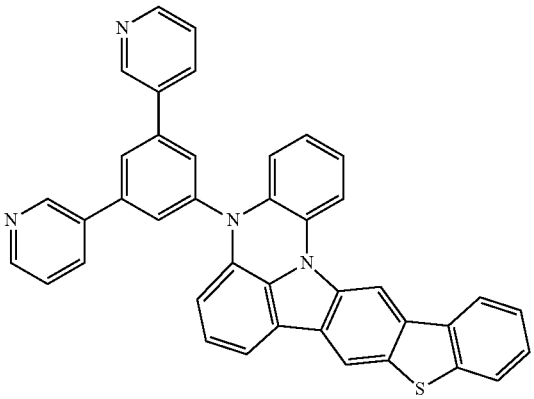
146
-continued
447
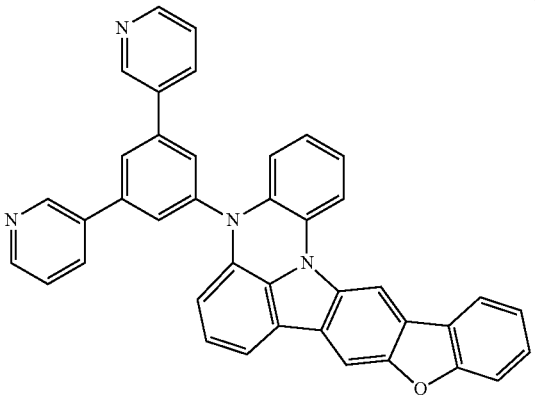
448
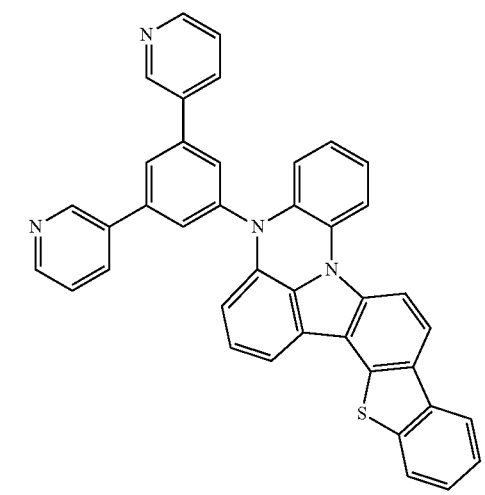
449
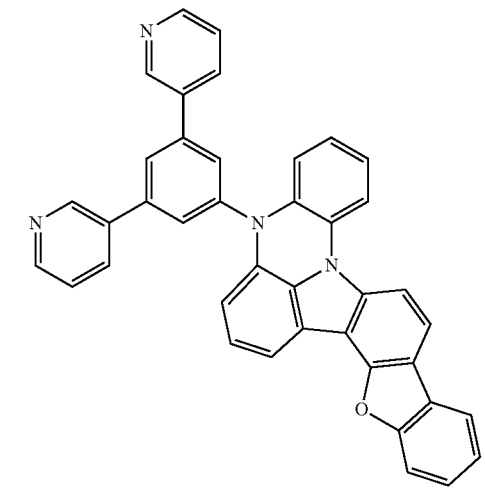

-continued
450
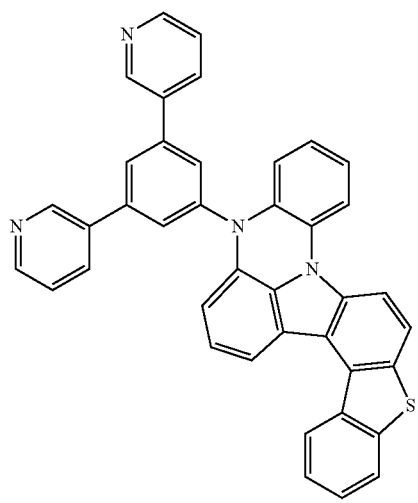
451
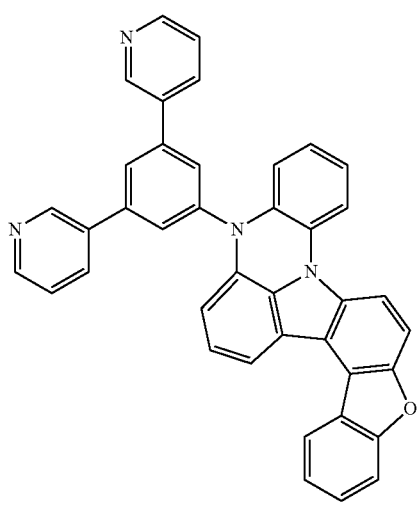
452
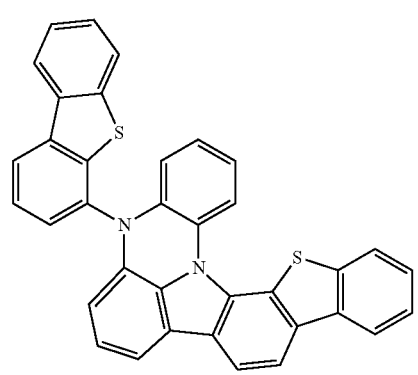
-continued
453
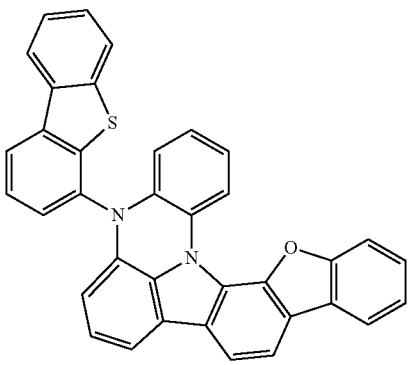
454
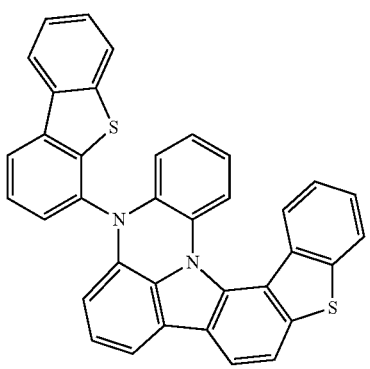
455
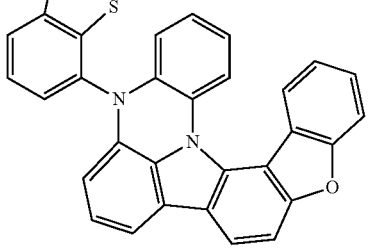
456
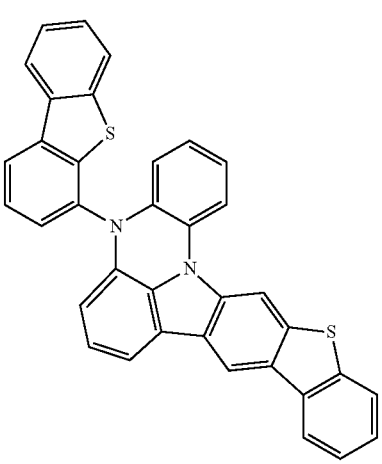

457
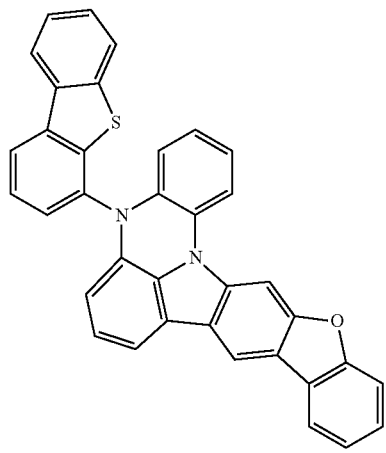
458
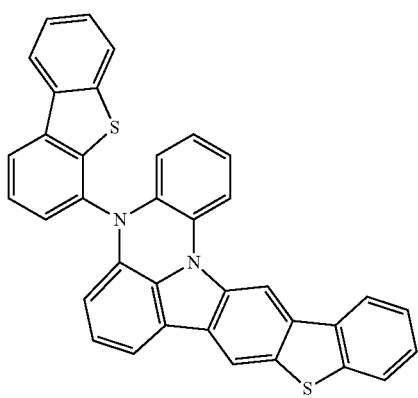
459
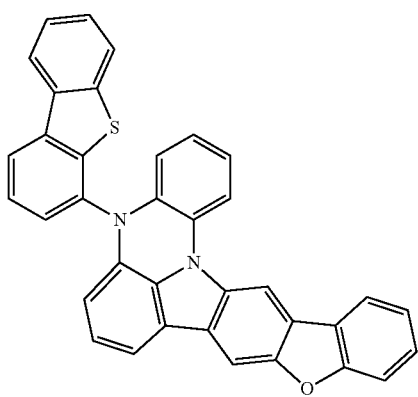
460
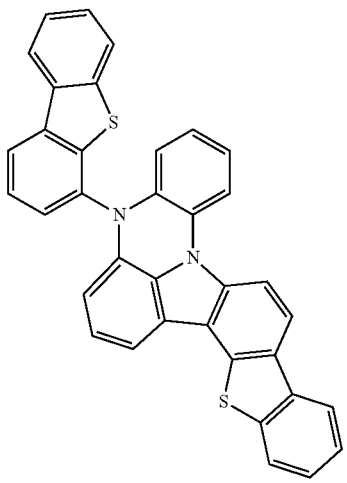
461
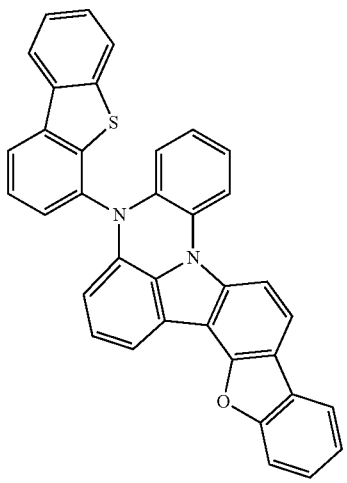
462
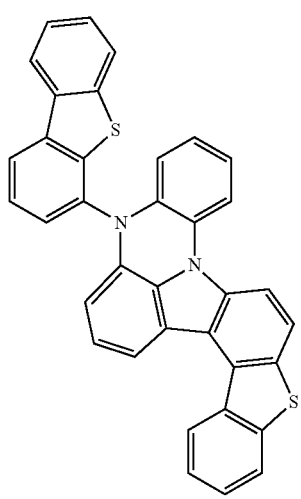

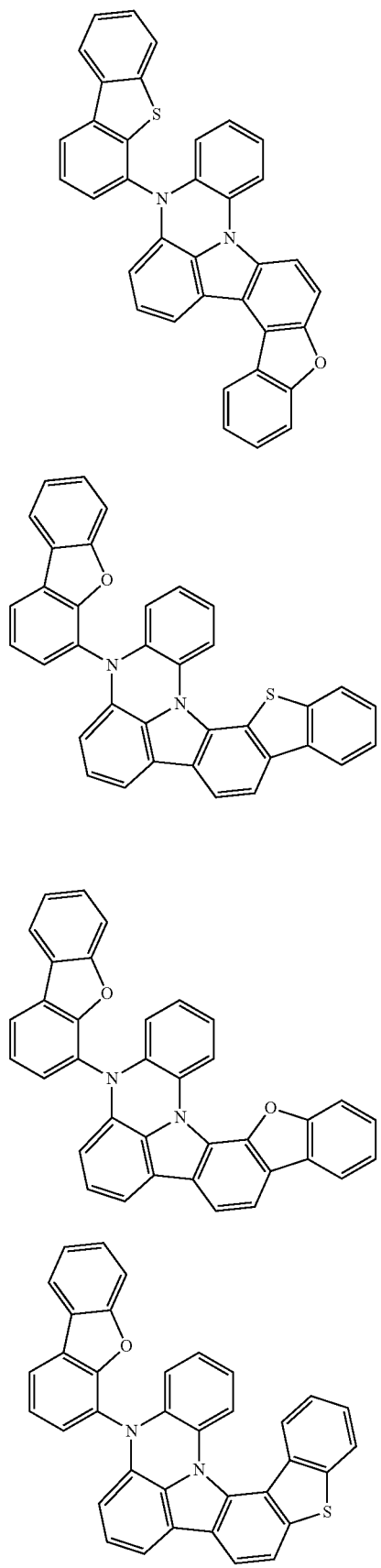

153
-continued
471
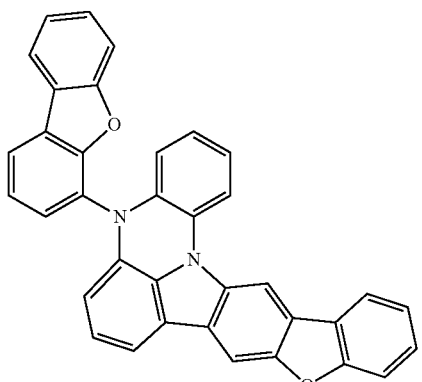
472
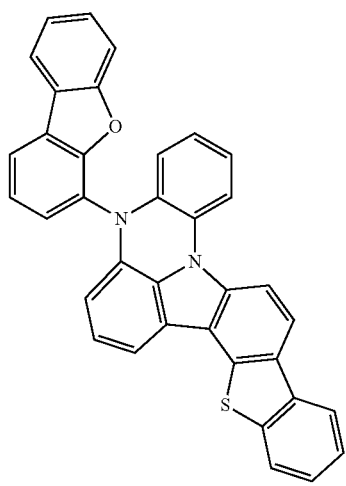
473
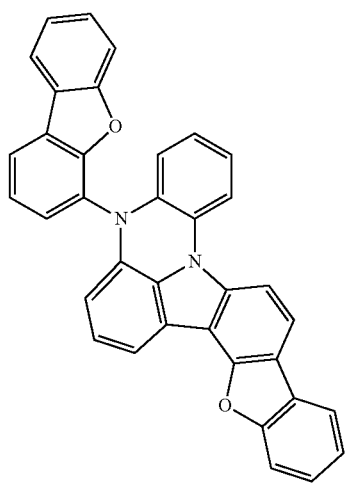
154
-continued
474
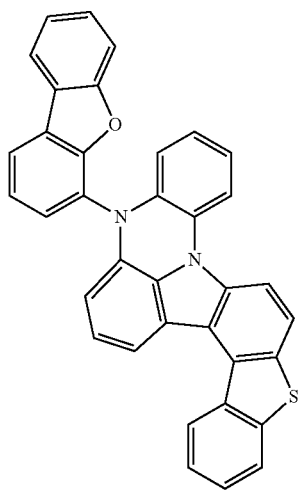
475
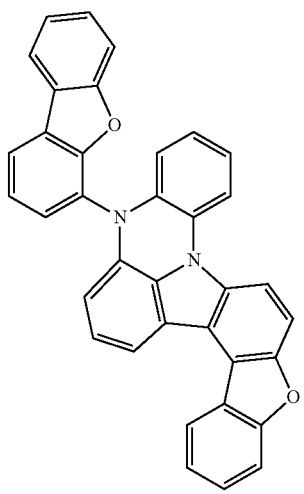
476
477
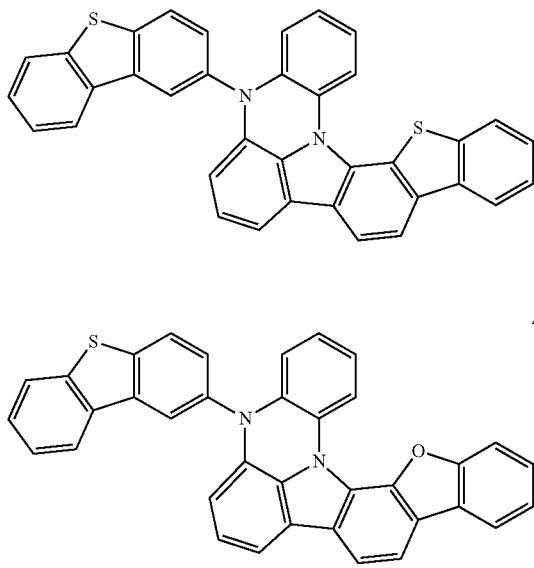

-continued
478
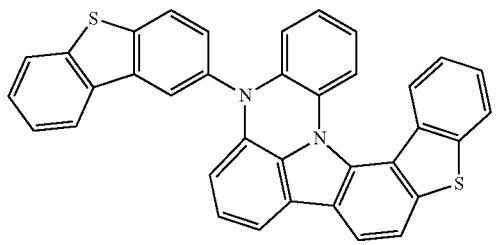
479
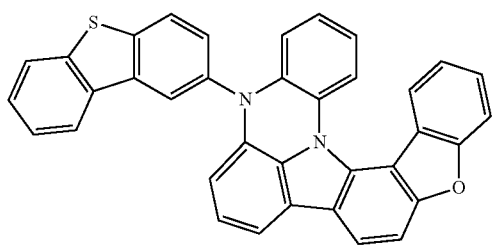
480
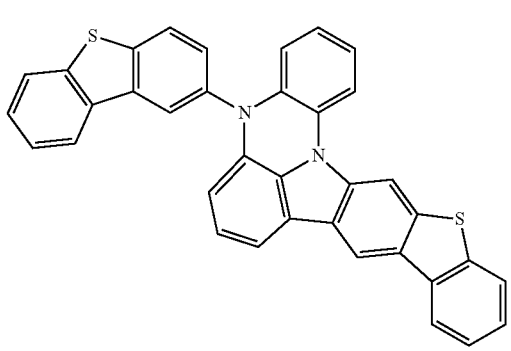
481
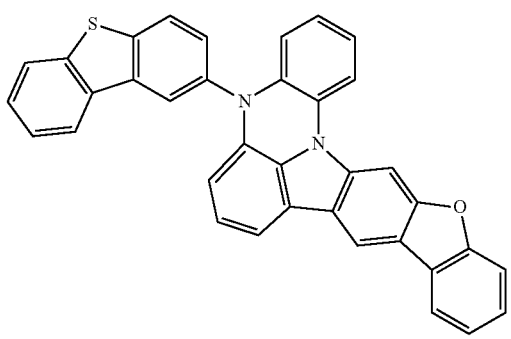
482
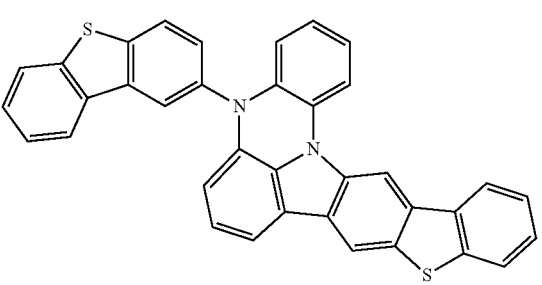
-continued
483
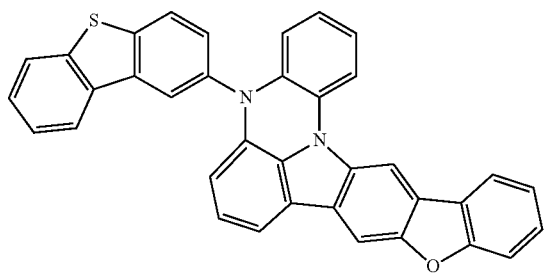
484
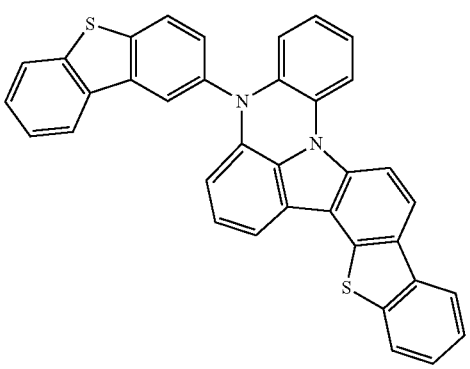
485
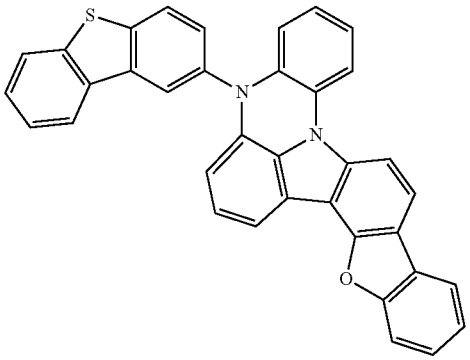
486
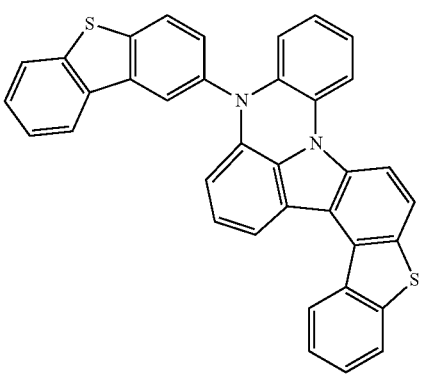

-continued
487
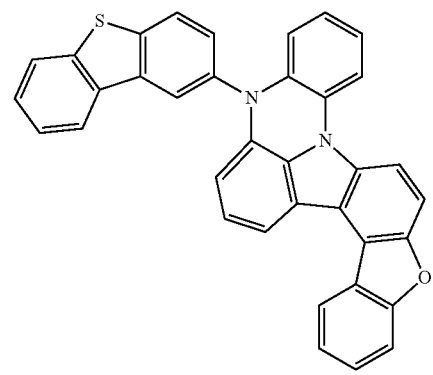
488
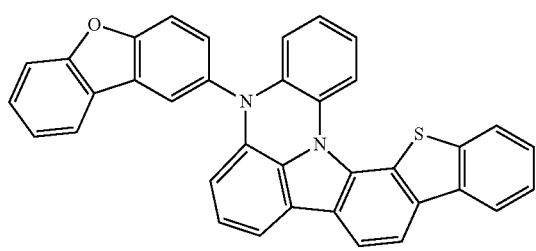
489
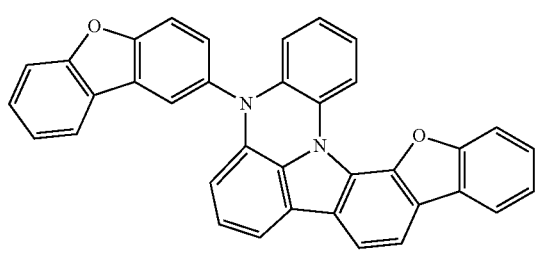
490
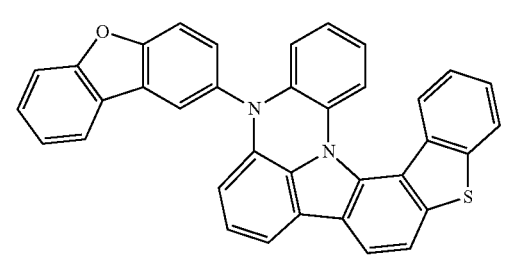
491
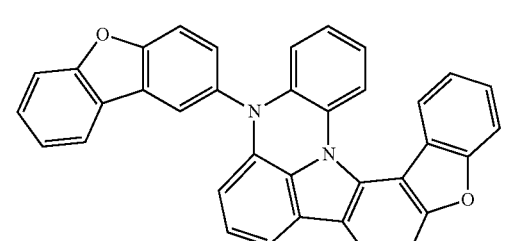
-continued
492
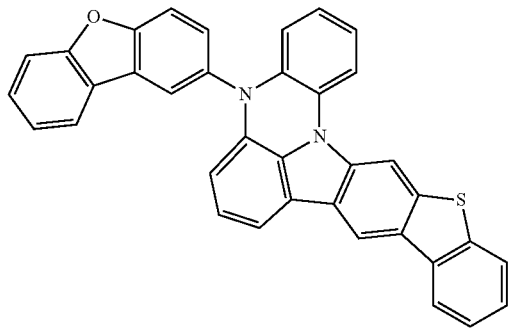
493
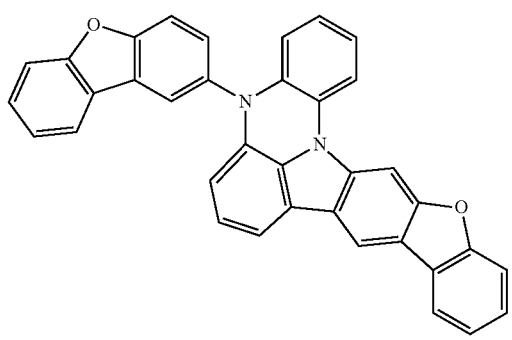
494
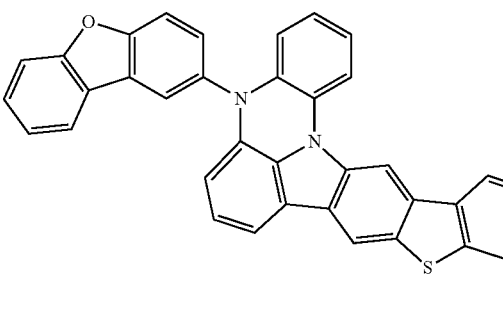
495
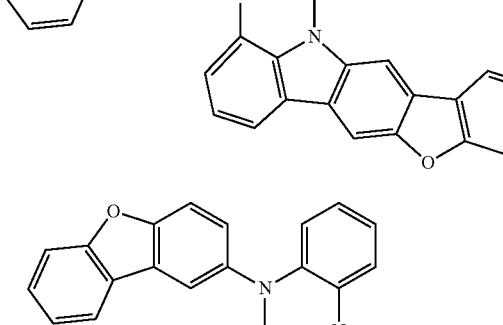
496

159
-continued
497
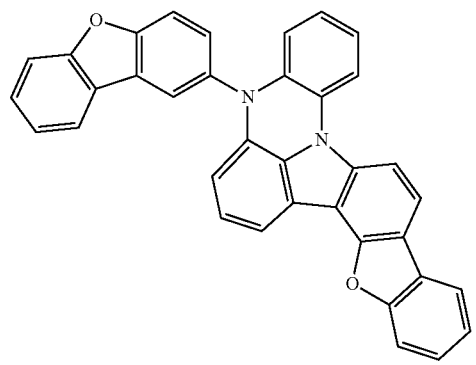
498
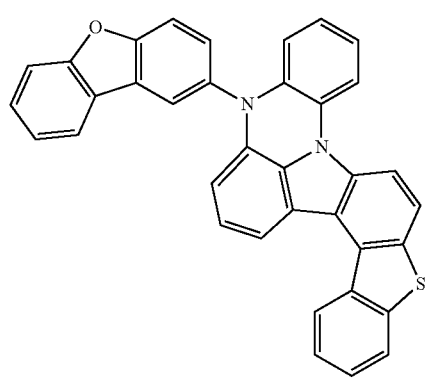
499
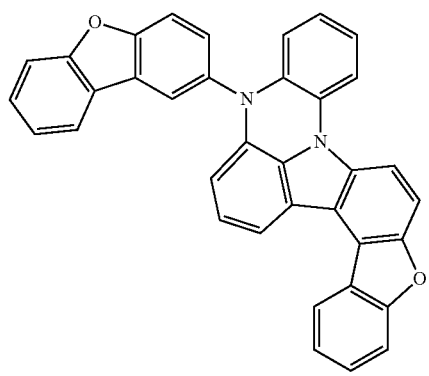
500
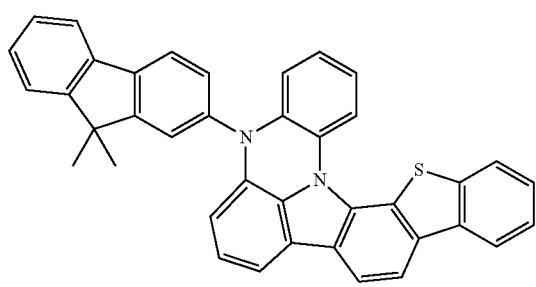
160
-continued
501
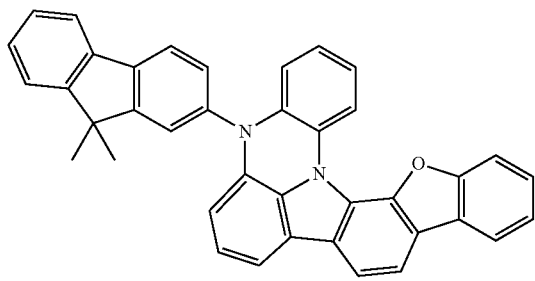
502
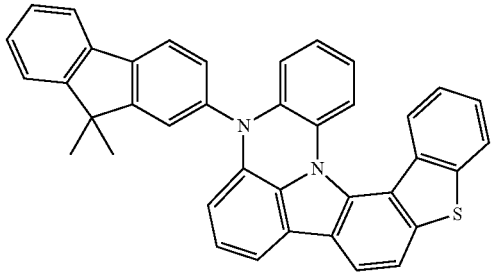
503
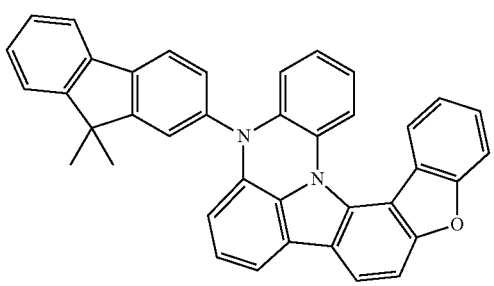
504
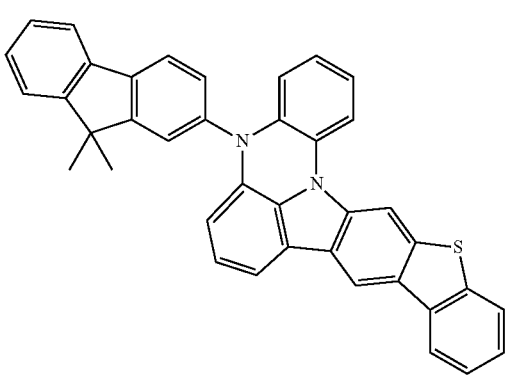
505
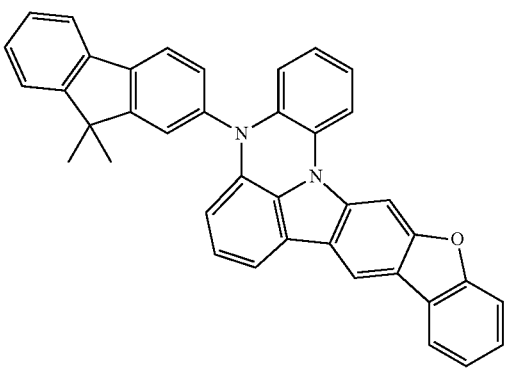

161
-continued
506
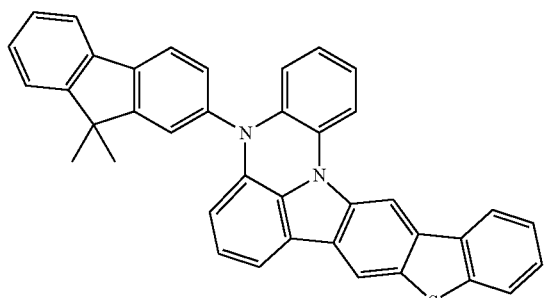
507
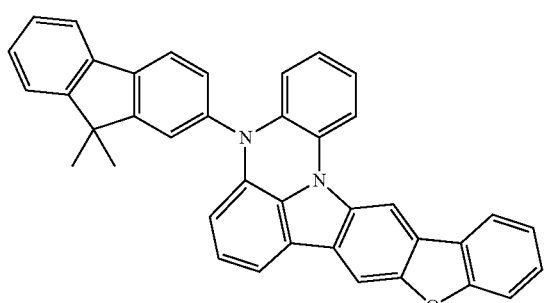
508
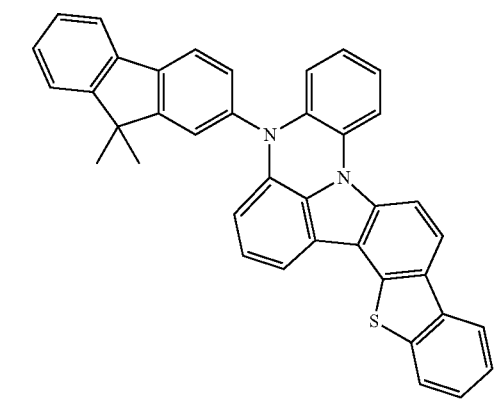
509
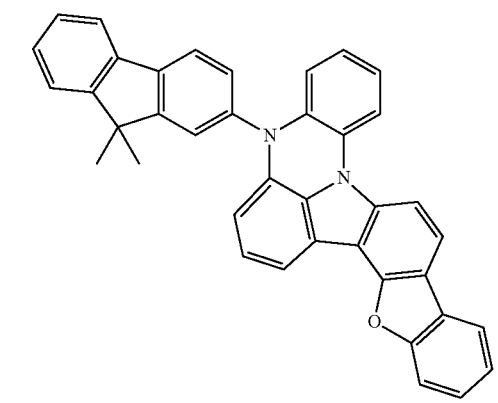
162
-continued
510
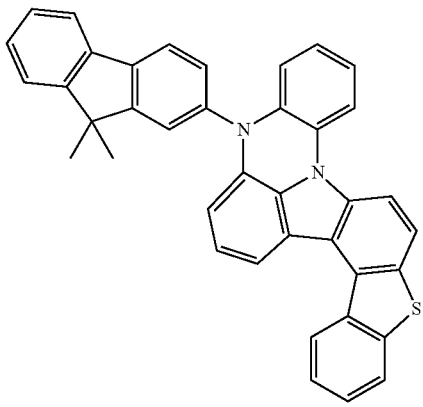
511
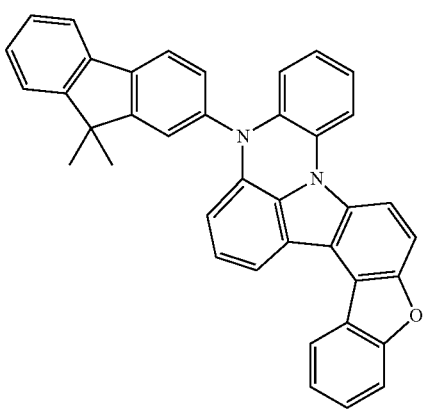
512
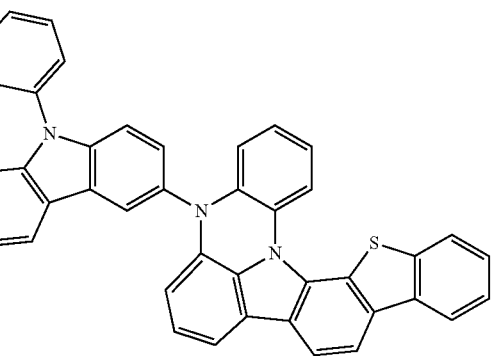
513
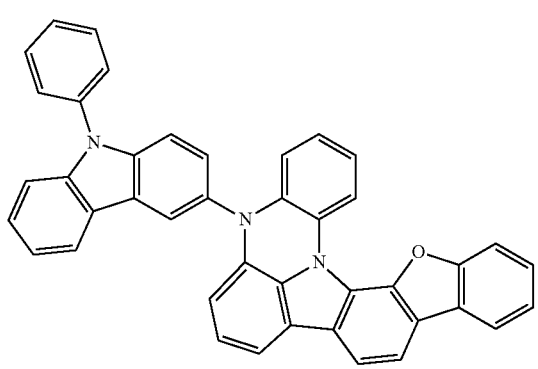

163
-continued
514
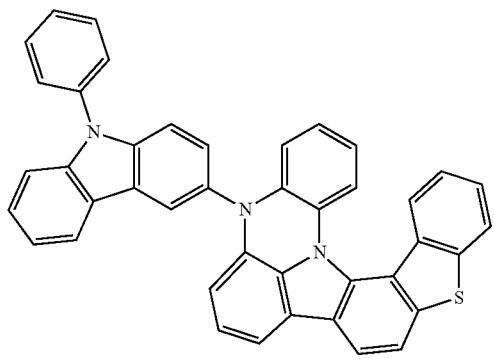
515
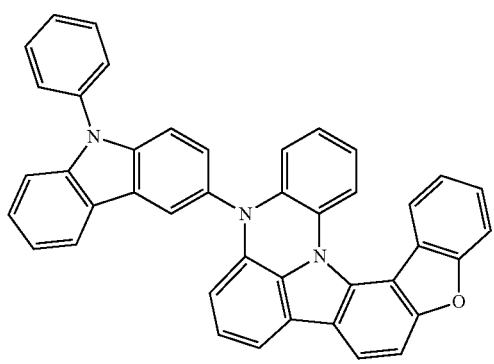
516
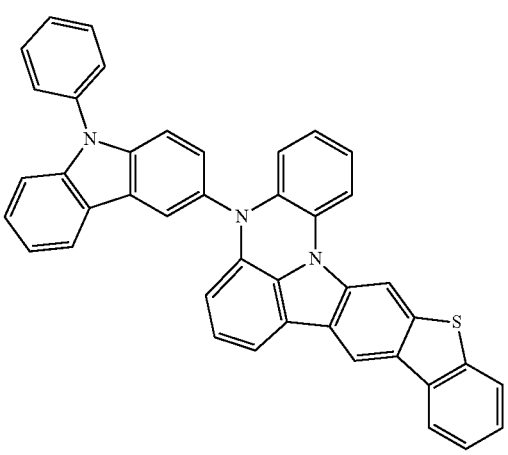
517
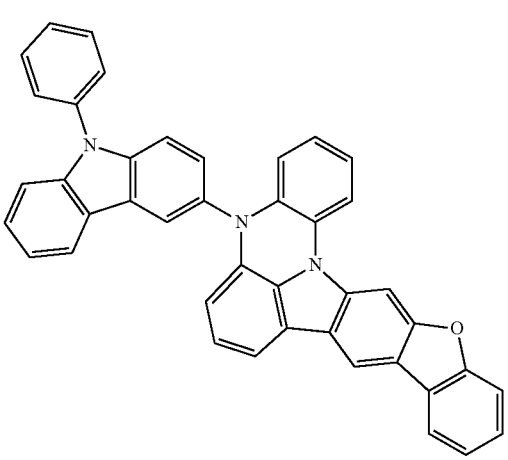
164
-continued
518
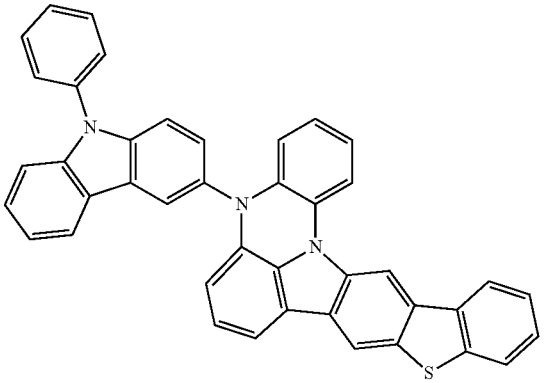
519
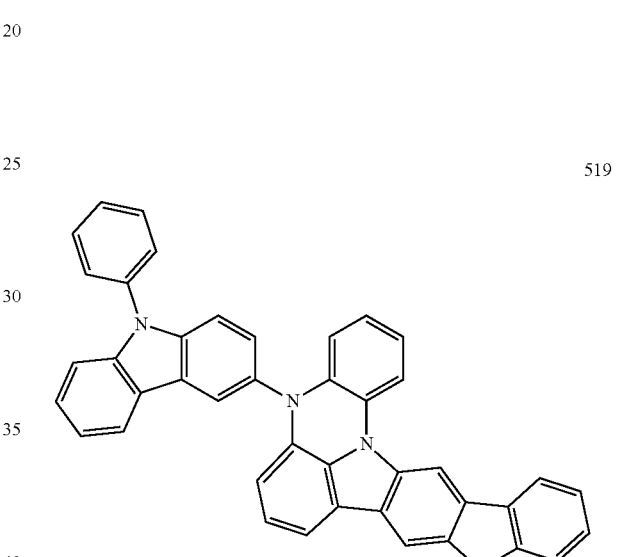
520
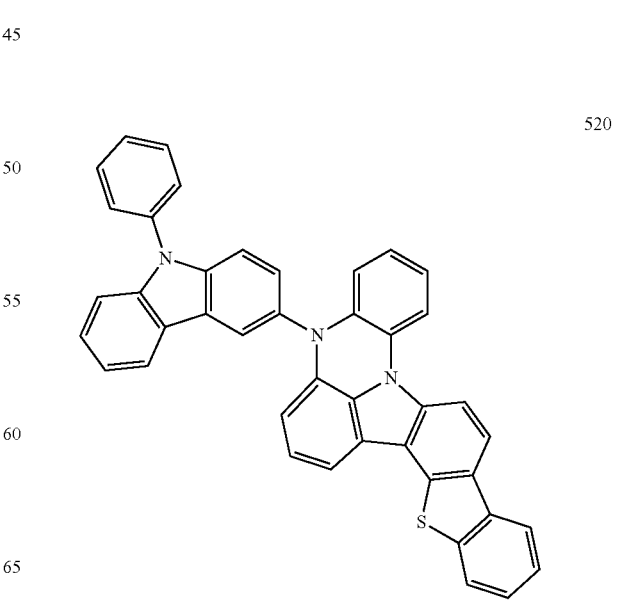

521
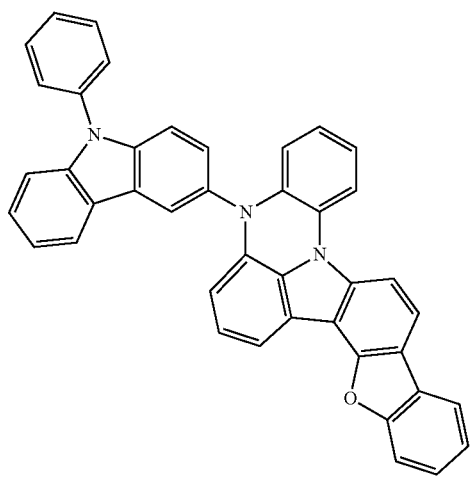
522
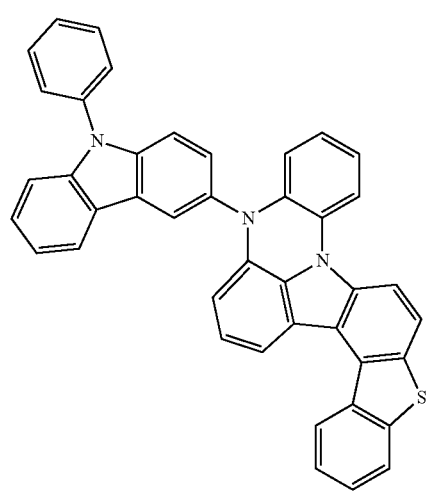
523
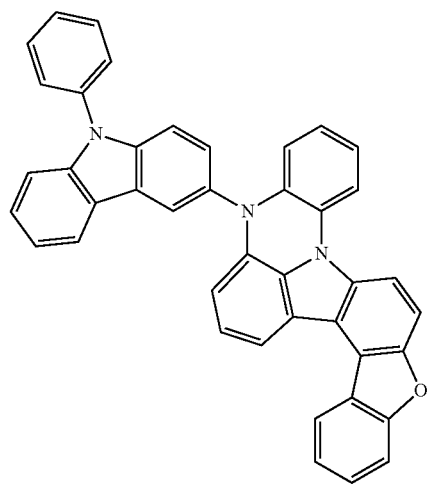
524
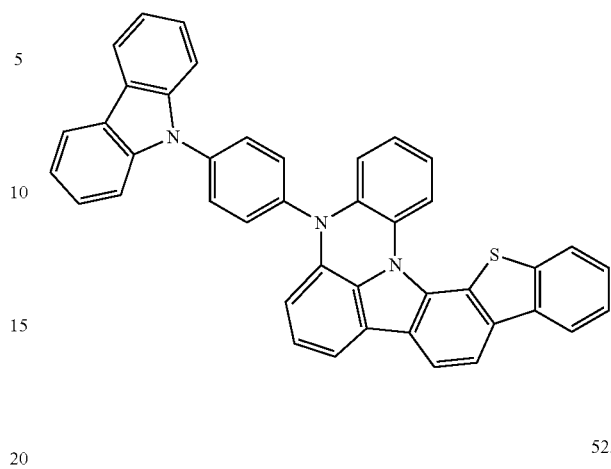
525
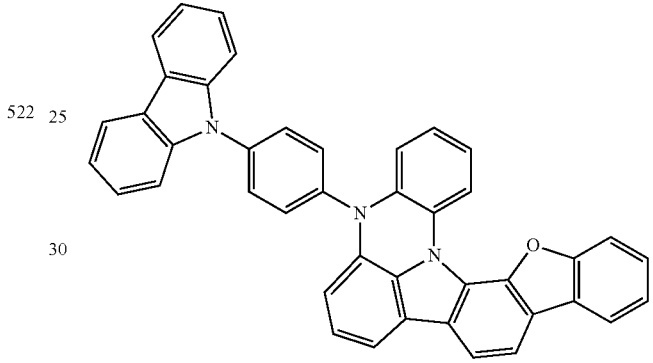
526
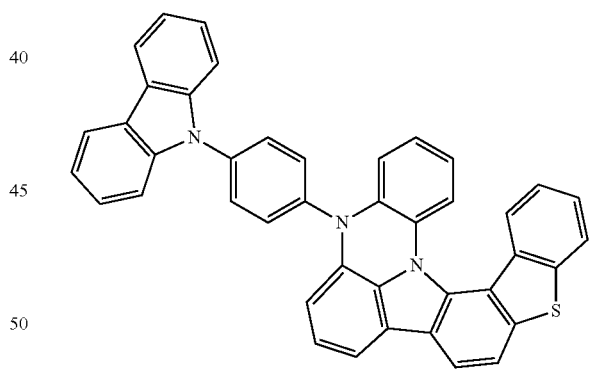
527
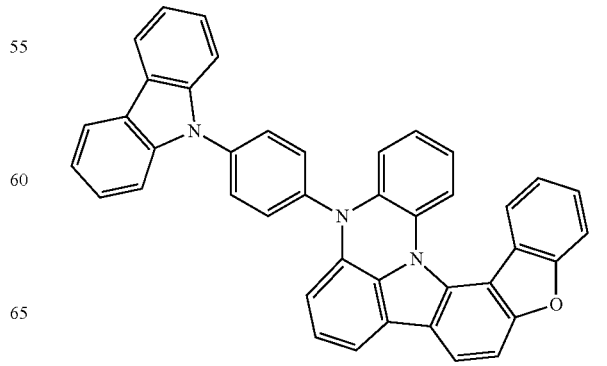

528
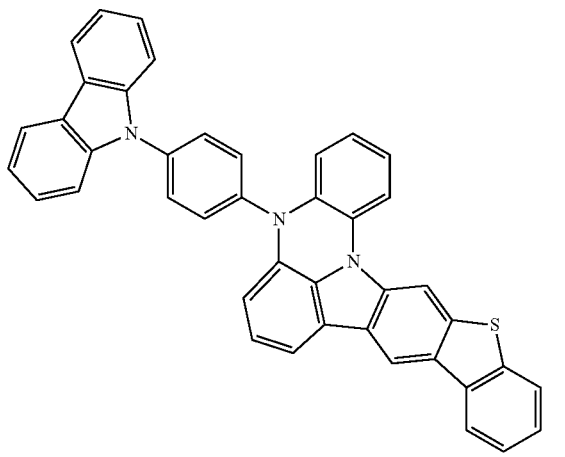
529
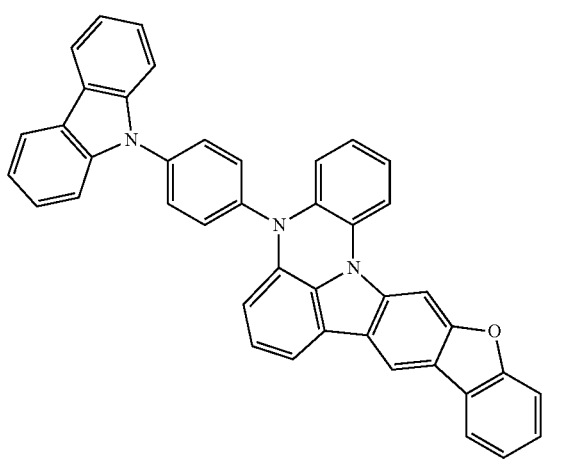
530
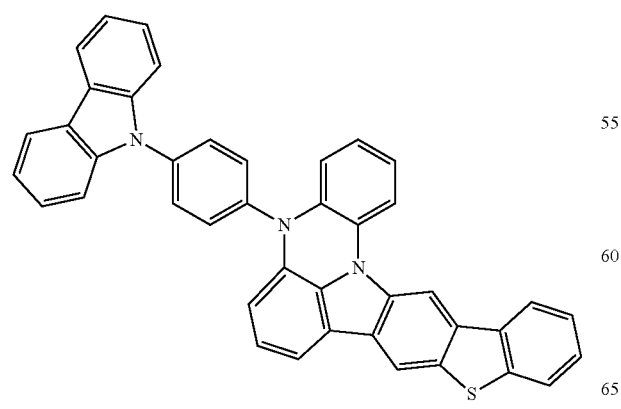
531
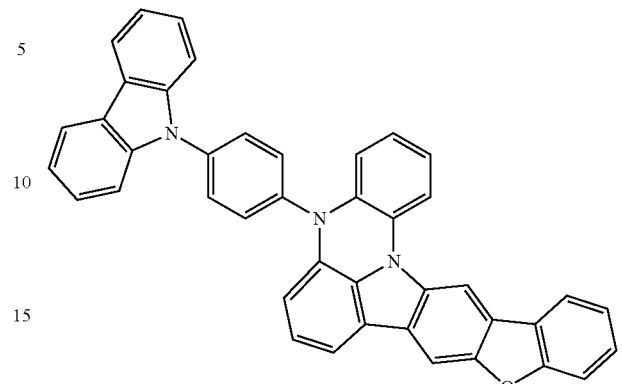
532
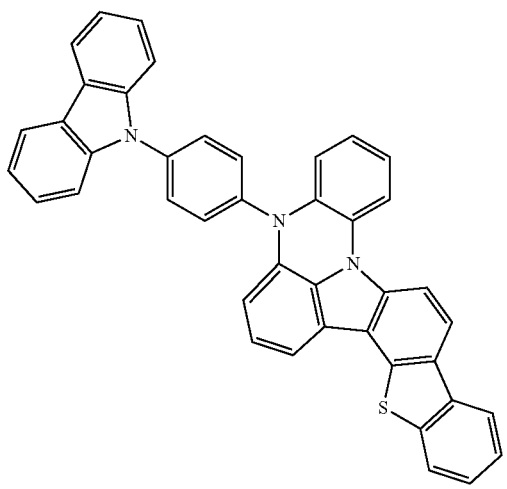
533
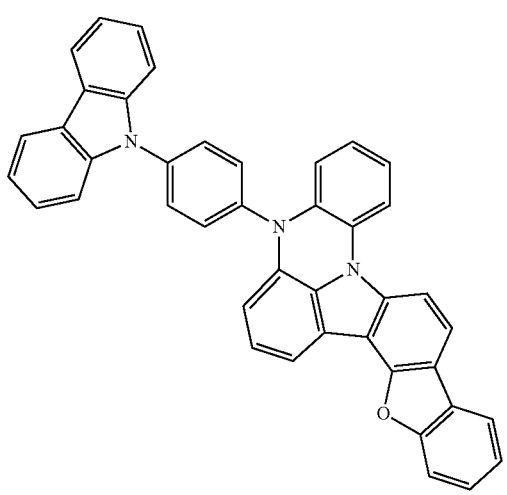

534
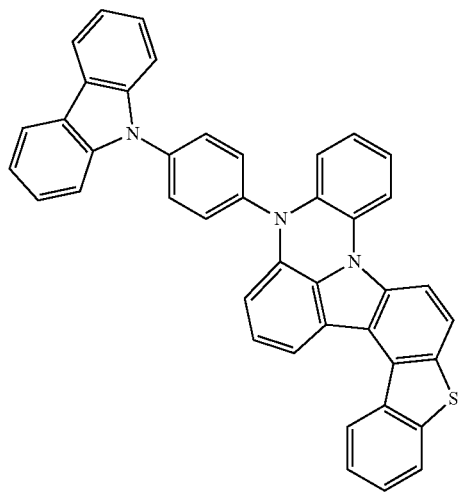
535
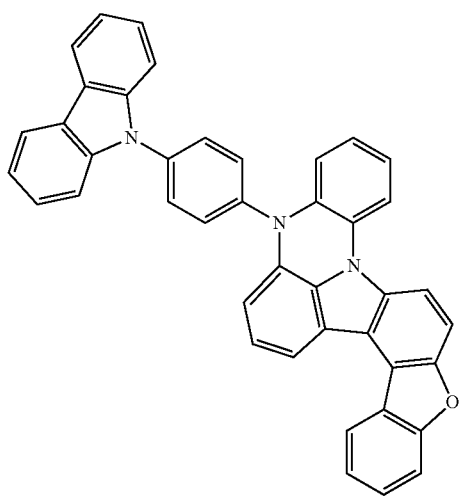
536
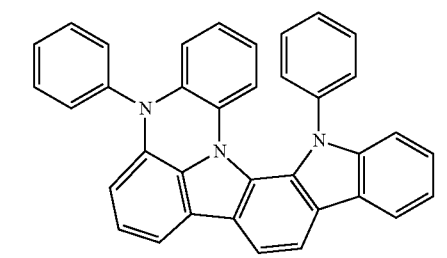
537
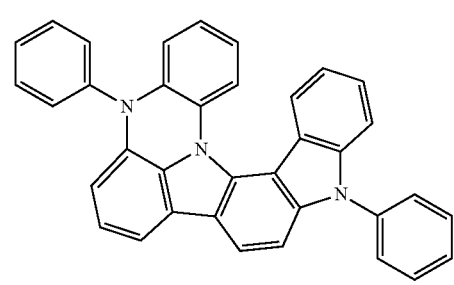
538
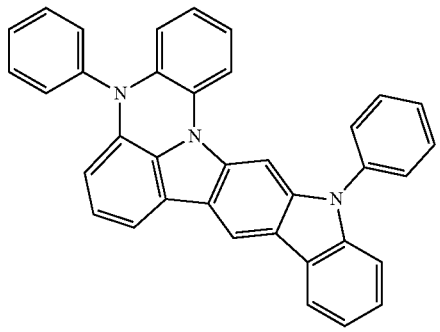
539
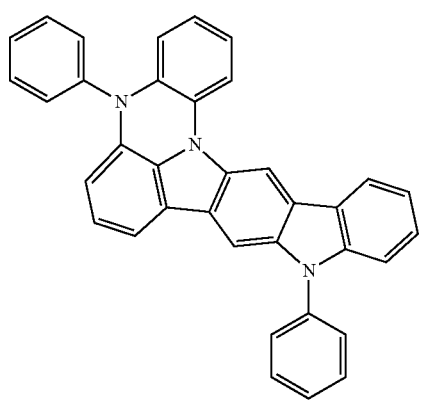
540
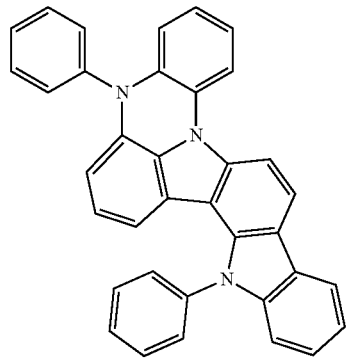
541
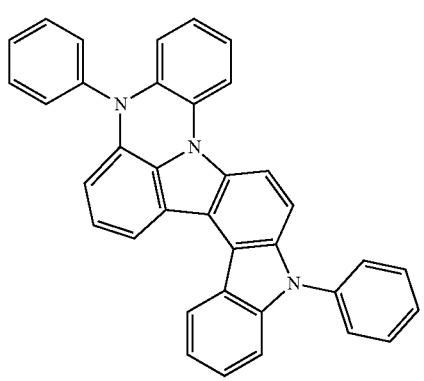

542
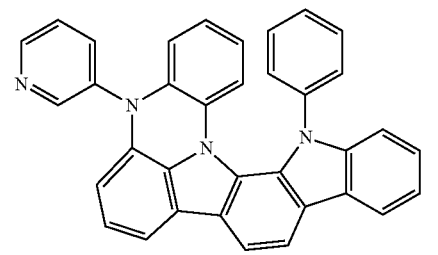
543
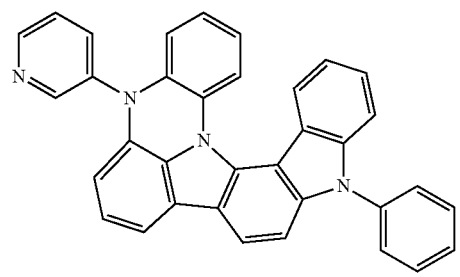
544
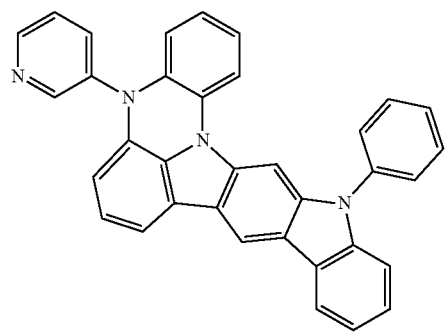
555
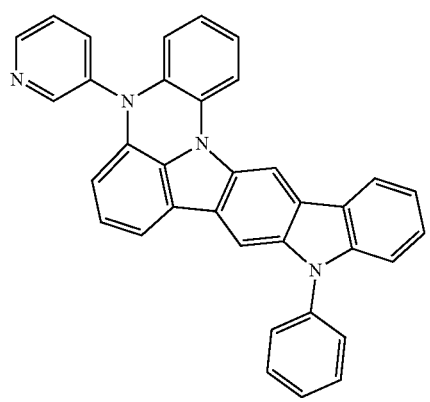
556
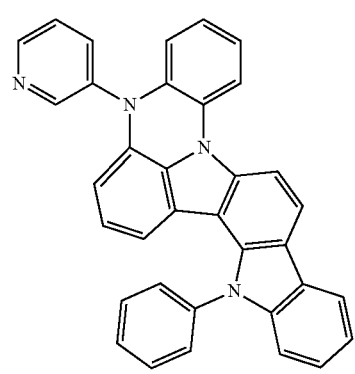
557
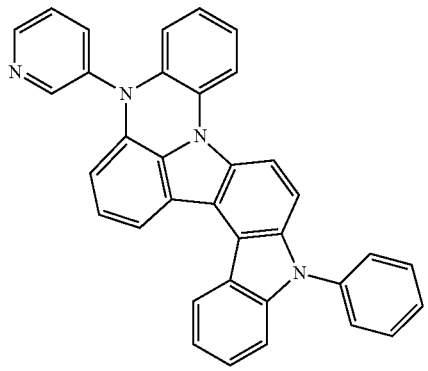
558
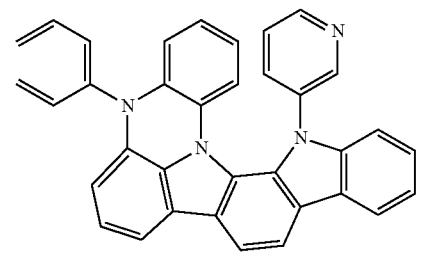
559
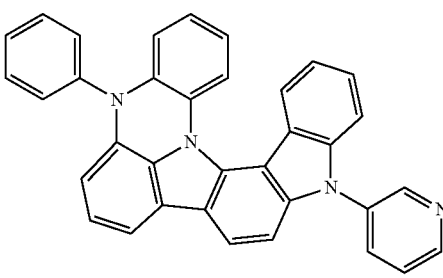
560
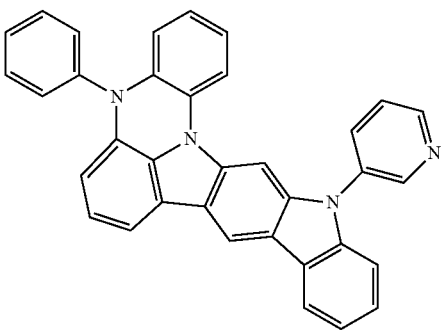
561
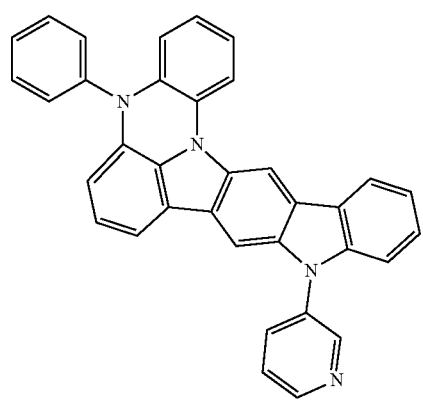

562
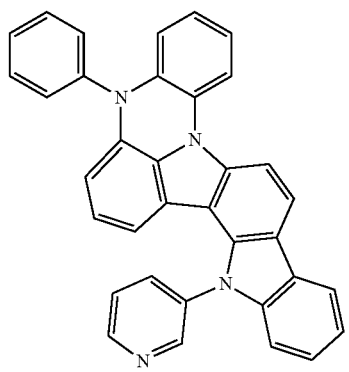
563
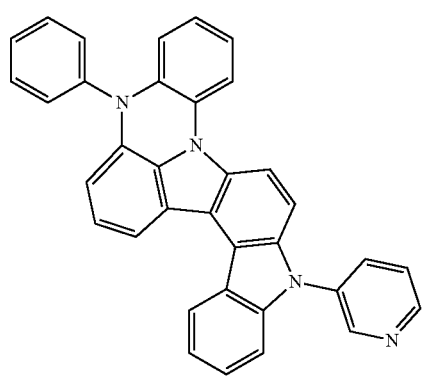
564
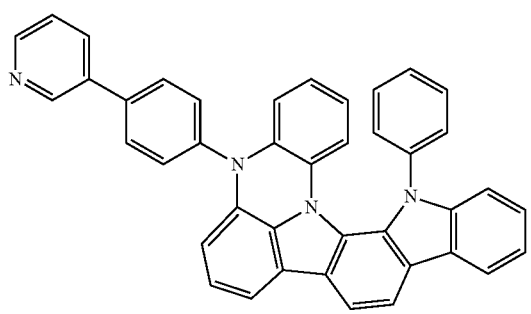
565
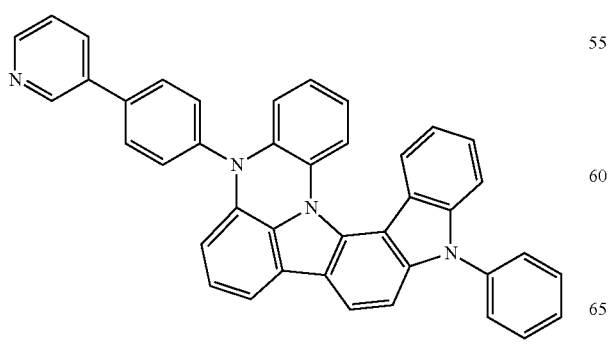
566
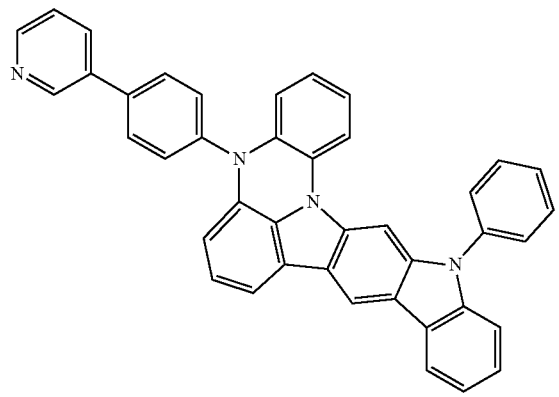
567
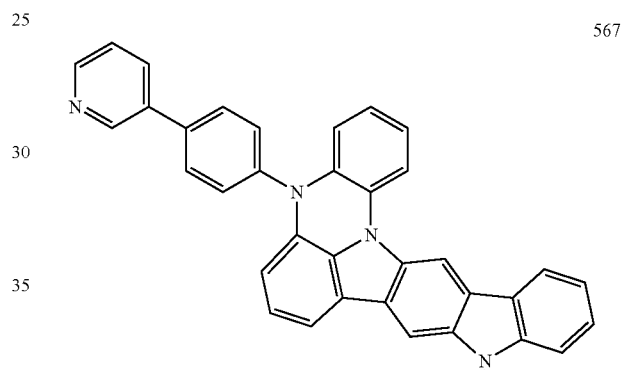
568
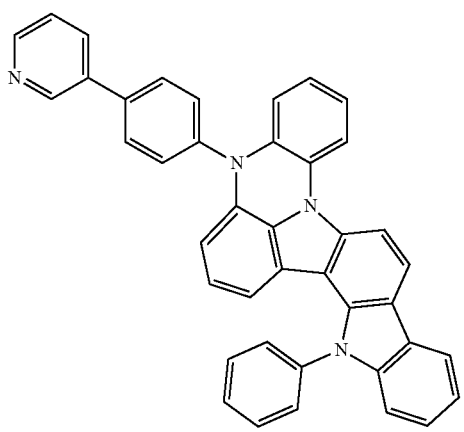

-continued
569
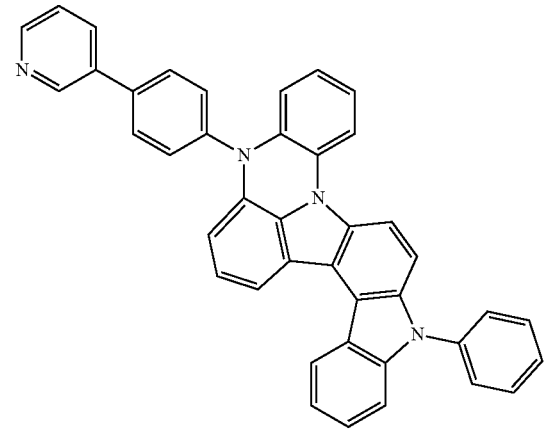
570
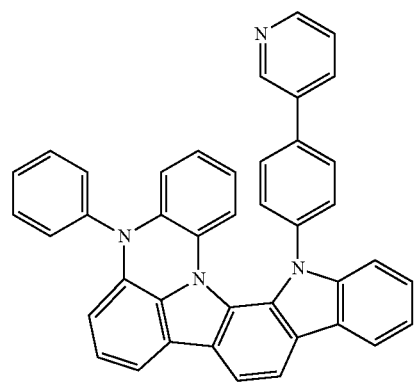
571
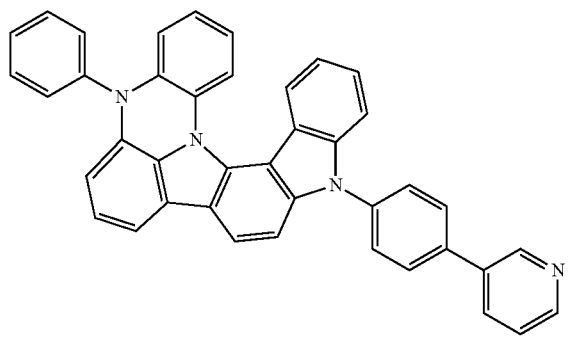
572
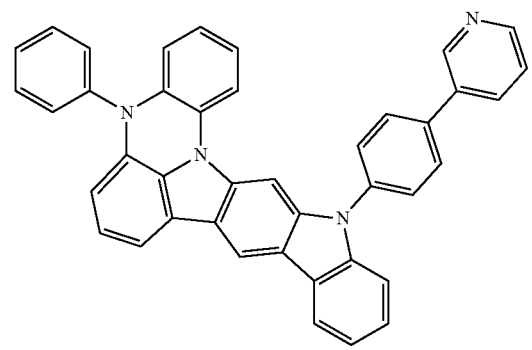
-continued
573
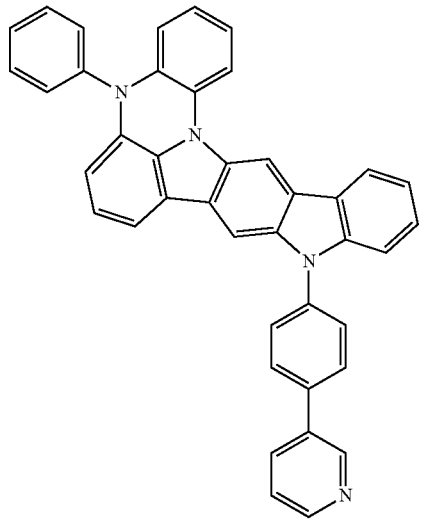
574
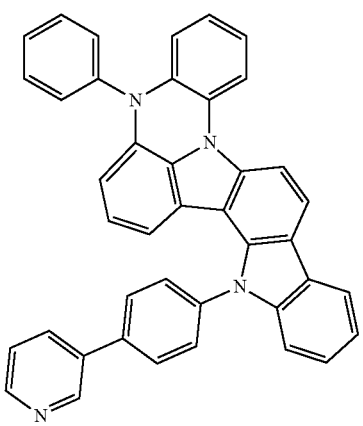
575
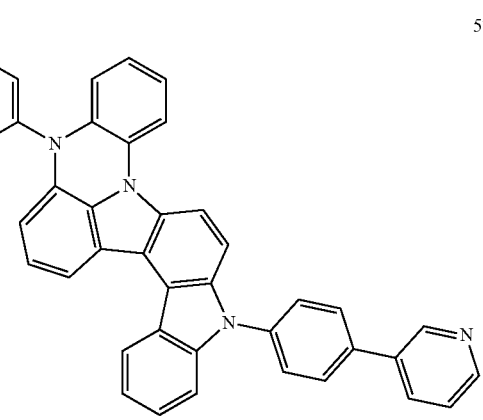
576
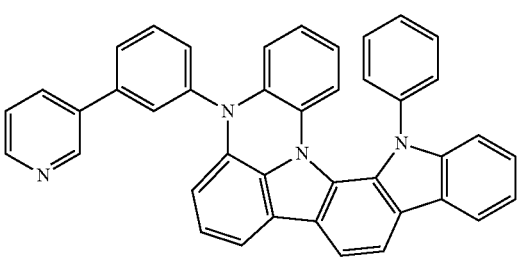

-continued
577
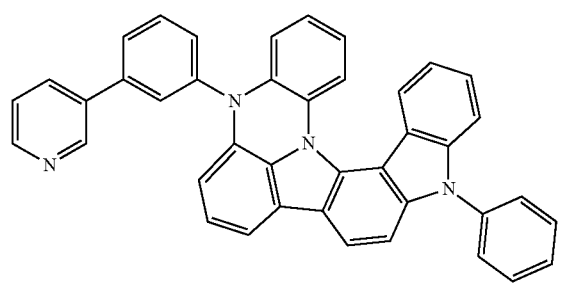
578
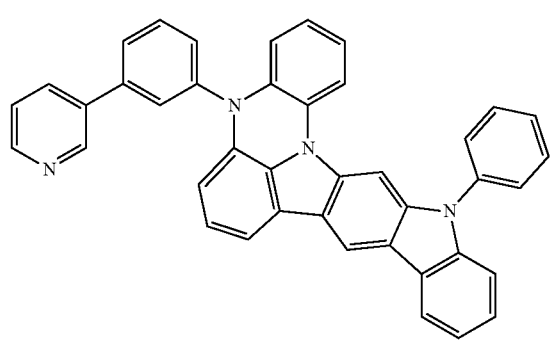
579
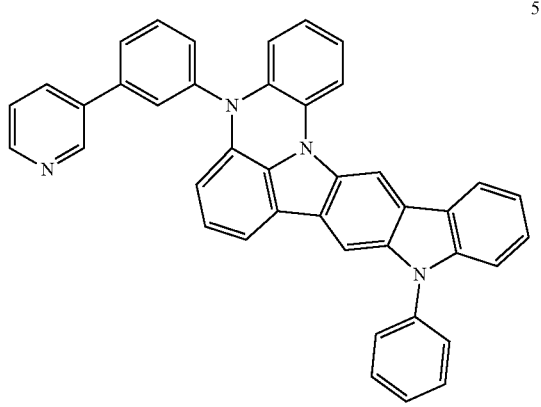
580
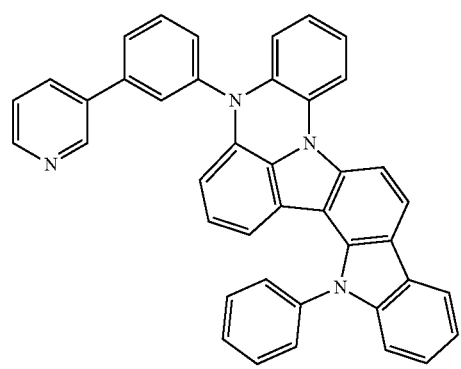
-continued
581
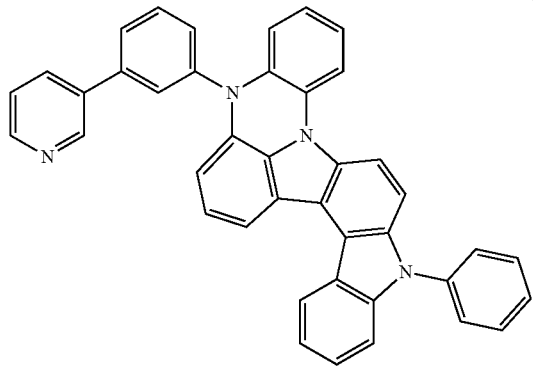
582
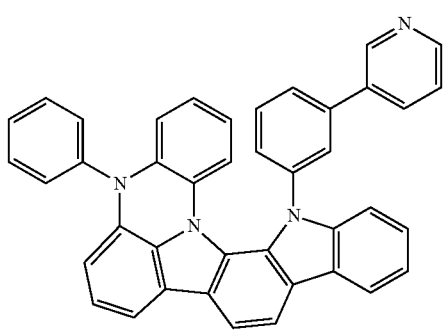
583
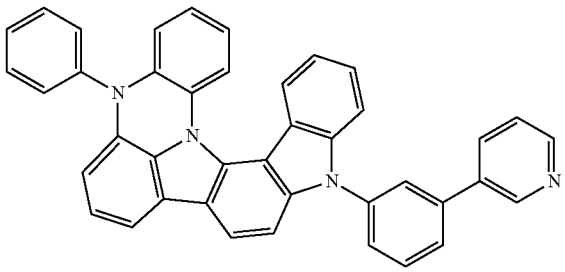
584
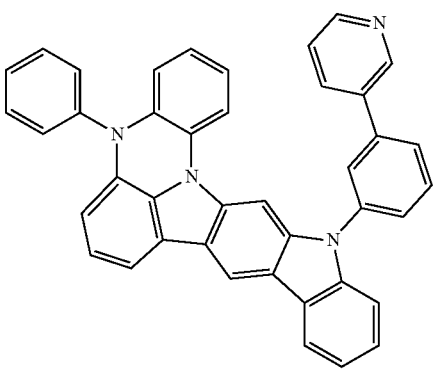

-continued
585
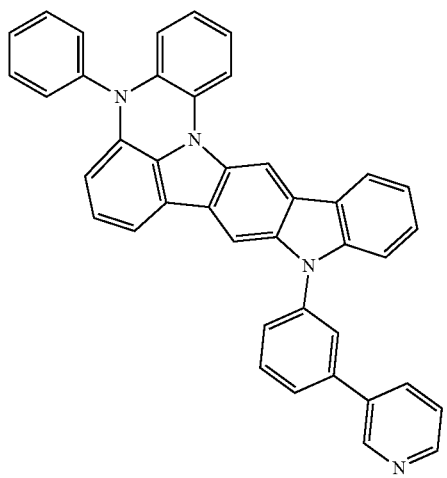
586
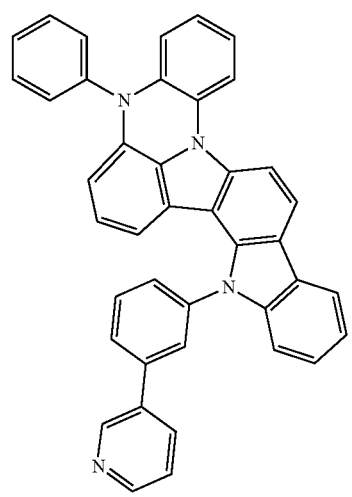
587
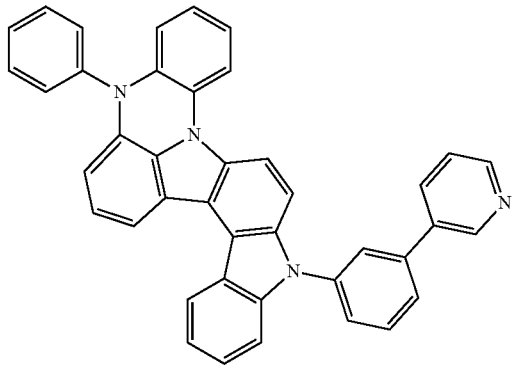
-continued
588
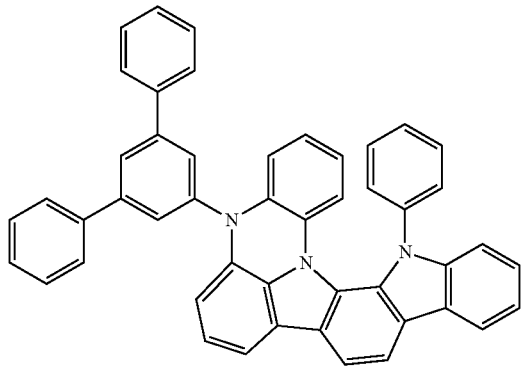
589
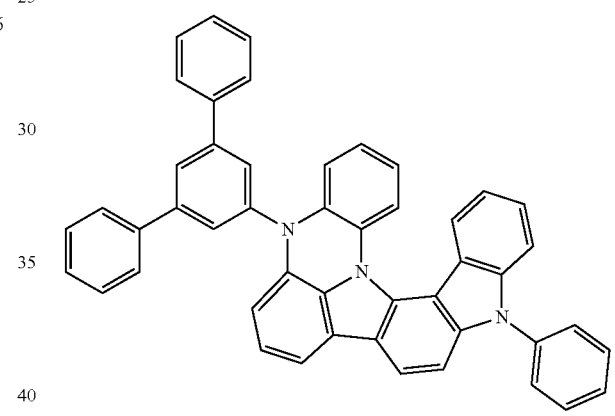
590
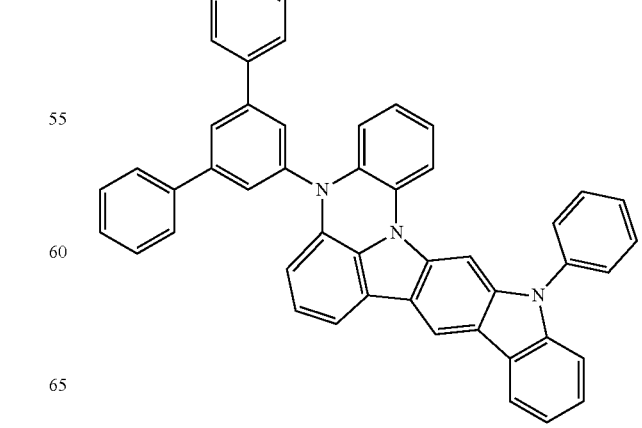

-continued
591
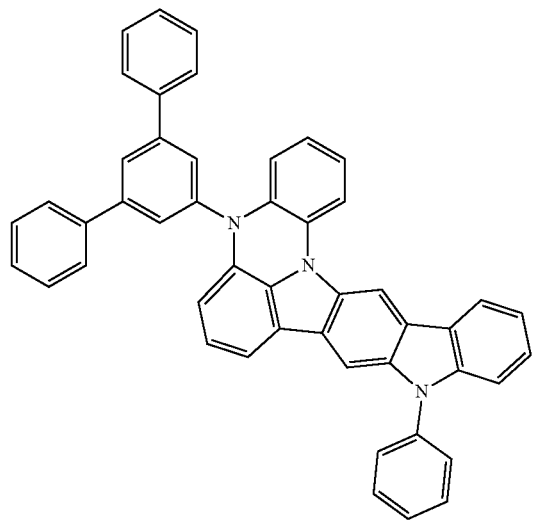
592
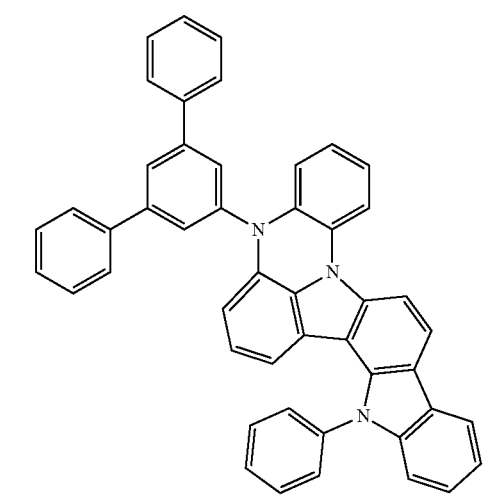
593
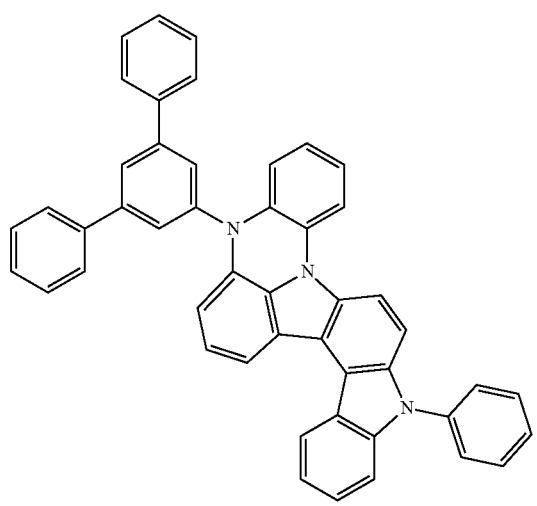
-continued
594
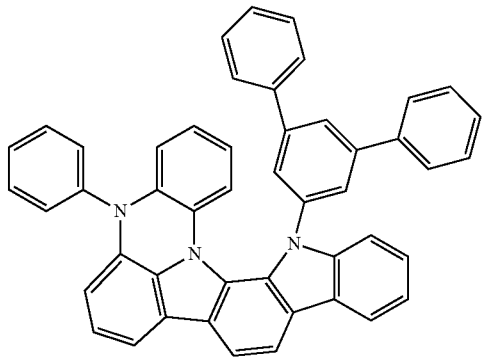
595
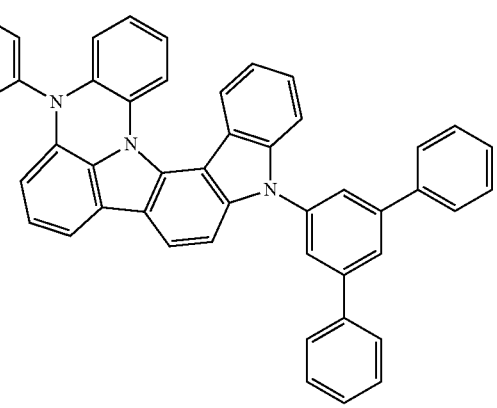
596
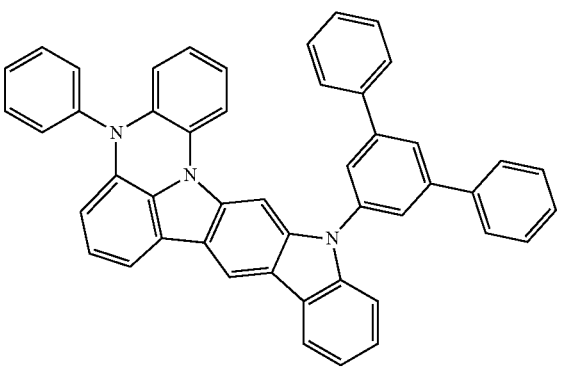
597
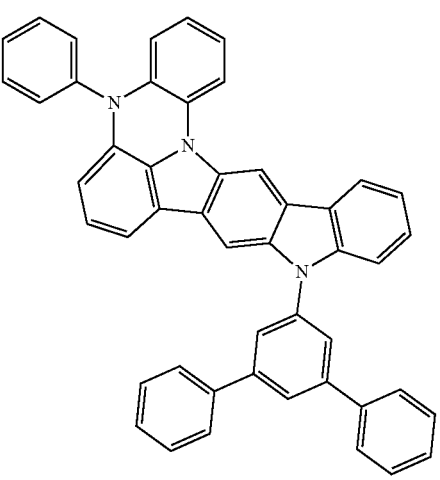

-continued
598
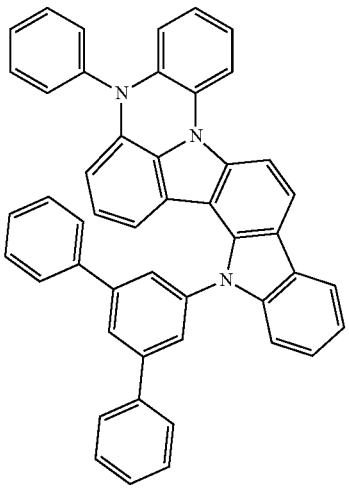
599
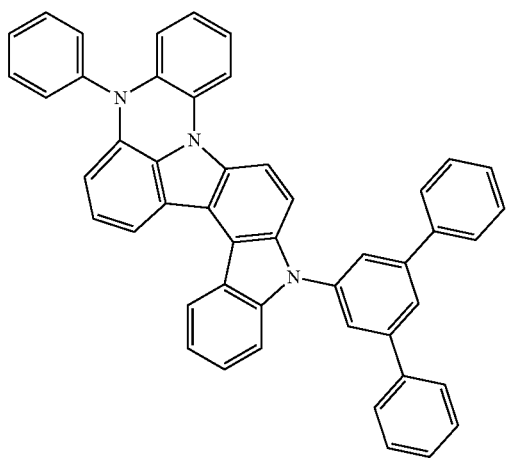
600
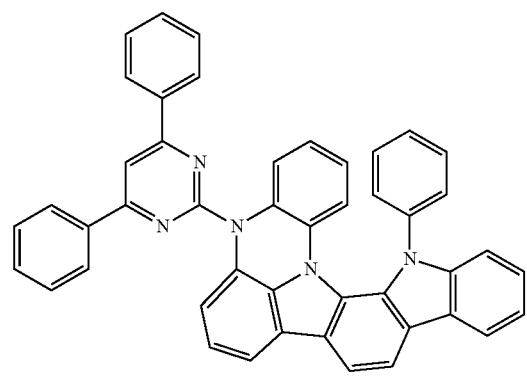
-continued
601
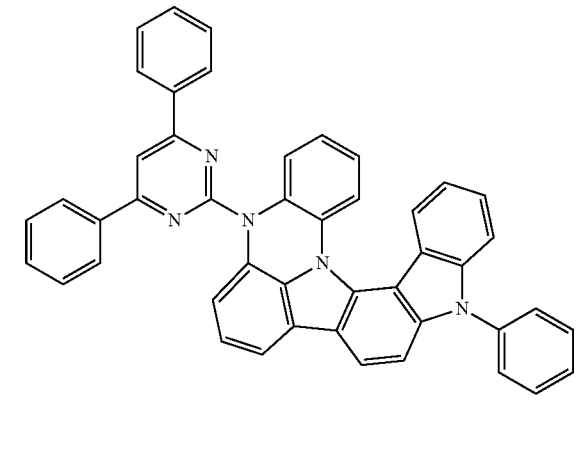
602
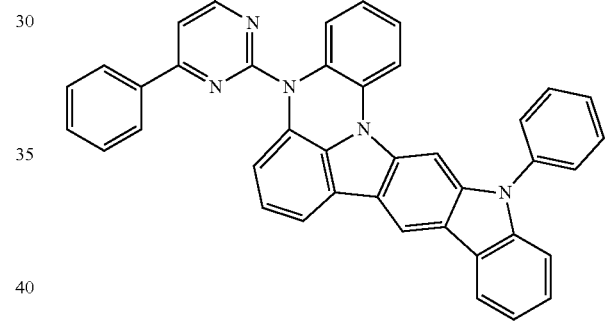
603
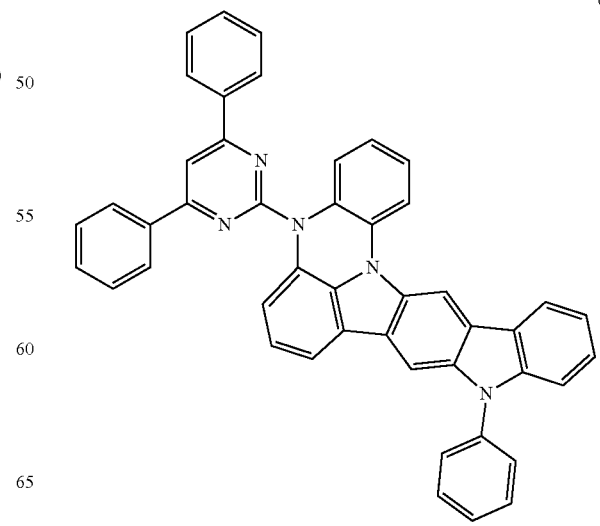

-continued
604
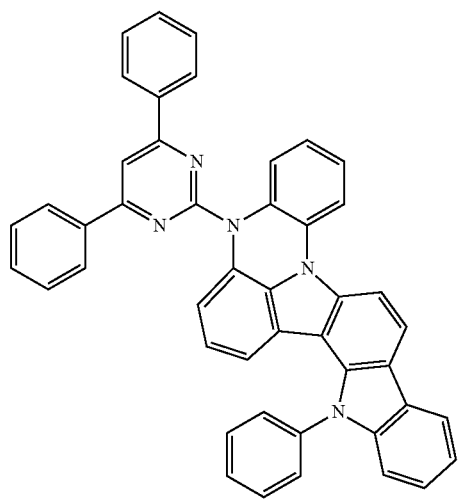
605
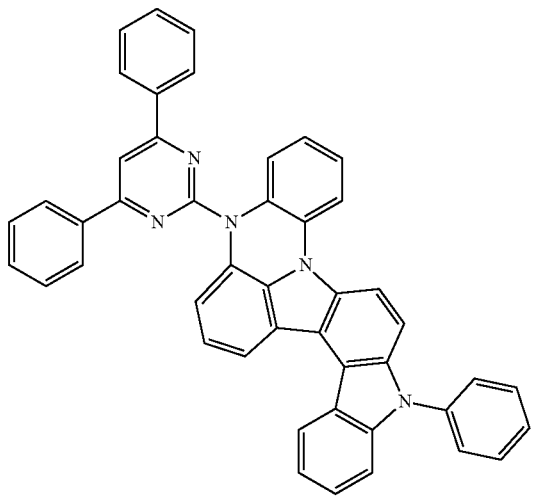
606
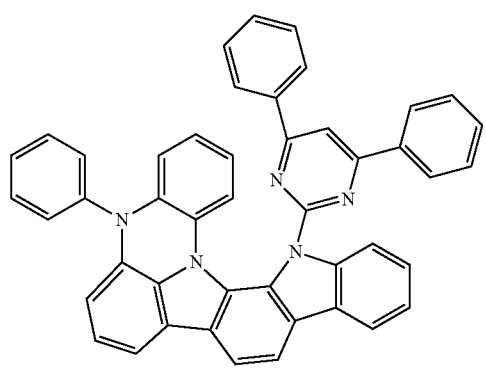
-continued
607
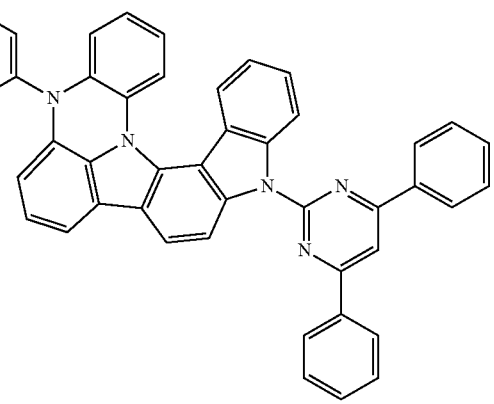
608
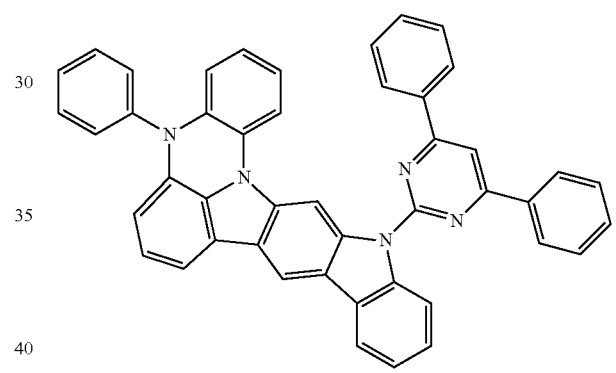
609
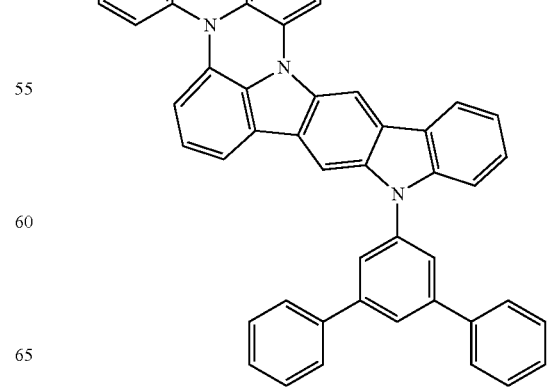

610
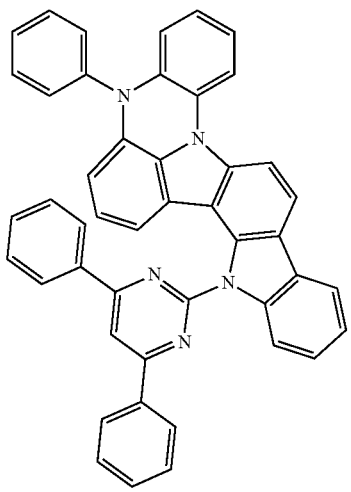
611
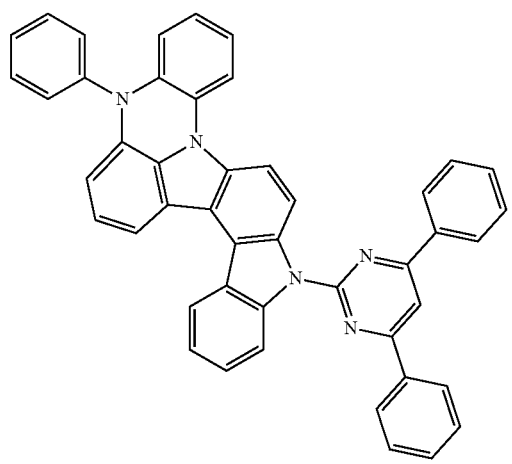
612
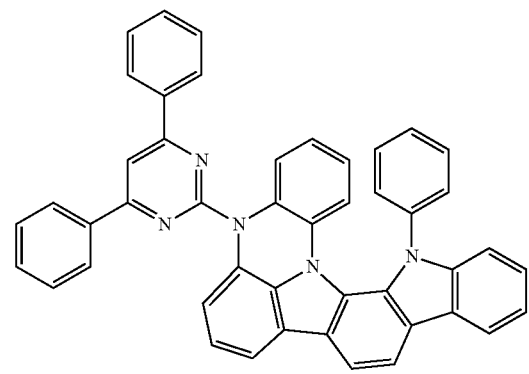
613
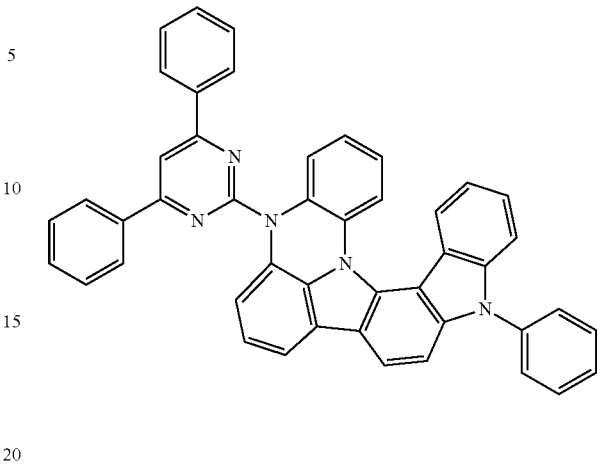
614
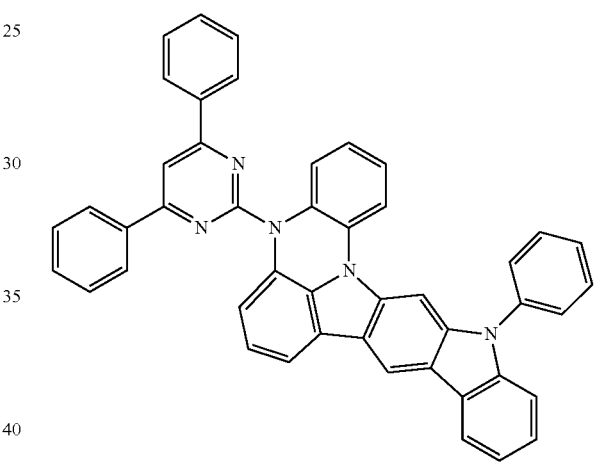
615
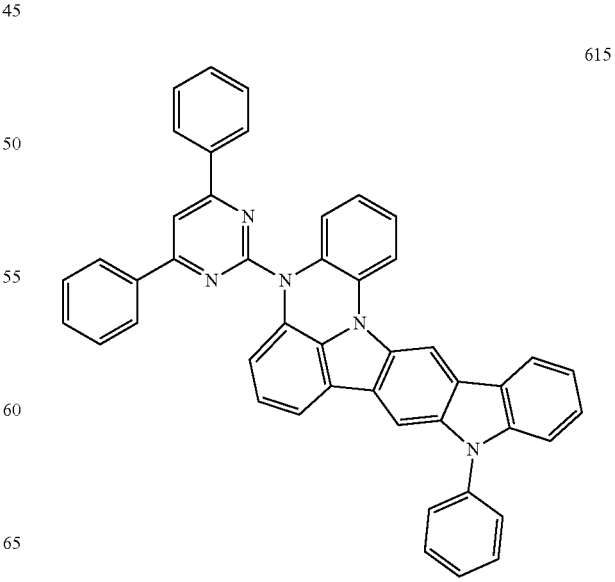

-continued
616
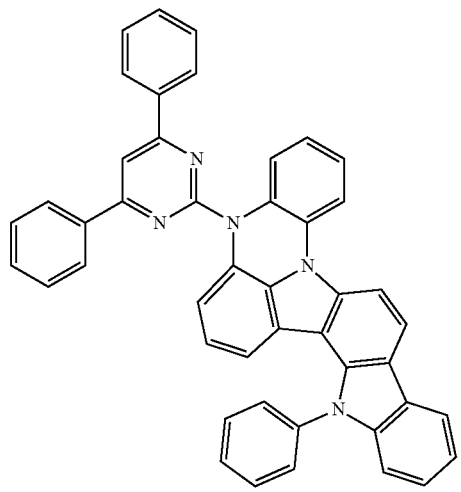
617
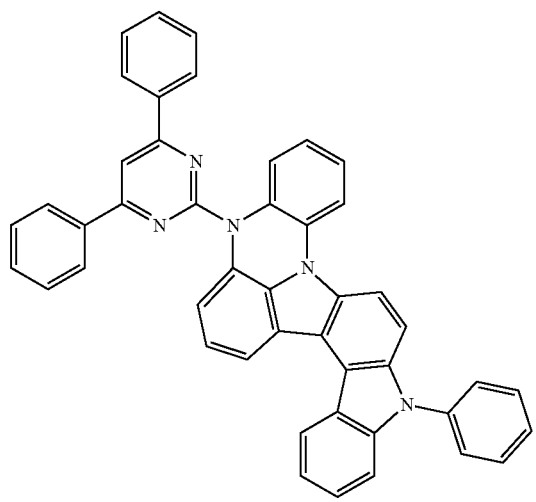
618
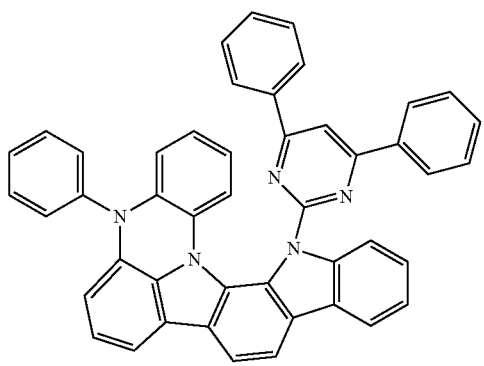
-continued
619
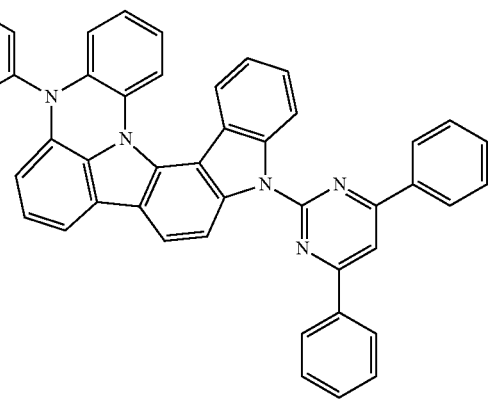
620
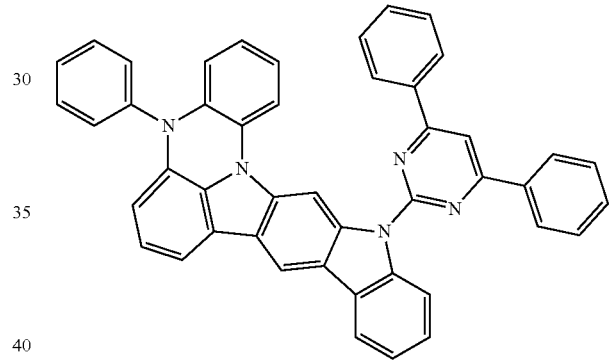
621
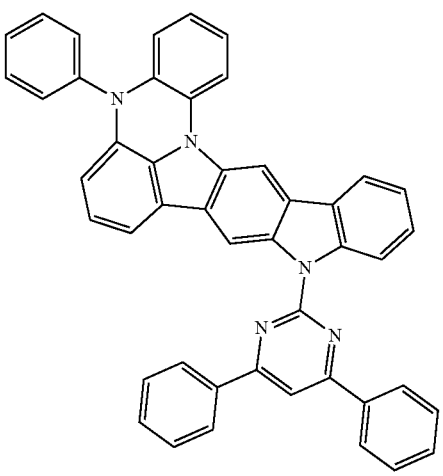

191
-continued
192
-continued
622
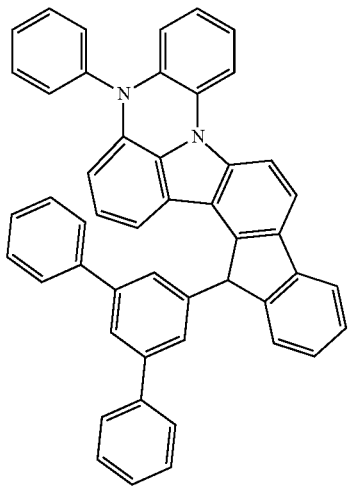
625
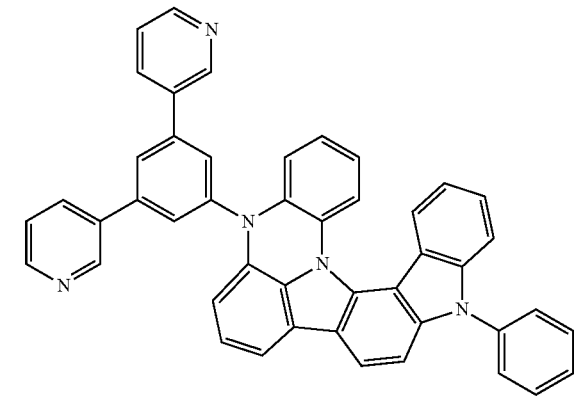
623
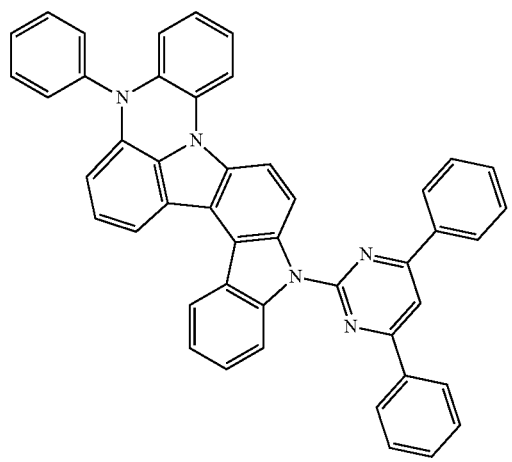
626
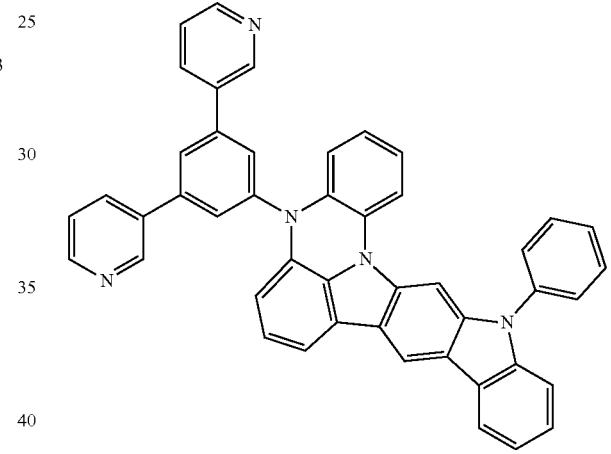
624
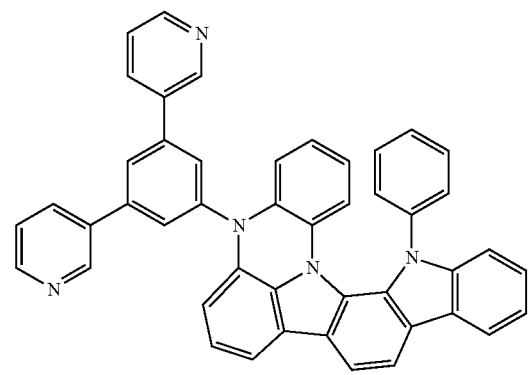
627
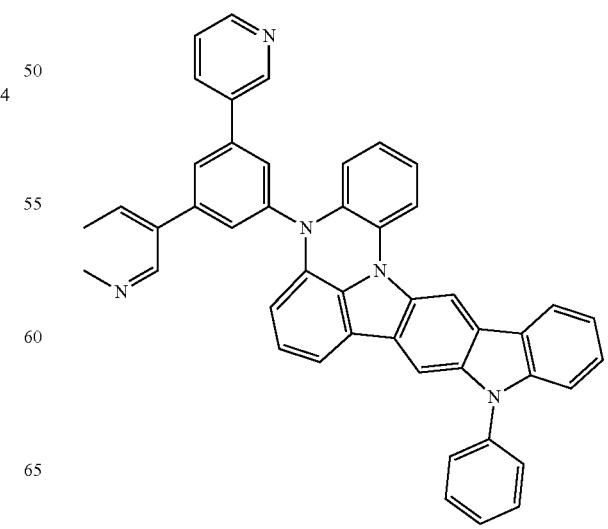

193
-continued
628
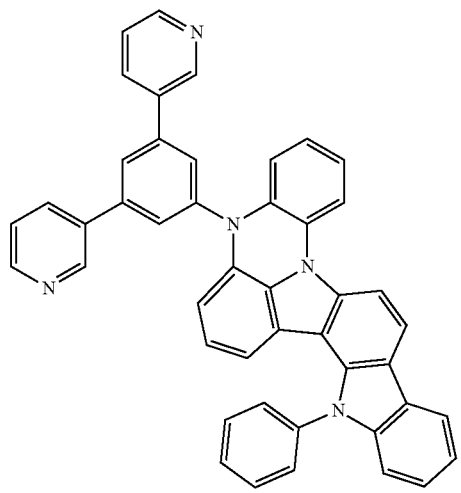
629
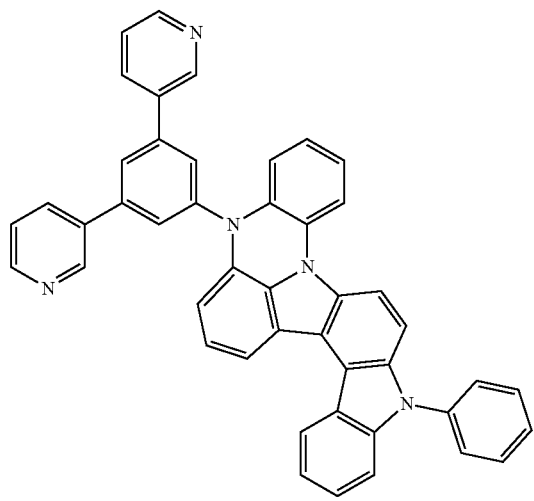
630
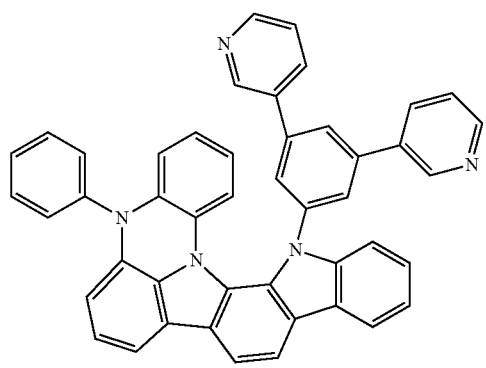
194
-continued
631
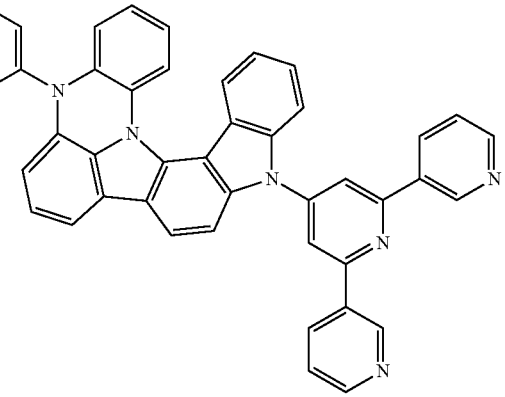
632
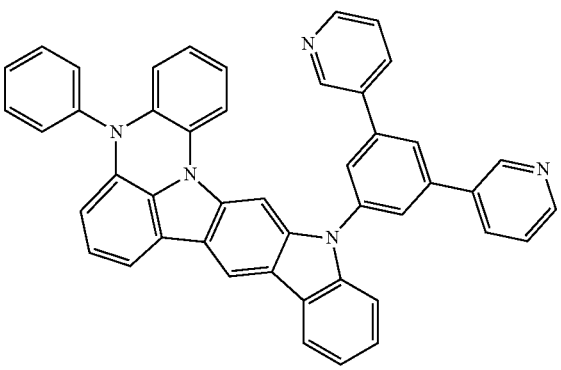
633
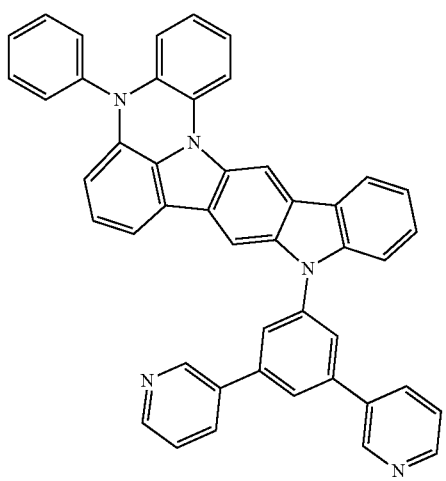

-continued
634
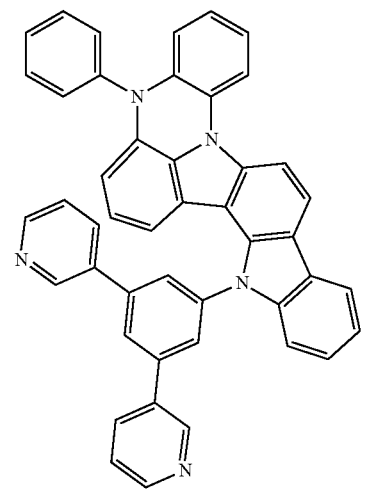
635
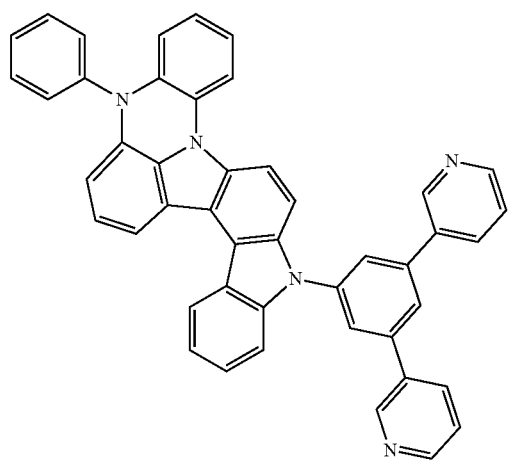
636
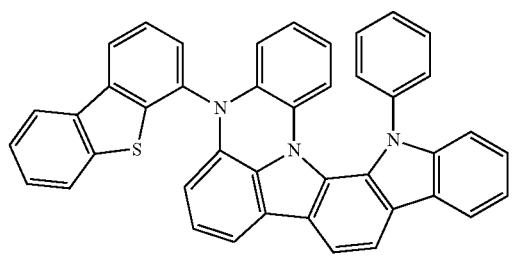
637
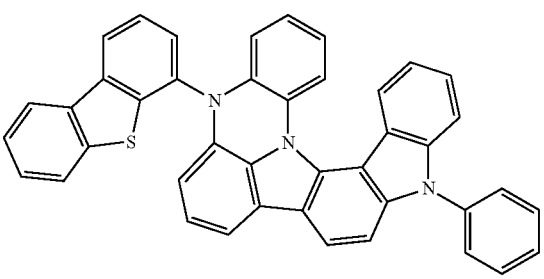
-continued
638
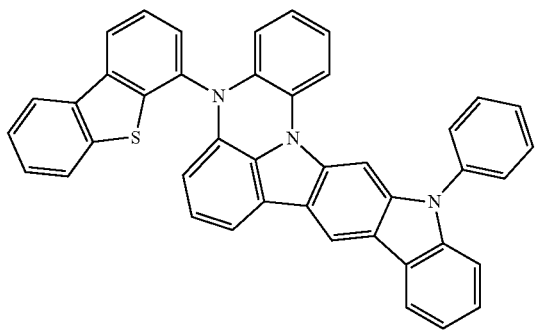
639
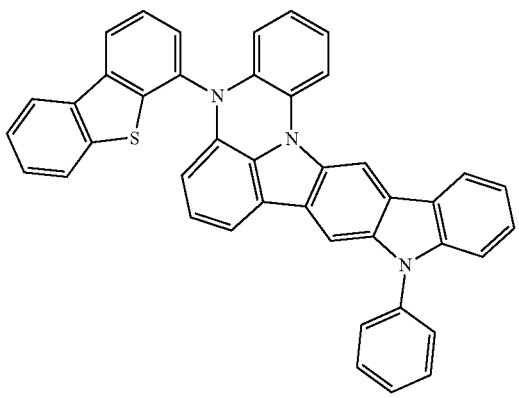
640
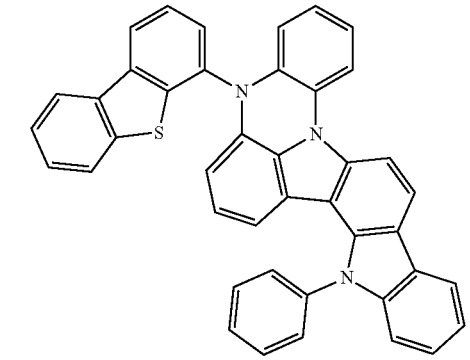
641
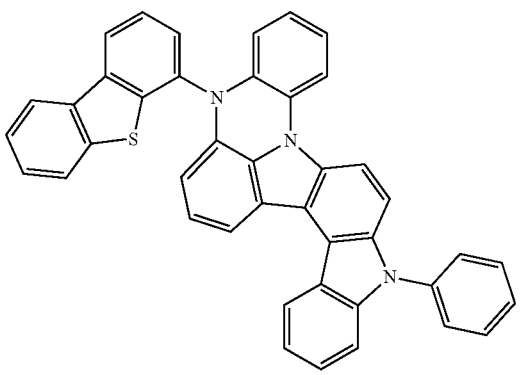

642
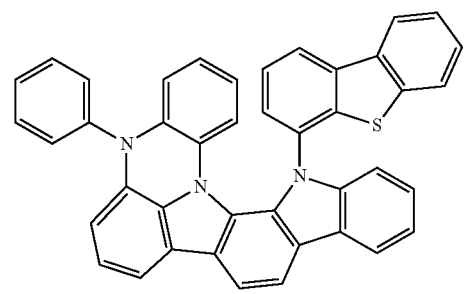
643
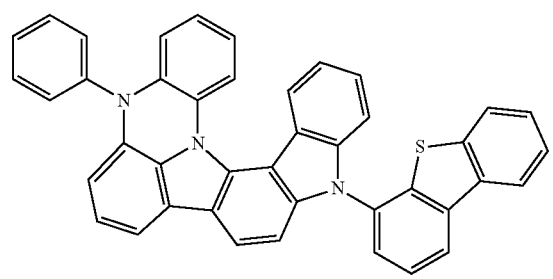
644
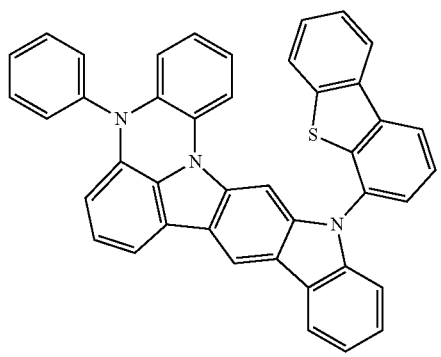
645
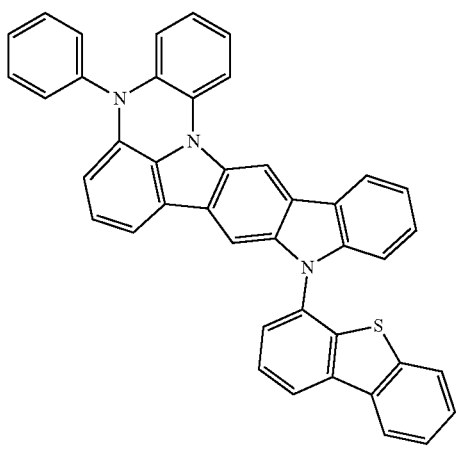
646
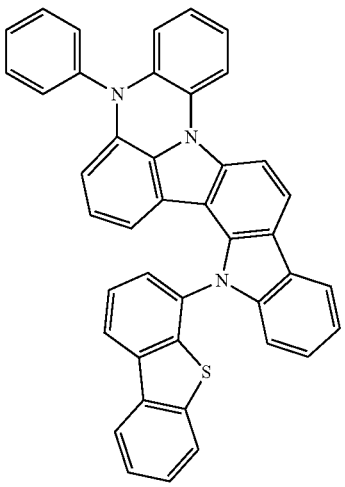
647
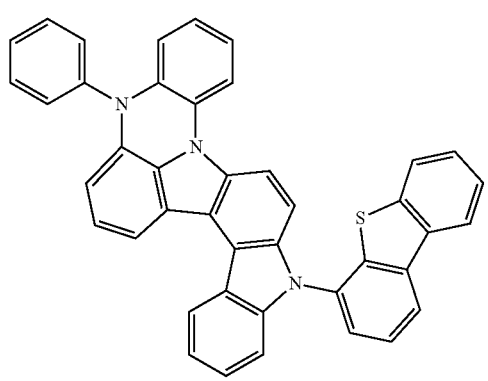
648
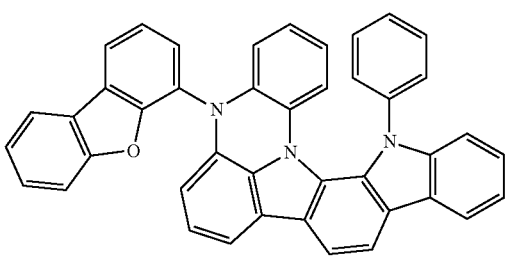
649
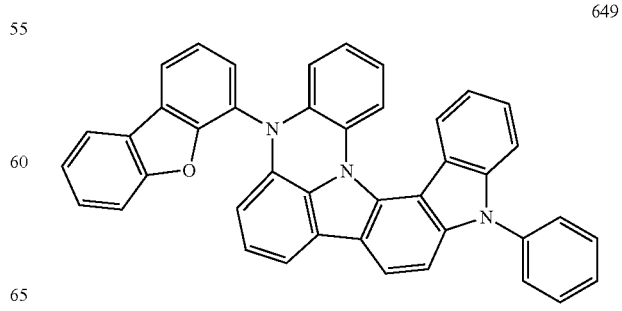

199
-continued
650
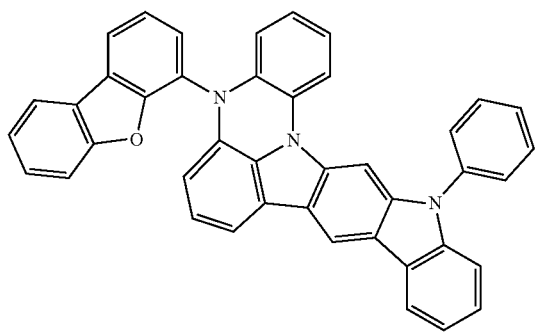
651
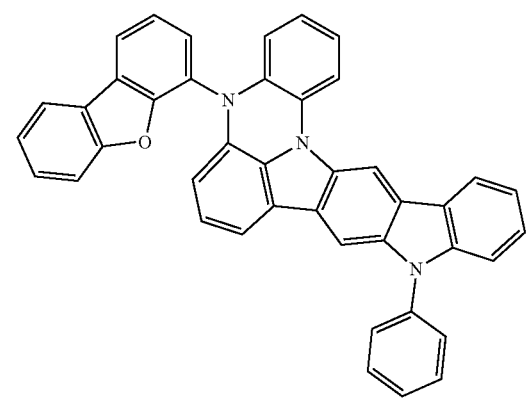
652
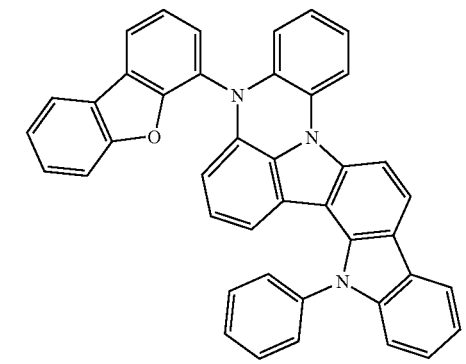
653
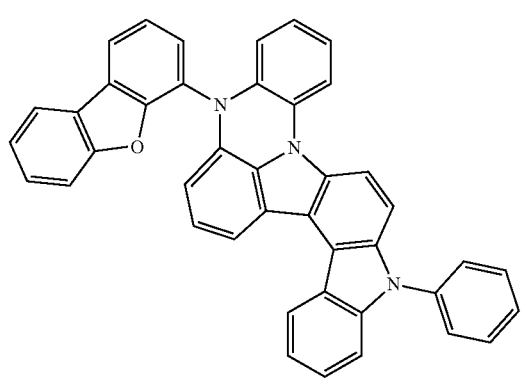
200
-continued
654
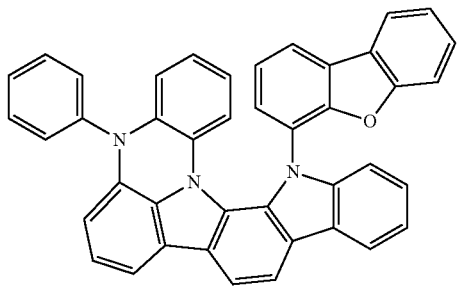
655
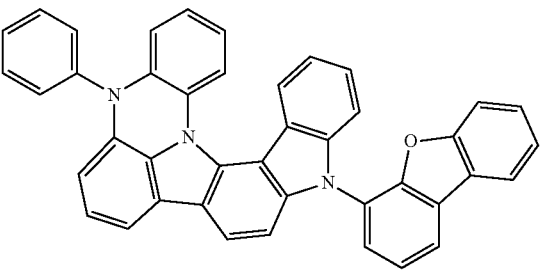
656
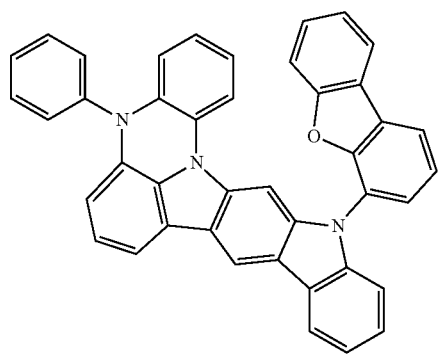
657
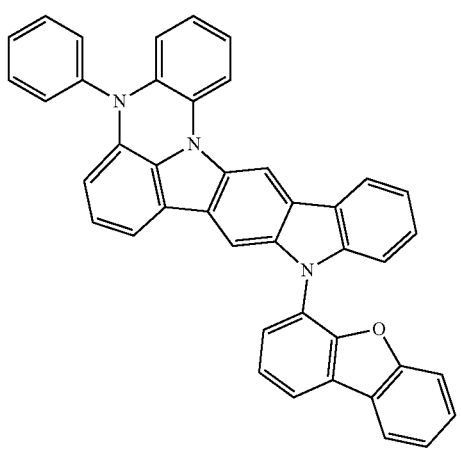

201
-continued
658
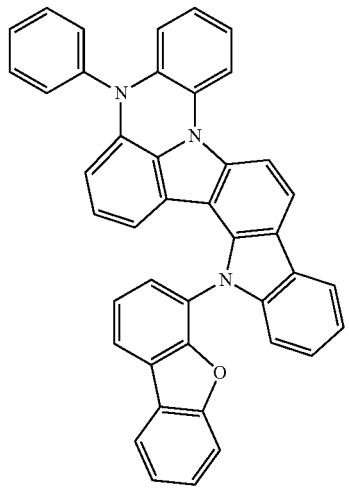
659
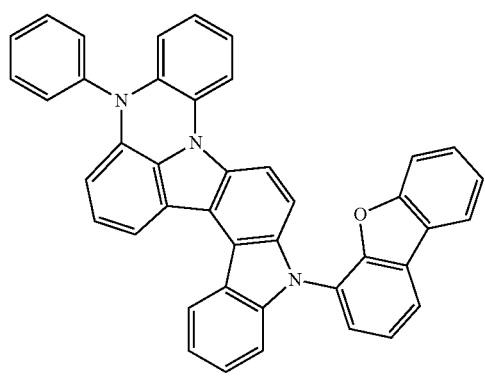
660
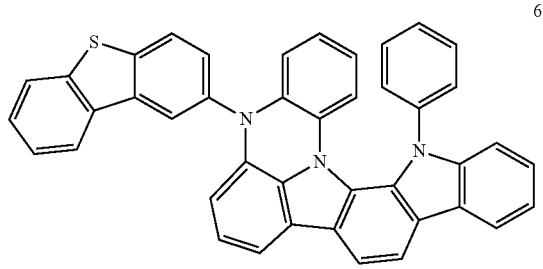
661
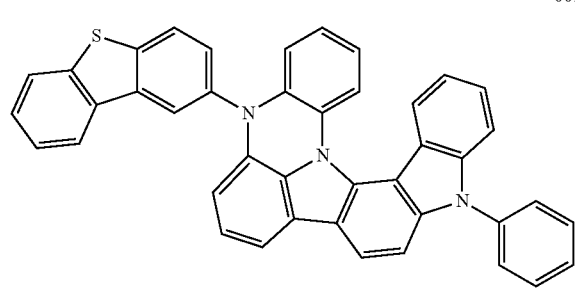
202
-continued
662
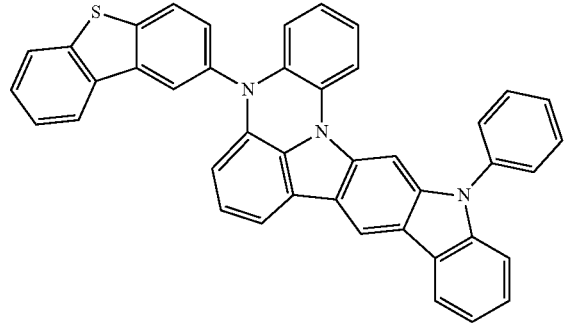
663
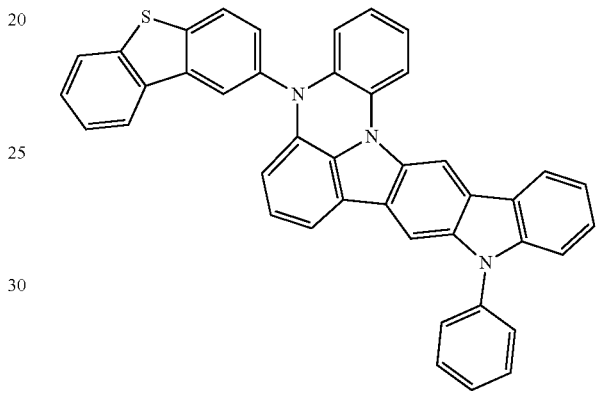
664
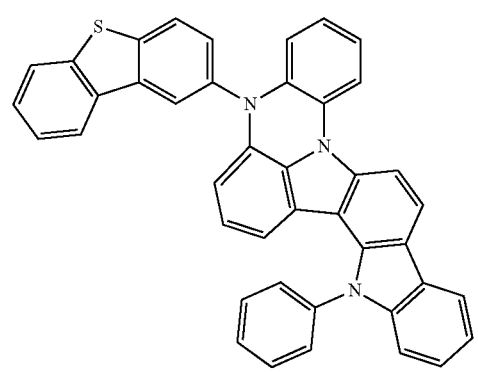
665
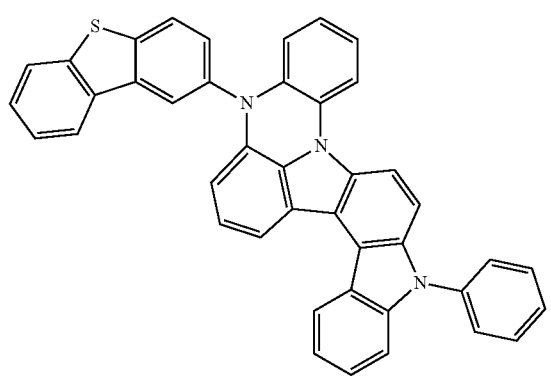

666
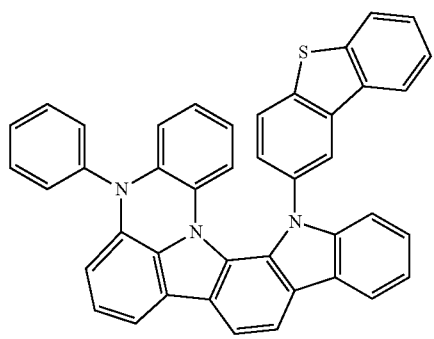
667
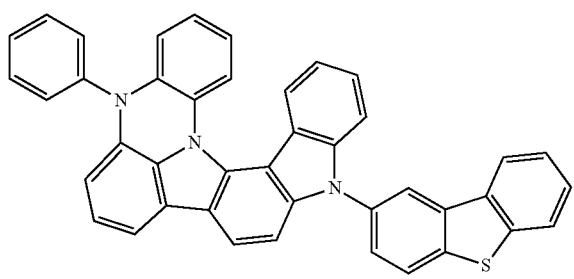
668
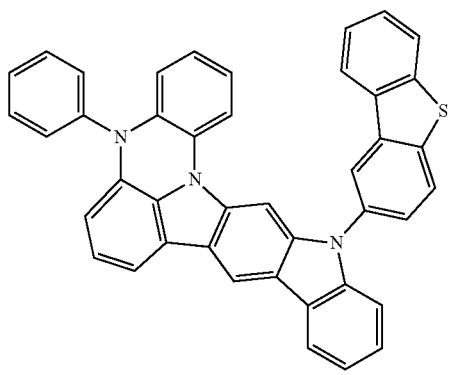
669
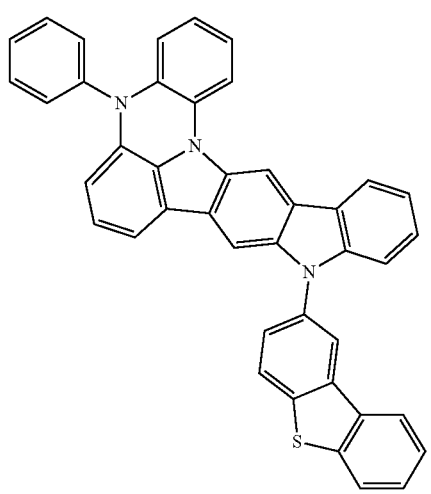
670
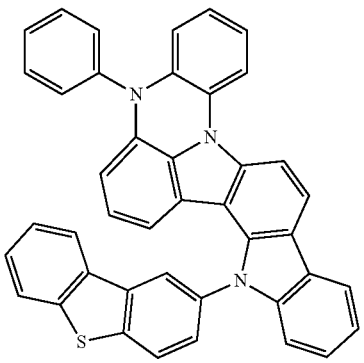
671
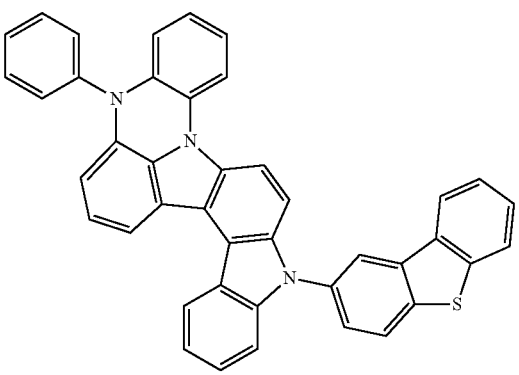
672
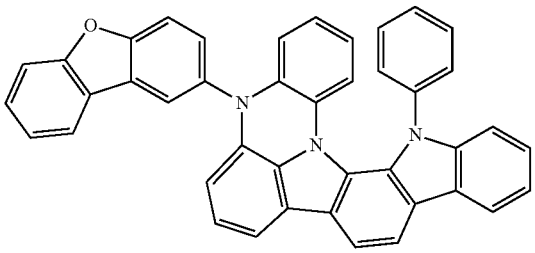
673
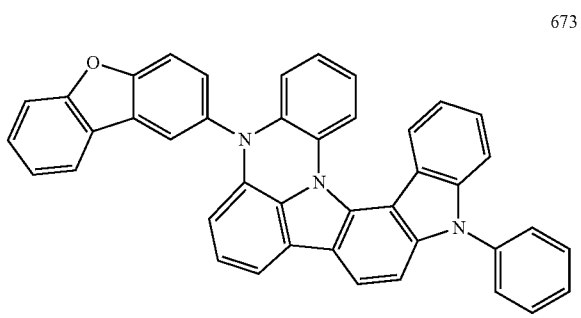

205
-continued
674
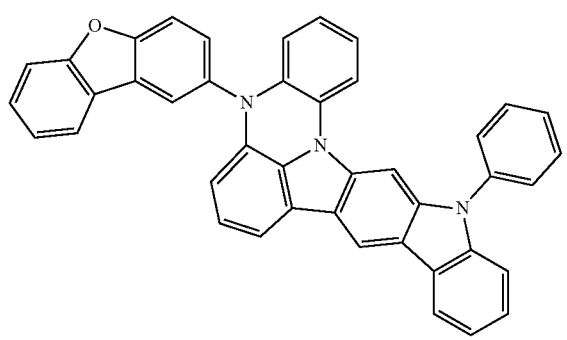
675
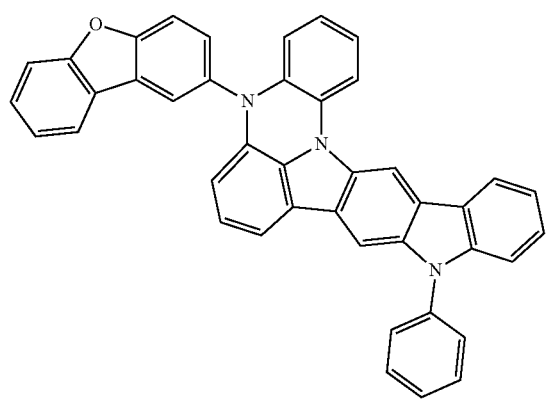
676
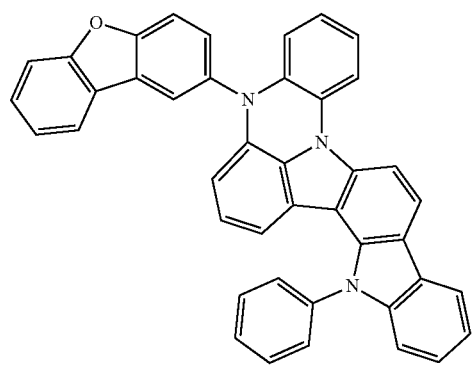
677
206
-continued
678
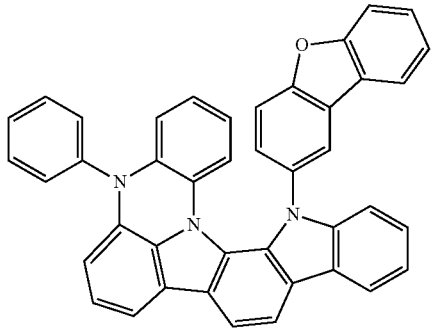
679
680
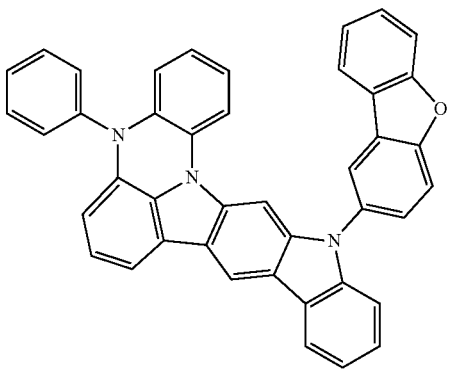
681
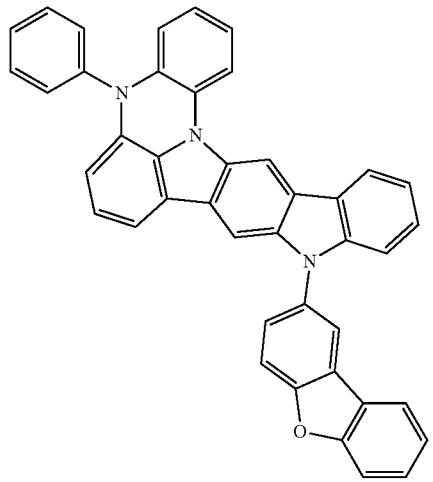

682
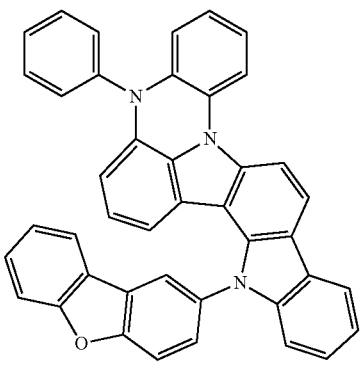
683
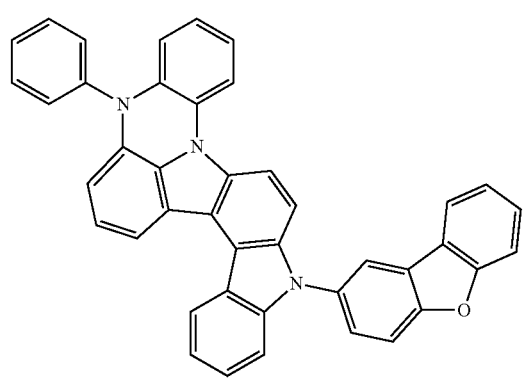
684
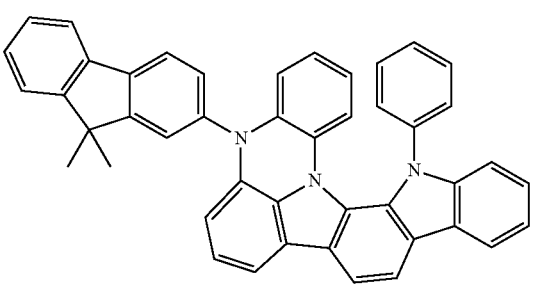
685
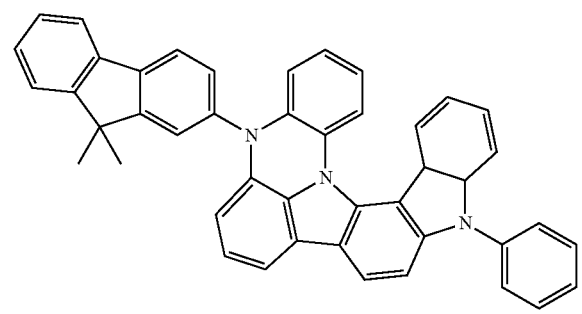
686
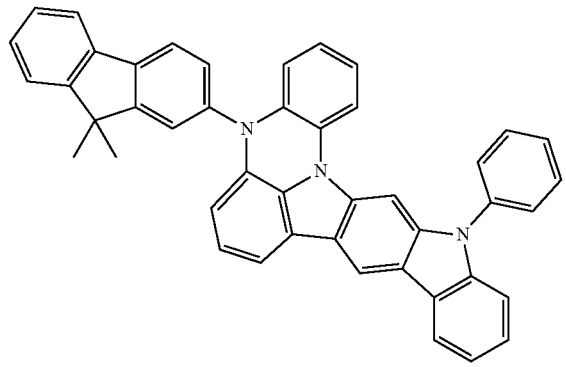
687
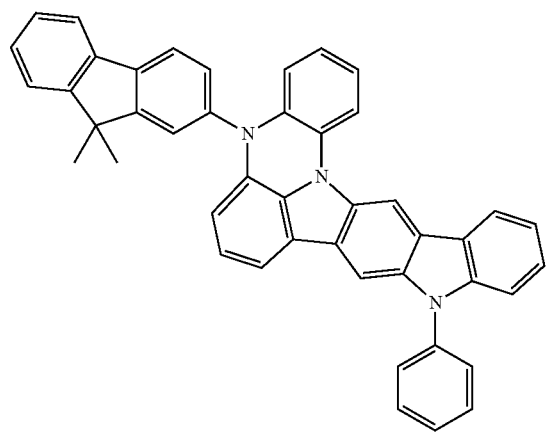
688
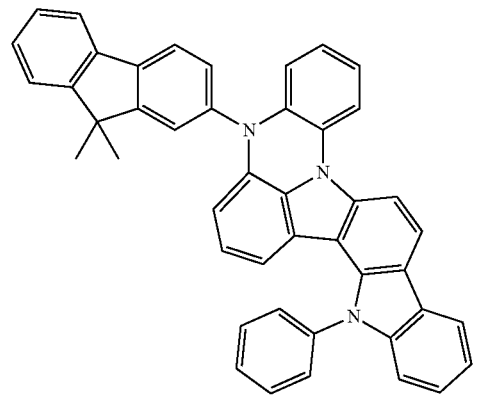
689
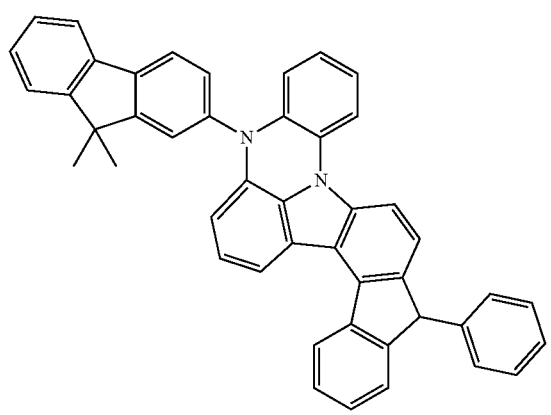

209
-continued
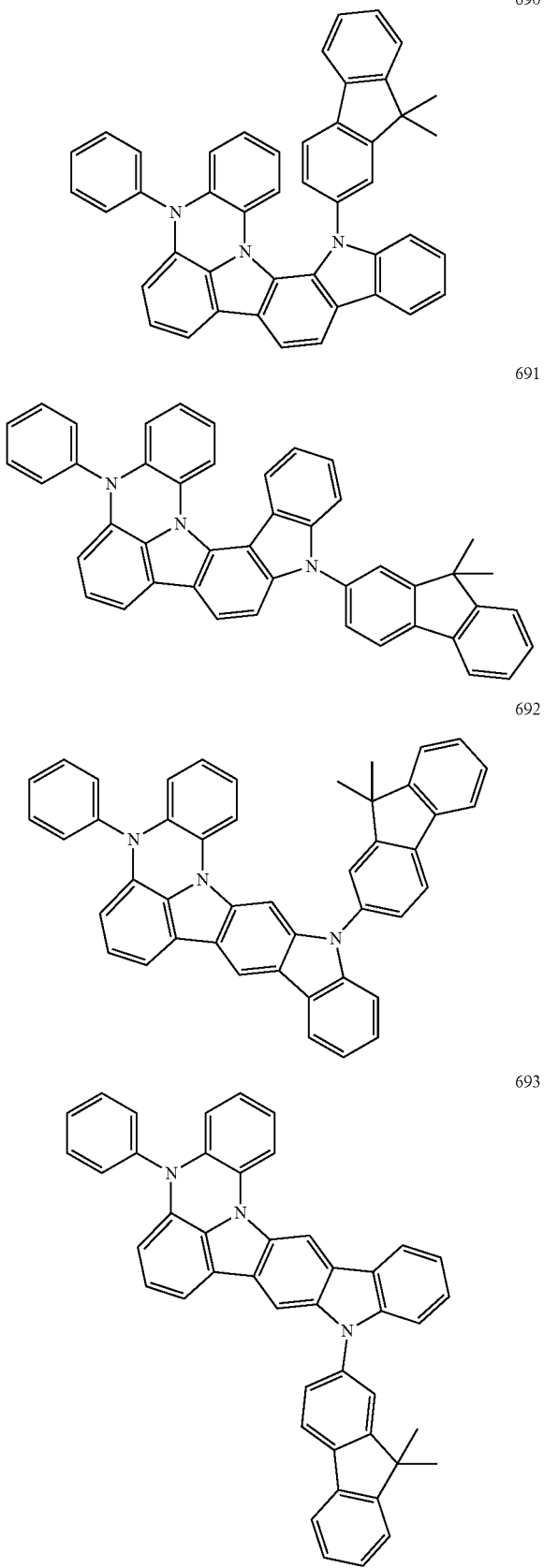
210
-continued
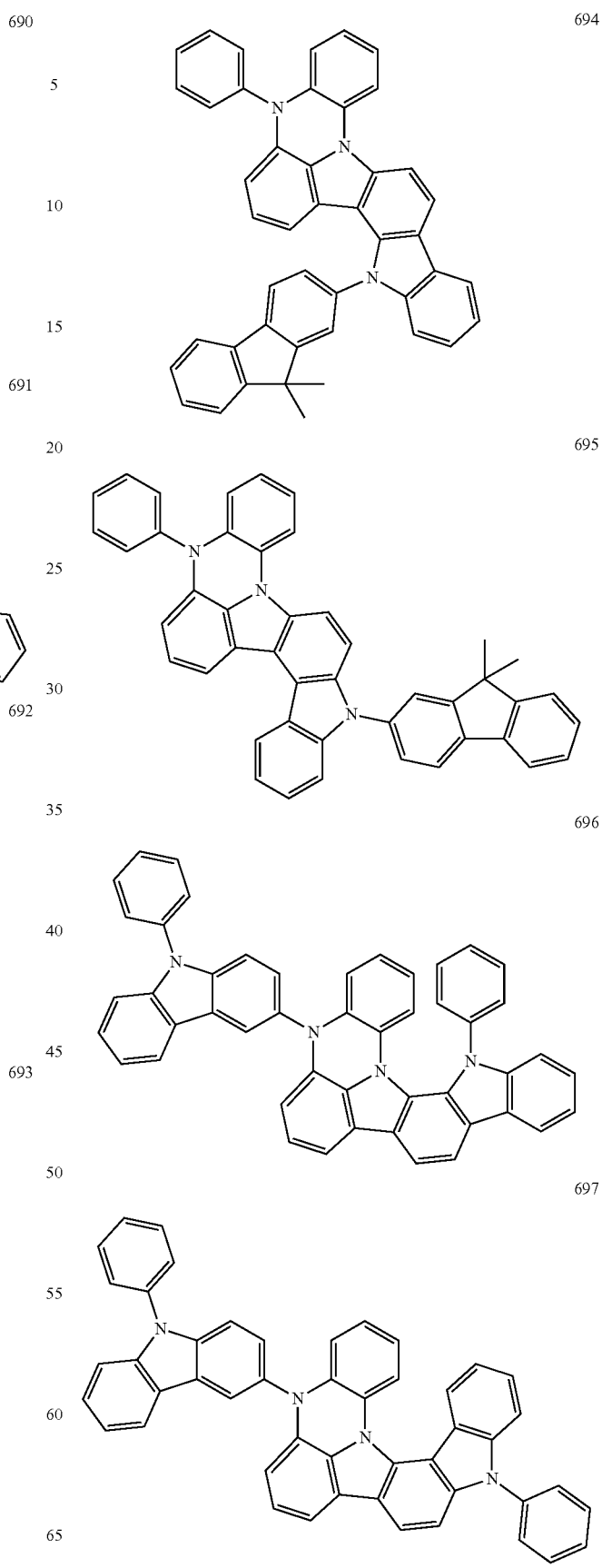

698
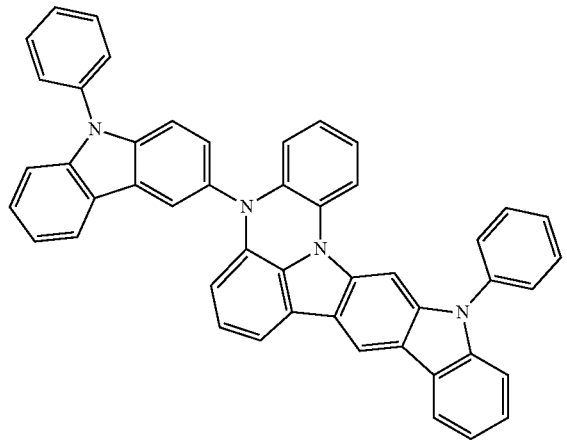
699
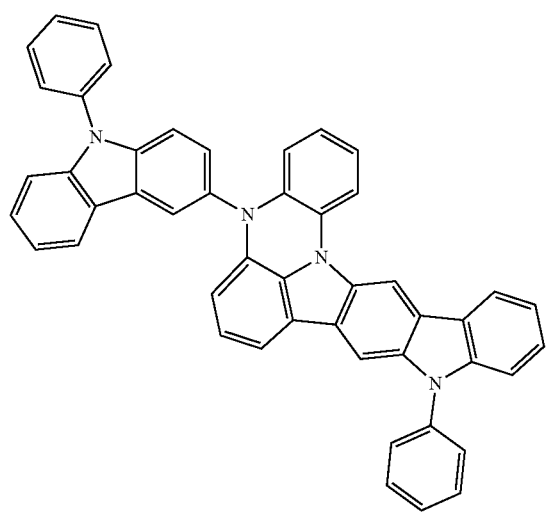
700
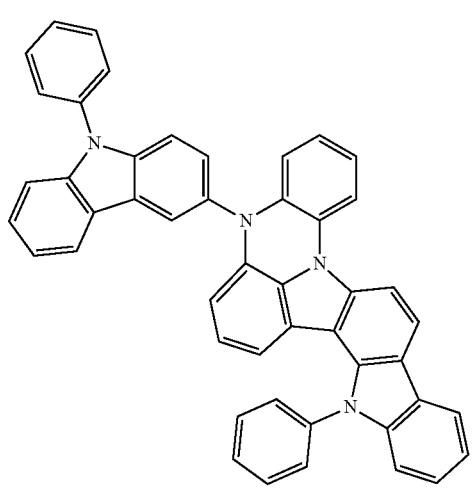
701
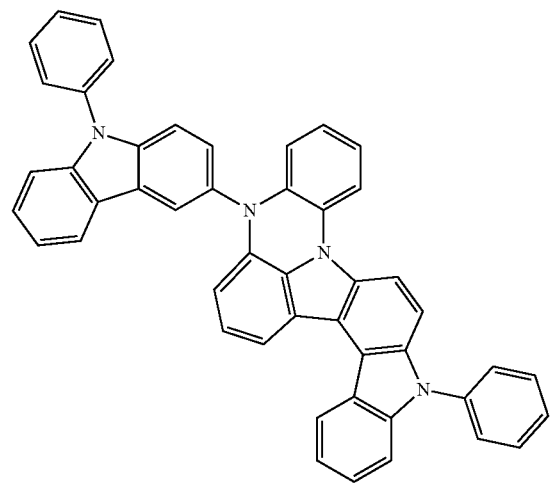
702
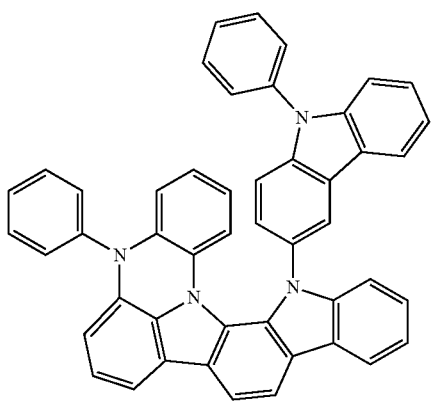
703
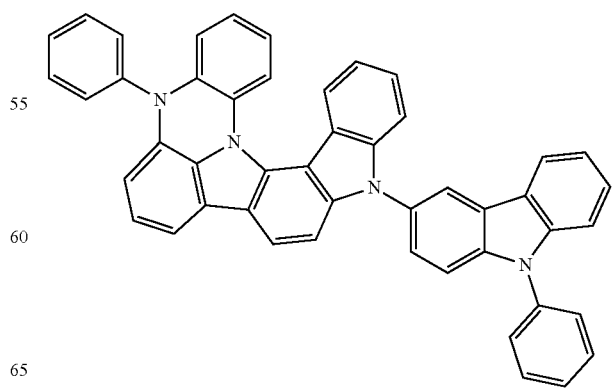

-continued
704
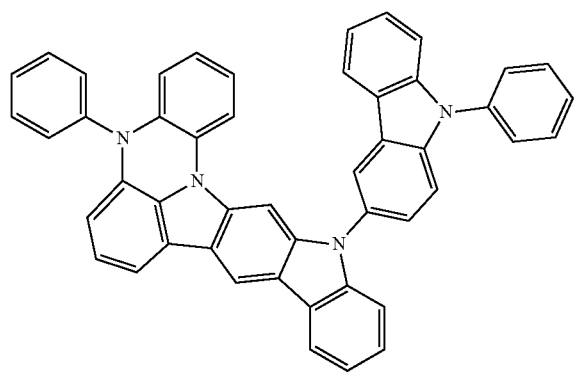
705
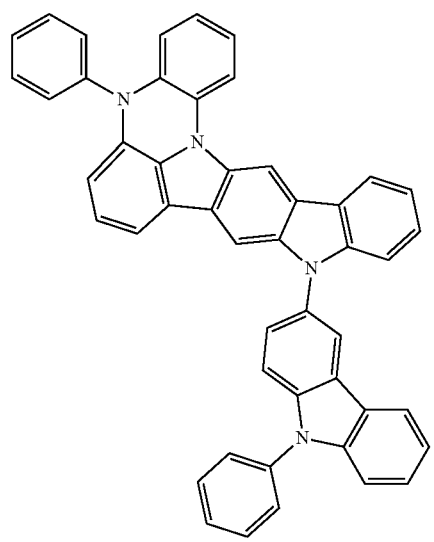
706
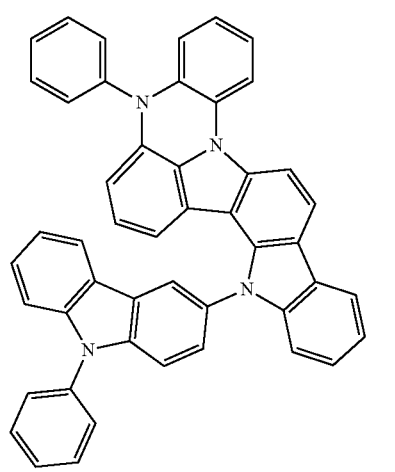
-continued
707
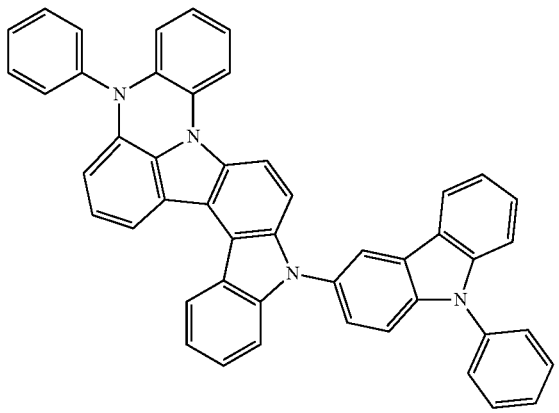
708
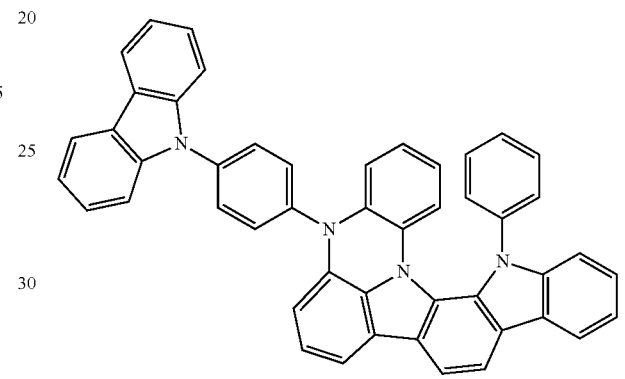
709
710
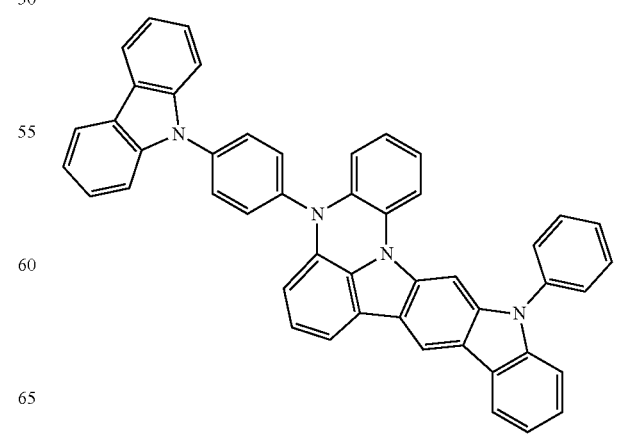

215
-continued
711
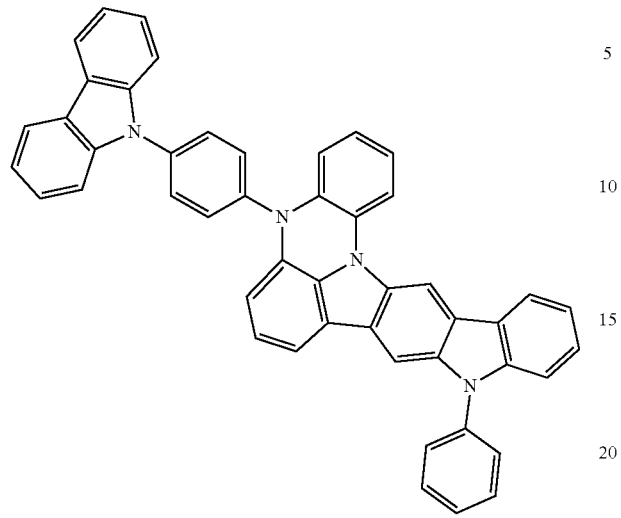
712
714
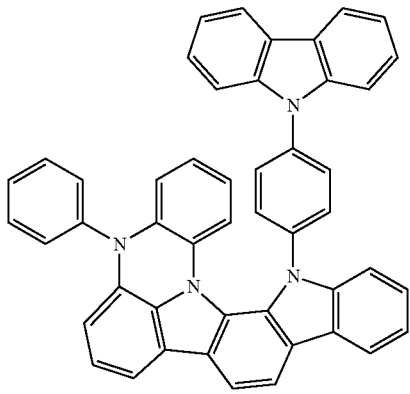
216
-continued
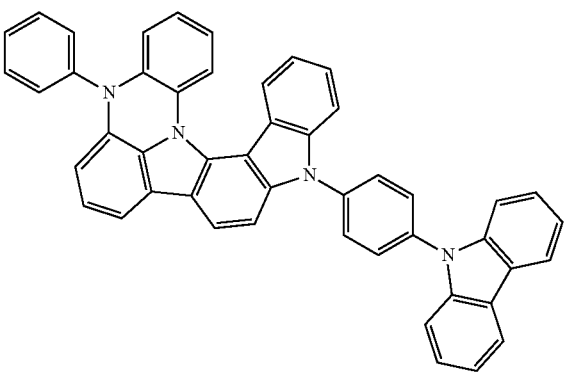
715
713
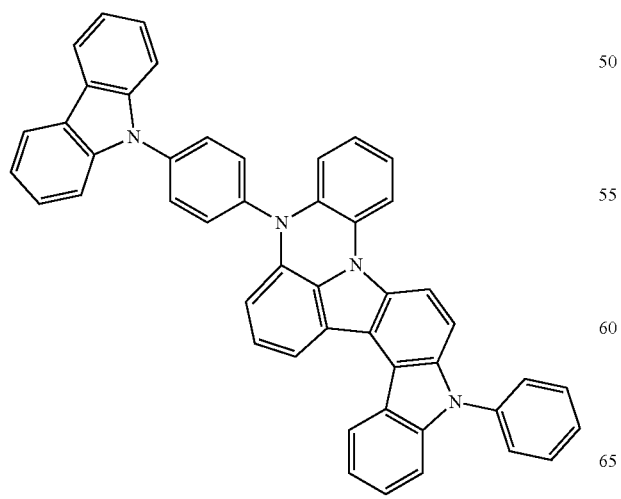
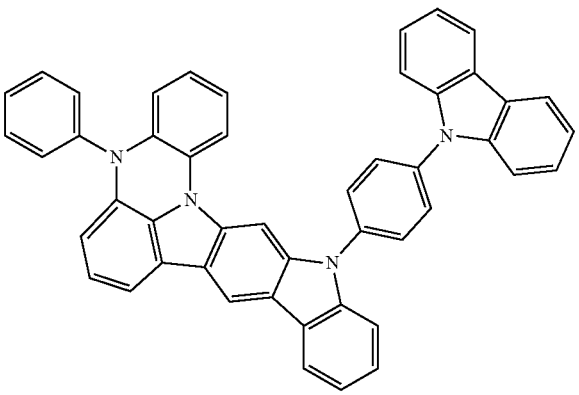
716

-continued

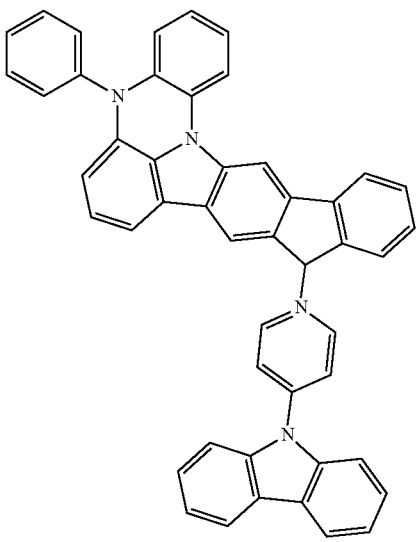
717

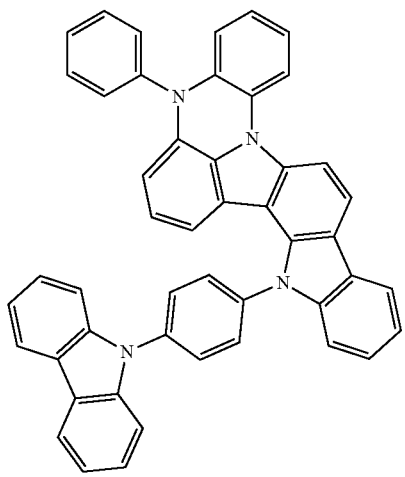
718

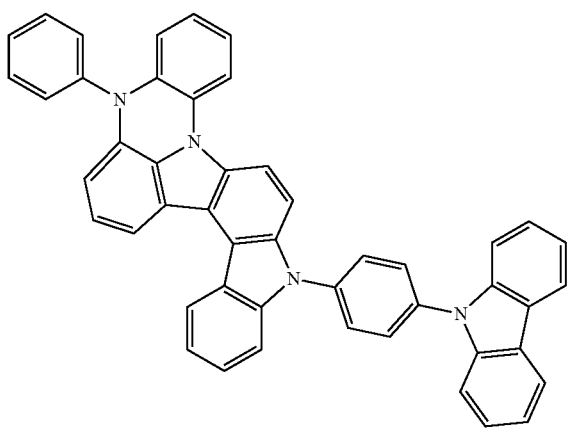
719

Hereinafter, an organic optoelectric device including the compound for an organic optoelectric device is described.

The organic optoelectric device may include a device to convert electrical energy into photoenergy or vice versa. For example, the device may include an organic photoelectric device, an organic light emitting diode, an organic solar cell, or an organic photo-conductor drum.

The embodiments may be realized by providing an organic optoelectric device including an anode and a cathode facing each other, and at least one organic layer between the anode and the cathode, wherein the organic layer includes the compound according to an embodiment.

The organic layer may include an emission layer, and the emission layer may include the compound.

The compound may be a host of the emission layer.

The organic layer may include at least one auxiliary layer selected from a hole injection layer, a hole transport layer, an electron blocking layer, an electron transport layer, an electron injection layer, or a hole blocking layer, and the at least one auxiliary layer may include the compound.

Herein, an organic light emitting diode as an example of an organic optoelectric device is described by referring to drawings.

Figure 2:
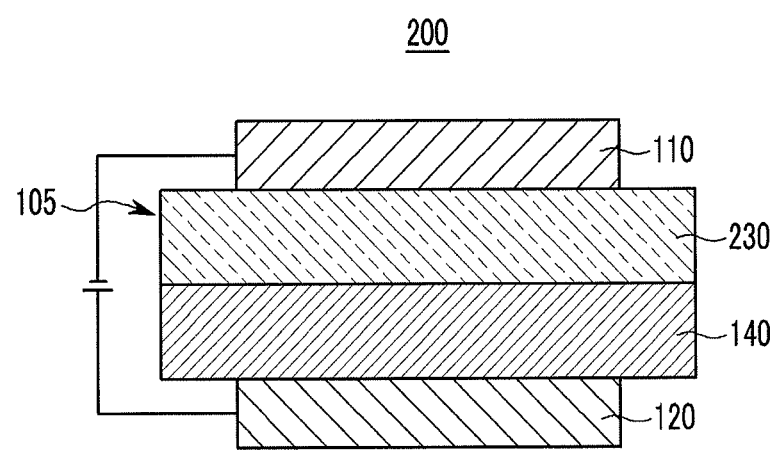

FIGS. 1 and 2 illustrate cross-sectional views of organic light emitting diodes according to various embodiments.

Referring to FIGS. 1 and 2, organic light emitting diodes 100 and 200 according to the embodiments may include an anode 120, a cathode 110, and at least one organic thin layer 105 between the anode and cathode.

The anode 120 may include an anode material having a large work function to facilitate hole injection into an organic thin layer. Examples of the anode material may include: a metal such as nickel, platinum, vanadium, chromium, copper, zinc, and gold, or alloys thereof; a metal oxide such as zinc oxide, indium oxide, indium tin oxide (ITO), and indium zinc oxide (IZO); a combined metal and oxide such as ZnO:Al or SnO$_2$:Sb; or a conductive polymer such as poly(3-methylthiophene), poly[3,4-(ethylene-1,2-dioxy)thiophene] (PEDT), polypyrrole, and polyaniline. In an implementation, a transparent electrode including indium tin oxide (ITO) may be used as an anode.

The cathode 110 may include a cathode material having a small work function to facilitate electron injection into an organic thin layer. Examples of the cathode material may include a metal such as magnesium, calcium, sodium, potassium, titanium, indium, yttrium, lithium, gadolinium, aluminum, silver, tin, and lead, or alloys thereof; or a multi-layered material such as LiF/Al, Liq/Al, LiO$_2$/Al, LiF/Ca, LiF/Al, and BaF$_2$/Ca. In an implementation, a metal electrode including aluminum may be used as a cathode.

Referring to FIG. 1, the organic light emitting diode 100 according to an embodiment may include an organic thin layer 105 including only an emission layer 130. For example, the organic thin layer 105 may include only a single layer.

Referring to FIG. 2, an organic light emitting diode 200 according to another embodiment may further include a hole auxiliary layer 140 along with an emission layer 230. The hole auxiliary layer 140 may help increase hole injection and/or hole mobility between the anode 120 and the emission layer 230 and may help prevent or block electrons. The hole auxiliary layer 140 may be, e.g., a hole transport layer (HTL), a hole injection layer (HIL), and/or an electron blocking layer, and may include at least one layer. The compound according to an embodiment, described above, may be included in an emission layer 130, 230 and/or in a hole auxiliary layer 140. In an implementation, the organic thin layer 105 may further include, e.g., an electron injection layer (EIL), an electron transport layer (ETL), an auxiliary electron transport layer (ETL), an auxiliary hole transport layer (HTL), hole transport layer (HTL), a hole injection layer (HIL), and/or a combination thereof, even though they are not shown in FIG. 1 or 2.

In FIGS. 1 and 2, at least one organic thin layer 105 selected from the emission layer 130 and 230, the hole transport layer (HTL) 140, and the electron injection layer (EIL), the electron transport layer (ETL), the auxiliary electron transport layer (ETL), the auxiliary hole transport layer (HTL), the hole injection layer (HIL), or a combination thereof, may include the compound according to an embodiment.

For example, the compound may be used or included in the hole injection layer (HIL) or the hole transport layer (HTL).

The compound for an organic optoelectric device may be used or included in the emission layer, e.g., may be a host in the emission layer. For example, the compound may be a green phosphorescent host in the emission layer.

The organic light emitting diodes 100 and 200 may be manufactured by: forming an anode or a cathode on a substrate; forming an organic thin layer in accordance with a dry coating method such as evaporation, sputtering, plasma plating, and ion plating or a wet coating method such as spin coating, dipping, and flow coating; and providing a cathode or an anode thereon.

Another embodiment may provide a display device including the organic optoelectric device.

Preparation of Compounds for an Organic Optoelectric Device

Exemplary Synthesis of Compound for an Organic Optoelectric Device

[Reaction Scheme 1]

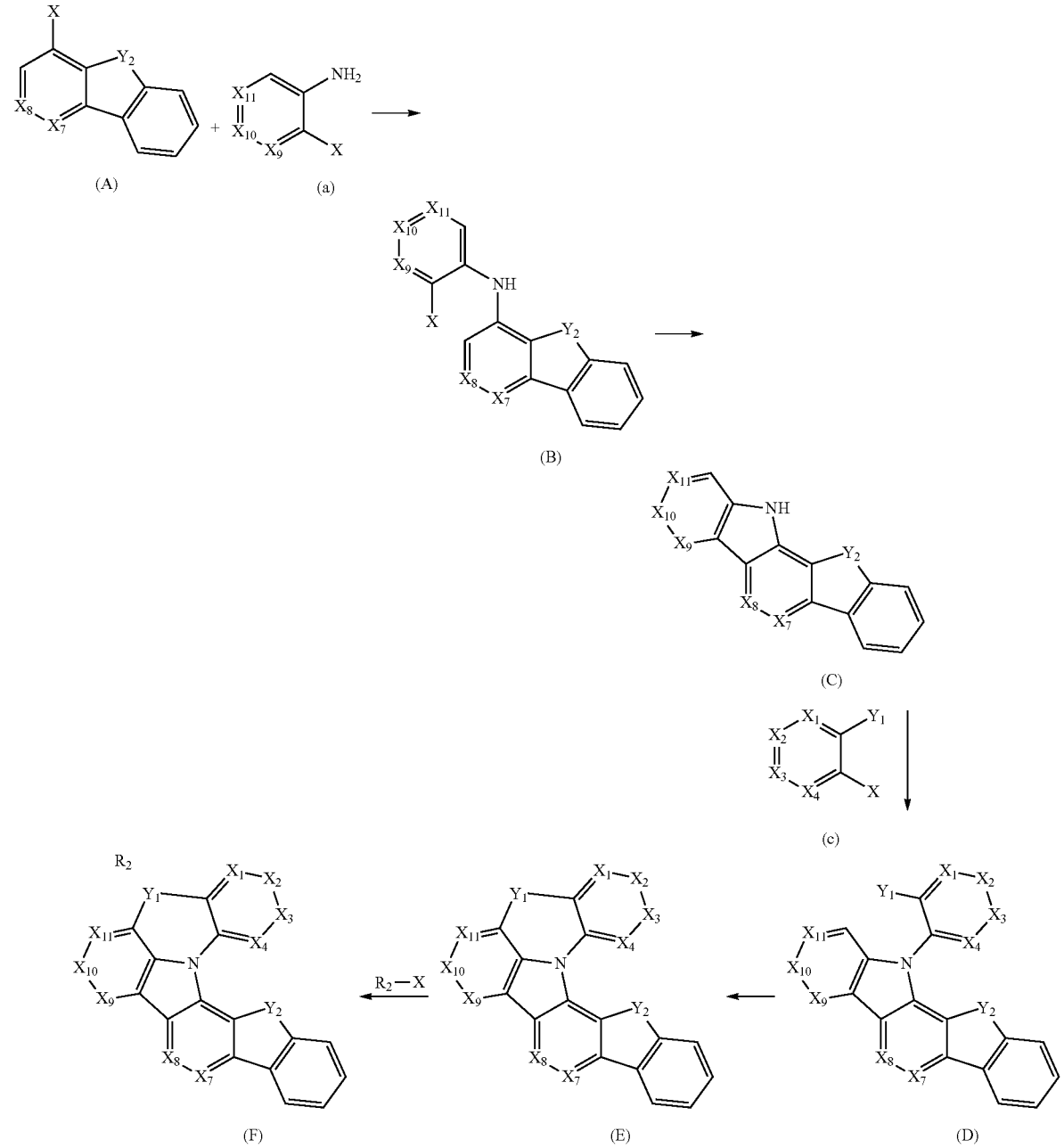

Compounds according to an embodiment may generally be synthesized according to Reaction scheme 1, above. In Reaction Scheme 1, (A) represents a structure including a ring in which X is fused with neighboring $X^9$ to $X^{11}$ (fusion, indeno, and the like) as defined in the above Chemical Formulae I and II, and $Y^2$ included in the (A) may be represented by C, N, O, S, S(=O), and S(=O)$_2$, and $R^2$ may be the same as defined in the above Chemical Formulas I and II.

Each step may be as follows.

Step 1: A compound (B) was prepared through Buchwald-Hartwig Cross Coupling Reaction by using commercially-available dibenzofuran, dibenzothiophene, carbazole, fluorene, and the like having the structure (A) and aniline having a halogen. This reaction may be performed without solvent or using a solvent such as toluene, xylene, 1,4-dioxane, or the like having no unfavorable influence thereon. The reaction may be performed at room or ambient temperature to an elevated temperature, e.g., at the elevated temperature. In the Buchwald-Hartwig Cross Coupling Reaction, various metal catalysts may be used, e.g., Pd(dba)$_2$, Pd$_2$(dba)$_3$, and the like.

Step 2: An indeno compound (C) may be prepared by performing RCM (ring close metathesis) on the compound (B) obtained in the step 1 and then, a cyclization reaction under a metal-catalyst. The metal-catalyst in the reaction may include palladium (0), and tetrakis(triphenylphosphine) palladium (0) (PPh$_3$)$_4$Pd), palladium acetate (II) (Pd(OAc)$_2$), tris(dibenzylideneacetone)dipalladium (0) (Pd$_2$dba$_3$), bis(triphenylphosphine)palladium (II) chloride (PdCl$_2$(PPh$_3$)$_2$), or the like may be used alone or as a composite with tributylphosphine (Bu$_3$P). The reaction may be performed without using a ligand, or by using a ligand used for a cyclization reaction under a metal-catalyst, e.g., triphenylphosphine ((PPh$_3$)$_4$), 1,2-bis(diphenylphosphino) propane (DPPP), (R)-2,2'-bis(diphenylphosphino)-1,1'-binaphthyl (R)-BiNAP), or the like. Herein, a base such as potassium carbonate, sodium carbonate, silver carbonate, diethylisopropylamine, or the like may be used, and a solvent having no unfavorable influence on the reaction, e.g., N,N-dimethylformamide, benzene, xylene, acetonitrile, or the like may be used for the reaction. The reaction may be performed at ambient temperature to an elevated temperature, e.g., at an elevated temperature.

Step 3: An intermediate product (D) may be prepared by using the indeno intermediate product (C) cyclized in the step 2 and performing the same Buchwald-Hartwig Cross Coupling Reaction as the step 1.

Step 4: An intermediate product (E) was prepared by using the intermediate product (D) in the step 3 and performing the same RCM (ring close metathesis) as the step 2. The reaction may include various RCM reactions and may use various reagents, e.g., triphenylphosphine, triphenylphosphite, or the like, for cyclization. Herein, a solvent having no unfavorable influence on the reaction such as dimethylformamide or the like may be used, e.g., triphenylphosphite may be used alone, and the reaction may be performed at ambient temperature to an elevated temperature, e.g., at an elevated temperature.

Step 5: A final compound (F) in Reaction Scheme 1 may be synthesized by using the indeno compound (E) prepared in the step 4 with R2 having halogen especially when Y1 was nitrogen and performing the same Buchwald-Hartwig Cross Coupling Reaction as the step 1.

The following Examples and Comparative Examples are provided in order to highlight characteristics of one or more embodiments, but it will be understood that the Examples and Comparative Examples are not to be construed as limiting the scope of the embodiments, nor are the Comparative Examples to be construed as being outside the scope of the embodiments. Further, it will be understood that the embodiments are not limited to the particular details described in the Examples and Comparative Examples.

Synthesis Example 1

Synthesis of Compound 75

Compound 75 ((4,6-diphenyl-1,3,5-triazin-2-yl)-16H-benzofuro[3',2':6,7]indolo[3,2,1-de]phenazine) as an example of a compound for an organic optoelectric device according to an embodiment was synthesized through 5 steps shown in the following Reaction Scheme.

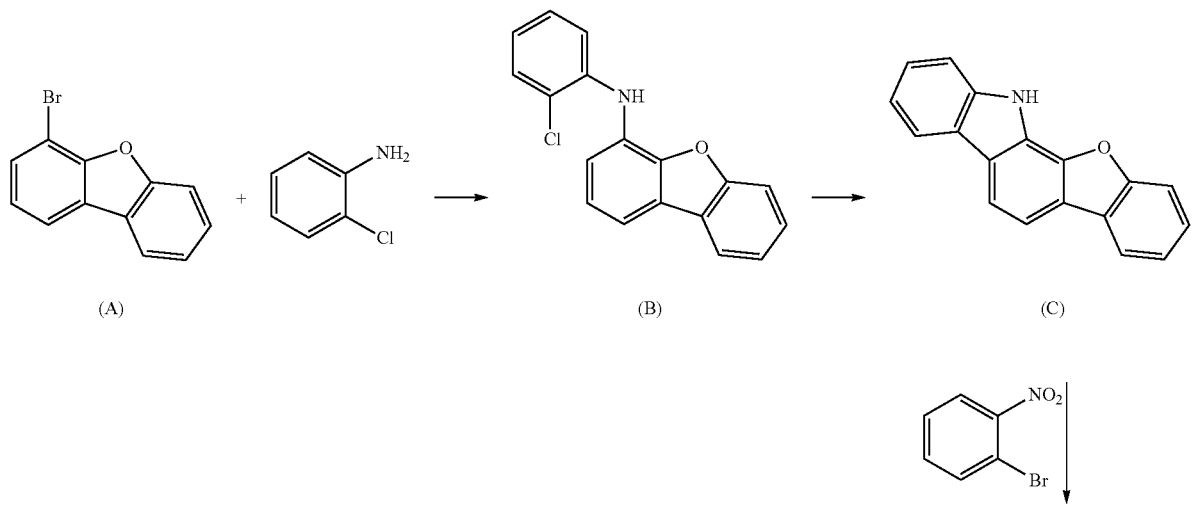

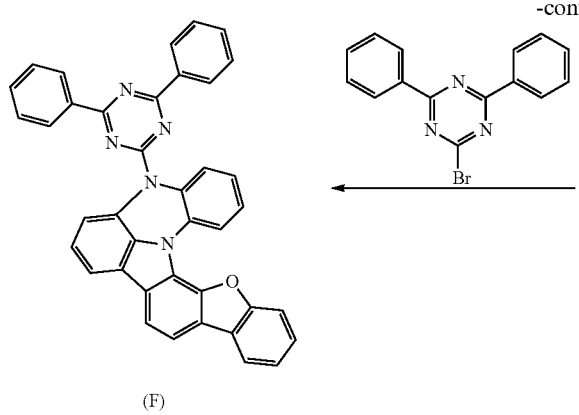

(F)

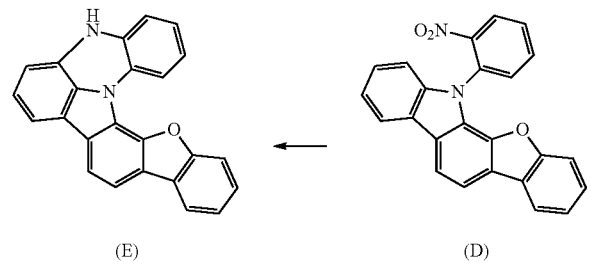

(E)  (D)

Step 1: Synthesis of Intermediate Product (B)

4-bromodibenzofuran (A) (30 g, 121.41 mmol) was put in xylene (500 ml), and 2-chloroaniline (16.23 g, 127.48 mmol), Pd$_2$(dba)$_3$ (3.34 g, 3.64 mmol), P(t-Bu)$_3$ (1.74 ml, 7.28 mmol), and NaO(t-bu) (23.34 g, 242.83 mmol) were added thereto at ambient temperature, and the mixture was then refluxed and agitated for 14 hours. When the reaction was complete, the subject compound (B) (31.4 g, 88%) was obtained by adding water and ethyl acetate to the resultant, drying a separated organic layer with a silica gel filter and anhydrous magnesium sulfate and then, concentrating a solvent under a reduced pressure to obtain a mixture, and recrystallizing the mixture with dichloromethane and hexane.

Step 2: Synthesis of Intermediate Product (C)

The compound (B) (31 g, 105.53 mmol) prepared in the step 1 was dissolved in N,N-dimethylformamide (280 ml), and 10% Pd—C (7.11 g, 31.66 mmol), 1,3-bis(diphenyl-phosphino)propane (13.058 g, 31.66 mmol), t-tributylphosphine (52.07 ml, 105.53 mmol), and K$_2$CO$_3$ (29.17 g, 211.06 mmol) were added thereto. The mixture was then refluxed and agitated for 24 hours. When the reaction was complete, the subject compound (C) (20.64 g, 76%) was obtained by adding water and ethyl acetate to the resultant, drying a separated organic layer with a silica gel filter and anhydrous magnesium sulfate and then, concentrating a solvent therein under a reduced pressure to obtain a mixture, and recrystallizing the mixture with dichloromethane and hexane.

Step 3: Synthesis of Intermediate Product (D)

The compound (C) (20 g, 77.73 mmol) prepared in the step 2 was dissolved in toluene, and 1-bromo-2-nitrobenzene (16.49 g, 81.62 mmol), Pd$_2$(dba)$_3$ (2.14 g, 2.33 mmol), P(t-Bu)$_3$ (1.11 ml, 4.66 mmol), and NaO(t-bu) (14.94 g, 155.47 mmol) were added thereto at ambient temperature. The mixture was then refluxed and agitated for 18 hours. When the reaction was complete, the subject compound (D) (24.12 g, 82%) was obtained by adding water and ethyl acetate to the resultant, drying a separated organic layer with a silica gel filter and anhydrous magnesium sulfate and then, concentrating a solvent under a reduced pressure to obtain a mixture, and recrystallizing the mixture with dichloromethane and acetone.

Step 4: Synthesis of Intermediate Product (E)

The compound (D) (24 g, 91.56 mmol) prepared in the step 3 was dissolved in triethylphosphite (55 ml), and the mixture was refluxed and agitated for 4 hours. When the reaction was complete, the subject compound (E) (15.82 g, 72%) was obtained by recrystallizing the mixture with dichloromethane and ethyl acetate after removing triethylphosphite therefrom.

Step 5: Synthesis of (4,6-diphenyl-1,3,5-triazin-2-yl)-16H-benzofuro[3',2':6,7]indolo[3,2,1-de] phenazine (Compound 75)

The compound (E) (15 g, 43.31 mmol) obtained in the step 4 was dissolved in xylene (180 ml), and 2-bromo-4,6-diphenyl-[1,3,5]triazine (14.20 g, 45.47 mmol), Pd$_2$(dba)$_3$ (1.19 g, 1.30 mmol), P(t-Bu)$_3$ (0.68 ml, 2.60 mmol), and NaO(t-bu) (8.23 g, 86.61 mmol) were added thereto at ambient temperature. The mixture was then refluxed and agitated for 13 hours. When the reaction was complete, Compound 75, i.e., (4,6-diphenyl-1,3,5-triazin-2-yl)-16H-benzofuro[3',2':6,7]indolo[3,2,1-de]phenazine, (18.26 g, 73%) was obtained by adding water and ethyl acetate thereto, drying a separated organic layer with a silica gel filter and anhydrous magnesium sulfate and then, concentrating a solvent under a reduced pressure to obtain a mixture, and recrystallizing the mixture with toluene.

Molecular formula: C$_{39}$H$_{23}$N$_5$O

HRMS (70 eV, EI+): m/z calculation value (577.19), measurement value (577)

Synthesis Example 2

Synthesis of Compound 248

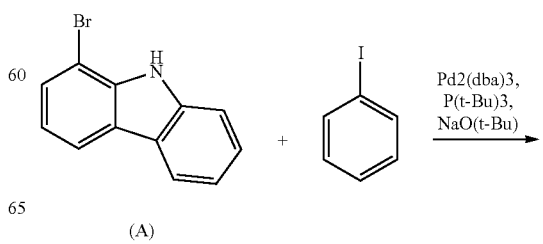

(A)

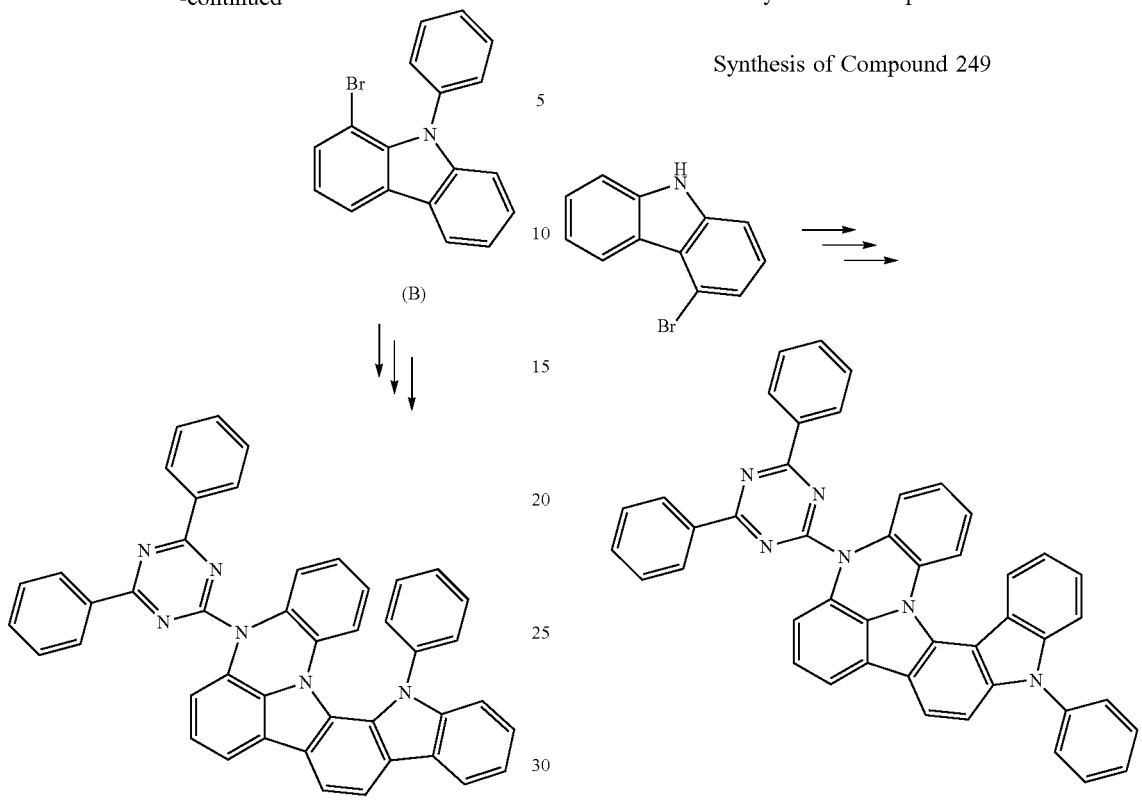

(B)

Step 1: Synthesis of Intermediate Product (B)

1-bromo-9H-carbazole (30 g, 121.90 mmol, CAS no. 16807-11-7) was dissolved in xylene (900 ml), and iodobenzene (29.84 g, 146.28 mmol), $Pd_2(dba)_3$ (3.35 g, 3.66 mmol), $P(t-Bu)_3$ (5.22 ml, 10.97 mmol), and NaO(t-bu) (17.57 g, 182.85 mmol) were added thereto at ambient temperature. The mixture was then refluxed and agitated for 13 hours. When the reaction was complete, the subject compound (B) (32.21 g, 82%) was obtained by adding water and ethyl acetate to the resultant, drying a separated organic layer with a silica gel filter and anhydrous magnesium sulfate and concentrating a solvent under a reduced pressure to obtain a mixture, and recrystallizing the mixture with ethyl acetate and hexane.

Step 2: Synthesis of (4,6-diphenyl-1,3,5-triazin-2-yl)-16H-benzofuro[3',2':6,7]indolo[3,2,1-de]phenazine (Compound 248)

Compound 248, i.e., (4,6-diphenyl-1,3,5-triazin-2-yl)-10-phenyl-10,16-dihydroindolo[3',2':6,7] indolo[3,2,1-de]phenazine, (16.6 g) was obtained by using the compound (B) (32.21 g, 99.32 mmol) prepared in the step 1 of Synthesis Example 2 through the same steps 2, 3, 4, and 5 as described above in Synthesis Example 1.

Molecular formula: $C_{45}H_{28}N_6$

HRMS (70 eV, EI+): m/z calculation value (652.24), measurement value 652

Synthesis Example 3

Synthesis of Compound 249

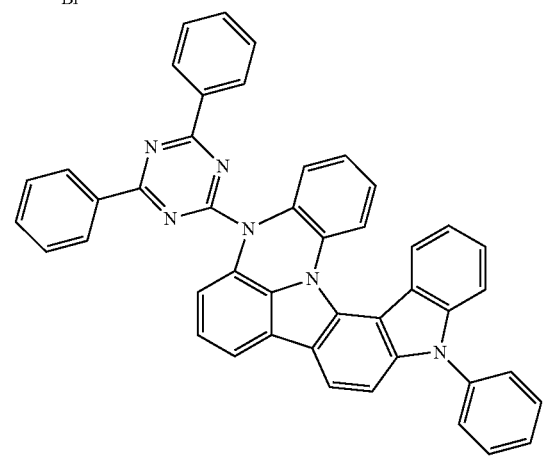

Step 1: Synthesis of (4,6-diphenyl-1,3,5-triazin-2-yl)-6-phenyl-6,16-dihydroindolo[2',3':6,7]indolo[3,2,1-de]phenazine (Compound 249)

Compound 249, i.e., (4,6-diphenyl-1,3,5-triazin-2-yl)-6-phenyl-6,16-dihydroindolo[2',3':6,7]indolo[3,2,1-de] phenazine, (14.2 g) was obtained by using 4-bromo-9H-carbazole (30 g, 121.90 mmol, CAS no. 3652-89-9) through the same step 1 of Synthesis Example 2 and the same steps 2, 3, 4, and 5 as Synthesis Example 1.

Molecular formula: $C_{45}H_{28}N_6$

HRMS (70 eV, EI+): m/z calculation value (652.24), measurement value 652

Synthesis Example 4

Synthesis of Compound 257

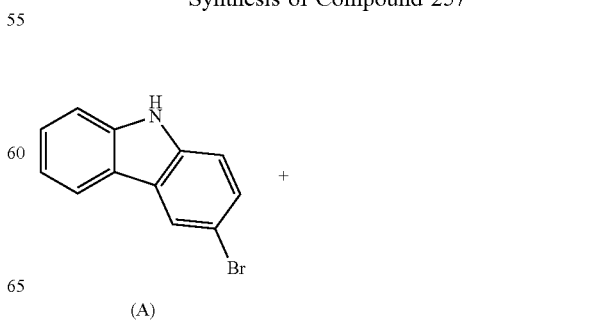

(A)

-continued

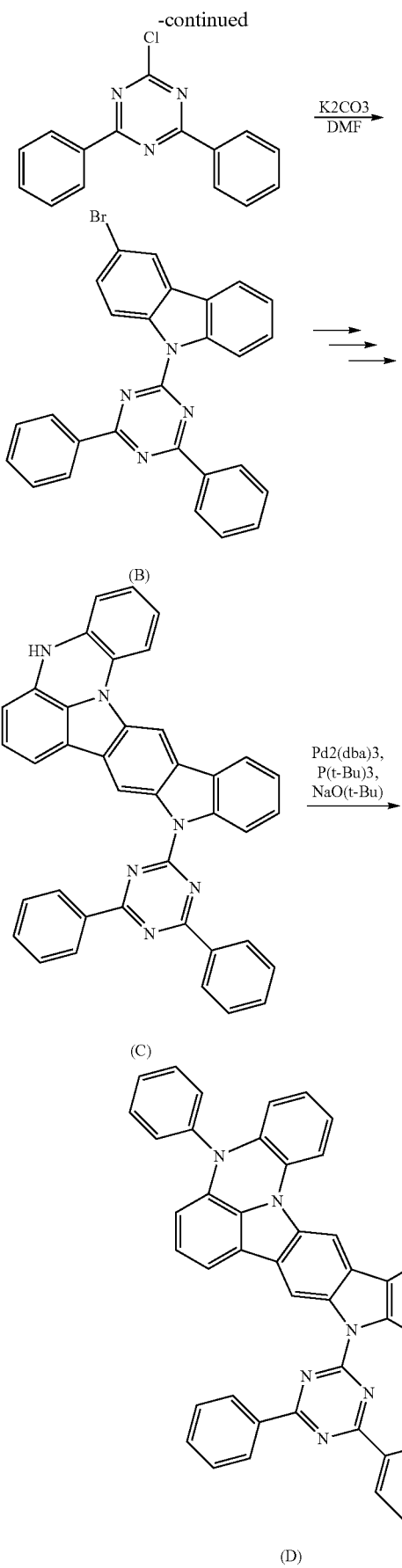

Step 1: Synthesis of Intermediate Product (B)

3-bromo-9H-carbazole (28.4 g, 116 mmol, CAS no. 1592-95-6) was dissolved in dimethylformamide (300 ml), and 2-chloro-4,6-diphenyl-1,3,5-triazine (31.0 g, 116 mmol) and $K_2CO_3$ (32 g, 116 mmol) were added thereto at ambient temperature. Then, the mixture was refluxed and agitated for 13 hours. When the reaction was complete, the subject compound (B) (25.0 g, 90%) was obtained by adding water and ethyl acetate to the resultant, drying a separated organic layer with a silica gel filter and anhydrous magnesium sulfate and concentrating a solvent under a reduced pressure to obtain a mixture, and recrystallizing the mixture with toluene.

Step 2: Synthesis of Intermediate Product (C)

The subject compound (C) (17.5 g) was obtained by using the compound (B) (25 g, 52.37 mmol) obtained in the step 1 of Synthesis Example 4 through the steps 2, 3, and 4 of Synthesis Example 1.

Step 3: Synthesis of (4,6-diphenyl-1,3,5-triazin-2-yl)-5-phenyl-5,10-dihydroindolo[2',3':5,6]indolo[3,2,1-de]phenazine (Compound 257)

The compound (C) (17 g, 29.48 mmol) obtained in the step 2 of Synthesis Example 4 was dissolved in xylene (216 ml), and iodobenzene (7.22 g, 35.38 mmol), $Pd_2(dba)_3$ (0.81 g, 0.88 mmol), $P(t-Bu)_3$ (1.26 ml, 2.65 mmol), and NaO(t-bu) (4.25 g, 44.22 mmol) were added thereto at ambient temperature. The mixture was refluxed and agitated for 13 hours. When the reaction was complete, Compound 257, i.e., (4,6-diphenyl-1,3,5-triazin-2-yl)-5-phenyl-5,10-dihydroindolo[2',3':5,6]indolo[3,2,1-de]phenazine, (14.82 g, 77%) was obtained by adding water and ethyl acetate to the resultant, drying a separated organic layer with a silica gel filter and anhydrous magnesium sulfate and concentrating a solvent under a reduced pressure to obtain a mixture, and recrystallizing the mixture with toluene.

Molecular formula: $C_{45}H_{28}N_6$

HRMS (70 eV, EI+): m/z calculation value (652.24), measurement value 652

(Comparison of Simulation Characteristics of Compounds)

Energy level of each compound was measured by using a super computer GAIA (IBM power 6) in a Gaussian 09 method, and the results are provided in the following Table 1.

TABLE 1

| Compound | T1 (eV) | S1 (eV) | HOMO (eV) | LUMO (eV) |
|---|---|---|---|---|
| Synthesis Example 1 (Compound 75) | 2.805 | 2.952 | −5.201 | −1.715 |
| Synthesis Example 2 (Compound 248) | 2.804 | 2.916 | −5.121 | −1.720 |
| Synthesis Example 3 (Compound 249) | 2.825 | 2.940 | −5.094 | −1.658 |
| Synthesis Example 4 (Compound 257) | 2.219 | 2.240 | −4.426 | −1.834 |
| CBP | 2.971 | 3.457 | −5.319 | −1.231 |

(Manufacture of Organic Light Emitting Diode)

Example 1

An organic light emitting diode was manufactured by using Compound 75 obtained in Synthesis Example 1 as a host and $Ir(PPy)_3$ as a dopant.

A 1,000 Å-thick ITO layer was used as an anode, and a 1,000 Å-thick aluminum (Al) layer was used as a cathode. Specifically, the anode was manufactured by cutting an ITO glass substrate having sheet resistance of 15 Ω/cm² into a size of 50 mm×50 mm×0.7 mm and washing it with a ultrasonic wave in acetone, isopropyl alcohol, and pure water respectively for 15 minutes and then, with UV ozone for 30 minutes.

On the anode, an 800 Å-thick hole transport layer (HTL) was formed by depositing N4,N4'-di(naphthalen-1-yl)-N4,N4'-diphenylbiphenyl-4,4'-diamine (NPB) (80 nm) under a vacuum degree of 650×10$^{-7}$ Pa at a deposition rate of 0.1 to 0.3 nm/s. Subsequently, a 300 Å-thick emission layer was formed by using Compound 75 obtained in Synthesis Example 1 as a host and Ir(PPy)$_3$ as a phosphorescent dopant, by simultaneously depositing the host and dopant. The phosphorescent dopant was deposited in an amount of 7 wt %, based on 100 wt % of the emission layer by adjusting its deposition rate.

On the emission layer, a 50 Å-thick hole-blocking layer was formed by depositing bis(2-methyl-8-quinolinolate)-4-(phenylphenolato)aluminium (BAlq) under the same deposition condition. Subsequently, a 200 Å-thick electron transport layer (ETL) was formed by depositing Alq3 under the same deposition condition. On the electron transport layer (ETL), the cathode was formed by sequentially depositing LiF and Al, manufacturing an organic light emitting diode.

The organic light emitting diode had a structure of ITO/NPB (80 nm)/EML (compound 75 (93 wt %)+Ir(PPy)$_3$ (7 wt %), 30 nm)/Balq (5 nm)/Alq3 (20 nm)/LiF (1 nm)/Al (100 nm).

Example 2

An organic light emitting diode was manufactured according to the same method as Example 1, except for using Compound 248 of Synthesis Example 2 instead of Compound 75 of Synthesis Example 1.

Example 3

An organic light emitting diode was manufactured according to the same method as Example 1, except for using Compound 249 of Synthesis Example 3 instead of Compound 75 of Synthesis Example 1.

Example 4

An organic light emitting diode was manufactured according to the same method as Example 1, except for using Compound 257 of Synthesis Example 4 instead of Compound 75 of Synthesis Example 1.

Comparative Example 1

An organic light emitting diode was manufactured according to the same method as Example 1, except for using CBP having the following structure, instead of Compound 75 of Synthesis Example 1.

NPB, BAlq, CBP, and Ir(PPy)$_3$ used to manufacture the organic light emitting diode have the following structure.

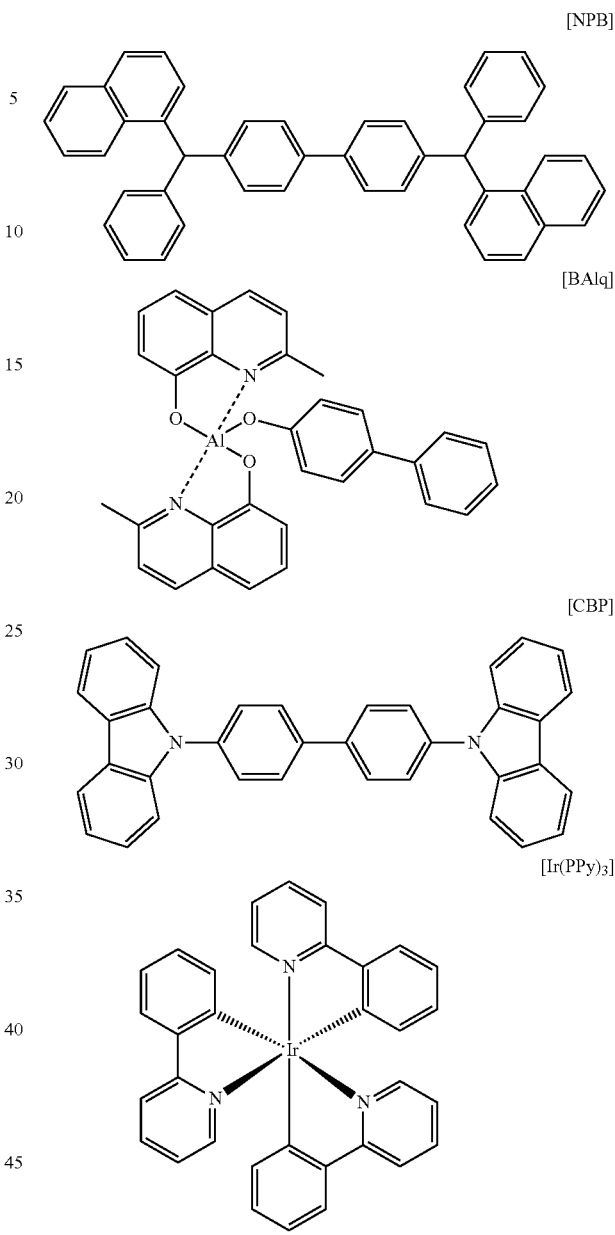

(Performance Measurement of Organic Light Emitting Diode)

Current density and luminance changes depending on a voltage and luminous efficiency of each organic light emitting diode according to Examples 1 to 4 and Comparative Example 1 were measured.

The measurements were specifically performed in the following method, and the results were provided in the following Table 2.

(1) Measurement of Current Density Change Depending on Voltage Change

The manufactured organic light emitting diodes were measured for current value flowing in the unit device, while increasing the voltage from 0 V to 10 V using a current-voltage meter (Keithley 2400), and the measured current value was divided by an area to provide the results.

(2) Measurement of Luminance Change Depending on Voltage Change

The manufactured organic light emitting diodes were measured for luminance, while increasing the voltage from 0 V to 10 V using a luminance meter (Minolta Cs-1000A).

(3) Measurement of Luminous Efficiency

Current efficiency (cd/A) at the same current density (10 mA/cm$^2$) were calculated by using the luminance, current density, and voltages (V) from the items (1) and (2).

(4) Measurement of Life-Span

Life-span of the organic light emitting diode was evaluated by maintaining luminance (cd/m$^2$) at 5,000 cd/m$^2$ and measuring time taken until current efficiency (cd/A) decreased down to 90%.

TABLE 2

| No. | Emission layer | Driving voltage (V) | Color (EL color) | Efficiency (cd/A) | 90% life-span (h) at 5,000 cd/m$^2$ |
|---|---|---|---|---|---|
| Example 1 | Compound 75 | 3.7 | Green | 66.4 | 180 |
| Example 2 | Compound 248 | 3.5 | Green | 69.5 | 165 |
| Example 3 | Compound 249 | 3.5 | Green | 77.8 | 160 |
| Example 4 | Compound 257 | 4.7 | Green | 48.2 | 76 |
| Comparative Example 1 | CBP | 4.8 | Green | 31.4 | 40 |

As shown in Table 2, the organic light emitting diodes according to Examples 1 to 4 showed improved characteristics in terms of a driving voltage, luminous efficiency, and/or power efficiency, compared with the organic light emitting diode according to Comparative Example 1.

DESCRIPTION OF SYMBOLS

100: organic light emitting diode
200: organic light emitting diode
110: cathode
120: anode
105: organic thin layer
130: emission layer
230: emission layer
140: hole transport layer (HTL)

By way of summation and review, performance of an organic light emitting diode may be affected by characteristics of the organic layer, e.g., may be mainly affected by characteristics of an organic material of the organic layer.

For example, an organic material that is capable of increasing hole and electron mobility and simultaneously increasing electrochemical stability may be used so that an organic light emitting diode may be applied to a large-size flat panel display.

The embodiments may provide a compound for an organic optoelectric device that realizes an organic optoelectric device having characteristics such as high efficiency, long life-span, and the like.

An organic optoelectric device including the compound for an organic optoelectric device according to one embodiment may have excellent electrochemical and thermal stability, excellent life-span characteristics, and high luminous efficiency at a low driving voltage. In addition, the compound for an organic optoelectric device may be appropriate for a solution process.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A compound for an organic optoelectric device, the compound including a combination of a moiety represented by the following Chemical Formula I and a moiety represented by the following Chemical Formula II:

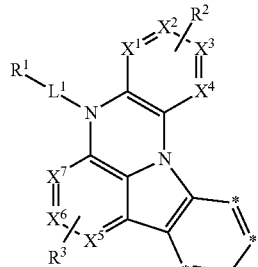

[Chemical Formula I]

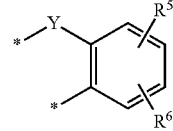

[Chemical Formula II]

wherein, in the above Chemical Formula I and Chemical Formula II,

X$^1$ to X$^7$ are each independently CR$^a$ or N, provided that all X$^1$ to X$^7$ are CR$^a$ or one of X$^1$ to X$^7$ is N, Y is O, S, SO$_2$, PO, or N-L$^2$-R$^4$, two *s of the above Chemical Formula II are bonded with two adjacent *s of the above Chemical Formula I,

*s in the above Chemical Formula I that are not bonded with the two *s of the above Chemical Formula II are each independently CR$^b$ or N, L$^1$ and L$^2$ are each independently a single bond, a substituted or unsubstituted C1 to C30 alkylene group, a substituted or unsubstituted C3 to C30 cycloalkylene group, a substituted or unsubstituted C3 to C30 heterocycloalkylene group, a substituted or unsubstituted C6 to C30 arylene group, a substituted or unsubstituted C3 to C30 heteroarylene group, a substituted or unsubstituted C6 to C30 aryleneamine group, a substituted or unsubstituted C6 to C30 heteroaryleneamine group, a substituted or unsubstituted C1 to C30 alkoxylene group, a substituted or unsubstituted C6 to C30 aryloxylene group, a substituted or unsubstituted C2 to C30 alkenylene group, a substituted or unsubstituted C2 to C30 alkynylene group, or a combination thereof, and R$^1$ to R$^6$, R$^a$, and R$^b$ are each independently hydrogen, deuterium, a halogen, a cyano group, a hydroxyl group, an amino group, a substituted or unsubstituted C1 to C20 amine group, a nitro group, a carboxyl group, a ferrocenyl group, a substituted or unsubstituted C1 to C20 alkyl group, a substituted or unsubstituted C6 to C30 aryl group, a substituted or unsubstituted C2 to C30 heteroaryl group, a substituted or unsubstituted C1 to C20 alkoxy group, a substituted or unsubstituted C6 to C20 aryloxy group, a substituted or unsubstituted C3 to C40 silyloxy group, a substituted or unsubstituted C1 to C20 acyl group, a substituted or unsubstituted C2 to C20 alkoxycarbonyl group, a substituted or unsubstituted C2 to C20 acyloxy group, a substituted or unsubstituted C2 to C20 acylamino group, a substituted or unsubstituted C2 to C20 alkoxycarbonylamino group, a substituted or unsubstituted C7 to C20 aryloxycarbonylamino group, a substituted or unsubstituted C1 to C20 sulfamoylamino group, a substituted or unsubstituted C1 to C20 sulfonyl group, a substituted or unsubstituted C1 to C20 alkylthiol group, a substituted or unsubstituted C6 to C20 arylthiol group, a substituted or unsubstituted C1 to C20 heterocyclothiol group, a substituted or unsubstituted C1 to C20 ureide group, a substituted or unsubstituted C3 to C40 silyl group, a substituted or unsubstituted C3 to C40 fused ring-containing group, or a combination thereof.

2. The compound for an organic optoelectric device as claimed in claim 1, wherein the compound is represented by one of the following Chemical Formula 1 to Chemical Formula 6:

[Chemical Formula 1]

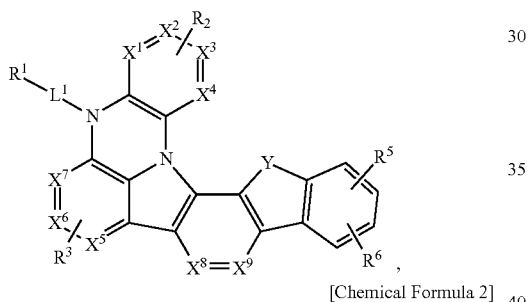

[Chemical Formula 2]

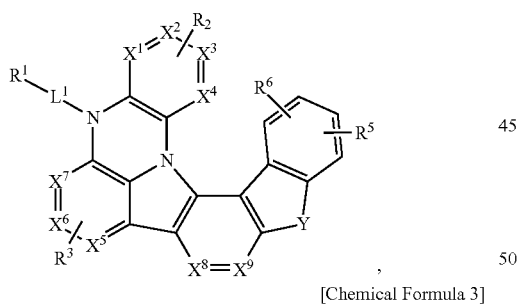

[Chemical Formula 3]

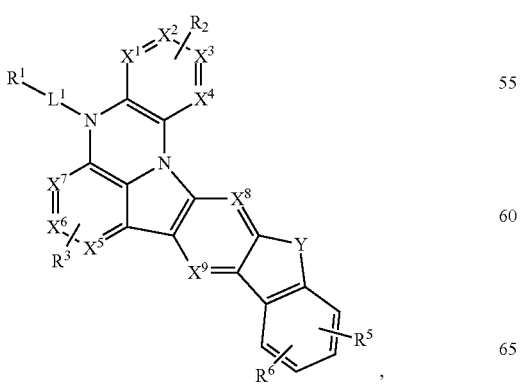

[Chemical Formula 4]

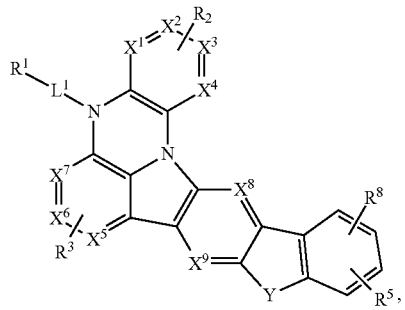

[Chemical Formula 5]

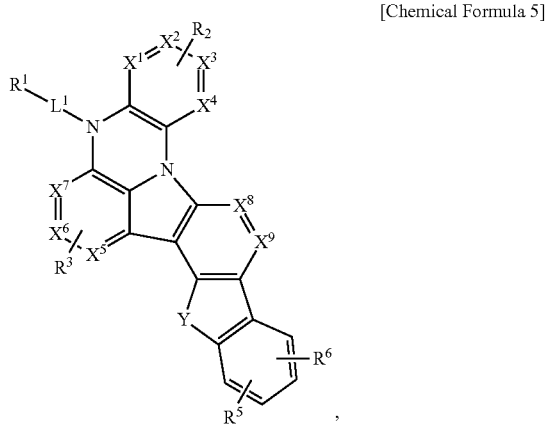

[Chemical Formula 6]

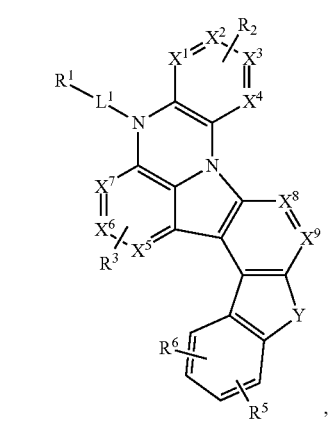

wherein, in the above Chemical Formula 1 to Chemical Formula 6, $X^1$ to $X^9$ are each independently $CR^a$ or N, provided that all $X^1$ to $X^9$ are $CR^a$ or one of $X^1$ to $X^9$ is N, Y is O, S, $SO_2$, PO, or $N-L^2-R^4$, $L^1$ and $L^2$ are each independently a single bond, a substituted or unsubstituted C1 to C30 alkylene group, a substituted or unsubstituted C3 to C30 cycloalkylene group, a substituted or unsubstituted C3 to C30 heterocycloalkylene group, a substituted or unsubstituted C6 to C30 arylene group, or a substituted or unsubstituted C3 to C30 heteroarylene group, a substituted or unsubstituted C6 to C30 aryleneamine group, a substituted or unsubstituted C6 to C30 heteroaryleneamine group, a substituted or unsubstituted C1 to C30 alkoxylene group, a substituted or unsubstituted C6 to C30 aryloxylene group, a substituted or unsubstituted C2 to C30 alkenylene group, a substituted or unsubstituted C2 to C30 alkynylene group, or a combination thereof, and R[1] to R[6] and R[a] are each independently hydrogen, deuterium, a halogen, a cyano group, a hydroxyl group, an amino group, a substituted or unsubstituted C1 to C20 amine group, a nitro group, a carboxyl group, a ferrocenyl group, a substituted or unsubstituted C1 to C20 alkyl group, a substituted or unsubstituted C6 to C30 aryl group, a substituted or unsubstituted C2 to C30 heteroaryl group, a substituted or unsubstituted C1 to C20 alkoxy group, a substituted or unsubstituted C6 to C20 aryloxy group, a substituted or unsubstituted C3 to C40 silyloxy group, a substituted or unsubstituted C1 to C20 acyl group, a substituted or unsubstituted C2 to C20 alkoxycarbonyl group, a substituted or unsubstituted C2 to C20 acyloxy group, a substituted or unsubstituted C2 to C20 acylamino group, a substituted or unsubstituted C2 to C20 alkoxycarbonylamino group, a substituted or unsubstituted C7 to C20 aryloxycarbonylamino group, a substituted or unsubstituted C1 to C20 sulfamoylamino group, a substituted or unsubstituted C1 to C20 sulfonyl group, a substituted or unsubstituted C1 to C20 alkylthiol group, a substituted or unsubstituted C6 to C20 arylthiol group, a substituted or unsubstituted C1 to C20 heterocyclothiol group, a substituted or unsubstituted C1 to C20 ureide group, a substituted or unsubstituted C3 to C40 silyl group, a substituted or unsubstituted C3 to C40 fused ring-containing group, or a combination thereof.

3. The compound for an organic optoelectric device as claimed in claim 1, wherein:

Y is O, S, or N-L[2]-R[4], and

R[1] and R[4] are each independently a functional group of the following Group I:

[Group 1]

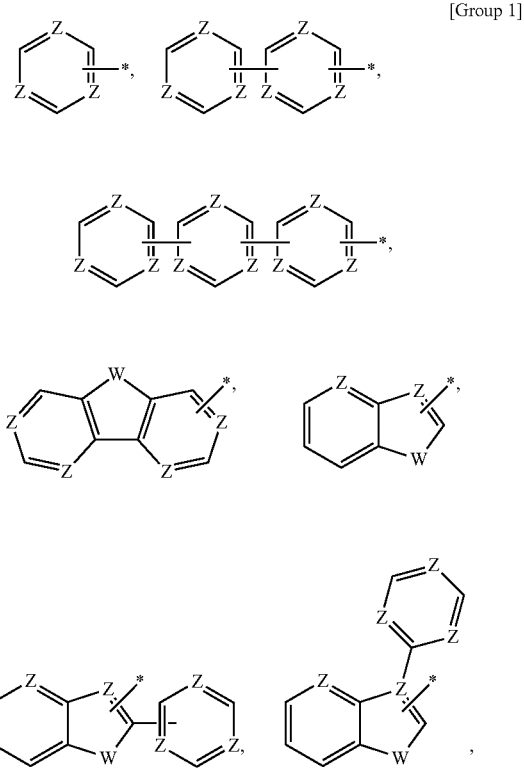

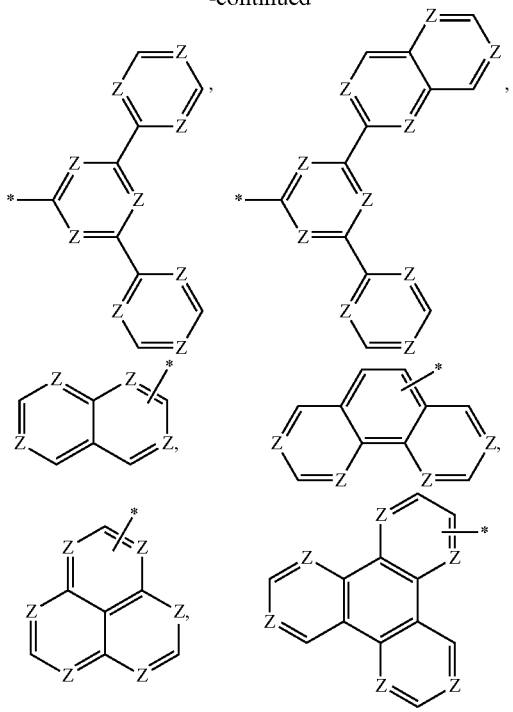

wherein, in Group I, each Z is independently N or CR[c],

W is O, S, SO, SO$_2$, NR', CR'R", or SiR'R",

R[c], R', and R" are each independently hydrogen, deuterium, a substituted or unsubstituted C1 to C30 alkyl group, a substituted or unsubstituted C3 to C30 cycloalkyl group, a substituted or unsubstituted C3 to C30 heterocycloalkyl group, a substituted or unsubstituted C6 to C30 aryl group, a substituted or unsubstituted C3 to C30 heteroaryl group, a substituted or unsubstituted amine group, a substituted or unsubstituted C6 to C30 arylamine group, a substituted or unsubstituted C6 to C30 heteroarylamine group, a substituted or unsubstituted C1 to C30 alkoxy group, a substituted or unsubstituted C2 to C30 alkoxycarbonyl group, a substituted or unsubstituted C2 to C30 alkoxycarbonylamino group, a substituted or unsubstituted C7 to C30 aryloxycarbonylamino group, a substituted or unsubstituted C1 to C30 sulfamoylamino group, a substituted or unsubstituted C2 to C30 alkenyl group, a substituted or unsubstituted C2 to C30 alkynyl group, a substituted or unsubstituted silyl group, a substituted or unsubstituted silyloxy group, a substituted or unsubstituted C1 to C30 acyl group, a substituted or unsubstituted C1 to C20 acyloxy group, a substituted or unsubstituted C1 to C20 acylamino group, a substituted or unsubstituted C1 to C30 sulfonyl group, a substituted or unsubstituted C1 to C30 alkylthiol group, a substituted or unsubstituted C1 to C30 heterocyclothiol group, a substituted or unsubstituted C6 to C30 arylthiol group, a substituted or unsubstituted C1 to C30 heteroarylthiol group, a substituted or unsubstituted C1 to C30 ureide group, a halogen, a halogen-containing group, a cyano group, a hydroxyl group, an amino group, a nitro group, a carboxyl group, a ferrocenyl group, or a combination thereof, and

* is a binding site.

4. The compound for an organic optoelectric device as claimed in claim 1, wherein $R^1$ and $R^4$ are each independently a substituted or unsubstituted functional group of the following Group II:
[Group II]
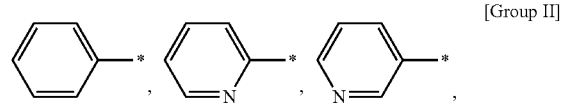
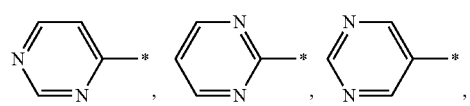
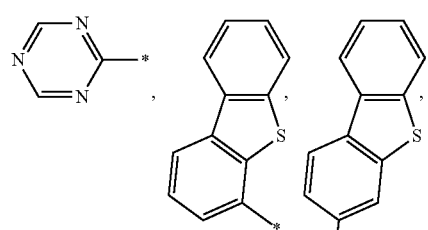
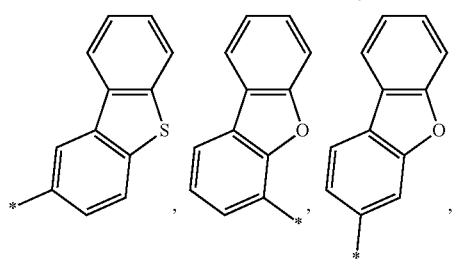
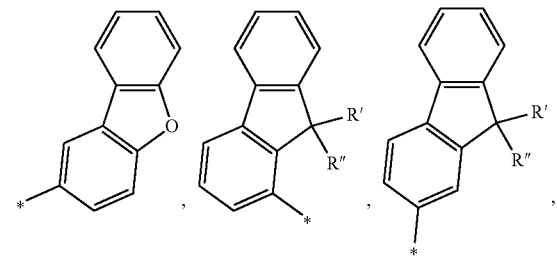
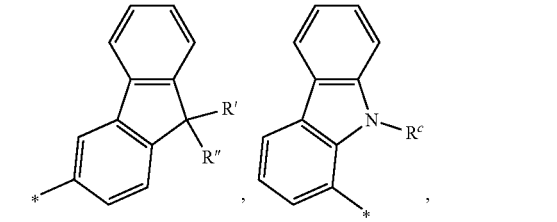
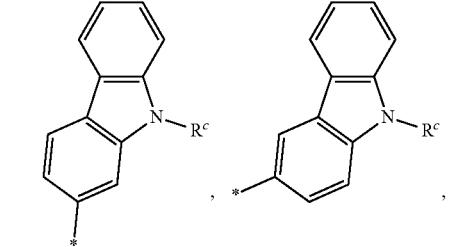
-continued
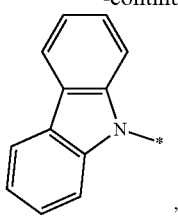
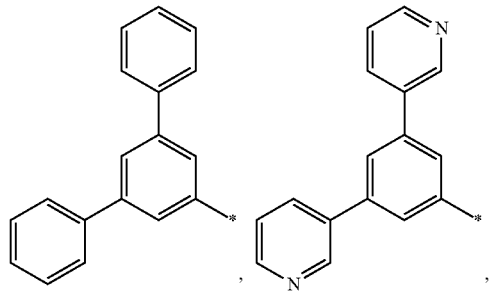
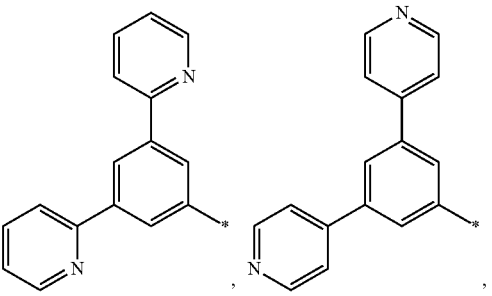
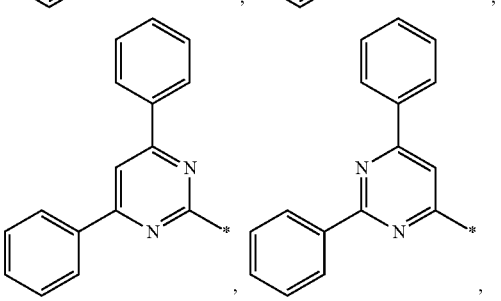
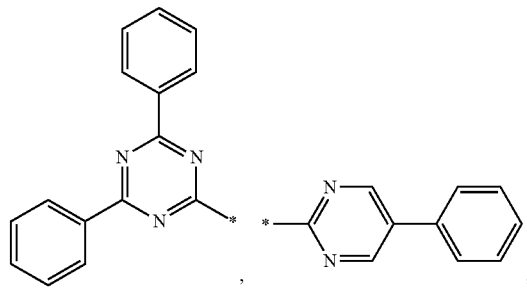
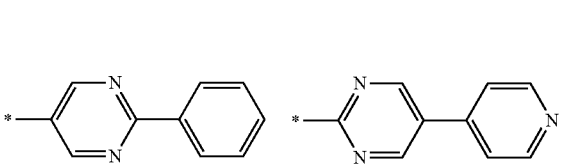
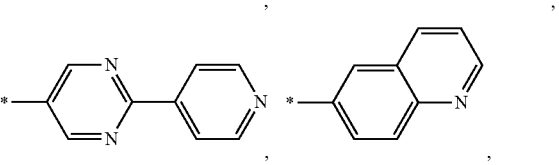

-continued

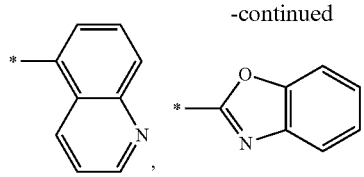

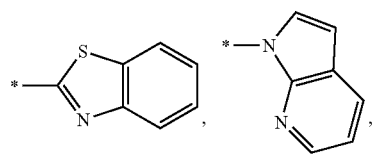

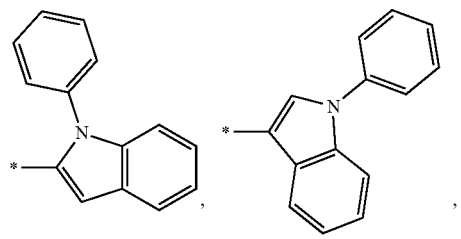

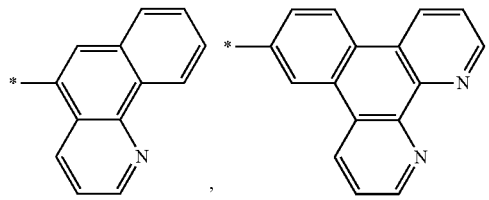

wherein, in Group II, $R^C$, R' and R" are each independently hydrogen, deuterium, a substituted or unsubstituted C1 to C30 alkyl group, a substituted or unsubstituted C3 to C30 cycloalkyl group, a substituted or unsubstituted C3 to C30 heterocycloalkyl group, a substituted or unsubstituted C6 to C30 aryl group, a substituted or unsubstituted C3 to C30 heteroaryl group, a substituted or unsubstituted C2 to C30 alkenyl group, a substituted or unsubstituted C2 to C30 alkynyl group, a substituted or unsubstituted silyl group, a substituted or unsubstituted silyloxy group, a halogen, a halogen-containing group, a cyano group, a hydroxyl group, an amino group, a nitro group, a carboxyl group, a ferrocenyl group, or a combination thereof, and

* is a binding site.

5. The compound for an organic optoelectric device as claimed in claim 1, wherein $L^1$ and $L^2$ are each independently a single bond, a substituted or unsubstituted phenylene group, a substituted or unsubstituted naphthylene group, a substituted or unsubstituted anthracenylene group, or a substituted or unsubstituted biphenylene group.

6. The compound for an organic optoelectric device as claimed in claim 1, wherein the compound is represented by one of the following Chemical Formula 7 to Chemical Formula 24:

[Chemical Formula 7]

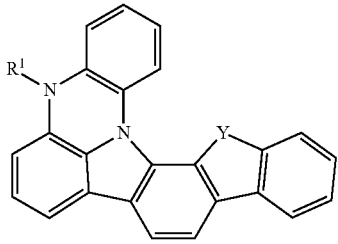

[Chemical Formula 8]

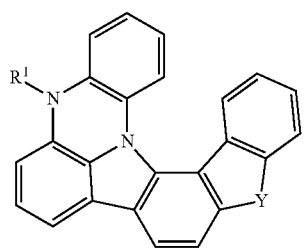

[Chemical Formula 9]

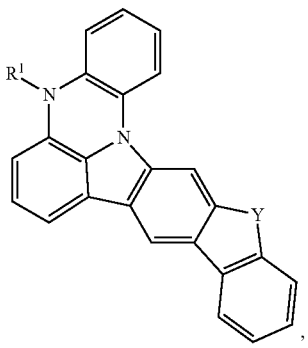

[Chemical Formula 10]

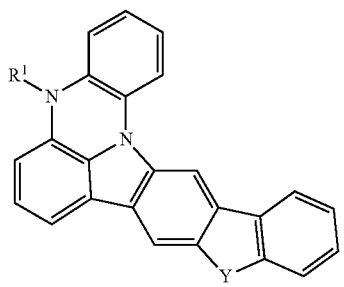

[Chemical Formula 11]

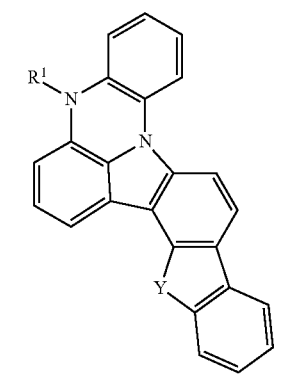

[Chemical Formula 12]
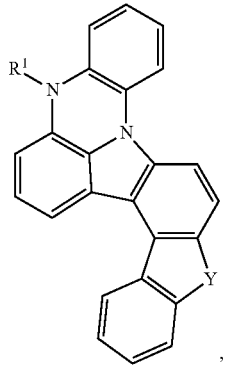
[Chemical Formula 13]
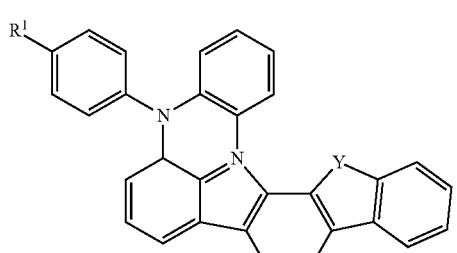
[Chemical Formula 14]
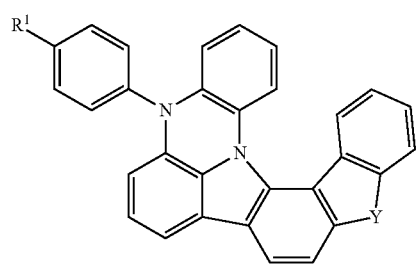
[Chemical Formula 15]
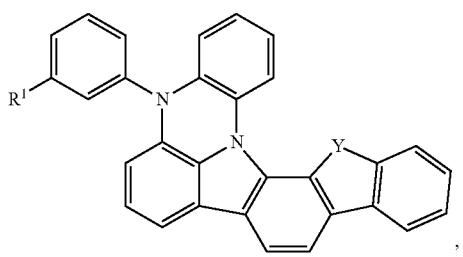
,
[Chemical Formula 16]
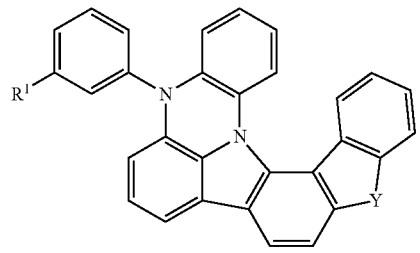
[Chemical Formula 17]
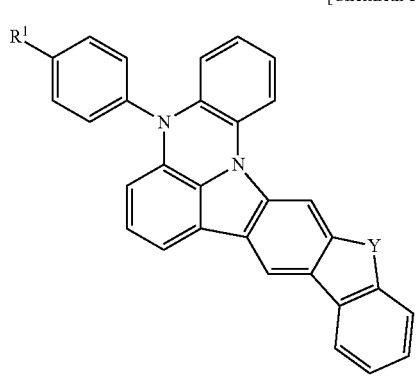
[Chemical Formula 18]
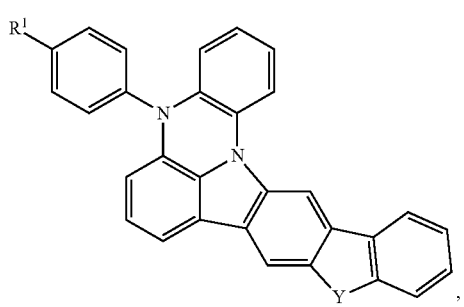
,
[Chemical Formula 19]
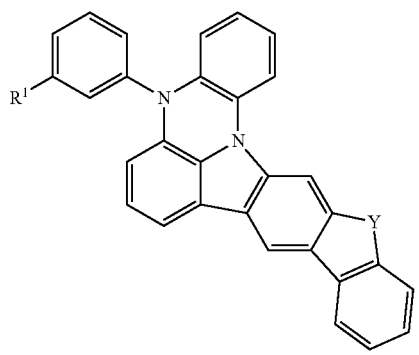
[Chemical Formula 20]
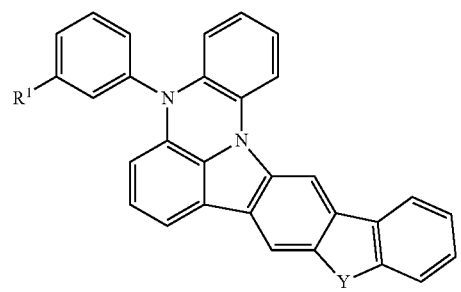

-continued

[Chemical Formula 21]
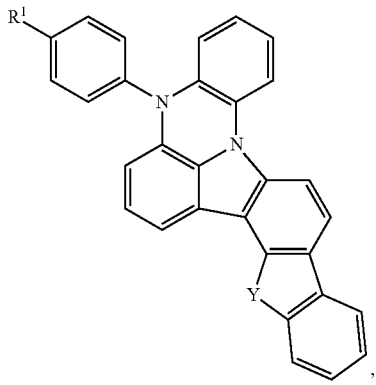

[Chemical Formula 22]
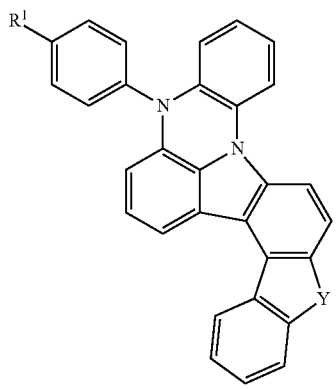

[Chemical Formula 23]
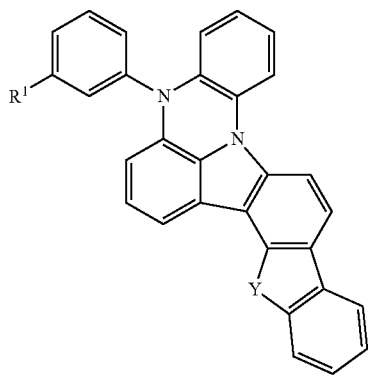

[Chemical Formula 24]
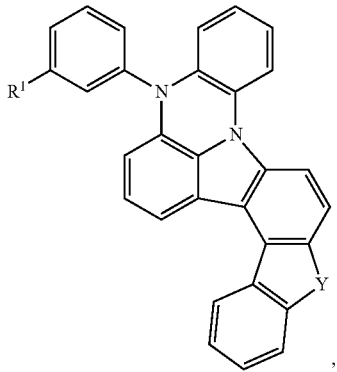

wherein, in the above Chemical Formula 7 to Chemical Formula 24,

Y is O, S, or N-L$^2$-R$^4$,

L$^2$ is a single bond, a substituted or unsubstituted C1 to C30 alkylene group, a substituted or unsubstituted C3 to C30 cycloalkylene group, a substituted or unsubstituted C3 to C30 heterocycloalkylene group, a substituted or unsubstituted C6 to C30 arylene group, or a substituted or unsubstituted C3 to C30 heteroarylene group, a substituted or unsubstituted C6 to C30 aryleneamine group, a substituted or unsubstituted C6 to C30 heteroaryleneamine group, a substituted or unsubstituted C1 to C30 alkoxylene group, a substituted or unsubstituted C6 to C30 aryloxylene group, a substituted or unsubstituted C2 to C30 alkenylene group, a substituted or unsubstituted C2 to C30 alkynylene group, or a combination thereof, and R$^1$ and R$^4$ are each independently hydrogen, deuterium, a halogen, a cyano group, a hydroxyl group, an amino group, a substituted or unsubstituted C1 to C20 amine group, a nitro group, a carboxyl group, a ferrocenyl group, a substituted or unsubstituted C1 to C20 alkyl group, a substituted or unsubstituted C6 to C30 aryl group, a substituted or unsubstituted C2 to C30 heteroaryl group, a substituted or unsubstituted C1 to C20 alkoxy group, a substituted or unsubstituted C6 to C20 aryloxy group, a substituted or unsubstituted C3 to C40 silyloxy group, a substituted or unsubstituted C1 to C20 acyl group, a substituted or unsubstituted C2 to C20 alkoxycarbonyl group, a substituted or unsubstituted C2 to C20 acyloxy group, a substituted or unsubstituted C2 to C20 acylamino group, a substituted or unsubstituted C2 to C20 alkoxycarbonylamino group, a substituted or unsubstituted C7 to C20 aryloxycarbonylamino group, a substituted or unsubstituted C1 to C20 sulfamoylamino group, a substituted or unsubstituted C1 to C20 sulfonyl group, a substituted or unsubstituted C1 to C20 alkylthiol group, a substituted or unsubstituted C6 to C20 arylthiol group, a substituted or unsubstituted C1 to C20 heterocyclothiol group, a substituted or unsubstituted C1 to C20 ureide group, a substituted or unsubstituted C3 to C40 silyl group, a substituted or unsubstituted C3 to C40 fused ring-containing group, or a combination thereof.

7. The compound for an organic optoelectric device as claimed in claim 1, wherein the compound is represented by one of the following Chemical Formula 25 to Chemical Formula 54:

[Chemical Formula 25]
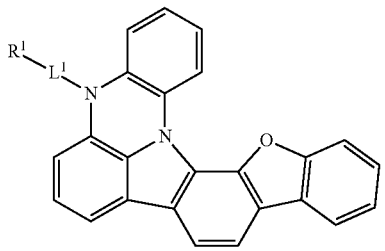

[Chemical Formula 26]
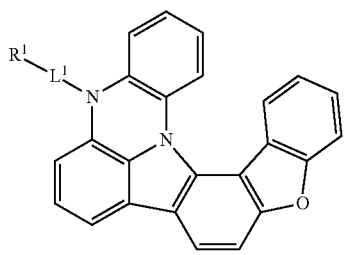
[Chemical Formula 27]
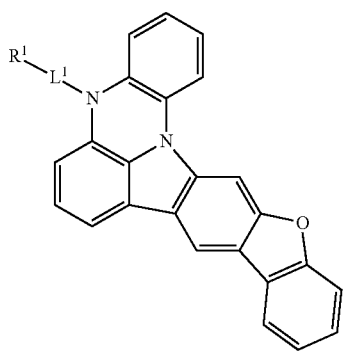
[Chemical Formula 28]
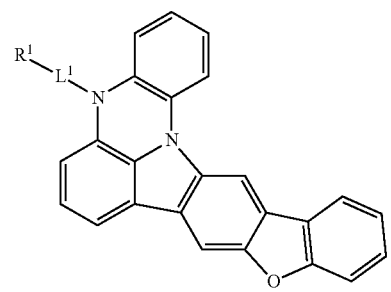
[Chemical Formula 29]
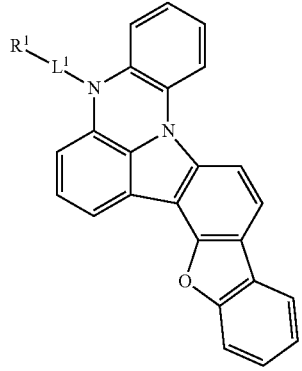
[Chemical Formula 30]
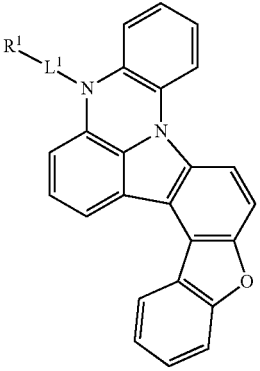
[Chemical Formula 31]
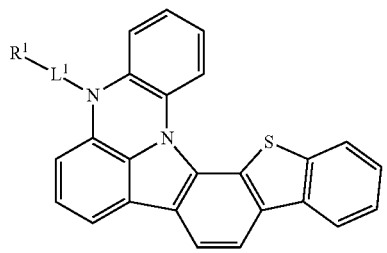
[Chemical Formula 32]
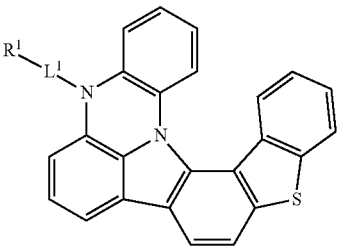
[Chemical Formula 33]
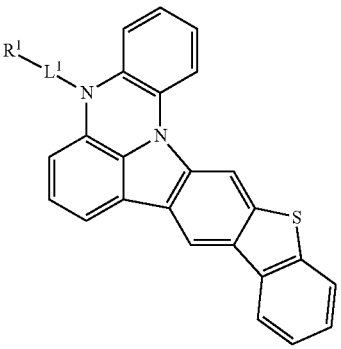
[Chemical Formula 34]
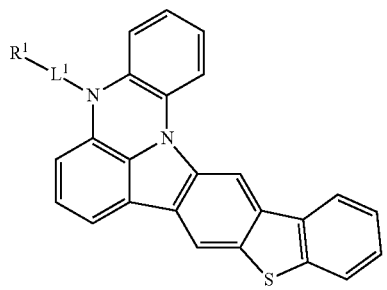

[Chemical Formula 35]
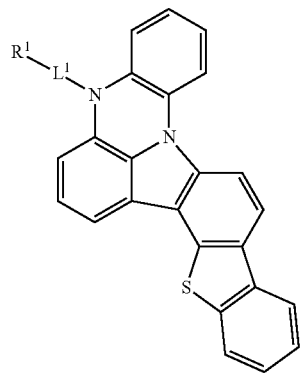
[Chemical Formula 36]
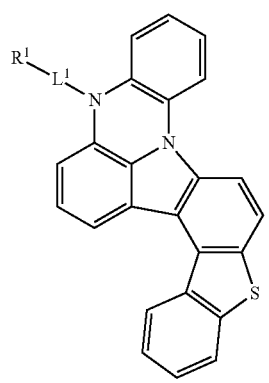
[Chemical Formula 37]
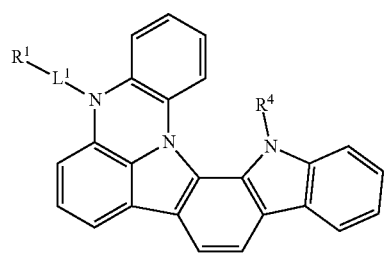
[Chemical Formula 38]
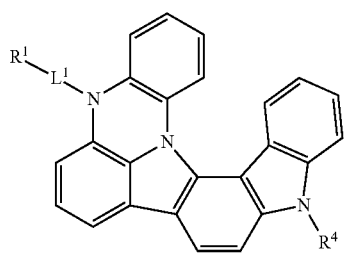
[Chemical Formula 39]
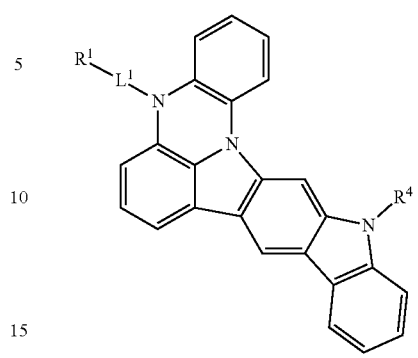
[Chemical Formula 40]
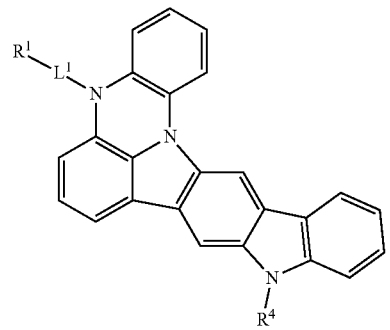
[Chemical Formula 41]
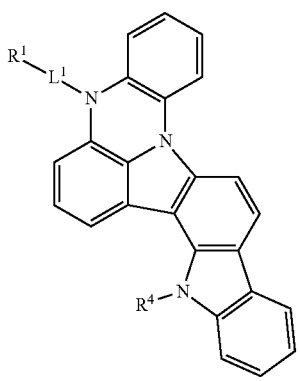
[Chemical Formula 42]
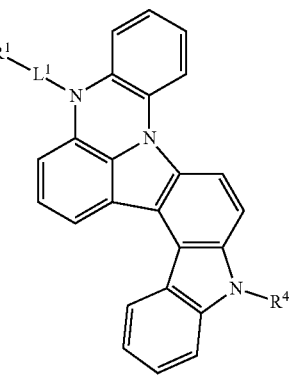

[Chemical Formula 43]
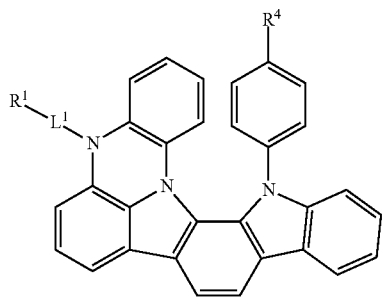
[Chemical Formula 44]
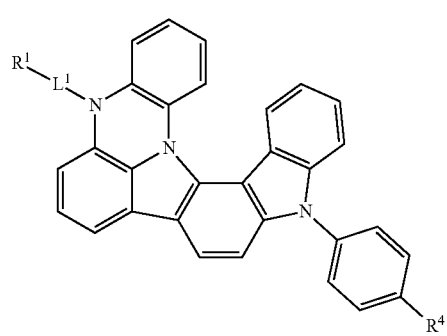
[Chemical Formula 45]
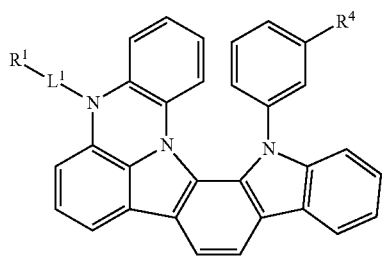
[Chemical Formula 46]
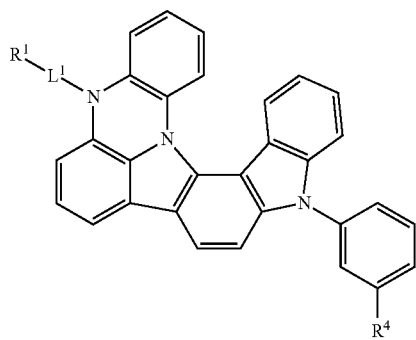
[Chemical Formula 47]
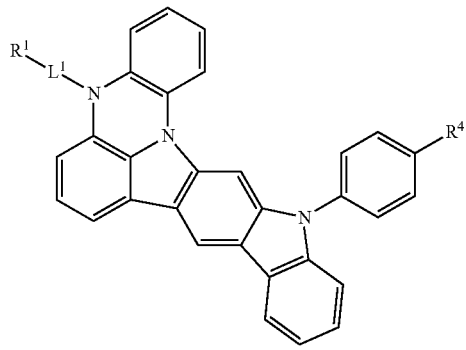
[Chemical Formula 48]
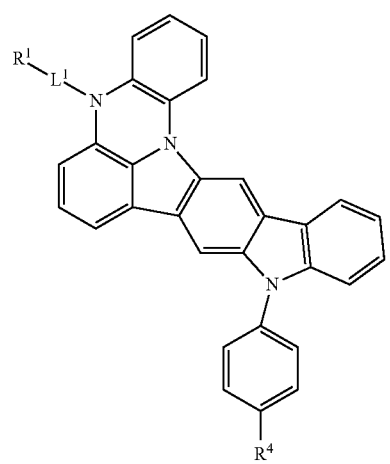
[Chemical Formula 49]
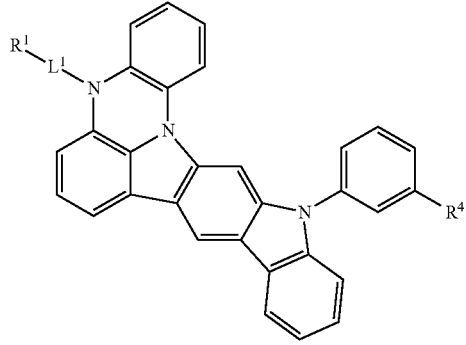
[Chemical Formula 50]
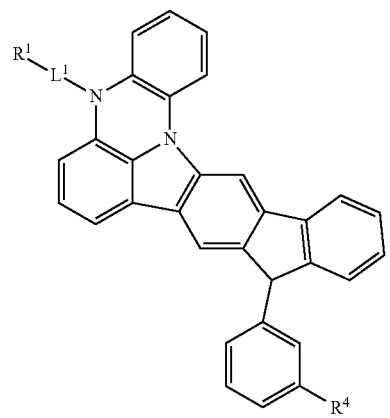

[Chemical Formula 51]

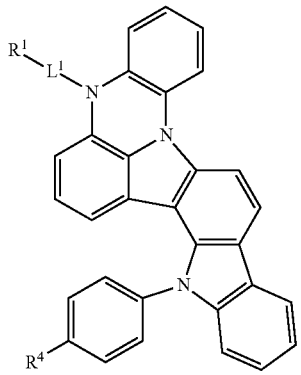

[Chemical Formula 52]

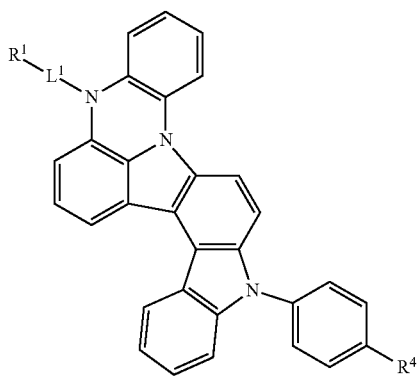

[Chemical Formula 53]

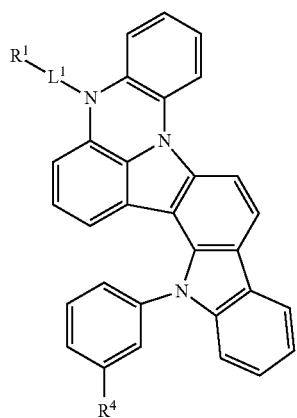

[Chemical Formula 54]

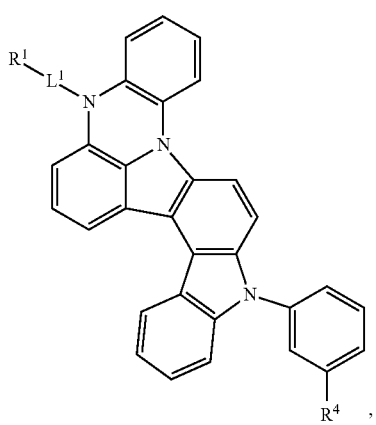

wherein, in the above Chemical Formula 25 to Chemical Formula 54,

L$^1$ is a single bond, a substituted or unsubstituted C6 to C30 arylene group, or a substituted or unsubstituted C3 to C30 heteroarylene group, and R$^1$ and R$^4$ are each independently hydrogen, deuterium, a substituted or unsubstituted C1 to C20 alkyl group, a substituted or unsubstituted C6 to C30 aryl group, or a substituted or unsubstituted C2 to C30 heteroaryl group.

8. The compound for an organic optoelectric device as claimed in claim 1, wherein:

Y is O, S or N-L$^2$-R$^4$,

L$^1$ and L$^2$ are each independently a single bond, a substituted or unsubstituted C6 to C30 arylene group, or a substituted or unsubstituted C3 to C30 heteroarylene group, and R$^1$ to R$^6$, R$^a$, and R$^b$ are each independently hydrogen, deuterium, a substituted or unsubstituted C1 to C20 alkyl group, a substituted or unsubstituted C6 to C30 aryl group, or a substituted or unsubstituted C2 to C30 heteroaryl group.

9. The compound for an organic optoelectric device as claimed in claim 1, wherein R$^1$ and R$^4$ is a substituted or unsubstituted phenyl group, a substituted or unsubstituted biphenyl group, a substituted or unsubstituted fluorenyl group, a substituted or unsubstituted pyridyl group, a substituted or unsubstituted pyrimidinyl group, a substituted or unsubstituted triazinyl group, a substituted or unsubstituted dibenzofuranyl group, a substituted or unsubstituted dibenzothiophenyl group, or a substituted or unsubstituted carbazolyl group.

10. The compound for an organic optoelectric device as claimed in claim 1, wherein:

L$^1$ and L$^2$ are each independently a single bond, a substituted or unsubstituted phenylene group, a substituted or unsubstituted biphenylene group, a substituted or unsubstituted fluorenylene group, a substituted or unsubstituted pyridylene group, a substituted or unsubstituted pyrimidinylene group, a substituted or unsubstituted triazinylene group, a substituted or unsubstituted dibenzofuranylene group, a substituted or unsubstituted dibenzothiophenylene group, or a substituted or unsubstituted carbazolylene group, and $R^1$ to $R^6$, $R^a$, and $R^b$ are each independently hydrogen, deuterium, a substituted or unsubstituted phenyl group, a substituted or unsubstituted biphenyl group, a substituted or unsubstituted fluorenyl group, a substituted or unsubstituted pyridyl group, a substituted or unsubstituted pyrimidinyl group, a substituted or unsubstituted triazinyl group, a substituted or unsubstituted dibenzofuranyl group, a substituted or unsubstituted dibenzothiophenyl group, or a substituted or unsubstituted carbazolyl group.

11. The compound for an organic optoelectric device as claimed in claim 1, wherein the compound is one of the following Compounds 75, 248, 249, and 257:

[Compound 75]

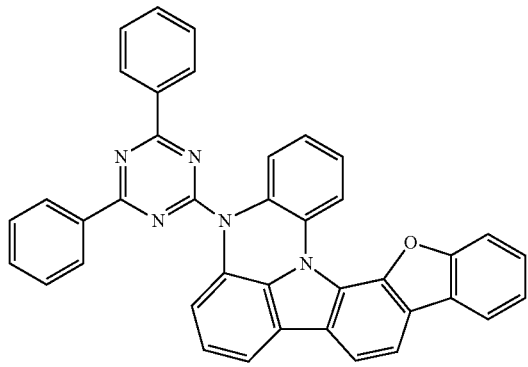

[Compound 248]

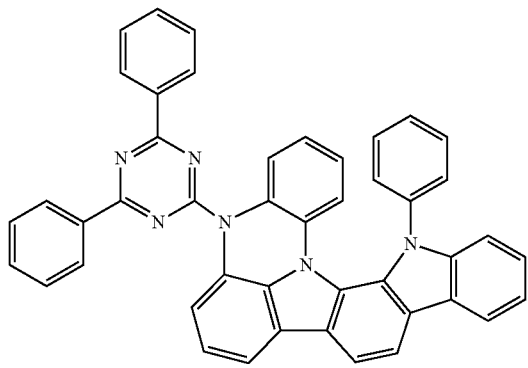

[Compound 249]

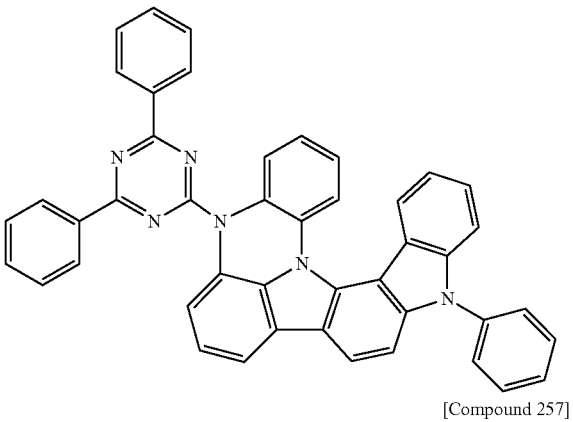

[Compound 257]

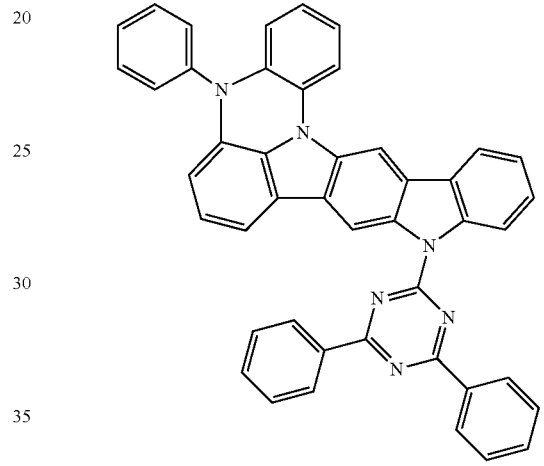

12. An organic optoelectric device, comprising:
an anode and a cathode facing each other, and
at least one organic layer between the anode and the cathode,
wherein the organic layer includes the compound as claimed in claim 1.

13. The organic optoelectric device as claimed in claim 12, wherein:
the organic layer includes an emission layer, and
the emission layer includes the compound.

14. The organic optoelectric device as claimed in claim 13, wherein the compound is a host of the emission layer.

15. The organic optoelectric device as claimed in claim 12, wherein:
the organic layer includes at least one auxiliary layer selected from a hole injection layer, a hole transport layer, an electron blocking layer, an electron transport layer, an electron injection layer, or a hole blocking layer, and
the at least one auxiliary layer includes the compound.

16. A display device comprising the organic optoelectric device as claimed in claim 12.

* * * * *